US012426303B2

(12) United States Patent
Okuda et al.

(10) Patent No.: US 12,426,303 B2
(45) Date of Patent: Sep. 23, 2025

(54) SEMICONDUCTOR DEVICE INCLUDING INSULATION GATE-TYPE TRANSISTORS

(71) Applicant: ROHM CO., LTD., Kyoto (JP)

(72) Inventors: Hajime Okuda, Kyoto (JP); Yoshinori Fukuda, Kyoto (JP); Toru Takuma, Kyoto (JP); Shuntaro Takahashi, Kyoto (JP); Naoki Takahashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 676 days.

(21) Appl. No.: 17/414,722

(22) PCT Filed: Dec. 20, 2019

(86) PCT No.: PCT/JP2019/050173

§ 371 (c)(1),
(2) Date: Jun. 16, 2021

(87) PCT Pub. No.: WO2020/130141

PCT Pub. Date: Jun. 25, 2020

(65) Prior Publication Data

US 2022/0045208 A1 Feb. 10, 2022

(30) Foreign Application Priority Data

Dec. 21, 2018 (JP) ................................ 2018-240076
Feb. 18, 2019 (JP) ................................ 2019-026833

(51) Int. Cl.
*H10D 30/66* (2025.01)
*H01L 21/76* (2006.01)
(Continued)

(52) U.S. Cl.
CPC ........... *H10D 30/668* (2025.01); *H01L 21/76* (2013.01); *H10D 12/481* (2025.01);
(Continued)

(58) Field of Classification Search
CPC ............. H01L 29/7813; H01L 29/1095; H01L 29/4238; H01L 29/7397; H01L 29/0878;
(Continued)

(56) References Cited

U.S. PATENT DOCUMENTS 5,448,083 A * 9/1995 Kitagawa ............ H01L 29/7397 257/E29.199
6,809,348 B1 * 10/2004 Suzuki ................ H01L 29/0696 257/119
(Continued)

FOREIGN PATENT DOCUMENTS

JP 07135309 A * 5/1995 ......... H01L 29/4236
JP 2000101076 4/2000
(Continued)

OTHER PUBLICATIONS

International Search Report and Written Opinion issued for International Patent Application No. PCT/JP2019/050173, Date of mailing: Mar. 17, 2020, 21 pages including English translation of Search Report.
(Continued)

*Primary Examiner* — Ida M Soward
(74) *Attorney, Agent, or Firm* — HSML P.C.

(57) ABSTRACT

A semiconductor device includes a semiconductor layer, an insulation gate-type first transistor which is formed in the semiconductor layer, an insulation gate-type second transistor which is formed in the semiconductor layer, and a control wiring which is formed on the semiconductor layer such as to be electrically connected to the first transistor and the second transistor, and transmits control signals that control the first transistor and the second transistor to be in ON states in a normal operation and that control the first transistor to be in an OFF state and the second transistor to be in an ON state in an active clamp operation.

8 Claims, 72 Drawing Sheets

(51) Int. Cl.

| | |
|---|---|
| ***H10D 12/00*** | (2025.01) |
| ***H10D 62/17*** | (2025.01) |
| ***H10D 64/27*** | (2025.01) |
| *H10D 30/65* | (2025.01) |
| *H10D 30/69* | (2025.01) |
| *H10D 62/13* | (2025.01) |
| *H10D 88/00* | (2025.01) |

(52) U.S. Cl.
CPC ......... *H10D 62/393* (2025.01); *H10D 64/519* (2025.01); *H10D 30/658* (2025.01); *H10D 30/699* (2025.01); *H10D 62/157* (2025.01); *H10D 64/512* (2025.01); *H10D 64/513* (2025.01); *H10D 88/00* (2025.01); *H10D 88/101* (2025.01)

(58) Field of Classification Search
CPC ............. H01L 29/0696; H01L 29/1608; H01L 29/7806; H01L 29/7825; H01L 29/42352; H01L 29/4236; H01L 29/42356; H01L 2224/0603; H01L 29/4903; H01L 27/0688; H01L 27/0694; H10D 30/668; H10D 30/658; H10D 30/699; H10D 12/481; H10D 62/393; H10D 62/157; H10D 62/127; H10D 62/8325; H10D 64/519; H10D 64/512; H10D 64/513; H10D 88/00; H10D 88/101; H10D 84/146
See application file for complete search history.

(56) References Cited

U.S. PATENT DOCUMENTS

| | | | | |
|---|---|---|---|---|
| 7,633,121 | B2 * | 12/2009 | Hshieh | H01L 29/7811 438/242 |
| 8,174,067 | B2 * | 5/2012 | Yedinak | H01L 29/7811 257/334 |
| 8,653,587 | B2 * | 2/2014 | Hsieh | H01L 29/66734 257/330 |
| 9,231,090 | B2 * | 1/2016 | Higuchi | H10D 62/393 |
| 9,614,039 | B2 * | 4/2017 | Onishi | H01L 29/7813 |
| 9,735,150 | B2 * | 8/2017 | Iwasaki | H10D 12/481 |
| 2005/0161768 | A1 | 7/2005 | Sugiyama et al. | |
| 2007/0210350 | A1 * | 9/2007 | Omura | H01L 23/4824 257/E21.384 |
| 2009/0315108 | A1 * | 12/2009 | Haeberlen | H10D 84/83 257/341 |
| 2010/0123192 | A1 * | 5/2010 | Burke | H01L 29/407 257/334 |
| 2012/0286288 | A1 | 11/2012 | Hussein et al. | |
| 2015/0091082 | A1 | 4/2015 | Tanaka et al. | |
| 2016/0133742 | A1 * | 5/2016 | Okuda | H01L 23/49562 438/270 |
| 2017/0092759 | A1 * | 3/2017 | Okuda | H01L 23/49575 |
| 2018/0226480 | A1 * | 8/2018 | Okuda | H01L 21/26586 |
| 2019/0260371 | A1 | 8/2019 | Wada et al. | |
| 2020/0044078 | A1 * | 2/2020 | Yilmaz | H01L 29/4236 |

FOREIGN PATENT DOCUMENTS

| | | |
|---|---|---|
| JP | 2004319624 | 11/2004 |
| JP | 2005191221 | 7/2005 |
| JP | 2012238715 | 12/2012 |
| JP | 2015070193 | 4/2015 |
| JP | 2016162855 | 9/2016 |
| JP | 2018037932 | 3/2018 |
| JP | 2018107693 | 7/2018 |
| JP | 2018129378 | 8/2018 |
| WO | 2014038064 | 3/2014 |

OTHER PUBLICATIONS

International Preliminary Report on Patentability issued for International Patent Application No. PCT/JP2019/050173, Date of mailing: Jul. 1, 2021, 26 pages including English translation.
Decision to Grant a Patent issued for Japanese Patent Application No. 2020-200381, dated Apr. 21, 2022, 3 pages Including English translation.
Office Action issued for Japanese Patent Application No. 2020-200381, Dispatch Date: Dec. 2, 2021, 7 pages Including English translation.
Notice of Reasons for Refusal issued for Japanese Patent Application No. 2022-078161, Dispatch date: Jun. 1, 2023, 5 pages including English machine translation.

* cited by examiner

SEMICONDUCTOR DEVICE INCLUDING INSULATION GATE-TYPE TRANSISTORS

TECHNICAL FIELD

The present invention relates to a semiconductor device having an insulation gate-type transistor.

BACKGROUND ART

A patent literature 1 discloses a planar gate-type semiconductor device as an example of a semiconductor device having an insulation gate-type transistor. This semiconductor device includes a semiconductor layer having a main surface, a gate insulation layer formed on the main surface, a gate electrode formed on the gate insulation layer, and a channel facing the gate electrode across the gate insulation layer at a surface layer portion of the semiconductor layer.

CITATION LIST

Patent Literature

Patent Literature 1: Japanese Patent Application Publication No. 2015-70193

SUMMARY OF THE INVENTION

Technical Problem

A semiconductor device having an insulation gate-type transistor is sometimes connected to an inductive load as an example of a manner of use. In this case, as electrical characteristics, an excellent ON resistance and an excellent active clamp capability are required. The ON resistance is a resistance value of the semiconductor device in a normal operation. The active clamp capability is a capability of the transistor in an active clamp operation.

Specifically, the active clamp capability is a capability of the transistor with respect to a counter electromotive force caused by energy accumulated in the inductive load in transition when the transistor is switched from an ON state to an OFF state. The active clamp operation is a transistor operation when the counter electromotive force is consumed (absorbed) by the transistor.

The ON resistance and the active clamp capability are adjusted by an area of channel of the transistor as an example. When the area of channel is increased, a current path can be increased in the normal operation, so that the ON resistance can be reduced. However, in this case, the active clamp capability is reduced by a sharp temperature rise due to the counter electromotive force in the active clamp operation.

In contrast thereto, in a case in which the area of channel is reduced, the current path is reduced in the normal operation, so that the ON resistance is increased. However, in this case, since the sharp temperature rise due to the counter electromotive force can be suppressed in the active clamp operation, the active clamp capability can be improved. As described above, the adjustment method based on the area of channel has a trade-off relationship and therefore there is a difficulty in realizing an excellent ON resistance and an excellent active clamp capability at the same time.

A preferred embodiment of the present invention provides a semiconductor device capable of realizing an excellent ON resistance and an excellent active clamp capability at the same time.

Solution to Problem

A preferred embodiment of the present invention provides a semiconductor device including a semiconductor layer, an insulation gate-type first transistor which is formed in the semiconductor layer, an insulation gate-type second transistor which is formed in the semiconductor layer, and a control wiring which is formed on the semiconductor layer such as to be electrically connected to the first transistor and the second transistor, and transmits control signals that control the first transistor and the second transistor to be in ON states in a normal operation and that control the first transistor to be in an OFF state and the second transistor to be in an ON state in an active clamp operation.

According to the semiconductor device, in the normal operation, a current is allowed to flow by using the first transistor and the second transistor. Thereby, it is possible to reduce an ON resistance. On the other hand, in the active clamp operation, a current is allowed to flow by using the second transistor in a state where the first transistor is stopped. Thereby, it is possible to consume (absorb) a counter electromotive force by the second transistor while suppressing a sharp temperature rise due to the counter electromotive force. As a result, it is possible to improve an active clamp capability. Therefore, it is possible to realize an excellent ON resistance and an excellent active clamp capability at the same time.

A preferred embodiment of the present invention provides a semiconductor device including a semiconductor layer, an insulation gate-type first transistor which is formed in the semiconductor layer, an insulation gate-type second transistor which is formed in the semiconductor layer, and a control circuit which is formed in the semiconductor layer such as to be electrically connected to the first transistor and the second transistor, controls the first transistor and the second transistor to be in ON states in a normal operation, and controls the first transistor to be in an OFF state and the second transistor to be in an ON state in an active clamp operation.

According to the semiconductor device, in the normal operation, a current is allowed to flow by using the first transistor and the second transistor. Thereby, it is possible to reduce an ON resistance. On the other hand, in the active clamp operation, in a state where the first transistor is stopped, a current is allowed to flow by using the second transistor. Thereby, it is possible to consume (absorb) a counter electromotive force by the second transistor while suppressing a sharp temperature rise due to the counter electromotive force. As a result, it is possible to improve an active clamp capability. Therefore, it is possible to realize an excellent ON resistance and an excellent active clamp capability at the same time.

A preferred embodiment of the present invention provides a semiconductor device including a semiconductor layer, an insulation gate-type first transistor which includes a first channel and is formed in the semiconductor layer, an insulation gate-type second transistor which includes a second channel and is formed in the semiconductor layer, and a control wiring which is formed on the semiconductor layer such as to be electrically connected to the first transistor and the second transistor, and transmits control signals that control the first transistor and the second transistor such that utilization rates of the first channel and the second channel in an active clamp operation becomes in excess of zero and less than utilization rates of the first channel and the second channel in a normal operation.

According to the semiconductor device, in the normal operation, the utilization rates of the first channel and the second channel are relatively increased. Thereby, a current path is relatively increased, and it becomes possible to reduce an ON resistance. On the other hand, in the active clamp operation, the utilization rates of the first channel and the second channel are relatively reduced. Thereby, it is possible to suppress a sharp temperature rise due to the counter electromotive force and therefore it is possible to improve an active clamp capability. Therefore, it is possible to realize an excellent ON resistance and an excellent active clamp capability at the same time.

A preferred embodiment of the present invention provides a semiconductor device including a semiconductor layer, an insulation gate-type first transistor which includes a first channel and is formed in the semiconductor layer, an insulation gate-type second transistor which includes a second channel and is formed in the semiconductor layer, and a control circuit which is formed in the semiconductor layer such as to be electrically connected to the first transistor and the second transistor, and controls the first transistor and the second transistor such that utilization rates of the first channel and the second channel in an active clamp operation becomes in excess of zero and less than utilization rates of the first channel and the second channel in a normal operation.

According to the semiconductor device, in the normal operation, the utilization rates of the first channel and the second channel are relatively increased. Thereby, a current path is relatively increased, and it becomes possible to reduce an ON resistance. On the other hand, in the active clamp operation, the utilization rates of the first channel and the second channel are relatively reduced. Thereby, it is possible to suppress a sharp temperature rise due to the counter electromotive force and therefore it is possible to improve an active clamp capability. Therefore, it is possible to realize an excellent ON resistance and an excellent active clamp capability at the same time.

The aforementioned or other objects, features, and effects of the present invention will be clarified by the following description of preferred embodiments given below with reference to the accompanying drawings.

DETAILED DESCRIPTION OF PREFERRED EMBODIMENTS

Figure 1:
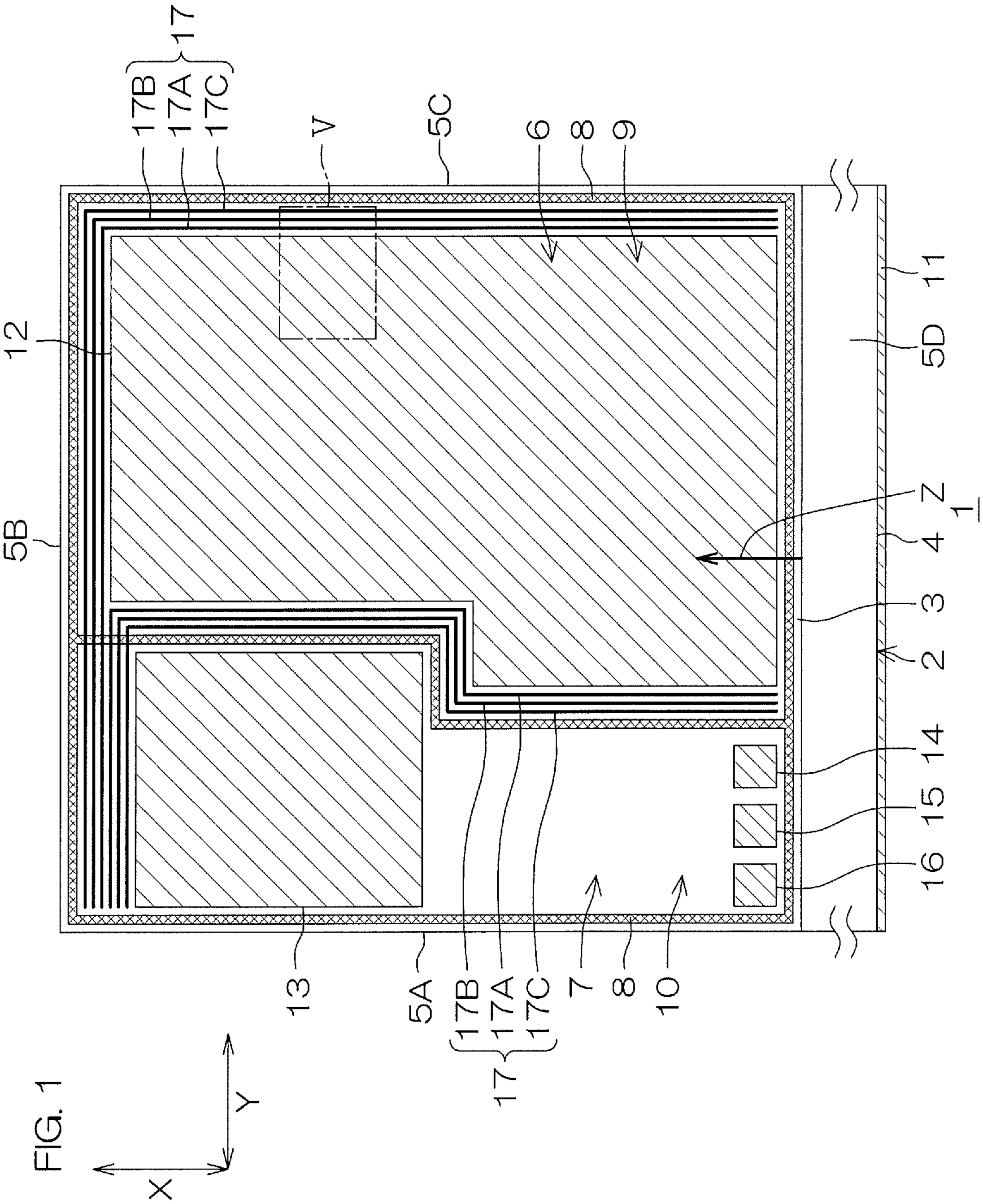
FIG. 1 is a perspective view of a semiconductor device according to a first preferred embodiment of the present invention which is viewed from one direction.

FIG. 1 is a perspective view of a semiconductor device 1 according to a first preferred embodiment of the present invention which is viewed from one direction. Hereinafter, a description will be given of a configuration example in which the semiconductor device 1 is a high-side switching device. However, the semiconductor device 1 is not restricted to the high-side switching device. The semiconductor device 1 can also be provided as a low-side switching device by adjusting electrical connection configurations and functions of various structures.

With reference to FIG. 1, the semiconductor device 1 includes a semiconductor layer 2. The semiconductor layer 2 includes silicon. The semiconductor layer 2 is formed in a rectangular parallelepiped chip shape. The semiconductor layer 2 has a first main surface 3 on one side, a second main surface 4 on the other side, and side surfaces 5A, 5B, 5C, and 5D connecting the first main surface 3 and the second main surface 4.

The first main surface 3 and the second main surface 4 are each formed in a rectangular shape in plan view when viewed from a normal direction Z thereof (hereinafter, simply referred to as "plan view"). The side surface 5A and the side surface 5C extend along a first direction X and face each other in a second direction Y which intersects the first direction X. The side surface 5B and the side surface 5D extend along the second direction Y and face each other in the first direction X. Specifically, the second direction Y is orthogonal to the first direction X.

An output region 6 and an input region 7 are defined in the semiconductor layer 2. The output region 6 is defined in a region at the side surface 5C side. The input region 7 is defined in a region at the side surface 5A side. In plan view, an area SOUT of the output region 6 is equal to or larger than an area SIN of the input region 7 (SIN≤SOUT).

A ratio SOUT/SIN of the area SOUT with respect to the area SIN may be from not less than 1 to not more than 10 (1≤SOUT/SIN≤10). The ratio SOUT/SIN may be from not less than 1 to not more than 2, from not less than 2 to not more than 4, from not less than 4 to not more than 6, from not less than 6 to not more than 8, or from not less than 8 to not more than 10. Planar shapes of the input region 7 and the output region 6 are arbitrary and not restricted to particular shapes. As a matter of course, the ratio SOUT/SIN may be in excess of 0 and less than 1.

The output region 6 includes a power MISFET (Metal Insulator Semiconductor Field Effect Transistor) 9 as an example of an insulation gate type transistor. The power MISFET 9 includes a gate, a drain, and a source.

The input region 7 includes a control IC (Integrated Circuit) 10 as an example of a control circuit. The control IC 10 includes plural types of functional circuits which realize various functions. The plural types of functional circuits include a circuit generating gate control signals which drive and control the power MISFET 9 based on an external electrical signal. The control IC 10 forms a so-called IPD (Intelligent Power Device) together with the power MISFET 9. The IPD is also referred to as an IPM (Intelligent Power Module).

The input region 7 is electrically insulated from the output region 6 by a region separation structure 8. In FIG. 1, the region separation structure 8 is indicated by hatching. Although a specific description shall be omitted, the region separation structure 8 may have a trench insulating structure in which an insulator is embedded in the trench.

On the semiconductor layer 2, a plurality of (in this embodiment, six) of electrodes 11, 12, 13, 14, 15, and 16 are formed. In FIG. 1, the plurality of electrodes 11 to 16 are indicated by hatching. Each of the electrodes 11 to 16 is formed as a terminal electrode to be externally connected by a lead wire (for example, bonding wire), etc. The number, the arrangement, and the shape of the plurality of electrodes 11 to 16 are arbitrary and are not restricted to the configuration shown in FIG. 1.

The number, the arrangement, and the shape of the plurality of electrodes 11 to 16 are adjusted according to the specification of the power MISFET 9 and/or the specification of the control IC 10. In this embodiment, the plurality of electrodes 11 to 16 include a drain electrode 11 (power supply electrode), a source electrode 12 (output electrode), an input electrode 13, a reference voltage electrode 14, an ENABLE electrode 15, and a SENSE electrode 16.

The drain electrode 11 is formed on the second main surface 4 of the semiconductor layer 2. The drain electrode 11 is electrically connected to the second main surface 4 of the semiconductor layer 2. The drain electrode 11 transmits a power supply voltage VB to the drain of the power MISFET 9 and to various types of circuits of the control IC 10.

The drain electrode 11 may include at least any one of a Ti layer, a Ni layer, an Au layer, an Ag layer and an Al layer. The drain electrode 11 may have a single layer structure which includes a Ti layer, a Ni layer, an Au layer, an Ag layer, or an Al layer. The drain electrode 11 may have a laminated structure in which at least two of a Ti layer, a Ni layer, an Au layer, an Ag layer, and an Al layer are laminated in any given manner.

The source electrode 12 is formed on the output region 6 in the first main surface 3. The source electrode 12 is electrically connected to the source of the power MISFET 9. The source electrode 12 transmits an electrical signal generated by the power MISFET 9 to the outside.

The input electrode 13, the reference voltage electrode 14, the ENABLE electrode 15, and the SENSE electrode 16 are each formed on the input region 7 in the first main surface 3. The input electrode 13 transmits an input voltage for driving the control IC 10.

The reference voltage electrode 14 transmits the reference voltage (for example, a ground voltage) to the control IC 10. The ENABLE electrode 15 transmits an electrical signal for partially or totally enabling or disabling functions of the control IC 10. The SENSE electrode 16 transmits an electrical signal for detecting malfunction of the control IC 10.

A gate control wiring 17 as an example of a control wiring is also formed anywhere on the semiconductor layer 2. The gate control wiring 17 is selectively laid around on the output region 6 and on the input region 7. The gate control wiring 17 is electrically connected to the gate of the power MISFET 9 in the output region 6 and electrically connected to the control IC 10 in the input region 7.

The gate control wiring 17 transmits gate control signals generated by the control IC 10 to the gate of the power MISFET 9. The gate control signals include an ON signal Von and an OFF signal Voff, and control an ON state and an OFF state of the power MISFET 9.

The ON signal Von is not less than a gate threshold voltage Vth of the power MISFET 9 (Vth Von). The OFF signal Voff is less than the gate threshold voltage Vth of the power MISFET 9 (Voff<Vth). The OFF signal Voff may be the reference voltage (for example, the ground voltage).

In this embodiment, the gate control wiring 17 includes a first gate control wiring 17A, a second gate control wiring 17B, and a third gate control wiring 17C. The first gate control wiring 17A, the second gate control wiring 17B, and the third gate control wiring 17C are electrically insulated from each other.

In this embodiment, two first gate control wirings 17A are laid around in different regions. Two second gate control wirings 17B are also laid around in different regions. Further, two third gate control wirings 17C are laid around in different regions.

The first gate control wiring 17A, the second gate control wiring 17B, and the third gate control wiring 17C transmit the same gate control signal or different gate control signals to the gate of the power MISFET 9. The number, the arrangement, and the shape, etc., of the gate control wiring 17 are arbitrary and adjusted in accordance with a transmitted distance of the gate control signals and/or the number of the gate control signals to be transmitted.

The source electrode 12, the input electrode 13, the reference voltage electrode 14, the ENABLE electrode 15, the SENSE electrode 16, and the gate control wiring 17 may each include at least any one of nickel, palladium, aluminum, copper, an aluminum alloy, and a copper alloy.

The source electrode 12, the input electrode 13, the reference voltage electrode 14, the ENABLE electrode 15, the SENSE electrode 16, and the gate control wiring 17 may each include at least any one of an Al—Si—Cu (aluminum-silicon-copper) alloy, an Al—Si (aluminum-silicon) alloy, and an Al—Cu (aluminum-copper) alloy.

The source electrode 12, the input electrode 13, the reference voltage electrode 14, the ENABLE electrode 15, the SENSE electrode 16, and the gate control wiring 17 may include the same type of electrode material or may include an electrode material which is different from each other.

Figure 2:
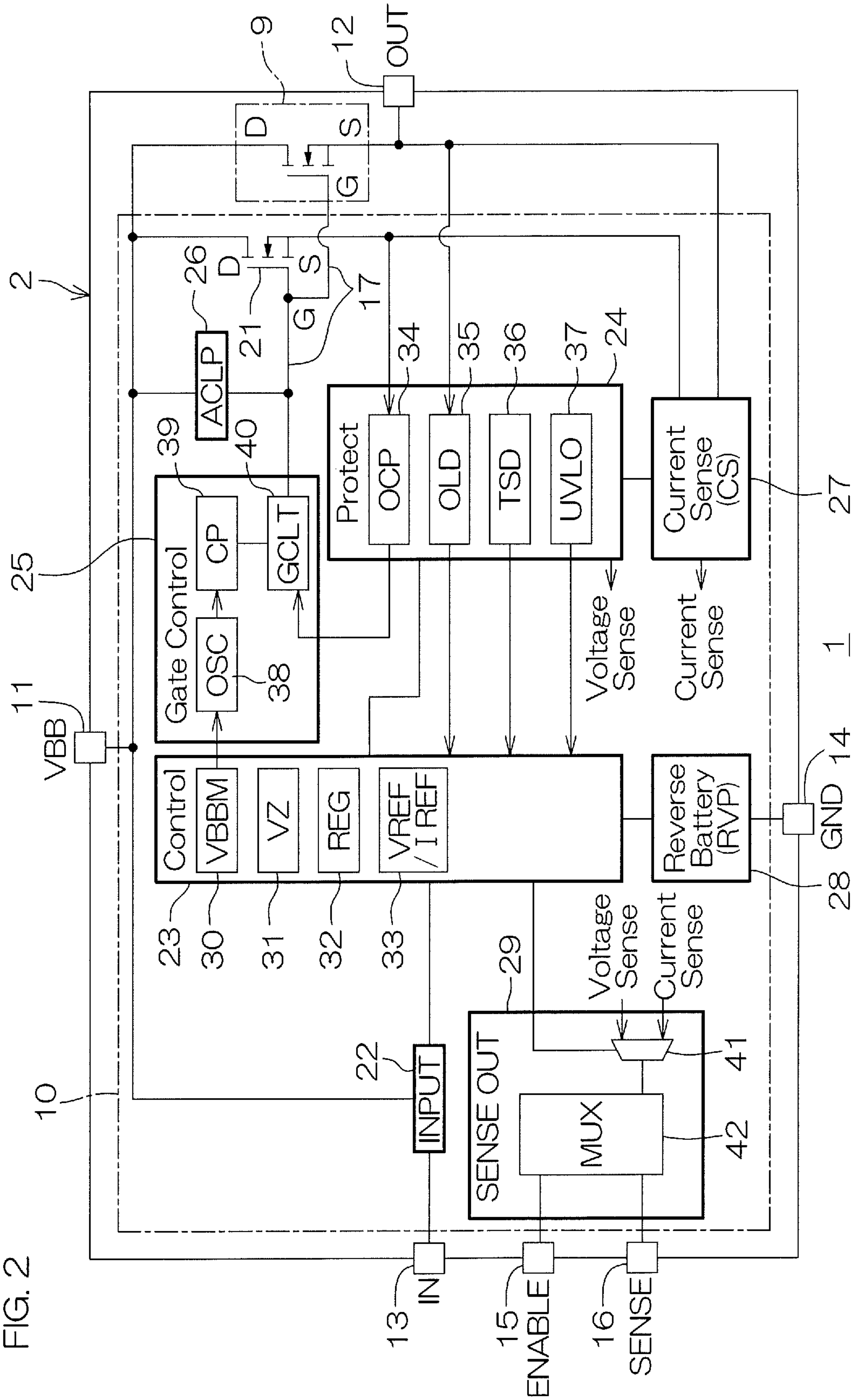
FIG. 2 is a block circuit diagram which shows an electrical configuration of the semiconductor device shown in FIG. 1.

FIG. 2 is a block circuit diagram which shows an electrical configuration of the semiconductor device 1 shown in FIG. 1. Hereinafter, a description will be given of an example in which the semiconductor device 1 is adopted into a vehicle.

The semiconductor device 1 includes a drain electrode 11, a source electrode 12, an input electrode 13, the reference voltage electrode 14, an ENABLE electrode 15, a SENSE electrode 16, a gate control wiring 17, a power MISFET 9, and a control IC 10.

The drain electrode 11 is connected to a power supply. The drain electrode 11 supplies a power supply voltage VB to the power MISFET 9 and the control IC 10. The power supply voltage VB may be from not less than 10 V to not more than 20 V. The source electrode 12 is connected to a load.

The input electrode 13 may be connected to an MCU (Micro Controller Unit), a DC/DC converter, an LDO (Low Drop Out), etc. The input electrode 13 supplies an input voltage to the control IC 10. The input voltage may be from not less than 1 V to not more than 10 V. The reference voltage electrode 14 is connected to the reference voltage wiring. The reference voltage electrode 14 supplies the reference voltage to the power MISFET 9 and the control IC 10.

The ENABLE electrode 15 may be connected to an MCU. An electrical signal partially or totally enabling or disabling functions of the control IC 10 is input to the ENABLE electrode 15. The SENSE electrode 16 may be connected to a resistor.

The gate of the power MISFET 9 is connected to the control IC 10 (a gate control circuit 25 to be described later) through the gate control wiring 17. The drain of the power MISFET 9 is connected to the drain electrode 11. The source of the power MISFET 9 is connected to the control IC 10 (a current detecting circuit 27 to be described later) and the source electrode 12.

The control IC 10 includes a sensor MISFET 21, an input circuit 22, a current-voltage control circuit 23, a protection circuit 24, a gate control circuit 25, an active clamp circuit 26, a current detecting circuit 27, a power-supply reverse connection protection circuit 28, and a malfunction detection circuit 29.

A gate of the sensor MISFET 21 is connected to the gate control circuit 25. A drain of the sensor MISFET 21 is connected to the drain electrode 11. A source of the sensor MISFET 21 is connected to the current detecting circuit 27.

The input circuit 22 is connected to the input electrode 13 and the current-voltage control circuit 23. The input circuit 22 may include a Schmitt trigger circuit. The input circuit 22 shapes a waveform of an electrical signal applied to the input electrode 13. The signal generated by the input circuit 22 is input to the current-voltage control circuit 23.

The current-voltage control circuit 23 is connected to the protection circuit 24, the gate control circuit 25, the power-supply reverse connection protection circuit 28, and the malfunction detection circuit 29. The current-voltage control circuit 23 may include a logic circuit.

The current-voltage control circuit 23 generates various voltages according to an electrical signal from the input circuit 22 and an electrical signal from the protection circuit 24. In this embodiment, the current-voltage control circuit 23 includes a driving voltage generation circuit 30, a first constant voltage generation circuit 31, a second constant voltage generation circuit 32, and the reference voltage-reference current generation circuit 33.

The driving voltage generation circuit 30 generates a driving voltage by which the gate control circuit 25 is driven. The driving voltage may be set at a value obtained by subtracting a predetermined value from the power supply voltage VB. The driving voltage generation circuit 30 may generate a driving voltage of not less than 5 V to not more than 15 V which is obtained by subtracting 5 V from the power supply voltage VB. The driving voltage is input to the gate control circuit 25.

The first constant voltage generation circuit 31 generates a first constant voltage for driving the protection circuit 24. The first constant voltage generation circuit 31 may include a Zener diode and/or a regulator circuit (here, the Zener diode is included). The first constant voltage may be from not less than 1 V to not more than 5 V. The first constant voltage is input to the protection circuit 24 (specifically, a load open detection circuit 35 to be described, etc.).

The second constant voltage generation circuit 32 generates a second constant voltage for driving the protection circuit 24. The second constant voltage generation circuit 32 may include a Zener diode and/or a regulator circuit (here, the regulator circuit). The second constant voltage may be from not less than 1 V to not more than 5 V. The second constant voltage is input to the protection circuit 24 (specifically, an overheat protection circuit 36 and a low-voltage malfunction suppression circuit 37 which are to be described later).

The reference voltage-reference current generation circuit 33 generates the reference voltage and a reference current of various types of circuits. The reference voltage may be from not less than 1 V to not more than 5 V. The reference current may be from not less than 1 mA to not more than 1 A. The reference voltage and the reference current are input to various types of circuits. In a case where various types of circuits include a comparator, the reference voltage and the reference current may be input to the comparator.

The protection circuit 24 is connected to the current-voltage control circuit 23, the gate control circuit 25, the malfunction detection circuit 29, the source of the power MISFET 9, and the source of the sensor MISFET 21. The protection circuit includes an overcurrent protection circuit 34, a load open detection circuit 35, an overheat protection circuit 36, and a low-voltage malfunction suppression circuit 37.

The overcurrent protection circuit 34 protects the power MISFET 9 from an overcurrent. The overcurrent protection circuit 34 is connected to the gate control circuit 25 and the source of the sensor MISFET 21. The overcurrent protection circuit 34 may include a current monitor circuit. A signal generated by the overcurrent protection circuit 34 is input to the gate control circuit 25 (specifically, a driving signal output circuit 40 to be described later).

The load open detection circuit 35 detects a load short state or a load open state. The load open detection circuit 35 is connected to the current-voltage control circuit 23 and the source of the power MISFET 9. A signal generated by the load open detection circuit 35 is input to the current-voltage control circuit 23.

The overheat protection circuit 36 monitors a temperature of the power MISFET 9 to protect the power MISFET 9 from an excessive temperature rise. The overheat protection circuit 36 is connected to the current-voltage control circuit 23. The overheat protection circuit 36 may include a temperature sensitive device such as a diode and a thermistor. A signal generated by the overheat protection circuit 36 is input to the current-voltage control circuit 23.

The low-voltage malfunction suppression circuit 37 suppresses malfunction of the power MISFET 9 in a case where the power supply voltage VB is less than a predetermined value. The low-voltage malfunction suppression circuit 37 is connected to the current-voltage control circuit 23. A signal generated by the low-voltage malfunction suppression circuit 37 is input to the current-voltage control circuit 23.

The gate control circuit 25 controls an ON state and an OFF state of the power MISFET 9 as well as an ON state and an OFF state of the sensor MISFET 21. The gate control circuit 25 is connected to the current-voltage control circuit 23, the protection circuit 24, the gate of the power MISFET 9, and the gate of the sensor MISFET 21.

The gate control circuit 25 generates plural types of gate control signals in accordance with the number of the gate control wirings 17 in response to an electrical signal from the current-voltage control circuit 23 and an electrical signal from the protection circuit 24. The plural types of gate control signals are each input to the gate of the power MISFET 9 and the gate of the sensor MISFET 21 through the gate control wiring 17.

The gate control circuit 25 may include an oscillation circuit 38, a charge pump circuit 39, and a driving signal output circuit 40. The oscillation circuit 38 oscillates in response to the electrical signal from the current-voltage control circuit 23 to generate a predetermined electrical signal. The electrical signal generated by the oscillation circuit 38 is input to the charge pump circuit 39. The charge pump circuit 39 boosts the electrical signal sent from the oscillation circuit 38. The electrical signal which is boosted by the charge pump circuit 39 is input to the driving signal output circuit 40.

The driving signal output circuit 40 generates plural types of gate control signals in response to the electrical signal from the charge pump circuit 39 and the electrical signal from the protection circuit 24 (specifically, the overcurrent protection circuit 34). The plural types of gate control signals are input to the gate of the power MISFET 9 and the gate of the sensor MISFET 21 through the gate control wiring 17. The sensor MISFET 21 and the power MISFET 9 are controlled at the same time by the gate control circuit 25.

The active clamp circuit 26 protects the power MISFET 9 from a counter electromotive force. The active clamp circuit 26 is connected to the drain electrode 11, the gate of the power MISFET 9, and the gate of the sensor MISFET 21. The active clamp circuit 26 may include a plurality of diodes.

The active clamp circuit 26 may include a plurality of diodes which are connected to each other in a biased manner. The active clamp circuit 26 may include a plurality of diodes which are connected to each other in a reverse-biased manner. The active clamp circuit 26 may include a plurality of diodes which are connected to each other in a biased manner and a plurality of diodes which are connected to each other in a reverse-biased manner.

The plurality of diodes may include a pn junction diode or a Zener diode, or a pn junction diode and a Zener diode. The active clamp circuit 26 may include a plurality of Zener diodes which are connected to each other in a biased manner. The active clamp circuit 26 may include a Zener diode and a pn junction diode which are connected to each other in a reverse-biased manner. The current detecting circuit 27 detects a current which flows through the power MISFET 9 and the sensor MISFET 21. The current detecting circuit 27 is connected to the protection circuit 24, the malfunction detection circuit 29, the source of the power MISFET 9, and the source of the sensor MISFET 21. The current detecting circuit 27 generates a current detection signal in response to an electrical signal generated by the power MISFET 9 and an electrical signal generated by the sensor MISFET 21. The current detection signal is input to the malfunction detection circuit 29.

The power-supply reverse connection protection circuit 28 protects the current-voltage control circuit 23, the power MISFET 9, etc., from a reverse voltage when a power supply is connected reversely. The power-supply reverse connection protection circuit is connected to the reference voltage electrode 14 and the current-voltage control circuit 23.

The malfunction detection circuit 29 monitors a voltage of the protection circuit 24. The malfunction detection circuit 29 is connected to the current-voltage control circuit 23, the protection circuit 24, and the current detecting circuit 27. In a case where malfunction (change in voltage, etc.) occurs in any of the overcurrent protection circuit 34, the load open detection circuit 35, the overheat protection circuit 36, and the low-voltage malfunction suppression circuit 37, the malfunction detection circuit 29 generates and outputs to the outside a malfunction detecting signal in accordance with a voltage of the protection circuit 24.

Specifically, the malfunction detection circuit 29 includes a first multiplexer circuit 41 and a second multiplexer circuit 42. The first multiplexer circuit 41 includes two input portions, one output portion, and one selection control input portion. The protection circuit 24 and the current detecting circuit 27 are each connected to the input portions of the first multiplexer circuit 41. The second multiplexer circuit 42 is connected to the output portion of the first multiplexer circuit 41. The current-voltage control circuit 23 is connected to the selection control input portion of the first multiplexer circuit 41.

The first multiplexer circuit 41 generates a malfunction detecting signal in response to an electrical signal from the current-voltage control circuit 23, a voltage detecting signal from the protection circuit 24, and a current detection signal from the current detecting circuit 27. The malfunction detecting signal generated by the first multiplexer circuit 41 is input to the second multiplexer circuit 42.

The second multiplexer circuit 42 includes two input portions and one output portion. The output portion of the second multiplexer circuit 42 and the ENABLE electrode 15 are each connected to the input portions of the second multiplexer circuit 42. The SENSE electrode 16 is connected to the output portion of the second multiplexer circuit 42.

In a case where the MCU is connected to the ENABLE electrode 15 and the resistor is connected to the SENSE electrode 16, an ON signal is input from the MCU to the ENABLE electrode 15 and a malfunction detecting signal is taken out from the SENSE electrode 16. The malfunction detecting signal is converted to an electrical signal by the resistor connected to the SENSE electrode 16. A malfunction state of the semiconductor device 1 is detected based in the electrical signal.

Figure 3:
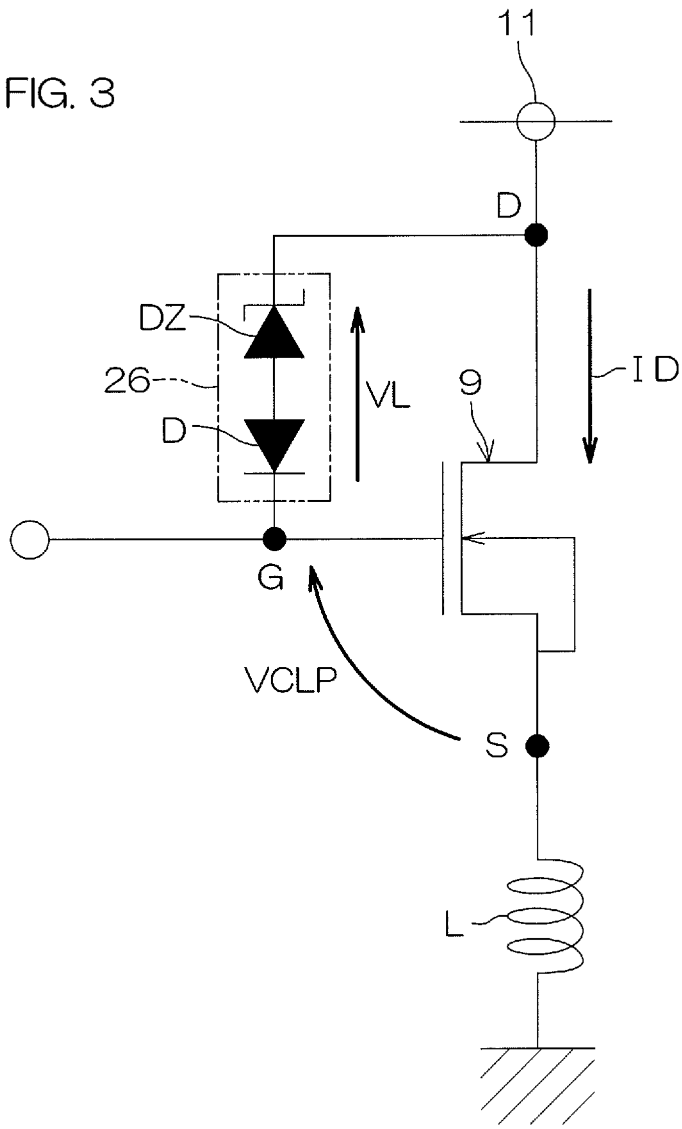
FIG. 3 is a circuit diagram for describing a normal operation and an active clamp operation of the semiconductor device shown in FIG. 1.
Figure 4:
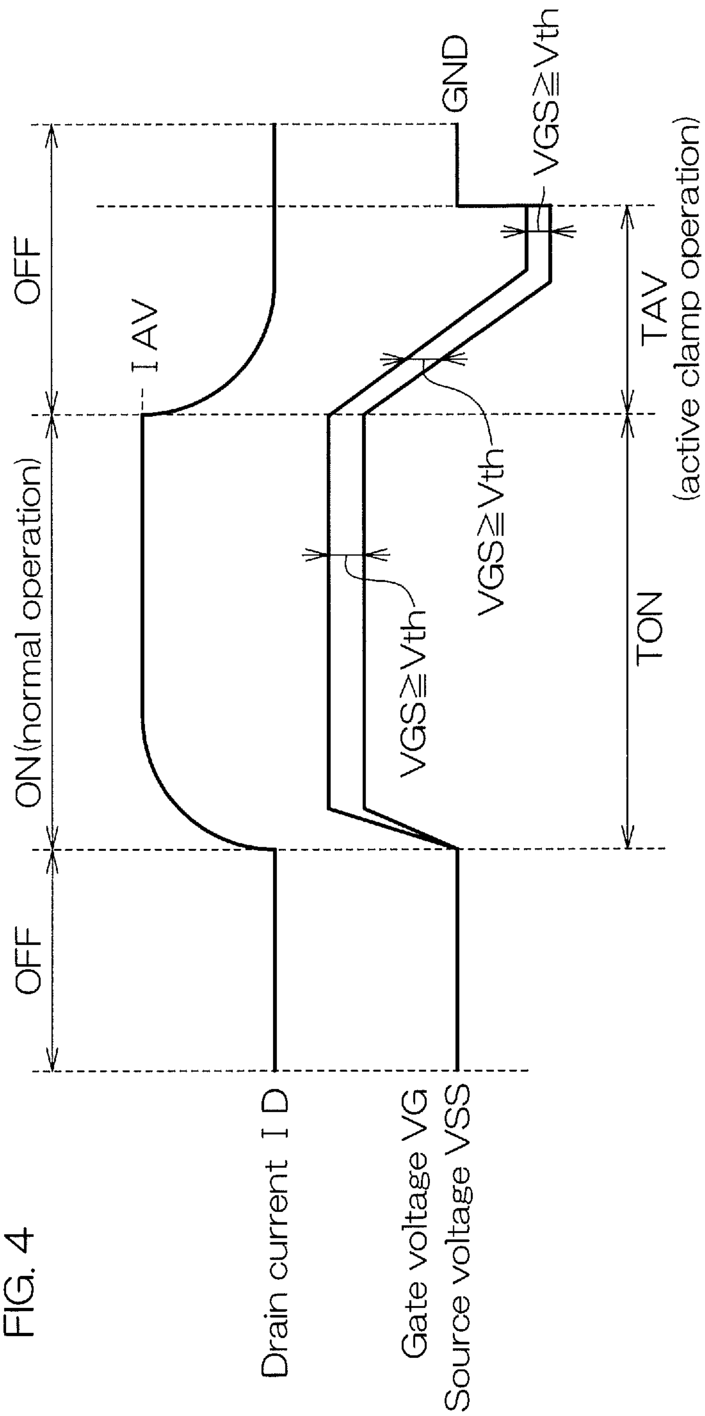
FIG. 4 is a waveform chart of a main electrical signal applied to the circuit diagram shown in FIG. 3.

FIG. 3 is a circuit diagram for describing active clamp operation of the semiconductor device 1 shown in FIG. 1. FIG. 4 is a waveform chart of a main electrical signal of the circuit diagram shown in FIG. 3.

Here, a circuit example in which an inductive load L is connected to the power MISFET 9 is used to describe a normal operation and an active clamp operation of the semiconductor device 1. A device which uses a winding (coil) such as a solenoid, a motor, a transformer, a relay, etc., is shown as an example of the inductive load L. The inductive load L is also called an L load.

With reference to FIG. 3, the source of the power MISFET 9 is electrically connected to the inductive load L. The drain of the power MISFET 9 is electrically connected to the drain electrode 11. The gate and the drain of the power MISFET 9 are connected to the active clamp circuit 26. In this circuit example, the active clamp circuit 26 includes the m number (m is a natural number) of Zener diodes DZ and the n number (n is a natural number) of pn junction diodes D. The pn junction diode D is connected to the Zener diode DZ in a reverse-biased manner.

With reference to FIG. 3 and FIG. 4, when an ON signal Von is input to the gate of the power MISFET 9 in an OFF state, the power MISFET 9 is switched from the OFF state to an ON state (a normal operation). The ON signal Von has a voltage equal to or larger than the gate threshold voltage Vth (Vth Von). The power MISFET 9 is kept in the ON state only for a predetermined in time TON.

When the power MISFET 9 is switched to the ON state, a drain current ID starts to flow from the drain of the power MISFET 9 to the source. The drain current ID increases from zero to a predetermined value and saturates. The inductive load L allows an inductive energy to accumulate due to an increase in the drain current ID.

When an OFF signal Voff is input to the gate of the power MISFET 9, the power MISFET 9 is switched from the ON state to the OFF state. The OFF signal Voff has a voltage less than the gate threshold voltage Vth (Voff<Vth). The OFF signal Voff may be the reference voltage (for example, the ground voltage).

In transition when the power MISFET 9 is switched from the ON state to the OFF state, an inductive energy of the inductive load L is applied as a counter electromotive force to the power MISFET 9. Thereby, the power MISFET 9 is shifted to an active clamp state (an active clamp operation). When the power MISFET 9 is shifted to the active clamp state, a source voltage VSS sharply lowers to a negative voltage less than the reference voltage (ground voltage).

At this time, the source voltage VSS is limited to a voltage equal to or more than a voltage obtained by subtracting a limit voltage VL and a clamp ON voltage VCLP from a power supply voltage VB due to operation of the active clamp circuit 26 (VSS VB-VL-VCLP).

In other words, when the power MISFET 9 is shifted to an active clamp state, a drain voltage VDS between the drain and the source of the power MISFET 9 sharply rises to a clamp voltage VDSSCL. The clamp voltage VDSSCL is limited to a voltage equal to or less than a voltage obtained by adding a clamp ON voltage VCLP and a limit voltage VL (VDS≤VCLP+VL) by the power MISFET 9 and the active clamp circuit 26.

In this embodiment, the limit voltage VL is a sum of a voltage between terminals VZ of a Zener diode DZ and a voltage between terminals VF of a pn junction diode in the active clamp circuit 26 (VL=m·VZ+n·VF).

The clamp ON voltage VCLP is a positive voltage (that is, a gate voltage VGS) applied between the gate and the source of the power MISFET 9. The clamp ON voltage VCLP is equal to or more than the gate threshold voltage Vth (Vth≤VCLP). Therefore, the power MISFET 9 keeps the ON state in an active clamp state.

In a case where the clamp voltage VDSSCL exceeds a maximum rated drain voltage VDSS (VDSS<VDSSCL), the power MISFET 9 reaches breakdown. The power MISFET 9 is designed such that the clamp voltage VDSSCL becomes equal to or less than the maximum rated drain voltage VDSS (VDSSCL≤VDSS).

In a case where the clamp voltage VDSSCL is equal to or less than the maximum rated drain voltage VDSS (VDSSCL VDSS), a drain current ID continuously flows from the drain of the power MISFET 9 to the source thereof, and an inductive energy of the inductive load L is consumed (absorbed) in the power MISFET 9.

Through an active clamp time TAV, the drain current ID is reduced to zero from a peak value IAV which is immediately before the power MISFET 9 becomes the OFF state. Thereby, the gate voltage VGS becomes the reference voltage (for example, the ground voltage) and the power MISFET 9 is switched from the ON state to the OFF state.

The active clamp capability Eac of the power MISFET 9 is defined by the capability of the power MISFET 9 in the active clamp operation. Specifically, the active clamp capability Eac is defined by the capability of the power MISFET 9 with respect to the counter electromotive force caused by the inductive energy of the inductive load L in transition when the power MISFET 9 is switched from the ON state to the OFF state.

More specifically, the active clamp capability Eac is defined by the capability of the power MISFET 9 with respect to the energy caused by the clamp voltage VDSSCL. For example, the active clamp capability Eac is expressed by a formula of Eac=(VL+VCLP)×ID×TAV by using the limit voltage VL, the clamp ON voltage VCLP, the drain current ID, and the active clamp time TAV.

Figure 5:
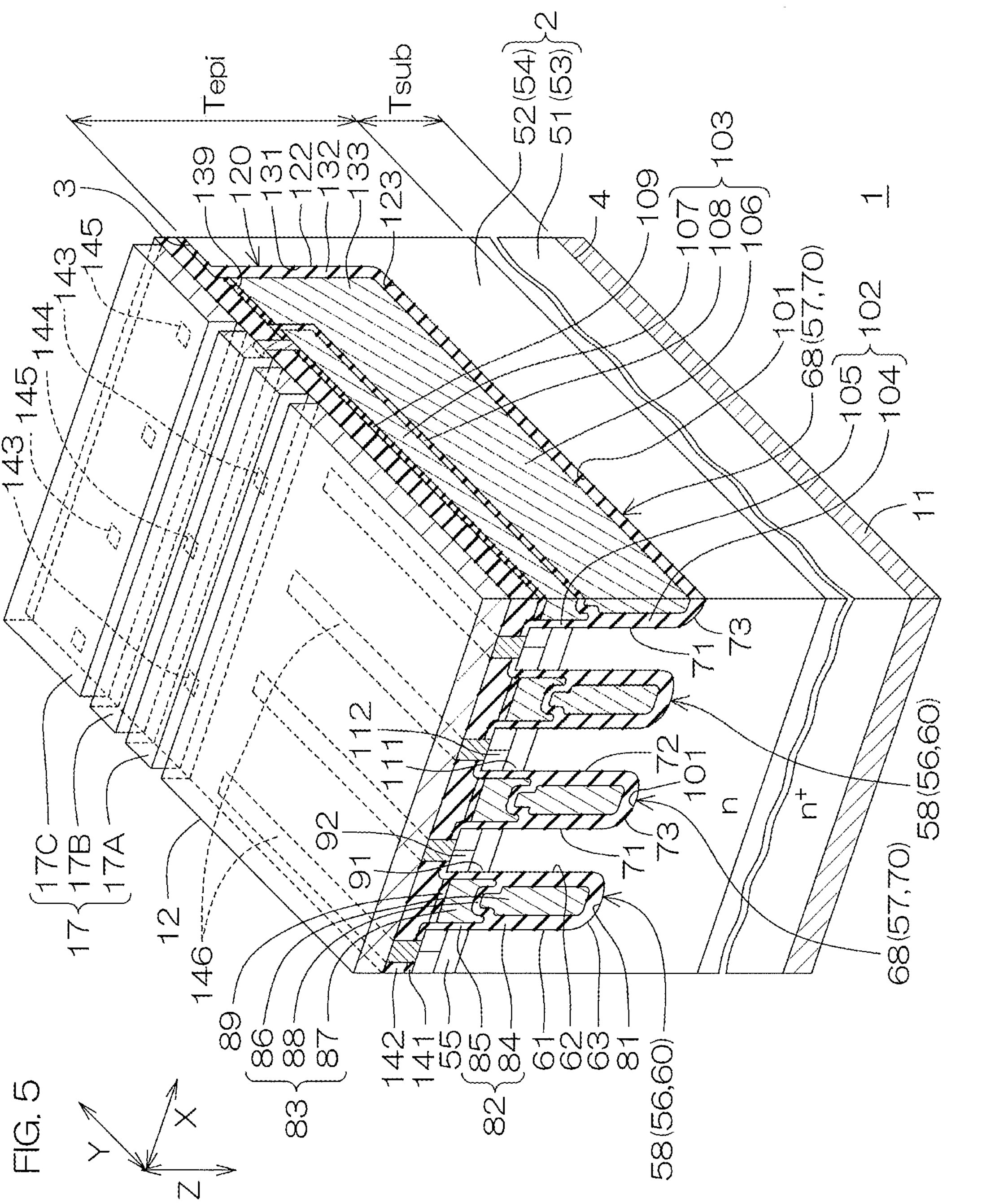
FIG. 5 is a sectional perspective view of a region V shown in FIG. 1.
Figure 6:
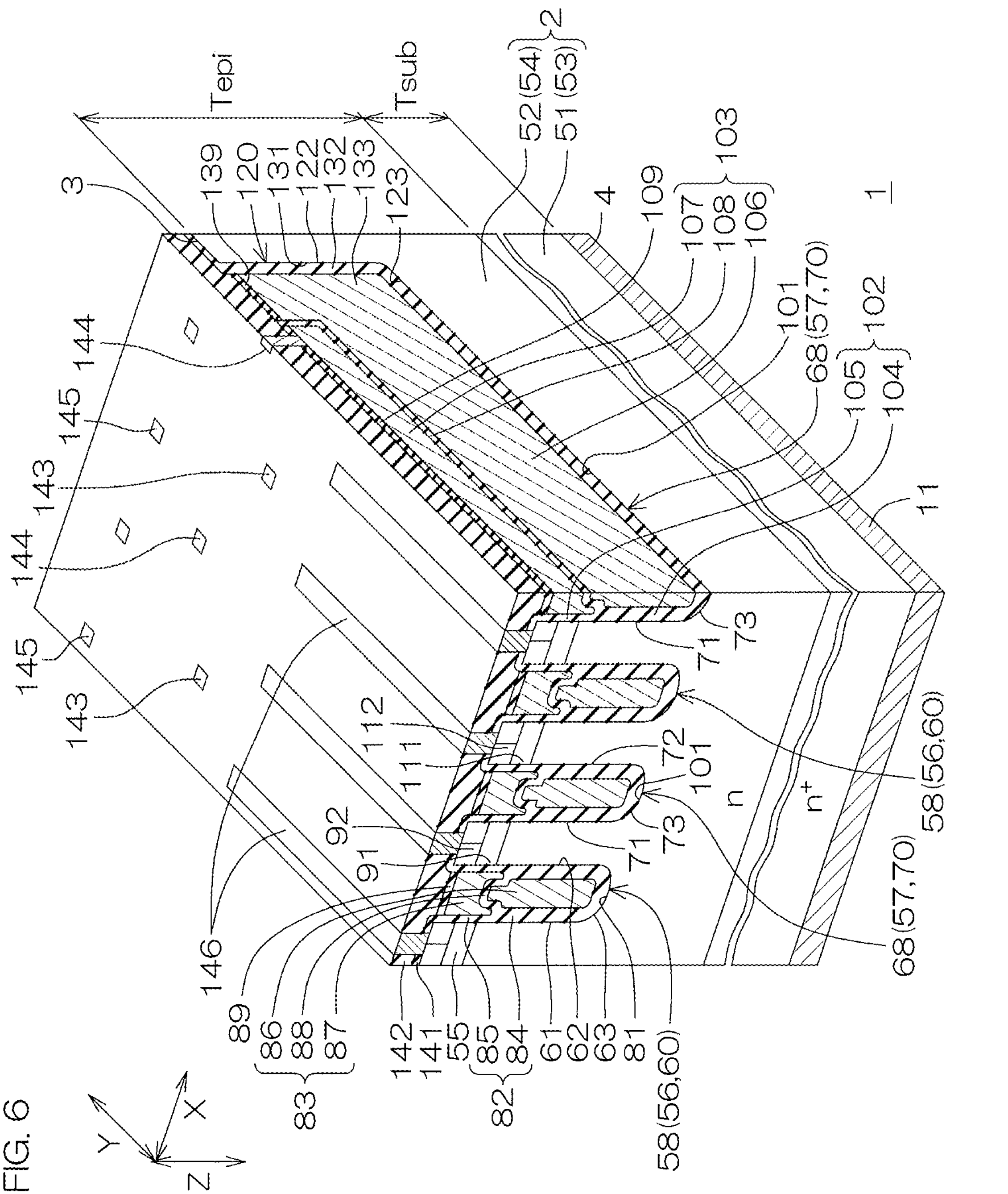
FIG. 6 is a sectional perspective view in which an electrode is removed from FIG. 5.
Figure 7:
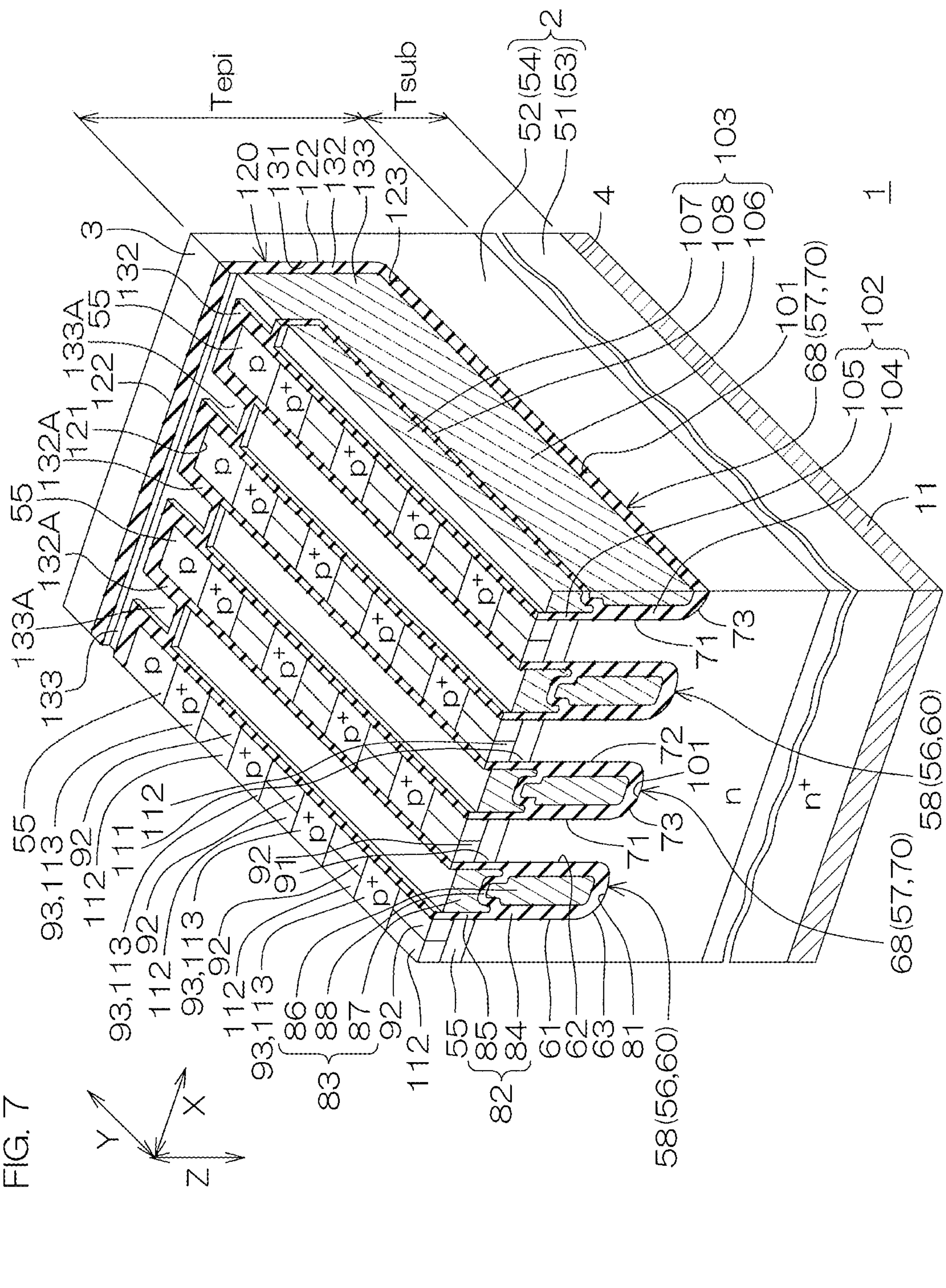
FIG. 7 is a sectional perspective view in which structures on a semiconductor layer are removed from FIG. 6 and is a sectional perspective view which shows a channel structure according to a first configuration example.

FIG. 5 is a sectional perspective view of a region V shown in FIG. 1. FIG. 6 is a sectional perspective view in which the source electrode 12 and the gate control wiring 17 are removed from FIG. 5. FIG. 7 is a sectional perspective view in which an interlayer insulation layer 142 is removed from FIG. 6 and is a sectional perspective view which shows a configuration of the channel structure according to the first configuration example.

Figure 8:
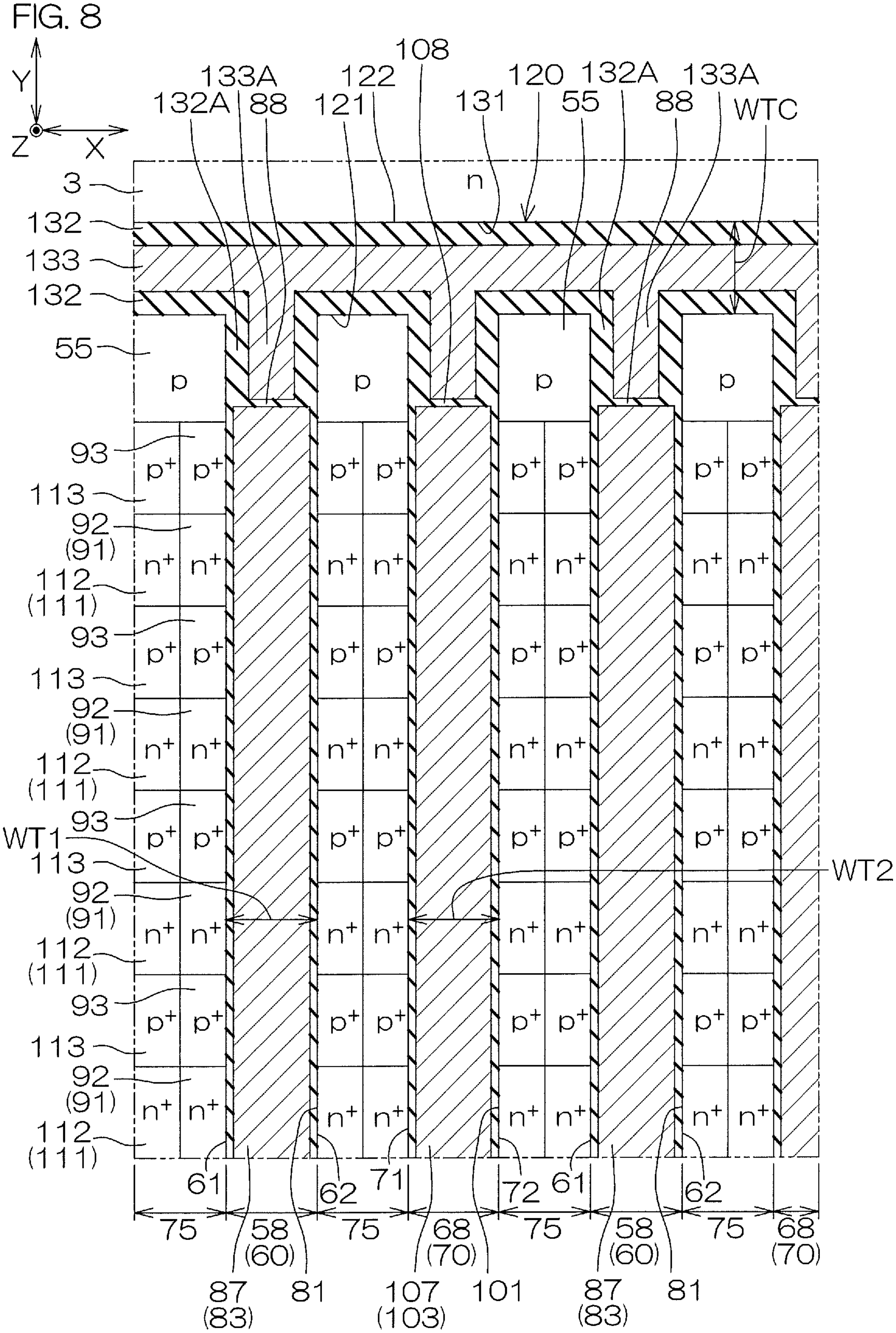
FIG. 8 is a plan view of the semiconductor layer shown in FIG. 7.
Figure 9:
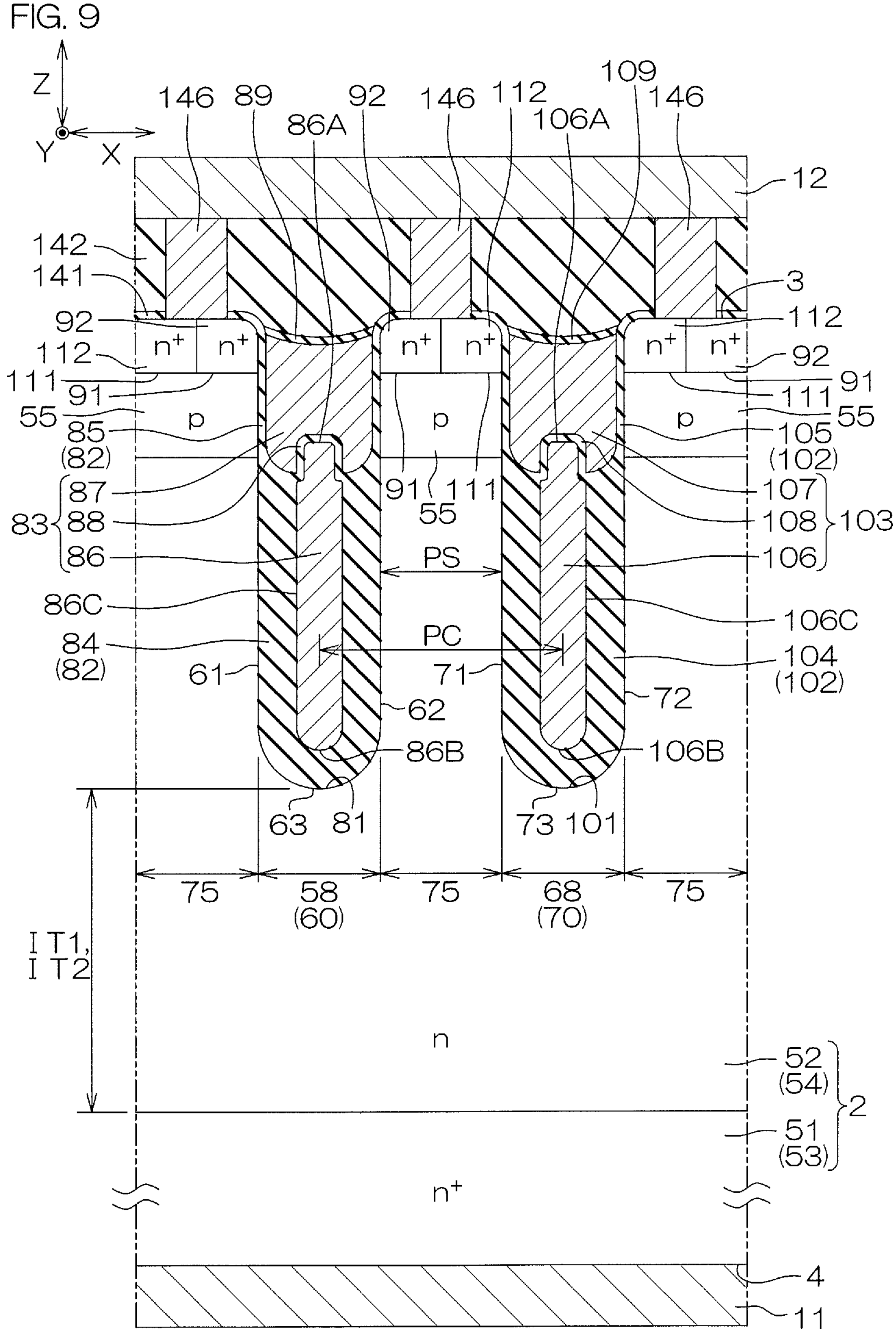
FIG. 9 is an enlarged sectional view of a region which includes a first trench gate structure and a second trench gate structure shown in FIG. 5.
Figure 10:
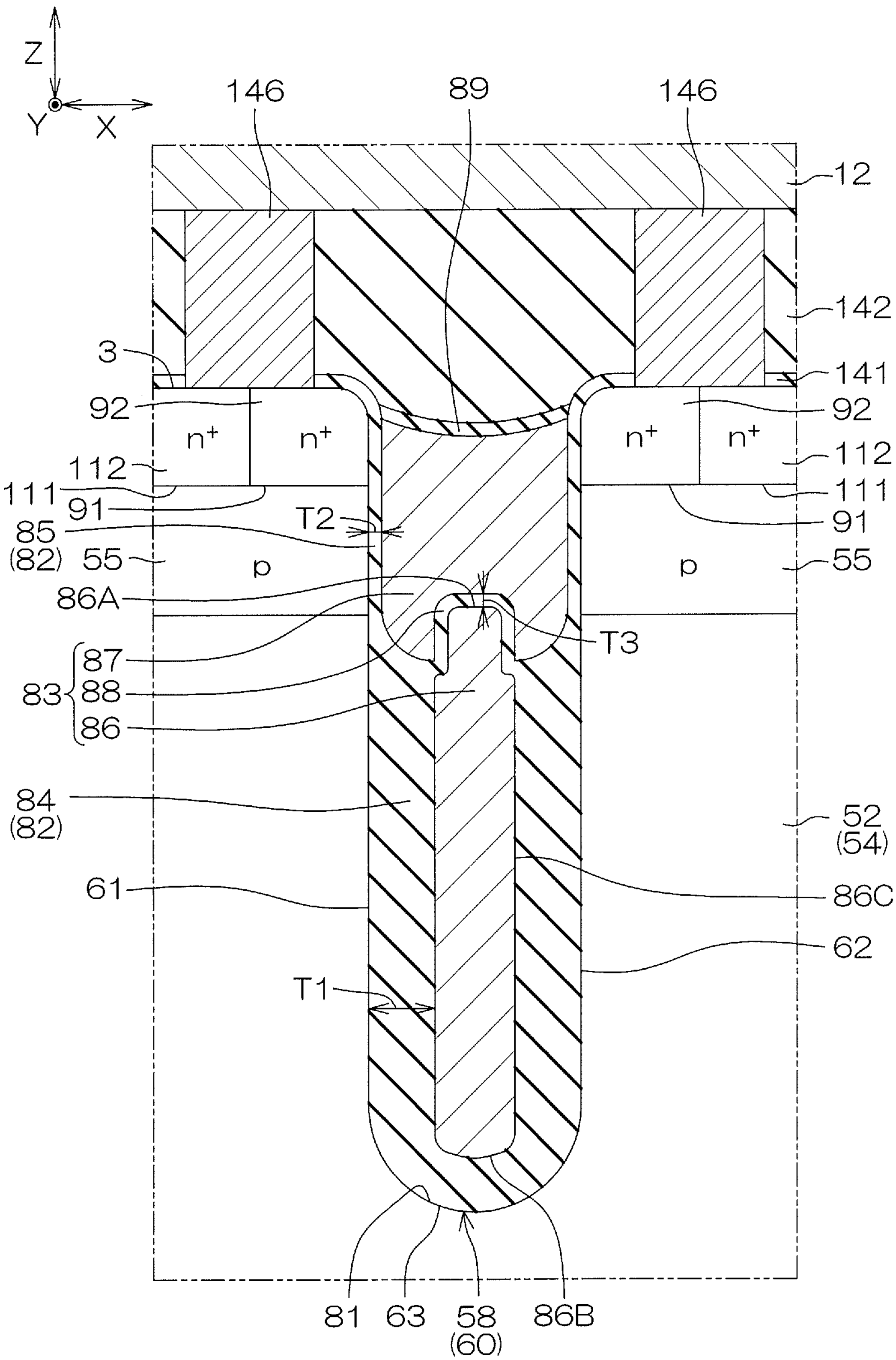
FIG. 10 is an enlarged sectional view of the first trench gate structure shown in FIG. 5.
Figure 11:
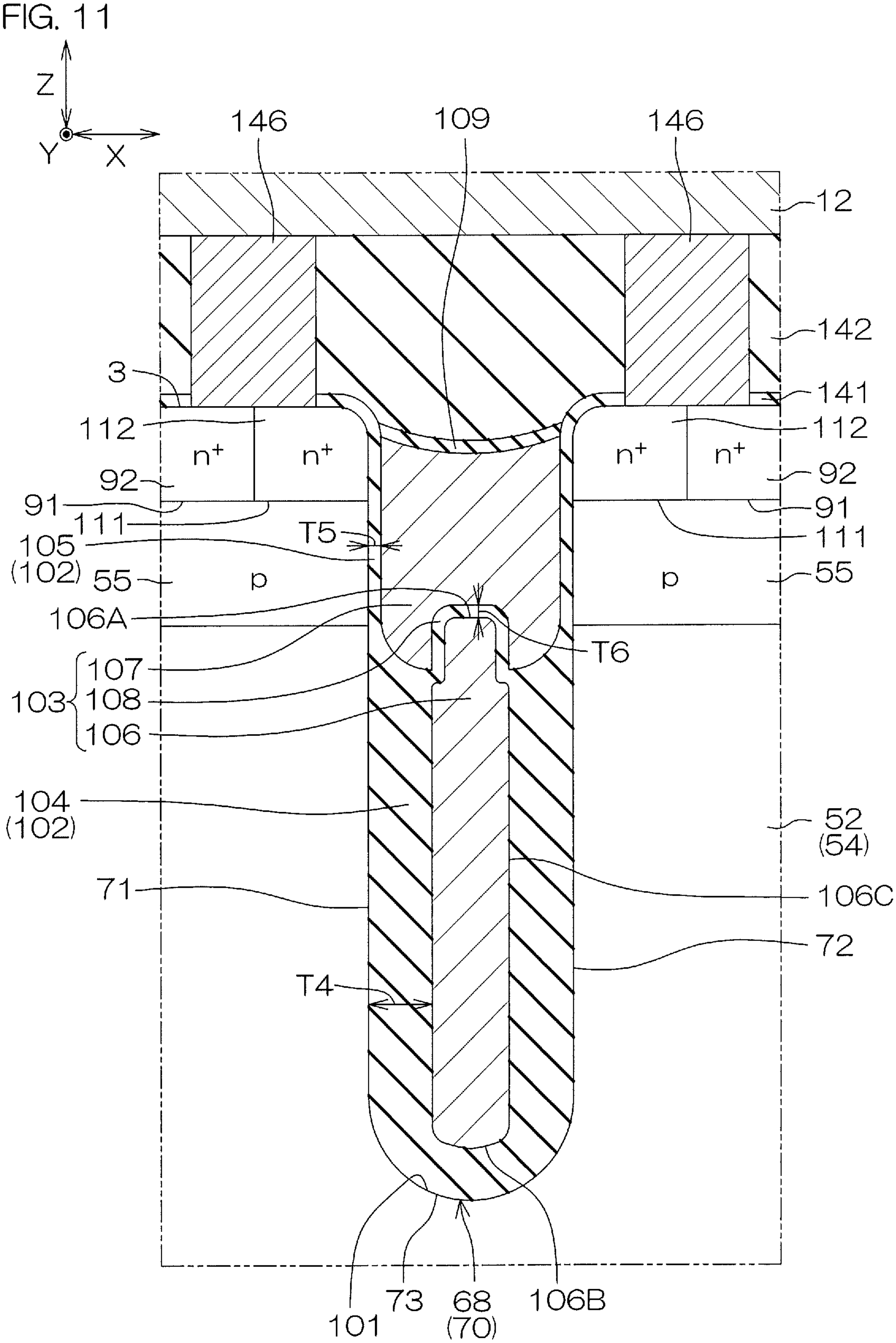
FIG. 11 is an enlarged sectional view of the second trench gate structure shown in FIG. 5

FIG. 8 is a plan view of the semiconductor layer 2 shown in FIG. 7. FIG. 9 is an enlarged sectional view of a region which includes a first trench gate structure 60 (first gate structure) and a second trench gate structure 70 (second gate structure) shown in FIG. 5. FIG. 10 is an enlarged sectional view of the first trench gate structure 60 shown in FIG. 5. FIG. 11 is an enlarged sectional view of the second trench gate structure 70 shown in FIG. 5.

With reference to FIG. 5 to FIG. 11, in this embodiment, the semiconductor layer 2 has a laminated structure including an $n^+$-type semiconductor substrate 51 and an n-type epitaxial layer 52. The second main surface 4 of the semiconductor layer 2 is formed by the semiconductor substrate 51. The first main surface 3 of the semiconductor layer 2 is formed by the epitaxial layer 52. The side surfaces 5A to 5D of the semiconductor layer 2 are formed by the semiconductor substrate 51 and the epitaxial layer 52.

The epitaxial layer 52 has an n-type impurity concentration less than an n-type impurity concentration of the semiconductor substrate 51. The n-type impurity concentration of the semiconductor substrate 51 may be from not less than $1\times10^{18}$ $cm^{-3}$ to not more than $1\times10^{20}$ $cm^{-3}$. The n-type impurity concentration of the epitaxial layer 52 may be from not less than $1\times10^{15}$ $cm^{-3}$ to not more than $1\times10^{18}$ $cm^{-3}$.

The epitaxial layer 52 has a thickness Tepi less than a thickness Tsub of the semiconductor substrate 51 (Tepi<Tsub). The thickness Tsub may be from not less than 50 μm to not more than 450 μm. The thickness Tsub may be from not less than 50 μm to not more than 150 μm, from not less than 150 μm to not more than 250 μm, from not less than 250 μm to not more than 350 μm, or from not less than 350 μm to not more than 450 μm.

By reducing the thickness Tsub, it becomes possible to reduce a resistance value. The thickness Tsub is adjusted by grinding. In this case, the second main surface 4 of the semiconductor layer 2 may be a ground surface having a grinding mark.

The thickness Tepi of the epitaxial layer 52 is preferably not more than 1/10 of the thickness Tsub. The thickness Tepi may be from not less than 5 μm to not more than 20 μm. The thickness Tepi may be from not less than 5 μm to not more than 10 μm, from not less than 10 μm to not more than 15 μm, or from not less than 15 μm to not more than 20 μm. The thickness Tepi is preferably from not less than 5 μm to not more than 15 μm.

The semiconductor substrate 51 is formed in the second main surface 4 side of the semiconductor layer 2 as a drain region 53. The epitaxial layer 52 is formed in a surface layer portion of the first main surface 3 of the semiconductor layer 2 as a drift region 54 (drain drift region). A bottom portion of the drift region 54 is formed by a boundary between the semiconductor substrate 51 and the epitaxial layer 52. Hereinafter, the epitaxial layer 52 is referred to as the drift region 54.

A p-type body region 55 is formed in a surface layer portion of the first main surface 3 of the semiconductor layer 2 in the output region 6. The body region 55 is a region which serves as a base of the power MISFET 9. A p-type impurity concentration of the body region 55 may be from not less than $1\times10^{16}$ $cm^{-3}$ to not more than $1\times10^{18}$ $cm^{-3}$.

The body region 55 is formed in a surface layer portion of the drift region 54. A bottom portion of the body region 55 is formed in a region in the first main surface 3 side with respect to the bottom portion of the drift region 54. A thickness of the body region 55 may be from not less than 0.5 μm to not more than 2 μm. The thickness of the body region 55 may be from not less than 0.5 μm to not more than 1 μm, from not less than 1 μm to not more than 1.5 μm, or from not less than 1.5 μm to not more than 2 μm.

The power MISFET 9 includes a first MISFET 56 (first transistor) and a second MISFET 57 (second transistor). The first MISFET 56 is electrically separated from the second MISFET 57 and controlled independently. The second MISFET 57 is electrically separated from the first MISFET 56 and controlled independently.

That is, the power MISFET 9 is configured such as to be driven when the first MISFET 56 and the second MISFET 57 are both in ON states (Full-ON control). The power MISFET 9 is also configured such as to be driven when the first MISFET 56 is in an ON state while the second MISFET 57 is in an OFF state (first Half-ON control). Further, the power MISFET 9 is configured such as to be driven when the first MISFET 56 is in an OFF state while the second MISFET 57 is in an ON state (second Half-ON control).

In the case of Full-ON control, the power MISFET 9 is driven in a state where all current paths are opened. Therefore, an ON resistance inside the semiconductor layer 2 is relatively reduced. On the other hand, in the case of first Half-ON control or second Half-ON control, the power MISFET 9 is driven in a state where some of the current paths are blocked. Therefore, the ON resistance inside the semiconductor layer 2 is relatively increased.

Specifically, the first MISFET 56 includes a plurality of first FET (Field Effect Transistor) structures 58. The plurality of first FET structures 58 are arrayed at intervals along the first direction X, and extend in a band shape along the second direction Y, respectively, in plan view. The plurality of first FET structures 58 are formed in a stripe shape as a whole in plan view.

In FIG. 5 to FIG. 8, a region of the first FET structure 58 at one end portion side is shown, while a region of the first FET structure 58 at the other end portion side is omitted. The region of the first FET structure 58 at the other end portion side is substantially similar in structure to the region of the first FET structure 58 at one end portion side. Hereinafter, the structure of the region of the first FET structure 58 at one end portion side is described as an example, and a description of the structure of the region of the first FET structure 58 at the other end portion side shall be omitted.

In this embodiment, each of the first FET structures 58 includes a first trench gate structure 60. A first width WT1 of the first trench gate structure 60 may be from not less than 0.5 μm to not more than 5 μm. The first width WT1 is a width in a direction (first direction X) orthogonal to a direction (second direction Y) in which the first trench gate structure 60 extends.

The first width WT1 may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The first width WT1 is preferably from not less than 0.8 μm to not more than 1.2 μm.

The first trench gate structure 60 penetrates through the body region 55 and reaches the drift region 54. A first depth DT1 of the first trench gate structure 60 may be from not less than 1 μm to not more than 10 μm. The first depth DT1 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The first depth DT1 is preferably from not less than 2 μm to not more than 6 μm.

The first trench gate structure 60 includes a first side wall 61 on one side, a second side wall 62 on the other side, and a bottom wall 63 which connects the first side wall 61 and the second side wall 62. Hereinafter, the first side wall 61, the second side wall 62, and the bottom wall 63 may be collectively referred to as "an inner wall" or "an outer wall."

An absolute value of an angle (taper angel) formed between the first side wall 61 and the first main surface 3 inside the semiconductor layer 2 may be in excess of 90° and not more than 95° (for example, approximately 91°). The absolute value of an angle (taper angel) formed between the second side wall 62 and the first main surface 3 inside the semiconductor layer 2 may be in excess of 90° and not more than 95° (for example, approximately) 91°. The first trench gate structure 60 may be formed in a shape (tapered shape) that the first width WT1 is made narrow from the first main surface 3 side to the bottom wall 63 side in sectional view.

The bottom wall 63 of the first trench gate structure 60 is positioned in a region at the first main surface 3 side with respect to the bottom portion of the drift region 54. The bottom wall 63 of the first trench gate structure 60 is formed in a convex curved shape (U letter shape) toward the bottom portion of the drift region 54.

The bottom wall 63 of the first trench gate structure 60 is positioned in a region at the first main surface 3 side with a first interval IT1 of not less than 1 μm to not more than 10 μm from the bottom portion of the drift region 54. The first interval IT1 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The first interval IT1 is preferably from not less than 1 μm to not more than 5 μm.

In this embodiment, the second MISFET 57 includes a plurality of second FET structures 68. The plurality of second FET structures 68 are arrayed at intervals along the first direction X, and extend in a band shape along the second direction Y, respectively, in plan view.

The plurality of second FET structures 68 extend along the same direction as the plurality of first FET structures 58. The plurality of second FET structures 68 are formed in a stripe shape as a whole in plan view. In this embodiment, the plurality of second FET structures 68 are arrayed alternately with the plurality of first FET structures 58 in a manner that one first FET structure 58 is held therebetween.

In FIG. 5 to FIG. 8, a region of the second FET structure 68 at one end portion side is shown in the drawing, while a region of the second FET structure 68 at the other end portion side is omitted. The region of the second FET structure 68 at the other end portion side is substantially similar in structure to the region of the second FET structure 68 t one end portion side. Hereinafter, the structure of the region of the second FET structure 68 at one end portion side is described as an example, and a description of the structure of the region of the second FET structure 68 at the other end portion side shall be omitted.

In this embodiment, each of the second FET structures 68 includes a second trench gate structure 70. A second width WT2 of the second trench gate structure 70 may be from not less than 0.5 μm to not more than 5 μm. The second width WT2 is a width in a direction (first direction X) orthogonal to a direction (second direction Y) in which the second trench gate structure 70 extends.

The second width WT2 may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The second width WT2 is preferably from not less than 0.8 μm to not more than 1.2 μm.

The second width WT2 of the second trench gate structure 70 may be equal to or more than the first width WT1 of the first trench gate structure 60 (WT1≤WT2). The second width WT2 may be equal to or less than the first width WT1 (WT1≥WT2). It is preferable that the second width WT2 is equal to the first width WT1 (WT1=WT2).

The second trench gate structure 70 penetrates through the body region 55 and reaches the drift region 54. A second depth DT2 of the second trench gate structure 70 may be from not less than 1 μm to not more than 10 μm. The second depth DT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second depth DT2 is preferably from not less than 2 μm to not more than 6 μm.

The second depth DT2 of the second trench gate structure 70 may be equal to or more than the first depth DT1 of the first trench gate structure 60 (DT1≤DT2). The second depth DT2 may be equal to or less than the first depth DT1 (DT1≥DT2). It is preferable that the second depth DT2 is equal to the first depth DT1 (DT1=DT2).

The second trench gate structure 70 includes a first side wall 71 on one side, a second side wall 72 on the other side, and a bottom wall 73 which connects the first side wall 71 and the second side wall 72. Hereinafter, the first side wall 71, the second side wall 72, and the bottom wall 73 may be collectively referred to as "an inner wall" or "an outer wall."

An absolute value of an angle (taper angel) formed between the first side wall 71 and the first main surface 3 inside the semiconductor layer 2 may be in excess of 90° and not more than 95° (for example, approximately 91°). The absolute value of an angle (taper angel) formed between the second side wall 72 and the first main surface 3 inside the semiconductor layer 2 may be in excess of 90° and not more than 95° (for example, approximately) 91°. The second trench gate structure 70 may be formed in a shape (tapered shape) that the second width WT2 is made narrow from the first main surface 3 side to the bottom wall 73 side in sectional view.

The bottom wall 73 of the second trench gate structure 70 is positioned in a region at the first main surface 3 side with respect to the bottom portion of the drift region 54. The bottom wall 73 of the second trench gate structure 70 is formed in a convex curved shape (U letter shape) toward the bottom portion of the drift region 54.

The bottom wall 73 of the second trench gate structure 70 is positioned in a region at the first main surface 3 side with a second interval IT2 of not less than 1 μm to not more than 10 μm from the bottom portion of the drift region 54. The second interval IT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second interval IT2 is preferably from not less than 1 μm to not more than 5 μm.

Cell regions 75 are each defined in regions between the plurality of first trench gate structures 60 and the plurality of second trench gate structures 70. The plurality of cell regions are arrayed at intervals along the first direction X, and extend in a band shape along the second direction Y, respectively, in plan view. The plurality of cell regions 75 extend along the same direction as the first trench gate structure 60 and the second trench gate structure 70. The plurality of cell regions 75 are formed in a stripe shape as a whole in plan view.

A first depletion layer spreads inside the drift region 54 from an outer wall of the first trench gate structure 60. The first depletion layer spreads toward a direction along the first main surface 3 from the outer wall of the first trench gate structure 60 and toward the normal direction Z. Similarly, a second depletion layer spreads inside the drift region 54 from the outer wall of the second trench gate structure 70. The second depletion layer spreads toward a direction along the first main surface 3 from the outer wall of the second trench gate structure 70 and toward the normal direction Z.

The second trench gate structure 70 is arrayed at an interval from the first trench gate structure 60 in a manner that the second depletion layer overlaps with the first depletion layer. That is, the second depletion layer overlaps with the first depletion layer in a region at the first main surface 3 side with respect to the bottom wall 73 of the second trench gate structure 70 in the cell region 75. According to the above-described structure, since it is possible to suppress an electric field concentration on the first trench gate structure 60 and the second trench gate structure 70, it is possible to suppress a reduction in breakdown voltage.

It is preferable that the second depletion layer overlaps with the first depletion layer in a region at the bottom portion side of the drift region 54 with respect to the bottom wall 73 of the second trench gate structure 70. According to the above-described structure, since it is possible to suppress an electric field concentration in the bottom wall 63 of the first trench gate structure 60 and the bottom wall 73 of the second trench gate structure 70, it is possible to appropriately suppress a reduction in breakdown voltage.

A pitch PS between a side wall of the first trench gate structure 60 and that of the second trench gate structure 70 may be from not less than 0.2 μm to not more than 2 μm. The pitch PS is a distance in a direction (first direction X) orthogonal to a direction (second direction Y) in which the first trench gate structure 60 and the second trench gate structure 70 extend between the first side wall 61 (second side wall 62) of the first trench gate structure 60 and the second side wall 72 (first side wall 71) of the second trench gate structure 70.

The pitch PS may be from not less than 0.2 μm to not more than 0.4 μm, from not less than 0.4 μm to not more than 0.6 μm, from not less than 0.6 μm to not more than 0.8 μm, from not less than 0.8 μm to not more than 1.0 μm, from not less than 1.0 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2.0 μm. The pitch PS is preferably from not less than 0.3 μm to not more than 1.5 μm.

A pitch PC between a central portion of the first trench gate structure 60 and that of the second trench gate structure 70 may be from not less than 1 μm to not more than 7 μm. The pitch PC is a distance in a direction (the first direction X) orthogonal to a direction (the second direction Y) in which the first trench gate structure 60 and the second trench gate structure 70 extend between the central portion of the first trench gate structure 60 and the central portion of the second trench gate structure 70.

The pitch PC may be from not less than 1 μm to not more than 2 μm, from not less than 2 μm to not more than 3 μm, from not less than 3 μm to not more than 4 μm, from not less than 4 μm to not more than 5 μm, from not less than 5 μm to not more than 6 μm, or from not less than 6 μm to not more than 7 μm. The pitch PC is preferably from not less than 1 μm to not more than 3 μm.

With reference to FIG. 9 and FIG. 10, specifically, the first trench gate structure 60 includes a first gate trench 81, a first insulation layer 82, and a first electrode 83. The first gate trench 81 is formed by digging down the first main surface 3 toward the second main surface 4 side.

The first gate trench 81 defines the first side wall 61, the second side wall 62, and the bottom wall 63 of the first trench gate structure 60. Hereinafter, the first side wall 61, the second side wall 62, and the bottom wall 63 of the first trench gate structure 60 shall also be referred to as the first side wall 61, the second side wall 62, and the bottom wall 63 of the first gate trench 81.

The first insulation layer 82 is formed in a film shape along an inner wall of the first gate trench 81. The first insulation layer 82 defines a concave space inside the first gate trench 81. A portion which covers the bottom wall 63 of the first gate trench 81 in the first insulation layer 82 is conformally formed along the bottom wall 63 of the first gate trench 81. Thereby, the first insulation layer 82 defines a U letter space which is recessed in a U letter shape inside the first gate trench 81.

The first insulation layer 82 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The first insulation layer 82 may have a laminated structure including an SiN layer and an $SiO_2$ layer formed in that order from the semiconductor layer 2 side. The first insulation layer 82 may have a laminated structure including an $SiO_2$ layer and an SiN layer formed in that order from the semiconductor layer 2 side. The first insulation layer 82 has a single layer structure composed of an $SiO_2$ layer or an SiN layer. In this embodiment, the first insulation layer 82 has a single layer structure composed of an $SiO_2$ layer.

The first insulation layer 82 includes a first bottom-side insulation layer 84 and a first opening-side insulation layer 85 which are formed in this order from the bottom wall 63 side of the first gate trench 81 to the first main surface 3 side.

The first bottom-side insulation layer 84 covers the inner wall of the first gate trench 81 at the bottom wall 63 side. Specifically, the first bottom-side insulation layer 84 covers the inner wall of the first gate trench 81 at the bottom wall 63 side with respect to the bottom portion of the body region 55. The first bottom-side insulation layer 84 defines a U letter space at the bottom wall 63 side of the first gate trench 81. The first bottom-side insulation layer 84 has a smooth inner wall surface which defines the U letter space. The first bottom-side insulation layer 84 is in contact with the drift region 54. A part of the first bottom-side insulation layer 84 may be in contact with the body region 55.

The first opening-side insulation layer 85 covers the inner wall of the first gate trench 81 at the opening side. Specifically, the first opening-side insulation layer 85 covers the first side wall 61 and the second side wall 62 of the first gate trench 81 in a region at the opening side of the first gate trench 81 with respect to the bottom portion of the body region 55. The first opening-side insulation layer 85 is in contact with the body region 55. A part of the first opening-side insulation layer 85 may be in contact with the drift region 54.

The first bottom-side insulation layer 84 has a first thickness T1. The first opening-side insulation layer 85 has a second thickness T2 less than the first thickness T1 (T2<T1). The first thickness T1 is a thickness of the first bottom-side insulation layer 84 along a normal direction of the inner wall of the first gate trench 81. The second thickness T2 is a thickness of the first opening-side insulation layer 85 along the normal direction of the inner wall of the first gate trench 81.

A first ratio T1/WT1 of the first thickness T1 with respect to the first width WT1 of the first gate trench 81 may be from not less than 0.1 to not more than 0.4. The first ratio T1/WT1 may be from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The first ratio T1/WT1 is preferably from not less than 0.25 to not more than 0.35.

The first thickness T1 of the first bottom-side insulation layer 84 may be from not less than 1500 Å to not more than 4000 Å. The first thickness T1 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The first thickness T1 is preferably from not less than 1800 Å to not more than 3500 Å.

The first thickness T1 may be adjusted to a range from not less than 4000 Å to not more than 12000 Å according to the first width WT1 of the first gate trench 81. The first thickness T1 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the first bottom-side insulation layer 84, it becomes possible to increase a withstand voltage of the semiconductor device 1.

The second thickness T2 of the first opening-side insulation layer 85 may be from not less than 1/100 to not more than 1/10 of the first thickness T1 of the first bottom-side insulation layer 84. The second thickness T2 may be from not less than 100 Å to not more than 500 Å. The second thickness T2 may be from not less than 100 Å to not more than 200 Å, from not less than 200 Å to not more than 300 Å, from not less than 300 Å to not more than 400 Å, or from not less than 400 Å to not more than 500 Å. The second thickness T2 is preferably from not less than 200 Å to not more than 400 Å.

The first bottom-side insulation layer 84 is formed in a manner that the first thickness T1 is reduced from a part which covers the first side wall 61 and the second side wall 62 of the first gate trench 81 toward a part which covers the bottom wall 63 of the first gate trench 81.

The part which covers the bottom wall 63 of the first gate trench 81 in the first bottom-side insulation layer 84 is smaller in thickness than the part which covers the first side wall 61 and the second side wall 62 of the first gate trench 81 in the first bottom-side insulation layer 84. An opening width of the U letter space in the bottom wall side defined by the first bottom-side insulation layer 84 is expanded by an amount of a reduction in the first thickness T1. Thereby, the U letter space is suppressed from being tapered. The above-described U letter space is formed, for example, by an etching method (for example, a wet etching method) to the inner wall of the first bottom-side insulation layer 84.

The first electrode 83 is embedded in the first gate trench 81 across the first insulation layer 82. First gate control signals (first control signals) including an ON signal Von and an OFF signal Voff are applied to the first electrode 83. In this embodiment, the first electrode 83 has an insulated-separation type split electrode structure including a first bottom-side electrode 86, a first opening-side electrode 87, and a first intermediate insulation layer 88.

The first bottom-side electrode 86 is embedded in the bottom wall 63 side of the first gate trench 81 across the first insulation layer 82. Specifically, the first bottom-side electrode 86 is embedded in the bottom wall 63 side of the first gate trench 81 across the first bottom-side insulation layer 84. The first bottom-side electrode 86 faces the drift region 54 across the first bottom-side insulation layer 84. A part of the first bottom-side electrode 86 may face the body region 55 across the first bottom-side insulation layer 84.

The first bottom-side electrode 86 includes a first upper end portion 86A, a first lower end portion 86B, and a first wall portion 86C. The first upper end portion 86A is positioned at the opening side of the first gate trench 81. The first lower end portion 86B is positioned at the bottom wall 63 side of the first gate trench 81. The first wall portion 86C connects the first upper end portion 86A and the first lower end portion 86B and extends in a wall shape along the inner wall of the first gate trench 81.

The first upper end portion 86A is exposed from the first bottom-side insulation layer 84. The first upper end portion 86A protrudes to the first main surface 3 side with respect to the first bottom-side insulation layer 84. Thereby, the first bottom-side electrode 86 defines an inverted concave recess in sectional view between the first bottom-side insulation layer 84 and the first opening-side insulation layer 85 at the opening side of the first gate trench 81. A width of the first upper end portion 86A is less than a width of the first wall portion 86C.

The first lower end portion 86B is formed in a convex curved shape toward the bottom wall 63 of the first gate trench 81. Specifically, the first lower end portion 86B is conformally formed along the bottom wall of the U letter space defined by the first bottom-side insulation layer 84 and formed in a smooth convex curved shape toward the bottom wall 63 of the first gate trench 81.

According to the above-described structure, since it is possible to suppress a local electric field concentration on the first bottom-side electrode 86, it is possible to suppress a reduction in breakdown voltage. In particular, by embedding the first bottom-side electrode 86 into an expanded U letter space of the first bottom-side insulation layer 84, it becomes possible to appropriately suppress the first bottom-side electrode 86 from being tapered from the first upper end portion 86A to the first lower end portion 86B. Thereby, it is possible to appropriately suppress a local electric field concentration on the first lower end portion 86B of the first bottom-side electrode 86.

The first bottom-side electrode 86 may include at least any one of conductive polysilicon, tungsten, aluminum, copper, an aluminum alloy, and a copper alloy. In this embodiment, the first bottom-side electrode 86 includes conductive polysilicon. The conductive polysilicon may include an n-type impurity or a p-type impurity. The conductive polysilicon preferably includes an n-type impurity.

The first opening-side electrode 87 is embedded into the opening side of the first gate trench 81 across the first insulation layer 82. Specifically, the first opening-side electrode 87 is embedded in the inverted concave recess defined at the opening side of the first gate trench 81 across the first opening-side insulation layer 85. The first opening-side electrode 87 faces the body region 55 across the first opening-side insulation layer 85. A part of the first opening-side electrode 87 may face the drift region 54 across the first opening-side insulation layer 85.

The first opening-side electrode 87 may include at least any one of conductive polysilicon, tungsten, aluminum, copper, an aluminum alloy, and a copper alloy. The first opening-side electrode 87 preferably includes the same type of conductive material as the first bottom-side electrode 86. In this embodiment, the first opening-side electrode 87 includes conductive polysilicon. The conductive polysilicon may include an n-type impurity or a p-type impurity. The conductive polysilicon preferably includes an n-type impurity.

The first intermediate insulation layer 88 is interposed between the first bottom-side electrode 86 and the first opening-side electrode 87 to electrically insulate the first bottom-side electrode 86 and the first opening-side electrode 87. Specifically, the first intermediate insulation layer 88 covers the first bottom-side electrode 86 exposed from the first bottom-side insulation layer 84 in a region between the first bottom-side electrode 86 and the first opening-side electrode 87. The first intermediate insulation layer 88 covers the first upper end portion 86A (specifically, protruded portion) of the first bottom-side electrode 86. The first intermediate insulation layer 88 is continuous with the first insulation layer 82 (first bottom-side insulation layer 84).

The first intermediate insulation layer 88 has a third thickness T3. The third thickness T3 is less than the first thickness T1 of the first bottom-side insulation layer 84 (T3<T1). The third thickness T3 may be from not less than 1/100 to not more than 1/10 of the thickness T1. The third thickness T3 may be from not less than 100 Å to not more than 500 Å. The third thickness T3 may be from not less than 100 Å to not more than 200 Å, from not less than 200 Å to not more than 300 Å, from not less than 300 Å to not more than 400 Å, or from not less than 400 Å to not more than 500 Å. The third thickness T3 is preferably from not less than 200 Å to not more than 400 Å.

The first intermediate insulation layer 88 includes at least any one of silicon oxide ($SiO_2$), silicon nitride (SiN), aluminum oxide ($Al_2O_3$), zirconium oxide ($ZrO_2$), and tantalum oxide layer 88 has a single layer structure composed of an $SiO_2$ layer.

In this embodiment, an exposed portion which is exposed from the first gate trench 81 in the first opening-side electrode 87 is positioned at the bottom wall 63 side of the first gate trench 81 with respect to the first main surface 3. The exposed portion of the first opening-side electrode 87 is formed in a curved shape toward the bottom wall 63 of the first gate trench 81.

The exposed portion of the first opening-side electrode 87 is covered by a first cap insulation layer 89 formed in a film shape. The first cap insulation layer 89 is continuous with the first insulation layer 82 (first opening-side insulation layer 85) inside the first gate trench 81. The first cap insulation layer 89 may include silicon oxide ($SiO_2$).

Each of the first FET structures 58 further includes a p-type first channel region 91 (first channel). The first channel region 91 is formed in a region which faces the first electrode 83 (first opening-side electrode 87) across the first insulation layer 82 (first opening-side insulation layer 85) in the body region 55.

The first channel region 91 is formed along the first side wall 61 or the second side wall 62 of the first trench gate structure 60, or along the first side wall 61 and the second side wall 62 thereof. In this embodiment, the first channel region 91 is formed along the first side wall 61 and the second side wall 62 of the first trench gate structure 60.

Each of the first FET structure 58 further includes an $n^+$-type first source region 92 formed in a surface layer portion of the body region 55. The first source region 92 demarcates the first channel region 91 with the drift region 54 inside the body region 55. An n-type impurity concentration of the first source region 92 is in excess of an n-type impurity concentration of the drift region 54. The n-type impurity concentration of the first source region 92 may be from not less than $1\times10^{19}$ $cm^{-3}$ to not more than $1\times10^{21}$ $cm^{-3}$.

In this embodiment, each of the first FET structures 58 includes the plurality of first source regions 92. The plurality of first source regions 92 are formed in the surface layer portion of the body region 55 at an interval along the first trench gate structure 60. Specifically, the plurality of first source regions 92 are formed along the first side wall 61 or the second side wall 62 of the first trench gate structure 60, or along the first side wall 61 and the second side wall 62 thereof. In this embodiment, the plurality of first source regions 92 are formed at an interval along the first side wall 61 and the second side wall 62 of the first trench gate structure 60.

The bottom portions of the plurality of first source regions 92 are positioned in a region at the first main surface 3 side with respect to the bottom portion of the body region 55. Thereby, the plurality of first source regions 92 face the first electrode 83 (first opening-side electrode 87) across the first insulation layer 82 (first opening-side insulation layer 85). Thus, the first channel region 91 of the first MISFET 56 is formed in a region which is held between the plurality of first source regions 92 and the drift region 54 in the body region 55.

Each of the first FET structures 58 further includes a $p^+$-type first contact region 93 formed in the surface layer portion of the body region 55. A p-type impurity concentration of the first contact region 93 is in excess of a p-type impurity concentration of the body region 55. The p-type impurity concentration of the first contact region 93 may be from not less than $1\times10^{19}$ $cm^{-3}$ to not more than $1\times10^{21}$ $cm^{-3}$.

In this embodiment, each of the first FET structure 58 includes a plurality of first contact regions 93. The plurality of first contact regions 93 are formed in the surface layer portion of the body region 55 at an interval along the first trench gate structure 60. Specifically, the plurality of first contact regions 93 are formed along the first side wall 61 or the second side wall 62 of the first trench gate structure 60, or along the first side wall 61 and the second side wall 62 thereof.

In this embodiment, the plurality of first contact regions 93 are formed at an interval along the first side wall 61 and the second side wall 62 of the first trench gate structure 60. Specifically, the plurality of first contact regions 93 are formed in the surface layer portion of the body region 55 in a manner that the plurality of first contact regions 93 are alternately arrayed with the plurality of first source regions 92. The bottom portions of the plurality of first contact regions 93 are positioned in a region at the first main surface 3 side with respect to the bottom portion of the body region 55.

With reference to FIG. 9 and FIG. 11, the second trench gate structure 70 includes a second gate trench 101, a second insulation layer 102, and a second electrode 103. The second gate trench 101 is formed by digging down the first main surface 3 toward the second main surface 4 side.

The second gate trench 101 defines the first side wall 71, the second side wall 72, and the bottom wall 73 of the second trench gate structure 70. Hereinafter, the first side wall 71, the second side wall 72, and the bottom wall 73 of the second trench gate structure 70 are also referred to as the first side wall 71, the second side wall 72, and the bottom wall 73 of the second gate trench 101.

The second insulation layer 102 is formed in a film shape along an inner wall of the second gate trench 101. The second insulation layer 102 defines a concave space inside the second gate trench 101. A part which covers the bottom wall 73 of the second gate trench 101 in the second insulation layer 102 is conformally formed along the bottom wall 73 of the second gate trench 101. Thereby, the second insulation layer 102 defines a U letter space recessed in a U letter shape inside the second gate trench 101.

The second insulation layer 102 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The second insulation layer 102 may have a laminated structure including an SiN layer and an $SiO_2$ layer formed in that order from the semiconductor layer 2 side. The second insulation layer 102 may have a laminated structure including an $SiO_2$ layer and an SiN layer formed in that order from the semiconductor layer 2 side. The second insulation layer 102 has a single layer structure composed of an $SiO_2$ layer or an SiN layer. In this embodiment, the second insulation layer 102 has a single layer structure composed of an $SiO_2$ layer.

The second insulation layer 102 includes a second bottom-side insulation layer 104 and a second opening-side insulation layer 105 which are formed in this order from the bottom wall 73 side of the second gate trench 101 to the first main surface 3 side.

The second bottom-side insulation layer 104 covers the inner wall of the second gate trench 101 at the bottom wall 73 side. Specifically, the second bottom-side insulation layer 104 covers the inner wall of the second gate trench 101 at the bottom wall 73 side with respect to the bottom portion of the body region 55. The second bottom-side insulation layer 104 defines a U letter space at the bottom wall 73 side of the second gate trench 101. The second bottom-side insulation layer 104 has a smooth inner wall surface which defines the U letter space. The second bottom-side insulation layer 104 is in contact with the drift region 54. A part of the second bottom-side insulation layer 104 may be in contact with the body region 55.

The second opening-side insulation layer 105 covers the inner wall of the second gate trench 101 at the opening side. Specifically, the second opening-side insulation layer 105 covers the first side wall 71 and the second side wall 72 of the second gate trench 101 in a region of the second gate trench 101 at the opening side with respect to the bottom portion of the body region 55. The second opening-side insulation layer 105 is in contact with the body region 55. A part of the second opening-side insulation layer 105 may be in contact with the drift region 54.

The second bottom-side insulation layer 104 has a fourth thickness T4. The second opening-side insulation layer 105 has a fifth thickness T5 less than the fourth thickness T4 (T5<T4). The fourth thickness T4 is a thickness of the second bottom-side insulation layer 104 along a normal direction of the inner wall of the second gate trench 101. The fifth thickness T5 is a thickness of the second opening-side insulation layer 105 along the normal direction of the inner wall of the second gate trench 101.

A second ratio T4/WT2 of the fourth thickness T4 with respect to the second width WT2 of the second gate trench 101, may be from not less than 0.1 to not more than 0.4. The second ratio T4/WT2 may be from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The second ratio T4/WT2 is preferably from not less than 0.25 to not more than 0.35.

The second ratio T4/WT2 may be equal to or less than the first ratio T1/WT1 (T4/WT2 T1/WT1). The second ratio T4/WT2 may be equal to or more than the first ratio T1/WT1 (T4/WT2 T1/WT1). The second ratio T4/WT2 may be equal to the first ratio T1/WT1 (T4/WT2=T1/WT1).

The fourth thickness T4 of the second bottom-side insulation layer 104 may be from not less than 1500 Å to not more than 4000 Å. The fourth thickness T4 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The fourth thickness T4 is preferably from not less than 1800 Å to not more than 3500 Å.

The fourth thickness T4 may be from not less than 4000 Å to not more than 12000 Å according to the second width WT2 of the second gate trench 101. The fourth thickness T4 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the second bottom-side insulation layer 104, it becomes possible to increase a withstand voltage of the semiconductor device 1.

The fourth thickness T4 may be equal to or less than the first thickness T1 (T4≤T1). The fourth thickness T4 may be equal to or more than the first thickness T1 (T4≥T1). The fourth thickness T4 may be equal to the first thickness T1 (T4=T1).

The fifth thickness T5 of the second opening-side insulation layer 105 is less than the fourth thickness T4 of the second bottom-side insulation layer 104 (T5<T4). The fifth thickness T5 may be from not less than 1/100 of the fourth thickness T4 to not more than 1/10. The fifth thickness T5 may be from not less than 100 Å to not more than 500 Å. The fifth thickness T5 may be from not less than 100 Å to not more than 200 Å, from not less than 200 Å to not more than 300 Å, from not less than 300 Å to not more than 400 Å, or from not less than 400 Å to not more than 500 Å. The fifth thickness T5 is preferably from not less than 200 Å to not more than 400 Å.

The fifth thickness T5 may be equal to or less than the second thickness T2 (T5≤T2). The fifth thickness T5 may be equal to or more than the second thickness T2 (T5≥T2). The fifth thickness T5 may be equal to the second thickness T2 (T5=T2).

The second bottom-side insulation layer 104 is formed in a manner that the fourth thickness T4 is reduced from a part which covers the first side wall 71 and the second side wall 72 of the second gate trench 101 toward a part which covers the bottom wall 73 of the second gate trench 101.

The part which covers the bottom wall 73 of the second gate trench 101 in the second bottom-side insulation layer 104 is smaller in thickness than the part which covers the first side wall 71 and the second side wall 72 of the second gate trench 101 in the second bottom-side insulation layer 104. An opening width of the U letter space defined by the second bottom-side insulation layer 104 at the bottom wall side is expanded by an amount of a reduction in the fourth thickness T4. Thereby, the U letter space is suppressed from being tapered. The above-described U letter space is formed, for example, by an etching method (for example, a wet etching method) to the inner wall of the second bottom-side insulation layer 104.

The second electrode 103 is embedded in the second gate trench 101 across the second insulation layer 102. Second gate control signals (second control signals) including an ON signal Von and an OFF signal Voff are applied to the second electrode 103.

In this embodiment, the second electrode 103 has an insulated-separation type split electrode structure including a second bottom-side electrode 106, a second opening-side electrode 107, and a second intermediate insulation layer 108. In this embodiment, the second bottom-side electrode 106 is electrically connected to the first bottom-side electrode 86. The second opening-side electrode 107 is electrically insulated from the first opening-side electrode 87.

The second bottom-side electrode 106 is embedded in the bottom wall 73 side of the second gate trench 101 across the second insulation layer 102. Specifically, the second bottom-side electrode 106 is embedded in the bottom wall 73 side of the second gate trench 101 across the second bottom-side insulation layer 104. The second bottom-side electrode 106 faces the drift region 54 across the second bottom-side insulation layer 104. A part of the second bottom-side electrode 106 may face the body region 55 across the second bottom-side insulation layer 104.

The second bottom-side electrode 106 includes a second upper end portion 106A, a second lower end portion 106B, and a second wall portion 106C. The second upper end portion 106A is positioned at an opening side of the second gate trench 101. The second lower end portion 106B is positioned at the bottom wall 73 side of the second gate trench 101. The second wall portion 106C connects the second upper end portion 106A and the second lower end portion 106B and extends in a wall shape along the inner wall of the second gate trench 101.

The second upper end portion 106A is exposed from the second bottom-side insulation layer 104. The second upper end portion 106A protrudes to the first main surface 3 side with respect to the second bottom-side insulation layer 104. Thereby, the second bottom-side electrode 106 defines an inverted concave recess in sectional view between the second bottom-side insulation layer 104 and the second opening-side insulation layer 105 at the opening side of the second gate trench 101. A width of the second upper end portion 106A is less than a width of the second wall portion 106C.

The second lower end portion 106B is formed in a convex curved shape toward the bottom wall 73 of the second gate trench 101. Specifically, the second lower end portion 106B is conformally formed along a bottom wall of the U letter space defined by the second bottom-side insulation layer 104 and formed in a smooth convex curved shape toward the bottom wall 73 of the second gate trench 101.

According to the above-described structure, since it is possible to suppress a local electric field concentration on the second bottom-side electrode 106, it is possible to suppress a reduction in breakdown voltage. In particular, by embedding the second bottom-side electrode 106 into the U letter space expanded by the second bottom-side insulation layer 104, it becomes possible to appropriately suppress the second bottom-side electrode 106 from being tapered from the second upper end portion 106A to the second lower end portion 106B. Thereby, it is possible to appropriately suppress a local electric field concentration at the second lower end portion 106B of the second bottom-side electrode 106.

The second bottom-side electrode 106 may include at least any one of conductive polysilicon, tungsten, aluminum, copper, an aluminum alloy, and a copper alloy. In this embodiment, the second bottom-side electrode 106 includes conductive polysilicon. The conductive polysilicon may include an n-type impurity or a p-type impurity. The conductive polysilicon preferably includes an n-type impurity.

The second opening-side electrode 107 is embedded in the opening side of the second gate trench 101 across the second insulation layer 102. Specifically, the second opening-side electrode 107 is embedded in the inverted concave recess defined at the opening side of the second gate trench 101 across the second opening-side insulation layer 105. The second opening-side electrode 107 faces the body region 55 across the second opening-side insulation layer 105. A part of the second opening-side electrode 107 may face the drift region 54 across the second opening-side insulation layer 105.

The second opening-side electrode 107 may include at least any one of conductive polysilicon, tungsten, aluminum, copper, an aluminum alloy, and a copper alloy. The second opening-side electrode 107 preferably includes the same type of conductive material as the second bottom-side electrode 106. In this embodiment, the second opening-side electrode 107 includes conductive polysilicon. The conductive polysilicon may include an n-type impurity or a p-type impurity. The conductive polysilicon preferably includes an n-type impurity.

The second intermediate insulation layer 108 is interposed between the second bottom-side electrode 106 and the second opening-side electrode 107 to electrically insulate the second bottom-side electrode 106 and the second opening-side electrode 107. Specifically, the second intermediate insulation layer 108 covers the second bottom-side electrode 106 exposed from the second bottom-side insulation layer 104 in a region between the second bottom-side electrode 106 and the second opening-side electrode 107. The second intermediate insulation layer 108 covers the second upper end portion 106A of the second bottom-side electrode 106 (specifically, a protruded portion). The second intermediate insulation layer 108 is continuous with the second insulation layer 102 (second bottom-side insulation layer 104).

The second intermediate insulation layer 108 has a sixth thickness T6. The sixth thickness T6 is less than the fourth thickness T4 of the second bottom-side insulation layer 104 (T6<T4). The sixth thickness T6 may be from not less than 1/100 of the fourth thickness T4 to not more than 1/10. The sixth thickness T6 may be from not less than 100 Å to not more than 500 Å. The sixth thickness T6 may be from not less than 100 Å to not more than 200 Å, from not less than 200 Å to not more than 300 Å, from not less than 300 Å to not more than 400 Å, or from not less than 400 Å to not more than 500 Å. The sixth thickness T6 is preferably from not less than 200 Å to not more than 400 Å.

The sixth thickness T6 may be equal to or less than the third thickness T3 (T6 T3). The sixth thickness T6 may be equal to or more than the third thickness T3 (T6 T3). The sixth thickness T6 may be equal to the third thickness T3 (T6=T3).

The second intermediate insulation layer 108 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the second intermediate insulation layer 108 has a single layer structure composed of an $SiO_2$ layer.

In this embodiment, an exposed portion which is exposed from the second gate trench 101 in the second opening-side electrode 107 is positioned at the bottom wall 73 side of the second gate trench 101 with respect to the first main surface 3. The exposed portion of the second opening-side electrode 107 is formed in a curved shape toward the bottom wall 73 of the second gate trench 101.

The exposed portion of the second opening-side electrode 107 is covered by a second cap insulation layer 109 formed in a film shape. The second cap insulation layer 109 is continuous with the second insulation layer 102 (second opening-side insulation layer 105) inside the second gate trench 101. The second cap insulation layer 109 may include silicon oxide ($SiO_2$).

Each of the second FET structures 68 further includes a p-type second channel region 111 (second channel). Specifically, the second channel region 111 is formed in a region which faces the second electrode 103 (second opening-side electrode 107) across the second insulation layer 102 (second opening-side insulation layer 105) in the body region 55.

Specifically, the second channel region 111 is formed along the first side wall 71 or the second side wall 72 of the second trench gate structure 70, or along the first side wall 71 and the second side wall 72 thereof. In this embodiment, the second channel region 111 is formed along the first side wall 71 and the second side wall 72 of the second trench gate structure 70.

Each of the second FET structures 68 further includes an $n^+$-type second source region 112 formed in the surface layer portion of the body region 55. The second source region 112 demarcates the second channel region 111 with the drift region 54 inside the body region 55.

An n-type impurity concentration of the second source region 112 is in excess of an n-type impurity concentration of the drift region 54. The n-type impurity concentration of the second source region 112 may be from not less than $1\times10^{19}$ $cm^{-3}$ to not more than $1\times10^{21}$ $cm^{-3}$. It is preferable that the n-type impurity concentration of the second source region 112 is equal to the n-type impurity concentration of the first source region 92.

In this embodiment, each of the second FET structures 68 includes the plurality of second source regions 112. The plurality of second source regions 112 are formed in the surface layer portion of the body region 55 at an interval along the second trench gate structure 70. Specifically, the plurality of second source regions 112 are formed along the first side wall 71 or the second side wall 72 of the second trench gate structure 70, or along the first side wall 71 and the second side wall 72 thereof. In this embodiment, the plurality of second source regions 112 are formed at an interval along the first side wall 71 and the second side wall 72 of the second trench gate structure 70.

In this embodiment, each of the second source regions 112 faces each of the first source regions 92 along the first direction X. Each of the second source regions 112 is integrally formed with each of the first source regions 92. FIG. 7 and FIG. show that the first source region 92 and the second source region 112 are distinguished from each other by a boundary line. However, in actuality, there is no clear boundary line in a region between the first source region 92 and the second source region 112.

The second source regions 112 may be each formed such as to be shifted from each of the first source regions 92 in the second direction Y such as not to face some of or all of the first source regions 92 along the first direction X. That is, the plurality of first source regions 92 and the plurality of second source regions 112 may be arrayed in a staggered manner in plan view.

The bottom portions of the plurality of second source regions 112 are positioned in a region at the first main surface 3 side with respect to the bottom portion of the body region 55. Thereby, the plurality of second source regions 112 face the second electrode 103 (second opening-side electrode 107) across the second insulation layer 102 (second opening-side insulation layer 105). Thus, the second channel region 111 of the second MISFET 57 is formed in a region held between the plurality of second source regions 112 and the drift region 54 in the body region 55.

Each of the second FET structures 68 further includes a $p^+$-type second contact region 113 formed in the surface layer portion of the body region 55. A p-type impurity concentration of the second contact region 113 is in excess of a p-type impurity concentration of the body region 55. The p-type impurity concentration of the second contact region 113 may be from not less than $1\times10^{19}$ $cm^{-3}$ to not more than $1\times10^{21}$ $cm^{-3}$. It is preferable that the p-type impurity concentration of the second contact region 113 is equal to the p-type impurity concentration of the first contact region 93.

In this embodiment, each of the second FET structures 68 includes the plurality of second contact regions 113. The plurality of second contact regions 113 are formed in the surface layer portion of the body region 55 at an interval along the second trench gate structure 70. Specifically, the plurality of second contact regions 113 are formed along the first side wall 71 or the second side wall 72 of the second trench gate structure 70, or along the first side wall 71 and the second side wall 72 thereof. The bottom portions of the plurality of second contact regions 113 are positioned in a region in the first main surface 3 side with respect to the bottom portion of the body region 55.

In this embodiment, the plurality of second contact regions 113 are formed at an interval along the first side wall 71 and the second side wall 72 of the second trench gate structure 70. Specifically, the plurality of second contact regions 113 are formed in the surface layer portion of the body region 55 in a manner that the plurality of second contact regions 113 are arrayed alternately with the plurality of second source regions 112.

With reference to FIG. 7 and FIG. 8, in this embodiment, each of the second contact regions 113 faces each of the first contact regions 93 along the first direction X. Each of the second contact regions 113 is integrally formed with each of the first contact regions 93.

In FIG. 7, in order to distinguish the first contact region 93 and the second contact region 113 from the first source region 92 and the second source region 112, the first contact region 93 and the second contact region 113 are collectively indicated by a reference sign of "$p^+$." Further, in FIG. 8, it is shown that the first contact region 93 is distinguished from the second contact region 113 by a boundary line. However, in actuality, there is no clear boundary line in a region between the first contact region 93 and the second contact region 113.

Each of the second contact regions 113 may be formed such as to be shifted from each of the first contact regions 93 in the second direction Y such as not to face some of or all of the first contact regions 93 along the first direction X. That is, the plurality of first contact regions 93 and the plurality of second contact regions 113 may be arrayed in a staggered manner in plan view.

With reference to FIG. 7 and FIG. 8, in this embodiment, the body region 55 is exposed from a region between one end portion of the first trench gate structure 60 and one end portion of the second trench gate structure 70 in the first main surface 3 of the semiconductor layer 2. Any of the first source region 92, the first contact region 93, the second source region 112, and the second contact region 113 is not formed in the region held between one end portion of the first trench gate structure 60 and one end portion of the second trench gate structure 70 in the first main surface 3.

Similarly, although not shown in the drawings, in this embodiment, the body region 55 is exposed from a region between the other end portion of the first trench gate structure 60 and the other end portion of the second trench gate structure 70 in the first main surface 3 of the semiconductor layer 2. Any of the first source region 92, the first contact region 93, the second source region 112, and the second contact region 113 is not formed in the region held between the other end portion of the first trench gate structure 60 and the other end portion of the second trench gate structure 70.

With reference to FIG. 5 to FIG. 8, a plurality of (in this embodiment, two) trench contact structures 120 are formed in the first main surface 3 of the semiconductor layer 2. The plurality of trench contact structures 120 include a trench contact structure 120 at one side and a trench contact structure 120 at the other side.

The trench contact structure 120 at one side is positioned in a region at the side of one end portion of the first trench gate structure 60 and one end portion of the second trench gate structure 70. The trench contact structure 120 at the other side is positioned in a region at the side of the other end portion of the first trench gate structure 60 and at the other end portion of the second trench gate structure 70.

The trench contact structure 120 at the other side is substantially similar in structure to the trench contact structure 120 at one side. Hereinafter, a structure of the trench contact structure 120 at one side shall be described as an example, and a specific description of a structure of the trench contact structure 120 at the other side shall be omitted.

The trench contact structure 120 is connected to one end portion of the first trench gate structure 60 and one end portion of the second trench gate structure 70. In this embodiment, the trench contact structure 120 extends in a band shape along the first direction X in plan view.

A width WTC of the trench contact structure 120 may be from not less than 0.5 μm to not more than 5 μm. The width WTC is a width in a direction (second direction Y) orthogonal to a direction (first direction X) in which the trench contact structure 120 extends.

The width WTC may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The width WTC is preferably from not less than 0.8 μm to not more than 1.2 μm.

It is preferable that the width WTC is equal to the first width WT1 of the first trench gate structure 60 (WTC=WT1). It is preferable that the width WTC is equal to the second width WT2 of the second trench gate structure 70 (WTC=WT2).

The trench contact structure 120 penetrates through the body region 55 and reaches the drift region 54. A depth DTC of the trench contact structure 120 may be from not less than 1 μm to not more than 10 μm. The depth DTC may be from may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The depth DTC is preferably from not less than 2 μm to not more than 6 μm.

It is preferable that the depth DTC is equal to the first depth DT1 of the first trench gate structure 60 (DTC=DT1). It is preferable that the depth DTC is equal to the second depth DT2 of the second trench gate structure 70 (DTC=DT2).

The trench contact structure 120 includes a first side wall 121 on one side, a second side wall 122 on the other side, and a bottom wall 123 which connects the first side wall 121 and the second side wall 122. Hereinafter, the first side wall 121, the second side wall 122, and the bottom wall 123 may be collectively referred to as "an inner wall." The first side wall 121 is a connection surface which is connected to the first trench gate structure 60 and the second trench gate structure 70.

The first side wall 121, the second side wall 122, and the bottom wall 123 are positioned inside the drift region 54. The first side wall 121 and the second side wall 122 extend along the normal direction Z. The first side wall 121 and the second side wall 122 may be formed perpendicularly to the first main surface 3.

An absolute value of an angle (taper angel) formed between the first side wall 121 and the first main surface 3 inside semiconductor layer 2 may be in excess of 90° and not more than 95° (for example, approximately 91°). The absolute value of an angle (taper angel) formed between the second side wall 122 and the first main surface 3 inside the semiconductor layer 2 may be in excess of 90° and not more than 95° (for example, approximately) 91°. The trench contact structure 120 may be formed in a shape (tapered shape) that the width WTC is made narrow from the first main surface 3 side of the semiconductor layer 2 to the bottom wall 123 side in sectional view.

The bottom wall 123 is positioned in a region at the first main surface 3 side with respect to the bottom portion of the drift region 54. The bottom wall 123 is formed in a convex curved shape toward the bottom portion of the drift region 54. The bottom wall 123 is positioned in a region at the first main surface 3 side with an interval ITC of not less than 1 μm to not more than 10 μm from the bottom portion of the drift region 54. The interval ITC may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The interval ITC is preferably from not less than 1 μm to not more than 5 μm.

It is preferable that the interval ITC is equal to the first interval IT1 of the first trench gate structure 60 (ITC=IT1). It is preferable that the interval ITC is equal to the second interval IT2 of the second trench gate structure 70 (ITC=IT2).

The trench contact structure 120 includes a contact trench 131, a contact insulation layer 132, and a contact electrode

133. The contact trench 131 is formed by digging down the first main surface 3 of the semiconductor layer 2 toward the second main surface 4 side.

The contact trench 131 defines the first side wall 121, the second side wall 122, and the bottom wall 123 of the trench contact structure 120. Hereinafter, the first side wall 121, the second side wall 122, and the bottom wall 123 of the trench contact structure 120 are also referred to as the first side wall 121, the second side wall 122, and the bottom wall 123 of the contact trench 131.

The first side wall 121 of the contact trench 131 communicates with the first side wall 61 and the second side wall 62 of the first gate trench 81. The first side wall 121 of the contact trench 131 communicates with the first side wall 71 and the second side wall 72 of the second gate trench 101. The contact trench 131 forms one trench with the first gate trench 81 and the second gate trench 101.

The contact insulation layer 132 is formed in a film shape along an inner wall of the contact trench 131. The contact insulation layer 132 defines a concave space inside the contact trench 131. A part which covers the bottom wall 123 of the contact trench 131 in the contact insulation layer 132 is conformally formed along the bottom wall 123 of the contact trench 131.

The contact insulation layer 132 defines a U letter space recessed in a U letter shape inside the contact trench 131 in a manner similar to the first bottom-side insulation layer 84 (second bottom-side insulation layer 104). That is, the contact insulation layer 132 defines a U letter space in which a region of the contact trench 131 at the bottom wall 123 side is expanded and suppressed from being tapered. The above-described U letter space is formed, for example, by an etching method (for example, a wet etching method) to the inner wall of the contact insulation layer 132.

The contact insulation layer 132 has a seventh thickness T7. The seventh thickness T7 may be from not less than 1500 Å to not more than 4000 Å. The seventh thickness T7 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The seventh thickness T7 is preferably from not less than 1800 Å to not more than 3500 Å.

The seventh thickness T7 may be from not less than 4000 Å to not more than 12000 Å according to the width WTC of the trench contact structure 120. The seventh thickness T7 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the contact insulation layer 132, it becomes possible to increase a withstand voltage of the semiconductor device 1.

It is preferable that the seventh thickness T7 is equal to the first thickness T1 of the first bottom-side insulation layer 84 (T7=T1). It is preferable that the seventh thickness T7 is equal to the fourth thickness T4 of the second bottom-side insulation layer 104 (T7=T4).

The contact insulation layer 132 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The contact insulation layer 132 may have a laminated structure including an SiN layer and an $SiO_2$ layer formed in that order from the semiconductor layer 2 side. The contact insulation layer 132 may have a laminated structure including an $SiO_2$ layer and an SiN layer formed in that order from the semiconductor layer side. The contact insulation layer 132 has a single layer structure composed of an $SiO_2$ layer or an SiN layer. In this embodiment, the contact insulation layer 132 has a single layer structure composed of an $SiO_2$ layer. The contact insulation layer 132 is preferably composed of the same insulating material as the first insulation layer 82 (second insulation layer 102).

The contact insulation layer 132 is integrally formed with the first insulation layer 82 in a communication portion between the first gate trench 81 and the contact trench 131. The contact insulation layer 132 is integrally formed with the second insulation layer 102 in a communication portion between the second gate trench 101 and the contact trench 131.

In this embodiment, the contact insulation layer 132 has a lead-out insulation layer 132A which is led out to one end portion of the first gate trench 81 and one end portion of the second gate trench 101. The lead-out insulation layer 132A crosses the communication portion to cover an inner wall of one end portion of the first gate trench 81. The lead-out insulation layer 132A crosses the communication portion to cover an inner wall of one end portion of the second gate trench 101.

The lead-out insulation layer 132A is integrally formed with the first bottom-side insulation layer 84 and the first opening-side insulation layer 85 inside the first gate trench 81. The lead-out insulation layer 132A defines a U letter space together with the first bottom-side insulation layer 84 at the inner wall of one end portion of the first gate trench 81.

The lead-out insulation layer 132A is integrally formed with the second bottom-side insulation layer 104 and the second opening-side insulation layer 105 inside the second gate trench 101. The lead-out insulation layer 132A defines the U letter space together with the second bottom-side insulation layer 104 at the inner wall of one end portion of the second gate trench 101.

The contact electrode 133 is embedded in the contact trench 131 across the contact insulation layer 132. The contact electrode 133 is embedded in the contact trench 131 as an integrated member unlike the first electrode 83 and the second electrode 103. The contact electrode 133 has an upper end portion exposed from the contact trench 131 and a lower end portion in contact with the contact insulation layer 132.

The lower end portion of the contact electrode 133 is formed in a convex curved shape toward the bottom wall 123 of the contact trench 131 in a manner similar to the first bottom-side electrode 86 (second bottom-side electrode 106). Specifically, the lower end portion of the contact electrode 133 is conformally formed along the bottom wall of the U letter space defined by the contact insulation layer 132 and formed in a smooth convex curved shape toward the bottom wall 123.

According to the above-described structure, since it is possible to suppress a local electric field concentration on the contact electrode 133, it is possible to suppress a reduction in breakdown voltage. In particular, by embedding the contact electrode 133 into the expanded U letter space of the contact insulation layer 132, it becomes possible to appropriately suppress the contact electrode 133 from being tapered from the upper end portion to the lower end portion.

Thereby, it is possible to appropriately suppress a local electric field concentration on the lower end portion of the contact insulation layer 132.

The contact electrode 133 is electrically connected to the first bottom-side electrode 86 at the connection portion between the first gate trench 81 and the contact trench 131. The contact electrode 133 is electrically connected to the second bottom-side electrode 106 at the connection portion between the second gate trench 101 and the contact trench 131. Thereby, the second bottom-side electrode 106 is electrically connected to the first bottom-side electrode 86.

Specifically, the contact electrode 133 has a lead-out electrode 133A which is led out to one end portion of the first gate trench 81 and one end portion of the second gate trench 101. The lead-out electrode 133A crosses the communication portion between the first gate trench 81 and the contact trench 131 and is positioned inside the first gate trench 81. The lead-out electrode 133A also crosses the communication portion between the second gate trench 101 and the contact trench 131 and is positioned inside the second gate trench 101.

The lead-out electrode 133A is embedded in a U letter space defined by the contact insulation layer 132 inside the first gate trench 81. The lead-out electrode 133A is integrally formed with the first bottom-side electrode 86 inside the first gate trench 81. Thereby, the contact electrode 133 is electrically connected to the first bottom-side electrode 86.

The first intermediate insulation layer 88 is interposed between the contact electrode 133 and the first opening-side electrode 87 inside the first gate trench 81. Thereby, the contact electrode 133 is electrically insulated from the first opening-side electrode 87 inside the first gate trench 81.

The lead-out electrode 133A is embedded in the U letter space defined by the contact insulation layer 132 inside the second gate trench 101. The lead-out electrode 133A is integrally formed with the second bottom-side electrode 106 inside the second gate trench 101. Thereby, the contact electrode 133 is electrically connected to the second bottom-side electrode 106.

The second intermediate insulation layer 108 is interposed between the contact electrode 133 and the second opening-side electrode 107 inside the second gate trench 101. Thereby, the contact electrode 133 is electrically insulated from the second opening-side electrode 107 inside the second gate trench 101.

The contact electrode 133 may include at least any one of conductive polysilicon, tungsten, aluminum, copper, an aluminum alloy, and a copper alloy. In this embodiment, the contact electrode 133 may include conductive polysilicon. The conductive polysilicon may include an n-type impurity or a p-type impurity. The conductive polysilicon preferably includes an n-type impurity. It is preferable that the contact electrode 133 includes the same conductive material as the first bottom-side electrode 86 and the second bottom-side electrode 106.

In this embodiment, an exposed portion which is exposed from the contact trench 131 in the contact electrode 133 is positioned at the bottom wall 123 side of the contact trench 131 with respect to the first main surface 3. The exposed portion of the contact electrode 133 is formed in a curved shape toward the bottom wall 123 of the contact trench 131.

The exposed portion of the contact electrode 133 is covered by a third cap insulation layer 139 which is formed in a film shape. The third cap insulation layer 139 is continuous with the contact insulation layer 132 inside the contact trench 131. The third cap insulation layer 139 may include silicon oxide ($SiO_2$).

With reference to FIG. 5 to FIG. 11, the semiconductor device 1 includes a main surface insulation layer 141 which is formed on the first main surface 3 of the semiconductor layer 2. The main surface insulation layer 141 selectively covers the first main surface 3. The main surface insulation layer 141 is continuous with the first insulation layer 82, the second insulation layer 102, and the contact insulation layer 132. The main surface insulation layer 141 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The main surface insulation layer 141 may have a laminated structure including an SiN layer and an $SiO_2$ layer formed in that order from the semiconductor layer 2 side. The main surface insulation layer 141 may have a laminated structure including an $SiO_2$ layer and an SiN layer formed in that order from the semiconductor layer 2 side. The main surface insulation layer 141 has a single layer structure composed of an $SiO_2$ layer or an SiN layer. In this embodiment, the main surface insulation layer 141 has a single layer structure composed of an $SiO_2$ layer. In this embodiment, the main surface insulation layer 141 has a single layer structure composed of an $SiO_2$ layer. The main surface insulation layer 141 is preferably composed of the same insulating material as the first insulation layer 82, the second insulation layer 102, and the contact insulation layer 132.

The semiconductor device 1 includes an interlayer insulation layer 142 is formed on the main surface insulation layer 141. The interlayer insulation layer 142 may have a thickness in excess of a thickness of the main surface insulation layer 141. The interlayer insulation layer 142 covers a substantially entire region of the main surface insulation layer 141. The interlayer insulation layer 142 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

In this embodiment, the interlayer insulation layer 142 includes a USG (Undoped Silica Glass) layer as an example of silicon oxide. The interlayer insulation layer 142 may have a single layer structure composed of a USG layer. The interlayer insulation layer 142 may have a flattened main surface. The main surface of the interlayer insulation layer 142 may be a ground surface which is ground by a CMP (Chemical Mechanical Polishing) method.

The interlayer insulation layer 142 may include PSG (Phosphor Silicate Glass) and/or BPSG (Boron Phosphor Silicate Glass) as an example of silicon oxide. The interlayer insulation layer 142 may have a laminated structure which includes a PSG layer and a BPSG layer which are laminated in this order from the semiconductor layer 2 side. The interlayer insulation layer 142 may have a laminated structure including a BPSG layer and a PSG layer which are laminated in this order from the first main surface 3 side.

With reference to FIG. 5 and FIG. 6, a first plug electrode 143, a second plug electrode 144, a third plug electrode 145, and a fourth plug electrode 146 are embedded in the interlayer insulation layer 142 in the output region 6. In this embodiment, the plurality of first plug electrodes 143, the plurality of second plug electrodes 144, the plurality of third plug electrodes 145, and the plurality of fourth plug electrodes 146 are embedded in the interlayer insulation layer 142. The first plug electrode 143, the second plug electrode 144, the third plug electrode 145, and the fourth plug electrode 146 may each include tungsten.

The plurality of first plug electrodes 143 are each embedded in a part which covers the first opening-side electrode 87 of the first trench gate structure 60 in the interlayer insulation layer 142. In this embodiment, the plurality of first plug electrodes 143 penetrate through the interlayer insulation layer 142 in a region of the first trench gate structure 60 at one end portion side and are connected to the plurality of first opening-side electrodes 87 in a one-to-one correspondence.

As a matter of course, the plurality of first plug electrodes 143 may be connected to one first opening-side electrode 87. Although not shown in the drawing, the plurality of first plug electrodes 143 are also embedded in a part which covers a region of the first trench gate structure 60 at the other end portion side of the interlayer insulation layer 142 in a manner similar to a region thereof at one end portion side.

In this embodiment, the plurality of first plug electrodes 143 are arrayed on a line at an interval along the first direction X. Each of the first plug electrodes 143 may be formed in a polygonal shape such as a triangular shape, a rectangular shape, a pentagonal shape, a hexagonal shape, etc., or in a circular shape or an elliptical shape in plan view. In this embodiment, each of the first plug electrodes 143 is formed in a rectangular shape in plan view.

The plurality of second plug electrodes 144 are each embedded in a part which covers the second opening-side electrode 107 of the second trench gate structure 70 in the interlayer insulation layer 142. In this embodiment, the plurality of second plug electrodes 144 penetrate through the interlayer insulation layer 142 in a region of the second trench gate structure 70 at one end portion side and are connected to the plurality of second opening-side electrodes 107 in a one-to-one correspondence.

As a matter of course, the plurality of second plug electrodes 144 may be connected to one second opening-side electrode 107. Although not shown in the drawing, the plurality of second plug electrodes 144 are also embedded in a part which covers a region of the second trench gate structure 70 at the other end portion side of the interlayer insulation layer 142 in a manner similar to a region thereof at one end portion side.

In this embodiment, the plurality of second plug electrodes 144 are arrayed on a line at an interval along the first direction X. Each of the second plug electrodes 144 may be formed in a polygonal shape such as a triangular shape, a rectangular shape, a pentagonal shape, a hexagonal shape, etc., or in a circular shape or an elliptical shape in plan view. In this embodiment, the second plug electrode 144 is formed in a rectangular shape in plan view.

The plurality of third plug electrodes 145 are each embedded in a part which covers the contact electrode 133 in the interlayer insulation layer 142. The plurality of third plug electrodes 145 penetrate through the interlayer insulation layer 142 and are connected to the contact electrode 133.

Although not shown in the drawing, the plurality of third plug electrodes 145 are also embedded in a part which covers the contact electrode 133 of the trench contact structure 120 at the other side of the interlayer insulation layer 142 in a manner similar to a region thereof at one end portion side.

In this embodiment, the plurality of third plug electrodes 145 are arrayed on a line at an interval along the first direction X. Each of the third plug electrodes 145 may be formed in a polygonal shape such as a triangular shape, a rectangular shape, a pentagonal shape, a hexagonal shape, etc., or in a circular shape or an elliptical shape in plan view. In this embodiment, each of the third plug electrodes 145 is formed in a rectangular shape in plan view.

The plurality of fourth plug electrodes 146 are each embedded in parts which cover the plurality of cell regions 75 in the interlayer insulation layer 142. Each of the fourth plug electrodes 146 penetrates through the interlayer insulation layer 142 and is connected to each of the cell regions 75. Specifically, each of the fourth plug electrodes 146 is electrically connected to the first source region 92, the first contact region 93, the second source region 112, and the second contact region 113 in each of the cell regions 75.

Each of the fourth plug electrodes 146 is formed in a band shape extending along the each of the cell regions 75 in plan view. A length of each fourth plug electrode 146 in the second direction Y may be less than a length of each cell region 75 in the second direction Y.

As a matter of course, the plurality of fourth plug electrodes 146 may be connected to each of the cell regions 75. In this case, the plurality of fourth plug electrodes 146 are formed at an interval along each of the cell regions 75. Further, in this case, each of the fourth plug electrodes 146 may be formed in a polygonal shape such as a triangular shape, a rectangular shape, a pentagonal shape, a hexagonal shape, etc., or in a circular shape or an elliptical shape in plan view.

The source electrode 12 and the gate control wiring 17 aforementioned are formed on the interlayer insulation layer 142 in the output region 6. The source electrode 12 is electrically connected to the plurality of fourth plug electrodes 146 collectively on the interlayer insulation layer 142. The reference voltage (for example, the ground voltage) is applied to the source electrode 12. The reference voltage is transmitted to the first source region 92, the first contact region 93, the second source region 112, and the second contact region 113 through the plurality of fourth plug electrodes 146.

The first gate control wiring 17A of the gate control wiring 17 is electrically connected to the plurality of first plug electrodes 143 on the interlayer insulation layer 142. The gate control signal from the control IC 10 is input to the first gate control wiring 17A. The gate control signal is transmitted to the first opening-side electrode 87 through the first gate control wiring 17A and the plurality of first plug electrodes 143.

The second gate control wiring 17B of the gate control wiring 17 is electrically connected to the plurality of second plug electrodes 144 on the interlayer insulation layer 142. The gate control signal from the control IC 10 is input to the second gate control wiring 17B. The gate control signal is transmitted to the second opening-side electrode 107 through the second gate control wiring 17B and the plurality of second plug electrodes 144.

The third gate control wiring 17C of the gate control wiring 17 is electrically connected to the plurality of third plug electrodes 145 on the interlayer insulation layer 142. The gate control signal from the control IC 10 is input to the third gate control wiring 17C. The gate control signal is transmitted to the contact electrode 133 through the third gate control wiring 17C and the plurality of third plug electrodes 145. That is, the gate control signal from the control IC 10 is transmitted to the first bottom-side electrode 86 and the second bottom-side electrode 106 through the contact electrode 133.

In a case where the first MISFET 56 (first trench gate structure 60) and the second MISFET 57 (second trench gate structure 70) are both controlled to be in the OFF states, the first channel region 91 and the second channel region 111 are both controlled to be in the OFF states.

In a case where the first MISFET 56 and the second MISFET 57 are both controlled to be in the ON states, the first channel region 91 and the second channel region 111 are both controlled to be in the ON states (Full-ON control).

In a case where the first MISFET 56 is controlled to be in the ON state while the second MISFET 57 is controlled to be in the OFF state, the first channel region 91 is controlled to be in the ON state and the second channel region 111 is controlled to be in the OFF state (first Half-ON control).

In a case where the first MISFET 56 is controlled to be in the OFF state while the second MISFET 57 is controlled to be in the ON state, the first channel region 91 is controlled to be in the OFF state and the second channel region 111 is controlled to be in the ON state (second Half-ON control).

As described above, in the power MISFET 9, the first MISFET 56 and the second MISFET 57 formed in one output region 6 are used to realize plural types of control including Full-ON control, first Half-ON control, and second Half-ON control.

When the first MISFET 56 is driven (that is, when the gate is controlled to be in the ON state), the ON signal Von may be applied to the first bottom-side electrode 86 and the ON signal Von may be applied to the first opening-side electrode 87. In this case, the first bottom-side electrode 86 and the first opening-side electrode 87 each function as a gate electrode.

Thereby, it is possible to suppress a voltage drop between the first bottom-side electrode 86 and the first opening-side electrode 87 and therefore it is possible to suppress an electric field concentration between the first bottom-side electrode 86 and the first opening-side electrode 87. It is also possible to reduce an ON resistance of the semiconductor layer 2 and therefore it is thereby possible to reduce electricity consumption.

When the first MISFET 56 is driven (that is, when the gate is controlled to be in the ON state), the OFF signal Voff (for example, the reference voltage) may be applied to the first bottom-side electrode 86 and the ON signal Von may be applied to the first opening-side electrode 87. In this case, while the first bottom-side electrode 86 functions as a field electrode, the first opening-side electrode 87 functions as a gate electrode. Thereby, it is possible to reduce a parasitic capacitance and therefore it is possible to improve a switching speed.

When the second MISFET 57 is driven (that is, when the gate is controlled to be in the ON state), the ON signal Von may be applied to the second bottom-side electrode 106 and the ON signal Von may be applied to the second opening-side electrode 107. In this case, the second bottom-side electrode 106 and the second opening-side electrode 107 each function as a gate electrode.

Thereby, it is possible to suppress a voltage drop between the second bottom-side electrode 106 and the second opening-side electrode 107 and therefore it is possible to suppress an electric field concentration between the second bottom-side electrode 106 and the second opening-side electrode 107. It is also possible to reduce an ON resistance of the semiconductor layer 2 and therefore it is possible to reduce electricity consumption.

When the second MISFET 57 is driven (that is, when the gate is controlled to be in the ON state), the OFF signal Voff (reference voltage) may be applied to the second bottom-side electrode 106 and the ON signal Von may be applied to the second opening-side electrode 107. In this case, while the second bottom-side electrode 106 functions as a field electrode, the second opening-side electrode 107 functions as a gate electrode. Thereby, it is possible to reduce a parasitic capacitance and therefore it is possible to improve a switching speed.

With reference to FIG. 7 and FIG. 8, the first channel region 91 is formed in each of the cell regions 75 at a first channel area S1. The first channel area S1 is defined by a total planar area of the plurality of first source regions 92 formed in each of the cell regions 75.

The first channel region 91 is formed in each of the cell regions 75 at a first channel rate R1 (first rate). The first channel rate R1 is a rate which is occupied by the first channel area S1 in each of the cell regions 75 when a planar area of each cell region 75 is given as 100%.

The first channel rate R1 is adjusted to a range from not less than 0% to not more than 50%. The first channel rate R1 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The first channel rate R1 is preferably from not less than 10% to not more than 35%.

In a case where the first channel rate R1 is 50%, the first source region 92 is formed in a substantially entire region of the first side wall 61 and the second side wall 62 of the first trench gate structure 60. In this case, no first contact region 93 is formed at the first side wall 61 side or the second side wall 62 side of the first trench gate structure 60. The first channel rate R1 is preferably less than 50%.

In a case where the first channel rate R1 is 0%, no first source region 92 is formed in the first side wall 61 side or the second side wall 62 side of the first trench gate structure 60. In this case, only the body region 55 and/or the first contact region 93 are formed in the first side wall 61 side and the second side wall 62 side of the first trench gate structure 60. The first channel rate R1 is preferably in excess of 0%. In this embodiment, an example in which the first channel rate R1 is 25% is shown.

The second channel region 111 is formed in each of the cell regions 75 at a second channel area S2. The second channel area S2 is defined by a total planar area of the plurality of second source regions 112 formed in each of the cell regions 75.

The second channel region 111 is formed in each of the cell regions 75 at a second channel rate R2 (second rate). The second channel rate R2 is a rate which is occupied by the second channel area S2 in each of the cell regions 75 when a planar area of each of the cell regions 75 is given as 100%.

The second channel rate R2 is adjusted to a range from not less than 0% to not more than 50%. The second channel rate R2 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The second channel rate R2 is preferably from not less than 10% to not more than 35%.

In a case where the second channel rate R2 is 50%, the second source region 112 is formed in a substantially entire region of the first side wall 71 side and the second side wall 72 side of the second trench gate structure 70. In this case, no second contact region 113 is formed in the first side wall 71 side or the second side wall 72 side of the second trench gate structure 70. The second channel rate R2 is preferably less than 50%.

In a case where the second channel rate R2 is 0%, no second source region 112 is formed in the first side wall 71 side or the second side wall 72 side of the second trench gate structure 70. In this case, only the body region 55 and/or the second contact region 113 are formed in the first side wall 71 side and the second side wall 72 side of the second trench gate structure 70. The second channel rate R2 is preferably in excess of 0%. In this embodiment, an example in which the second channel rate R2 is 25% is shown.

As described above, the first channel region 91 and the second channel region 111 are formed in each of the cell regions 75 at a total channel rate RT (RT=R1+R2) from not less than 0% to not more than 100% (preferably in excess of 0% to less than 100%).

In this embodiment, the total channel rate RT in each of the cell regions 75 is 50%. In this embodiment, the total channel rates RT are all set at an equal value. Therefore, an average channel rate RAV inside the output region 6 (unit area) is given as 50%. The average channel rate RAV is such that a sum of all of the total channel rates RT is divided by a total number of the total channel rates RT.

Figure 12A:
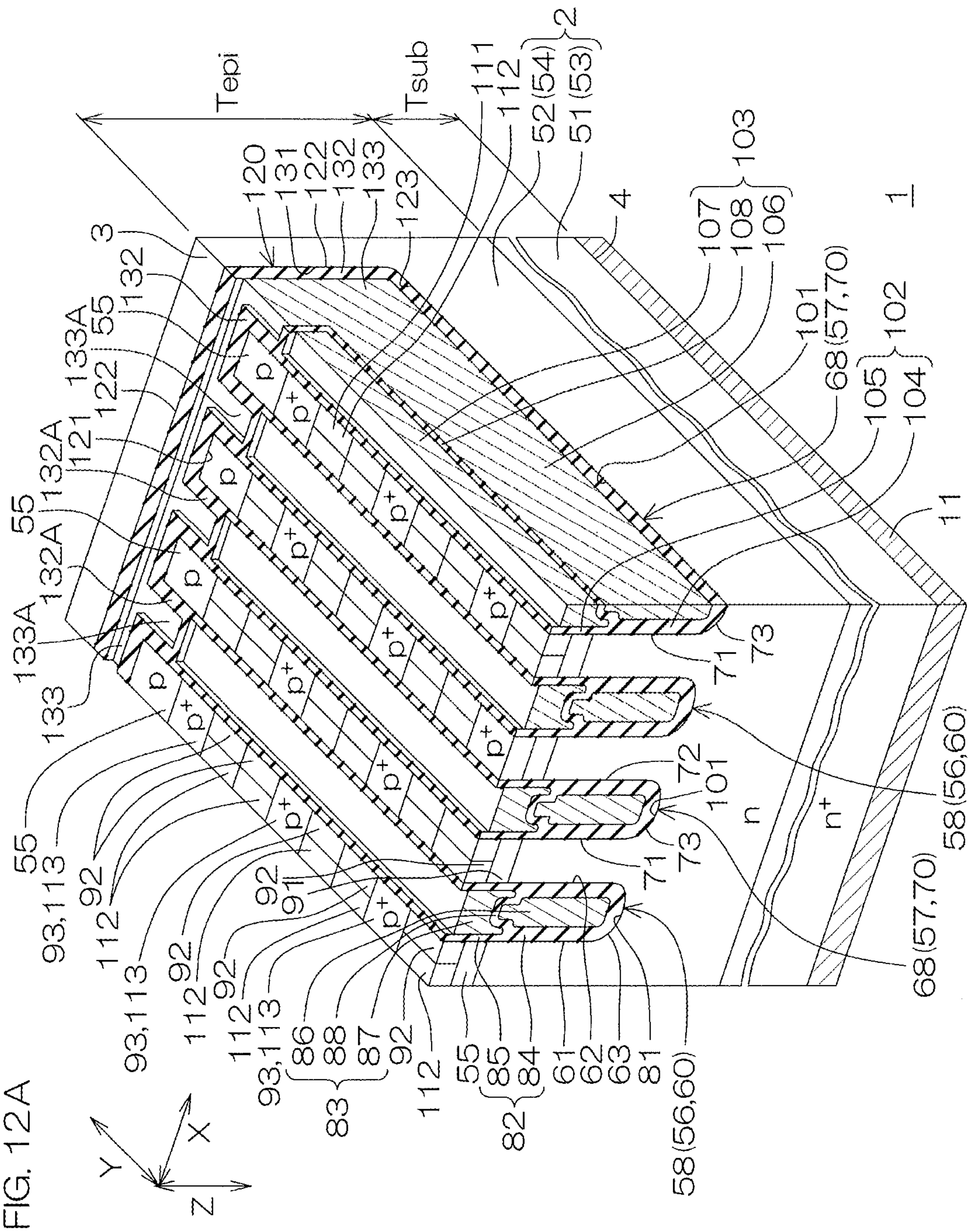
FIG. 12A is a sectional perspective view of a region corresponding to FIG. 7 and is a sectional perspective view which shows a configuration including a channel structure according to a second configuration example.
Figure 12B:
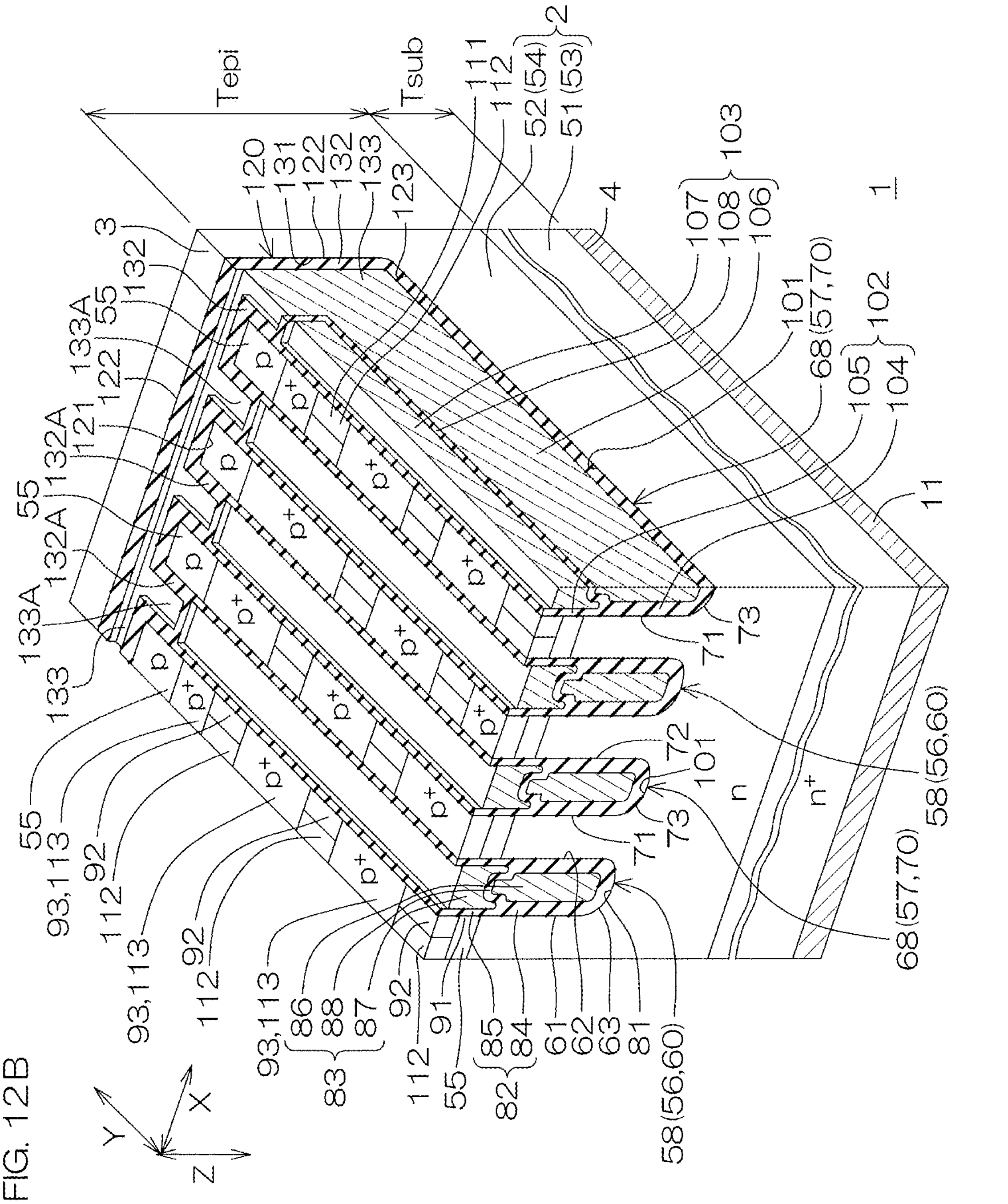
FIG. 12B is a sectional perspective view of a region corresponding to FIG. 7 and is a sectional perspective view which shows a configuration including a channel structure according to a third configuration example.

Hereinafter, in FIG. 12A and FIG. 12B, a configuration example in which the average channel rate RAV is adjusted is shown. FIG. 12A is a sectional perspective view of a region corresponding to FIG. 7 and is a sectional perspective view which shows a configuration including a channel structure according to a second configuration example. FIG. 12B is a sectional perspective view of a region corresponding to FIG. 7 and is a sectional perspective view which shows a configuration including a channel structure according to a third configuration example.

In FIG. 12A, a configuration example in which the average channel rate RAV is adjusted to approximately 66% is shown. The total channel rate RT of each of the cell regions 75 is approximately 66%. In FIG. 12B, a configuration example in which the average channel rate RAV is adjusted to 33% is shown. The total channel rate RT of each of the cell regions 75 is 33%.

The total channel rate RT may be adjusted for each cell region 75. That is, the plurality of total channel rates RT different in value from each other may be each applied to each of the cell regions 75. The total channel rate RT relates to a temperature rise of the semiconductor layer 2. For example, an increase in the total channel rate RT causes a temperature rise of the semiconductor layer 2 to occur easily. On the other hand, a reduction in the total channel rate RT causes a temperature rise of the semiconductor layer 2 not to occur easily.

By using the above, the total channel rate RT may be adjusted according to a temperature distribution of the semiconductor layer 2. For example, the total channel rate RT of a region in which a temperature rise easily occurs in the semiconductor layer 2 may be made relatively small, and the total channel rate RT of a region in which a temperature rise does not easily occur in the semiconductor layer 2 may be made relatively large.

A central portion of the output region 6 can be given as an example of a region in which a temperature rise easily occurs in the semiconductor layer 2. A peripheral portion of the output region 6 can be given as an example of a region in which a temperature rise does not easily occur in the semiconductor layer 2. As a matter of course, the average channel rate RAV may be adjusted while the total channel rate RT is adjusted according to a temperature distribution of the semiconductor layer 2.

The plurality of cell regions 75 having the total channel rate RT of not less than 20% to not more than 40% (for example, 25%) may be concentrated at a region in which a temperature rise easily occurs (for example, a central portion). The plurality of cell regions 75 having the total channel rate RT of not less than 60% to not more than 80% (for example, 75%) may be concentrated at a region in which a temperature rise does not easily occur (for example, a peripheral portion). The plurality of cell regions 75 having the total channel rate RT in excess of 40% and less than 60% (for example, 50%) may be concentrated between a region in which a temperature rise easily occurs and a region in which a temperature rise does not easily occur.

Further, the total channel rate RT of not less than 20% to not more than 40%, the total channel rate RT of not less than 40% to not more than 60%, and the total channel rate RT of not less than 60% to not more than 80% may be applied to the plurality of cell regions 75 in a regular arrangement.

As an example, three types of total channel rates RT which sequentially repeat in a pattern of 25% (low)→50% (middle)→75% (high) may be applied to the plurality of cell regions 75. In this case, the average channel rate RAV may be adjusted to 50%. In the case of the above-described structure, it is possible to suppress, with a relatively simple design, a biased temperature distribution in the semiconductor layer 2 to be formed. A specific configuration to which the above structure is applied is shown in the next preferred embodiment.

Figure 13:
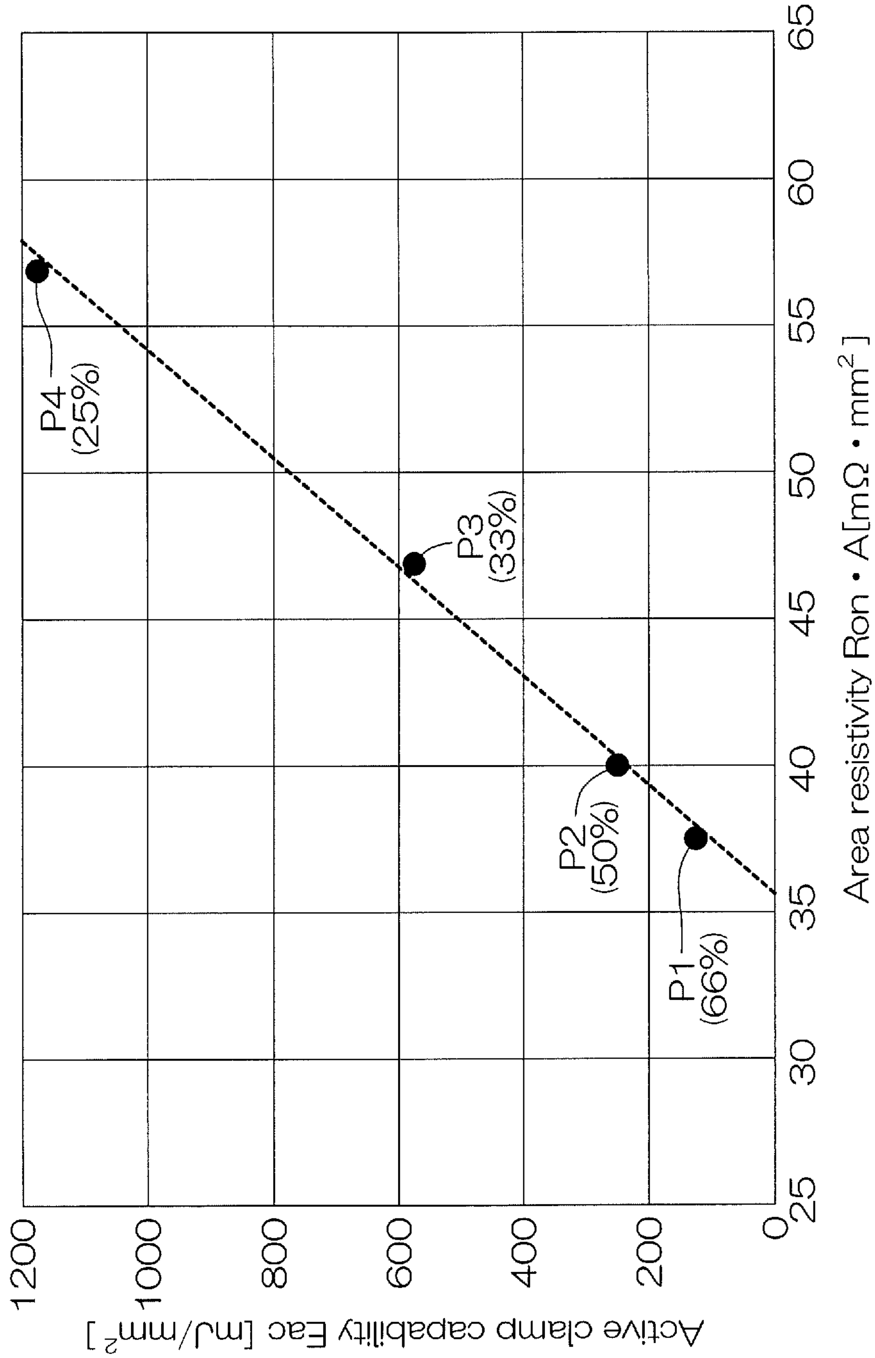
FIG. 13 is a graph which is obtained by an actual measurement of a relationship between an active clamp capability and an area resistivity.

FIG. 13 is a graph which is obtained by an actual measurement of a relationship between the active clamp capability Eac and an area resistivity Ron·A. The graph of FIG. 13 shows the characteristics where the first MISFET 56 and the second MISFET 57 are simultaneously controlled to be in the ON states and to be in the OFF states.

In FIG. 13, the vertical axis indicates the active clamp capability Eac [$mJ/mm^2$], while the horizontal axis indicates the area resistivity Ron·A [$m\Omega \cdot mm^2$]. As has been described in FIG. 3, the active clamp capability Eac is the capability with respect to the counter electromotive force. The area resistivity Ron·A expresses the ON resistance inside the semiconductor layer 2 in the normal operation.

A first plot point P1, a second plot point P2, a third plot point P3, and a fourth plot point P4 are shown in FIG. 13. The first plot point P1, the second plot point P2, the third plot point P3, and the fourth plot point P4 show the respective characteristics where the average channel rate RAV (that is, a total channel rate RT occupied in each of the cell regions 75) is adjusted to 66%, 50%, 33%, and 25%.

In a case where the average channel rate RAV was increased, the area resistivity Ron·A was reduced in the normal operation and the active clamp capability Eac was reduced in the active clamp operation. In contrast thereto, where the average channel rate RAV was reduced, the area resistivity Ron·A was increased in the normal operation and the active clamp capability Eac was improved in the active clamp operation.

In view of the area resistivity Ron·A, the average channel rate RAV is preferably not less than 33% (specifically, from not less than 33% to less than 100%). In view of the active clamp capability Eac, the average channel rate RAV is preferably less than 33% (specifically, in excess of 0% and less than 33%).

The area resistivity Ron·A was reduced due to an increase in the average channel rate RAV, and this is because of an increase in current path. The active clamp capability Eac was reduced due to an increase in the average channel rate RAV, and this is because of a sharp temperature rise due to the counter electromotive force.

In particular, in a case where the average channel rate RAV (total channel rate RT) is relatively large, it is more likely that a local and sharp temperature rise may occur in a region between the first trench gate structure 60 and the second trench gate structure 70 which are adjacent to each other. It is considered that the active clamp capability Eac was reduced due to this type of temperature rise.

On the other hand, the area resistivity Ron·A was increased due to a reduction in the average channel rate RAV, and this is because of shrinkage of the current path. The active clamp capability Eac was improved due to a reduction in the average channel rate RAV, and this is considered to be because the average channel rate RAV (total channel rate RT) was made relatively small and a local and sharp temperature rise was suppressed.

From the results of the graph of FIG. 13, it is found that an adjustment method based on the average channel rate RAV (total channel rate RT) has a trade-off relationship and therefore there is a difficulty in realizing an excellent area resistivity Ron·A and an excellent active clamp capability Eac at the same time independently of the trade-off relationship.

On the other hand, from the results of the graph of FIG. 13, it is found that, by making the power MISFET 9 operate such as to approach the first plot point P1 (RAV=66%) in the normal operation and operate such as to approach the fourth plot point P4 (RAV=25%) in the active clamp operation, it is possible to realize an excellent area resistivity Ron·A and an excellent active clamp capability Eac at the same time. Thus, in this embodiment, the following control is performed.

Figure 14A:
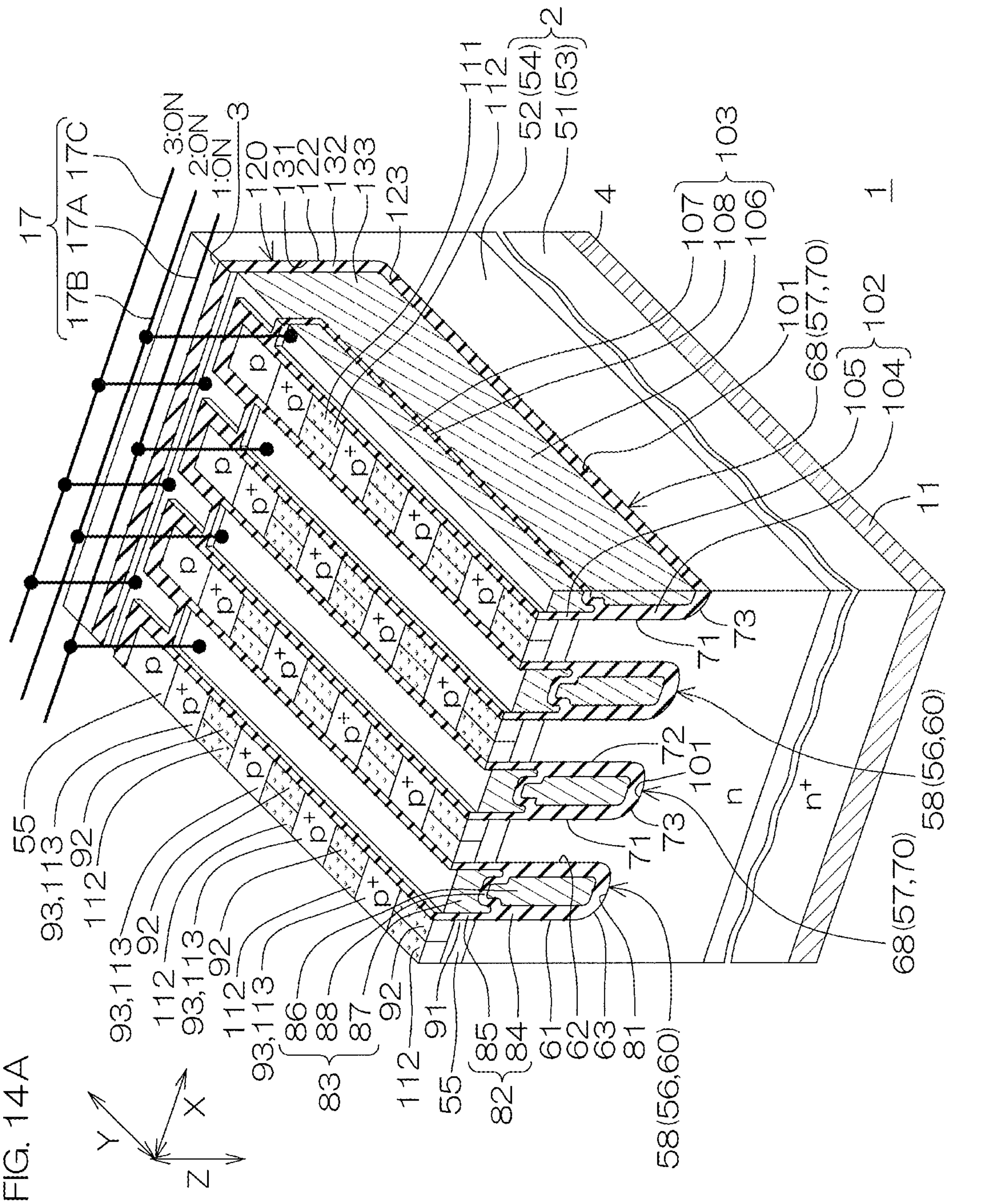
FIG. 14A is a sectional perspective view for describing a normal operation according to a first control example of the semiconductor device shown in FIG. 1.
Figure 14B:
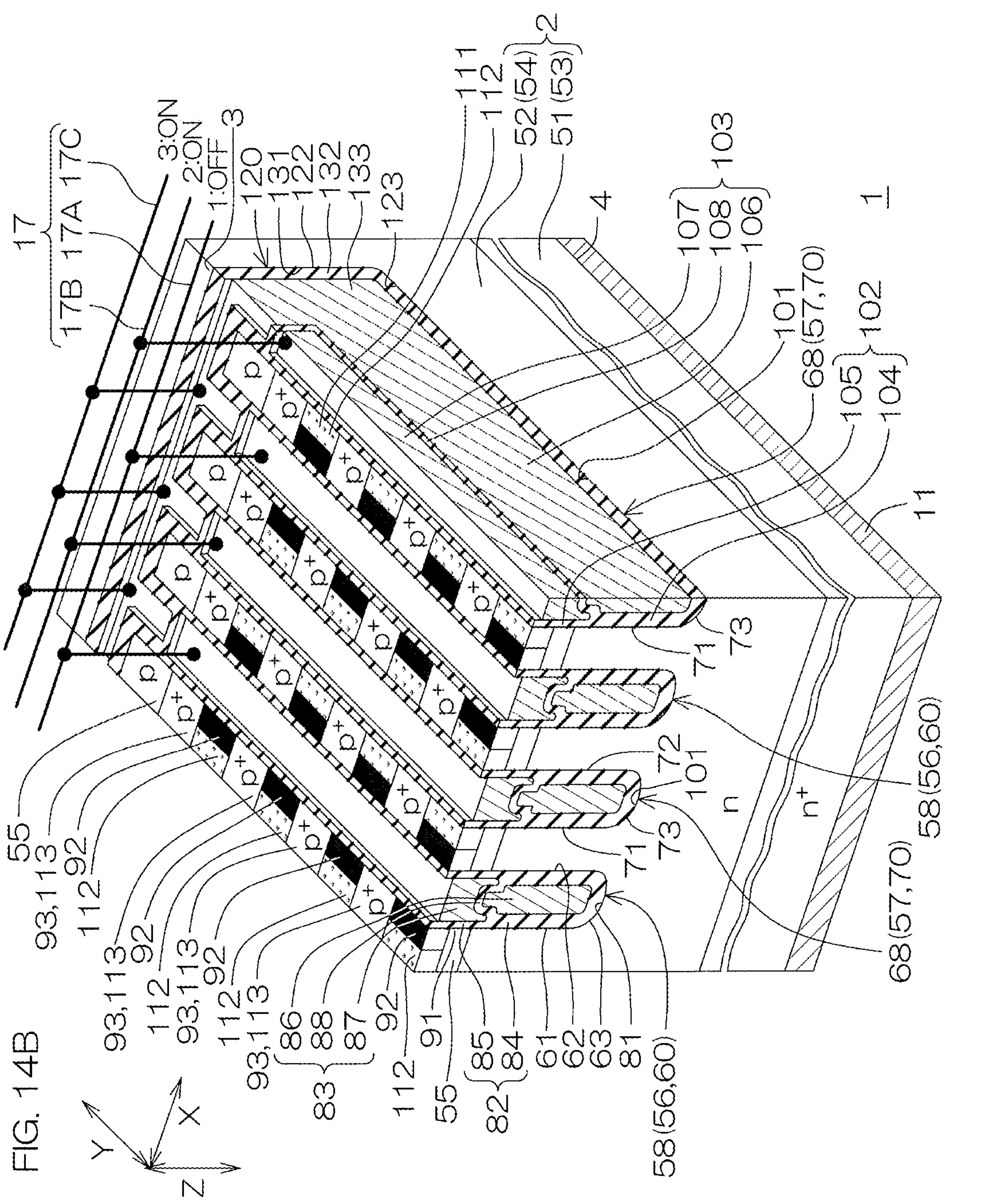
FIG. 14B is a sectional perspective view for describing an active clamp operation according to the first control example of the semiconductor device shown in FIG. 1.

FIG. 14A is a sectional perspective view for describing the normal operation according to a first control example of the semiconductor device 1 shown in FIG. 1. FIG. 14B is a sectional perspective view for describing the active clamp operation according to the first control example of the semiconductor device 1 shown in FIG. 1. In FIG. 14A and FIG. 14B, for convenience of description, structures in the first main surface 3 are omitted and the gate control wiring 17 is simplified.

With reference to FIG. 14A, when the power MISFET 9 is in the normal operation, a first ON signal Von1 is input to the first gate control wiring 17A, a second ON signal Von2 is input to the second gate control wiring 17B, and a third ON signal Von3 is input to the third gate control wiring 17C.

The first ON signal Von1, the second ON signal Von2, and the third ON signal Von3 are each input from the control IC 10. The first ON signal Von1, the second ON signal Von2, and the third ON signal Von3 each have a voltage equal to or higher than the gate threshold voltage Vth. The first ON signal Von1, the second ON signal Von2, and the third ON signal Von3 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 14A, the first channel region 91 and the second channel region 111 in the ON states are indicated by dotted hatching.

As a result, the first MISFET 56 and the second MISFET 57 are both driven (Full-ON control). A channel utilization rate RU in the normal operation is 100%. A characteristics channel rate RC in the normal operation is 50%. The channel utilization rate RU is a rate of the first channel region 91 and the second channel region 111 which are controlled in the ON state, of the first channel region 91 and the second channel region 111.

The characteristics channel rate RC is a value obtained by multiplying the average channel rate RAV by a channel utilization rate RU (RC=RAV×RU). The characteristics (the area resistivity Ron·A and the active clamp capability Eac) of the power MISFET 9 are determined based on the characteristics channel rate RC. Thereby, the area resistivity Ron·A approaches the area resistivity Ron·A indicated by the second plot point P2 in the graph of FIG. 13.

On the other hand, with reference to FIG. 14B, when the power MISFET 9 is in the active clamp operation, an OFF signal Voff is input to the first gate control wiring 17A, a first clamp ON signal VCon1 is input to the second gate control wiring 17B, and a second clamp ON signal VCon2 is input to the third gate control wiring 17C.

The OFF signal Voff, the first clamp ON signal VCon1, and the second clamp ON signal VCon2 are each input from the control IC 10. The OFF signal Voff has a voltage less than the gate threshold voltage Vth (for example, the reference voltage). The first clamp ON signal VCon1 and the second clamp ON signal VCon2 each have a voltage equal to or higher than the gate threshold voltage Vth. The first clamp ON signal VCon1 and the second clamp ON signal VCon2 may each have an equal voltage. The first clamp ON signal VCon1 and the second clamp ON signal VCon2 may have a voltage not more than or less than a voltage in the normal operation.

In this case, the first opening-side electrode 87 is put into the OFF state, and the first bottom-side electrode 86, the second bottom-side electrode 106, and the second opening-side electrode 107 are each put into the ON state. Thereby, the first channel region 91 is controlled to be in the OFF state, and the second channel region 111 is controlled to be in the ON state. In FIG. 14B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In the first control example, a description has been given of an example in which the second Half-ON control is applied in the active clamp operation. However, the first Half-ON control may be applied in the active clamp operation.

Figure 15A:
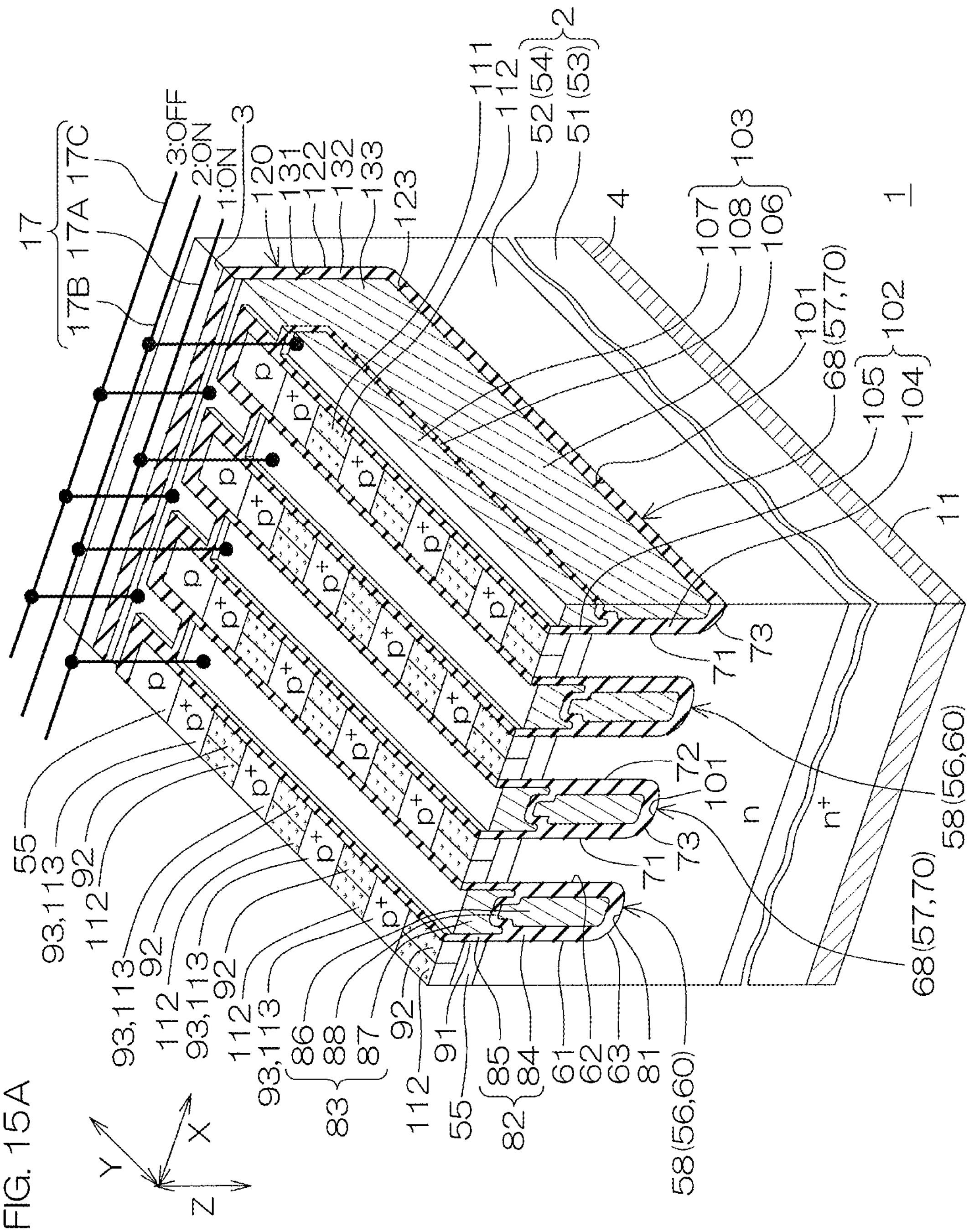
FIG. 15A is a sectional perspective view for describing a normal operation according to a second control example of the semiconductor device shown in FIG. 1.
Figure 15B:
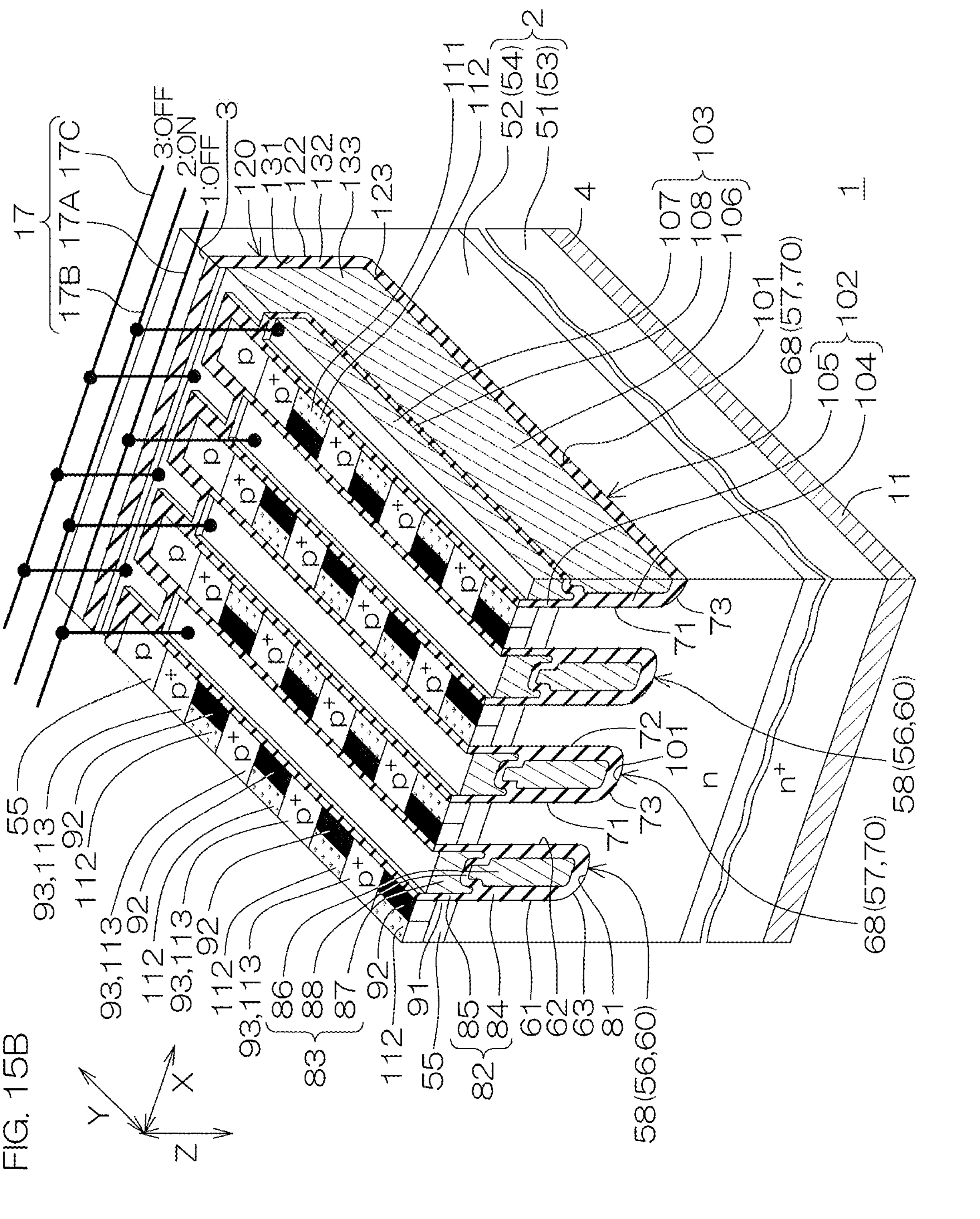
FIG. 15B is a sectional perspective view for describing an active clamp operation according to the second control example of the semiconductor device shown in FIG. 1.

FIG. 15A is a sectional perspective view for describing the normal operation according to a second control example of the semiconductor device 1 shown in FIG. 1. FIG. 15B is a sectional perspective view for describing the active clamp operation according to the second control example of the semiconductor device 1 shown in FIG. 1. In FIG. 15A and FIG. 15B, for convenience of description, structures in the first main surface 3 are omitted and the gate control wiring 17 is simplified.

With reference to FIG. 15A, when the power MISFET 9 is in the normal operation, a first ON signal Von1 is input to the first gate control wiring 17A, a second ON signal Von2 is input to the second gate control wiring 17B, and the OFF signal Voff is input to the third gate control wiring 17C.

The first ON signal Von1, the second ON signal Von2, and the OFF signal Voff are each input from the control IC 10. The first ON signal Von1 and the second ON signal Von2 each have a voltage not less than the gate threshold voltage Vth. The first ON signal Von1 and the second ON signal Von2 may each have an equal voltage. The OFF signal Voff has a voltage less than the gate threshold voltage Vth (for example, the reference voltage).

In this case, the first opening-side electrode 87 and the second opening-side electrode 107 are each put into the ON state, and the first bottom-side electrode 86 and the second bottom-side electrode 106 are each put into the OFF state. That is, while the first opening-side electrode 87 and the second opening-side electrode 107 each function as a gate electrode, the first bottom-side electrode 86 and the second bottom-side electrode 106 each function as a field electrode.

Thereby, the first channel region 91 and the second channel region 111 are both controlled to be in the ON states. In FIG. 15A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 15B, when the power MISFET 9 is in the active clamp operation, a first OFF signal Voff1 is input to the first gate control wiring 17A, a clamp ON signal VCon is input to the second gate control wiring 17B, and a second OFF signal Voff2 is input to the third gate control wiring 17C.

The first OFF signal Voff1, the clamp ON signal VCon, and the second OFF signal Voff2 are each input from the control IC 10. The first OFF signal Voff1 has a voltage less than the gate threshold voltage Vth (for example, the reference voltage). The clamp ON signal VCon has a voltage not less than the gate threshold voltage Vth. The clamp ON signal VCon may have a voltage not more than or less than a voltage in the normal operation. The second OFF signal Voff2 has a voltage value less than the gate threshold voltage Vth (for example, the reference voltage).

In this case, the first opening-side electrode 87, the first bottom-side electrode 86, and the second bottom-side electrode 106 are each put into the OFF state, and the second opening-side electrode 107 is put into the ON state. Thereby, the first channel region 91 is controlled to be in the OFF state, and the second channel region 111 is controlled to be in the ON state. In FIG. 15B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In the second control example, a description has been given of an example in which the second Half-ON control in the active clamp operation is applied. However, in the active clamp operation, the first Half-ON control may be applied As described above, the semiconductor device 1 includes the IPD (Intelligent Power Device) formed in the semiconductor layer 2. The IPD includes the power MISFET 9 and the control IC 10 which controls the power MISFET 9. Specifically, the power MISFET 9 includes the first MISFET 56 and the second MISFET 57. The control IC 10 controls the first MISFET 56 and the second MISFET 57 individually.

Specifically, the control IC 10 controls the first MISFET 56 and the second MISFET 57 to be in the ON states in (during) the normal operation, and controls the first MISFET 56 to be in the OFF state and the second MISFET 57 to be in the ON state in (during) the active clamp operation.

Therefore, in the normal operation, a current is allowed to flow by using the first MISFET 56 and the second MISFET 57. Thereby, it is possible to reduce the area resistivity Ron·A (ON resistance).

On the other hand, in the active clamp operation, a current is allowed to flow by using the second MISFET 57 in a state where the first MISFET 56 is stopped. Therefore, the counter electromotive force can be consumed (absorbed) by the second MISFET 57. Thereby, it is possible to suppress a sharp temperature rise due to the counter electromotive force and therefore it is possible to improve the active clamp capability Eac.

Specifically, the semiconductor device 1 has the first MISFET 56 which includes the first FET structure 58 and also the second MISFET 57 which includes the second FET structure 68. The first FET structure 58 includes the first trench gate structure 60 and the first channel region 91. The second FET structure 68 includes the second trench gate structure 70 and the second channel region 111.

In this case, the control IC 10 controls the first MISFET 56 and the second MISFET 57 such that a different characteristics channel rate RC (area of channel) can be applied between the normal operation or the active clamp operation. Specifically, the control IC 10 controls the first MISFET 56 and the second MISFET 57 such that the channel utilization rate RU in the active clamp operation becomes in excess of zero and less than the channel utilization rate RU in the normal operation.

Therefore, the characteristics channel rate RC relatively increases in the normal operation. Thereby, a current path is relatively increased, and it becomes possible to reduce the area resistivity Ron·A (ON resistance). On the other hand, the characteristics channel rate RC relatively reduces in the active clamp operation. Thereby, it is possible to suppress a sharp temperature rise due to the counter electromotive force and therefore it is possible to improve the active clamp capability Eac.

Thus, it is possible to provide the semiconductor device 1 capable of realizing both of an excellent area resistivity Ron·A and an excellent active clamp capability Eac, independently of the trade-off relationship shown in FIG. 13.

Figure 16:
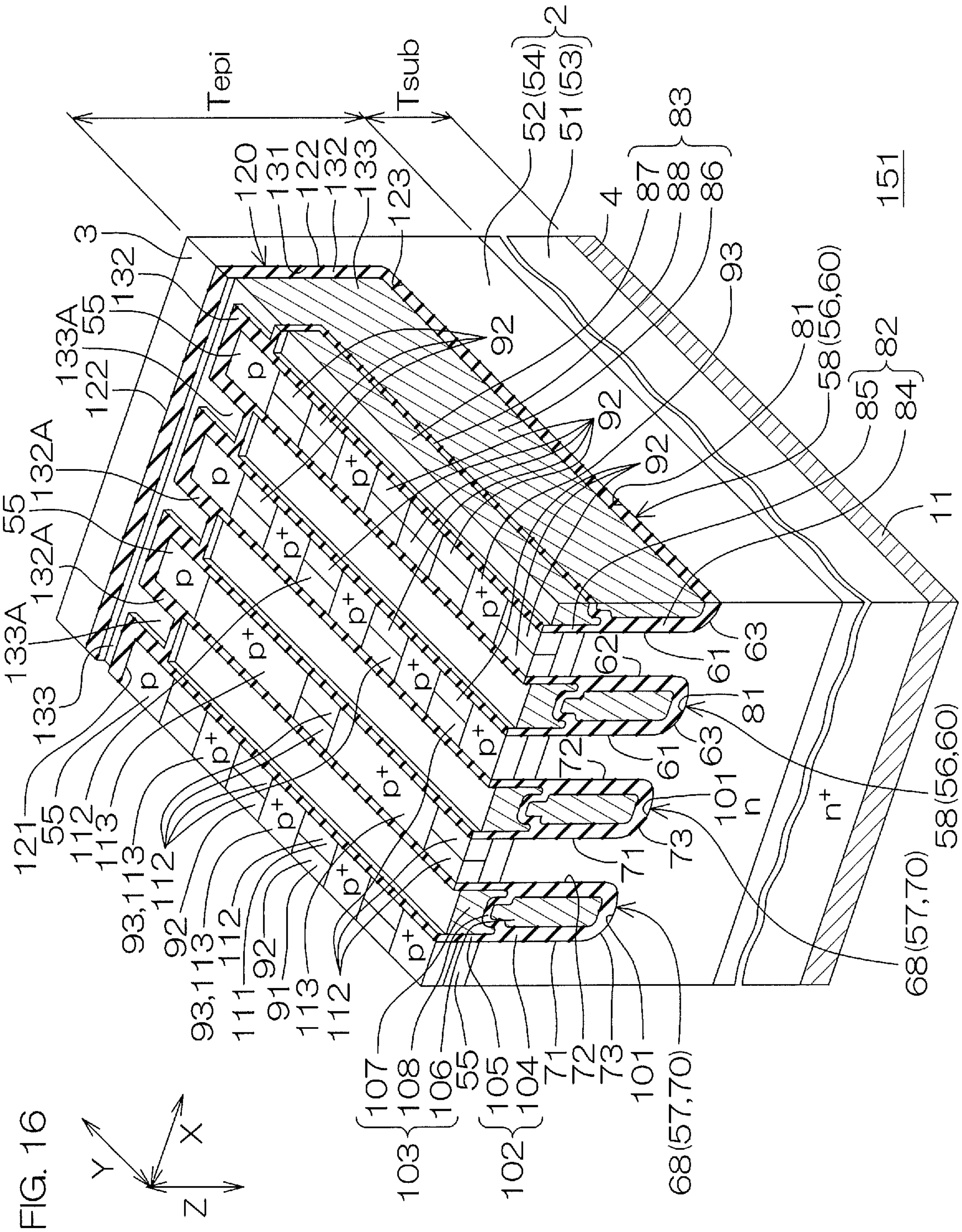
FIG. 16 is a sectional perspective view of a region corresponding to FIG. 7 and is a perspective view which shows a semiconductor device according to a second preferred embodiment of the present invention.

FIG. 16 is a sectional perspective view of a region corresponding to FIG. 7 and is a perspective view which shows a semiconductor device 151 according to the second preferred embodiment of the present invention. Hereinafter, structures corresponding to the structures described for the semiconductor device 1 shall be provided with the same reference symbols and description thereof shall be omitted.

In the semiconductor device 1, the plurality of first FET structures 58 and the plurality of second FET structures 68 are formed in the manner that one first FET structure 58 and one second FET structure 68 are alternately arrayed. In contrast thereto, in the semiconductor device 151, the plurality of first FET structures 58 and the plurality of second FET structures 68 are formed in a manner that a group of a plurality (in this embodiment, two) of first FET structures 58 and a group of a plurality (in this embodiment, two) of second FET structures 68 are alternately arrayed.

Further, in the semiconductor device 1, the second channel rate R2 (second channel area S2) is equal to the first channel rate R1 (first channel area S1). In contrast thereto, in the semiconductor device 151, the second channel rate R2 is different from the first channel rate R1 (R1≠R2). Specifically, the second channel rate R2 is less than the first channel rate R1 (R2<R1). Hereinafter, a specific description will be given of a structure of the semiconductor device 151.

With reference to FIG. 16, in this embodiment, the plurality of cell regions 75 are each defined to a region between two first FET structures 58 which are adjacent to each other, a region between one first FET structure 58 and one second FET structure 68 which are adjacent to each other, and a region between two second FET structures 68 which are adjacent to each other.

In this embodiment, three types of total channel rates RT which are different in value from each other are applied to the plurality of cell regions 75. The three types of total channel rates RT include a first total channel rate RT1, a second total channel rate RT2, and a third total channel rate RT3.

The first total channel rate RT1 is applied to the region between two first FET structures 58 which are adjacent to each other. No second channel region 111 is formed in the region between two first FET structures 58 which are adjacent to each other, due to its structure.

The first total channel rate RT1 is a total value of the first channel rates R1 of two first FET structures 58 which are adjacent to each other. The first total channel rate RT1 may be adjusted to a range from not less than 60% to not more than 80% as an example. In this embodiment, the first total channel rate RT1 is adjusted to 75%. In the first total channel rate RT1, the first channel rate R1 on one side and the first channel rate R1 on the other side are each 37.5%.

The second total channel rate RT2 is applied to the region between one first FET structure 58 and one second FET structure 68 which are adjacent to each other. A first channel region 91 and a second channel region 111 are formed in the region between one first FET structure 58 and one second FET structure 68 which are adjacent to each other, due to its structure.

The second total channel rate RT2 is a total value of the first channel rate R1 and the second channel rate R2. The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 is applied to the region between two second FET structures 68 which are adjacent to each other. No first channel region 91 is formed in the region between two second FET structures 68 which are adjacent to each other, due to its structure.

The third total channel rate RT3 is a total value of the second channel rates R2 of two second FET structures 68 which are adjacent to each other. The third total channel rate RT3 may be adjusted to a range from not less than 20% to not more than 40% as an example. In this embodiment, the third total channel rate RT3 is adjusted to 25%. In the third total channel rate RT3, the second channel rate R2 on one side and the second channel rate R2 on the other side are each 12.5%.

The first channel region 91 occupies a rate in excess of 50% (½) of a total channel. In this embodiment, the first channel region 91 occupies 62.5% of the total channel, and the second channel region 111 occupies 37.5% of the total channel. That is, the second channel rate R2 is less than the first channel rate R1 (R2<R1). In this embodiment, the average channel rate RAV is 50%. Other structures of the semiconductor device 151 are similar to those of the semiconductor device 1. In this embodiment, control which shall be described hereinafter is performed.

Figure 17A:
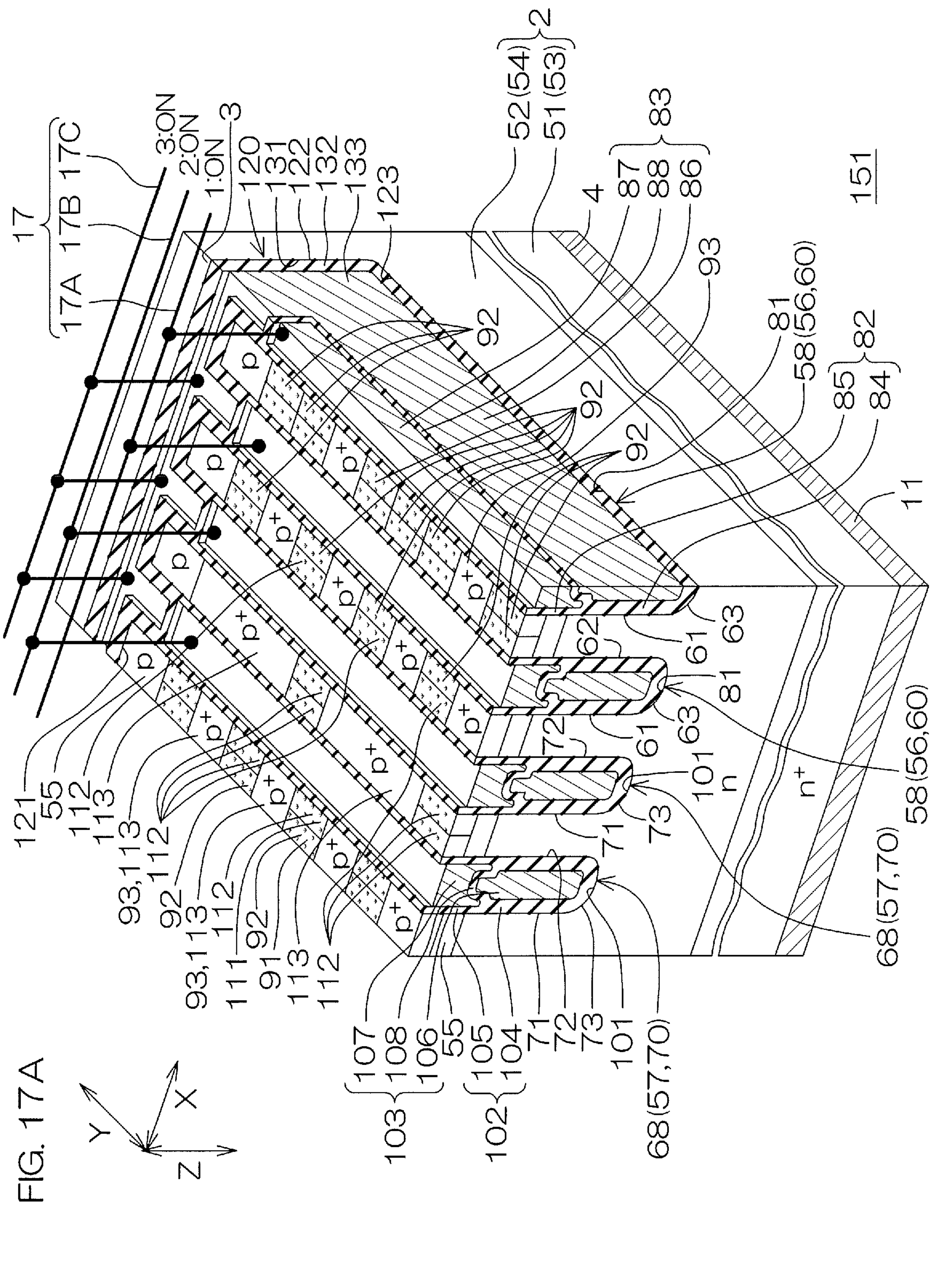
FIG. 17A is a sectional perspective view for describing a normal operation according to a first control example of the semiconductor device shown in FIG. 16.
Figure 17B:
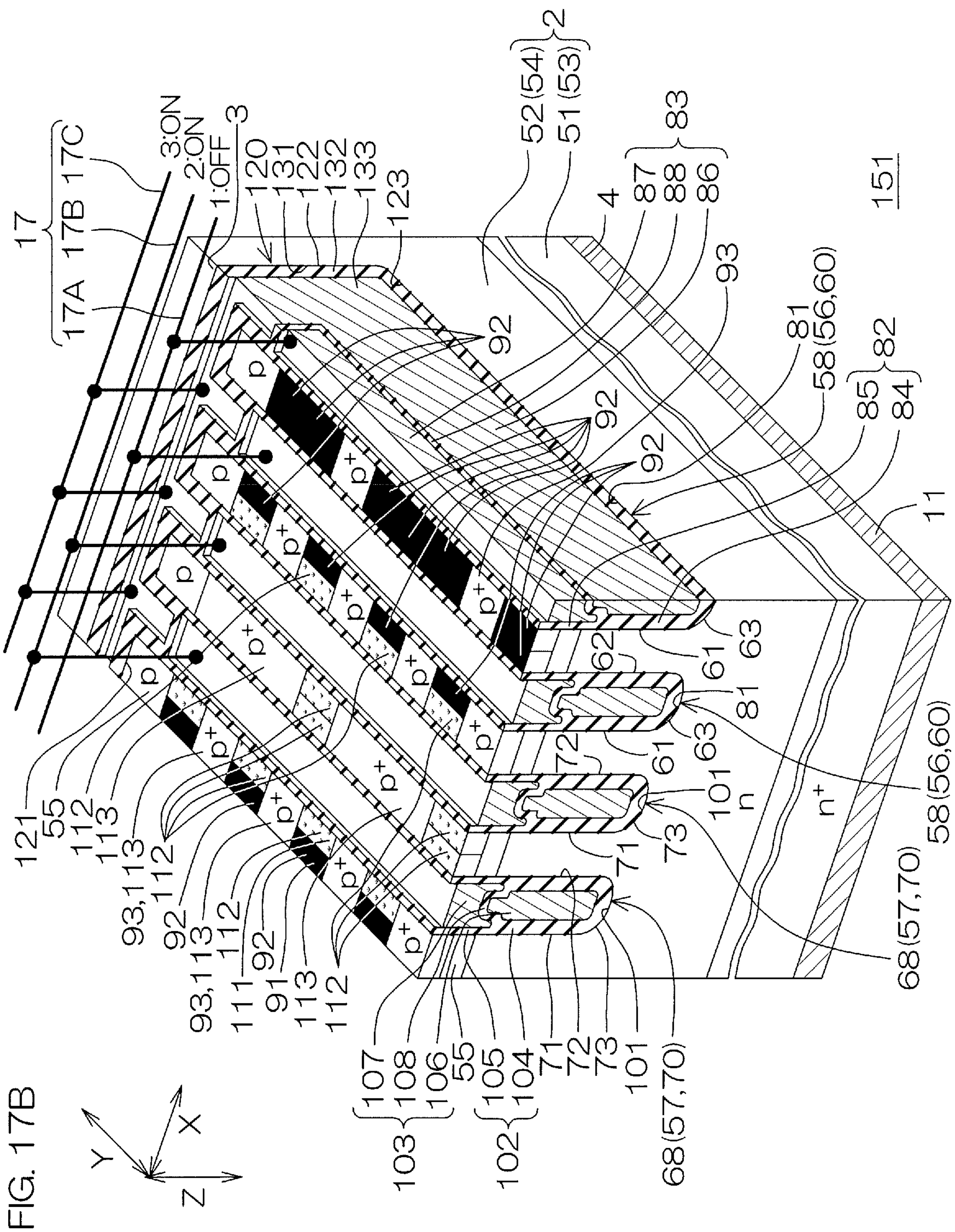
FIG. 17B is a sectional perspective view for describing an active clamp operation according to the first control example of the semiconductor device shown in FIG. 16.

FIG. 17A is a sectional perspective view for describing the normal operation according to a first control example of the semiconductor device 151 shown in FIG. 1. FIG. 17B is a sectional perspective view for describing the active clamp operation according to the first control example of the semiconductor device 151 shown in FIG. 1. In FIG. 17A and FIG. 17B, for convenience of description, structure in the first main surface 3 are omitted to simplify a gate control wiring 17.

With reference to FIG. 17A, when the power MISFET 9 is in the normal operation, a first ON signal Von1 is input to the first gate control wiring 17A, a second ON signal Von2 is input to the second gate control wiring 17B, and a third ON signal Von3 is input to the third gate control wiring 17C.

The first ON signal Von1, the second ON signal Von2, and the third ON signal Von3 are each input from the control IC 10. The first ON signal Von1, the second ON signal Von2, and the third ON signal Von3 each have a voltage equal to or higher than the gate threshold voltage Vth. The first ON signal Von1, the second ON signal Von2, and the third ON signal Von3 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 17A, the first channel region 91 and the second channel region 111 in the ON states are indicated by dotted hatching.

As a result, a first MISFET 56 and a second MISFET 57 are both driven (Full-ON control). The channel utilization rate Ru in the normal operation is 100%. The characteristics channel rate RC in the normal operation is 50%. Thereby, the area resistivity Ron·A approaches the area resistivity Ron·A shown by a second plot point P2 in the graph of FIG. 13.

On the other hand, with reference to FIG. 17B, when the power MISFET 9 is in the active clamp operation, an OFF signal Voff is input to the first gate control wiring 17A, a first clamp ON signal VCon1 is input to the second gate control wiring 17B, and a second clamp ON signal VCon2 is input to the third gate control wiring 17C.

The OFF signal Voff, the first clamp ON signal VCon1, and the second clamp ON signal VCon2 are each input from the control IC 10. The OFF signal Voff has a voltage less than the gate threshold voltage Vth (for example, the reference voltage). The first clamp ON signal VCon1 and the second clamp ON signal VCon2 each have a voltage equal to or higher than the gate threshold voltage Vth. The first clamp ON signal VCon1 and the second clamp ON signal VCon2 may each have an equal voltage. The first clamp ON signal VCon1 and the second clamp ON signal VCon2 may each have a voltage not more than or less than a voltage in the normal operation.

In this case, the first opening-side electrode 87 is put into the OFF state, and the second opening-side electrode 107, the first bottom-side electrode 86, and the second bottom-side electrode 106 are put into the ON states. Thereby, the first channel region 91 is controlled to be in the OFF state, and the second channel region 111 is controlled to be in the ON state. In FIG. 17B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. Specifically, the first channel region 91 having the first channel rate R1 (R2<R1) in excess of the second channel rate R2 is controlled to be in the OFF state, and the channel utilization rate RU in the active clamp operation therefore becomes less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the fourth plot point P4 in the graph of FIG. 13 or exceeds the active clamp capability Eac concerned.

Figure 18A:
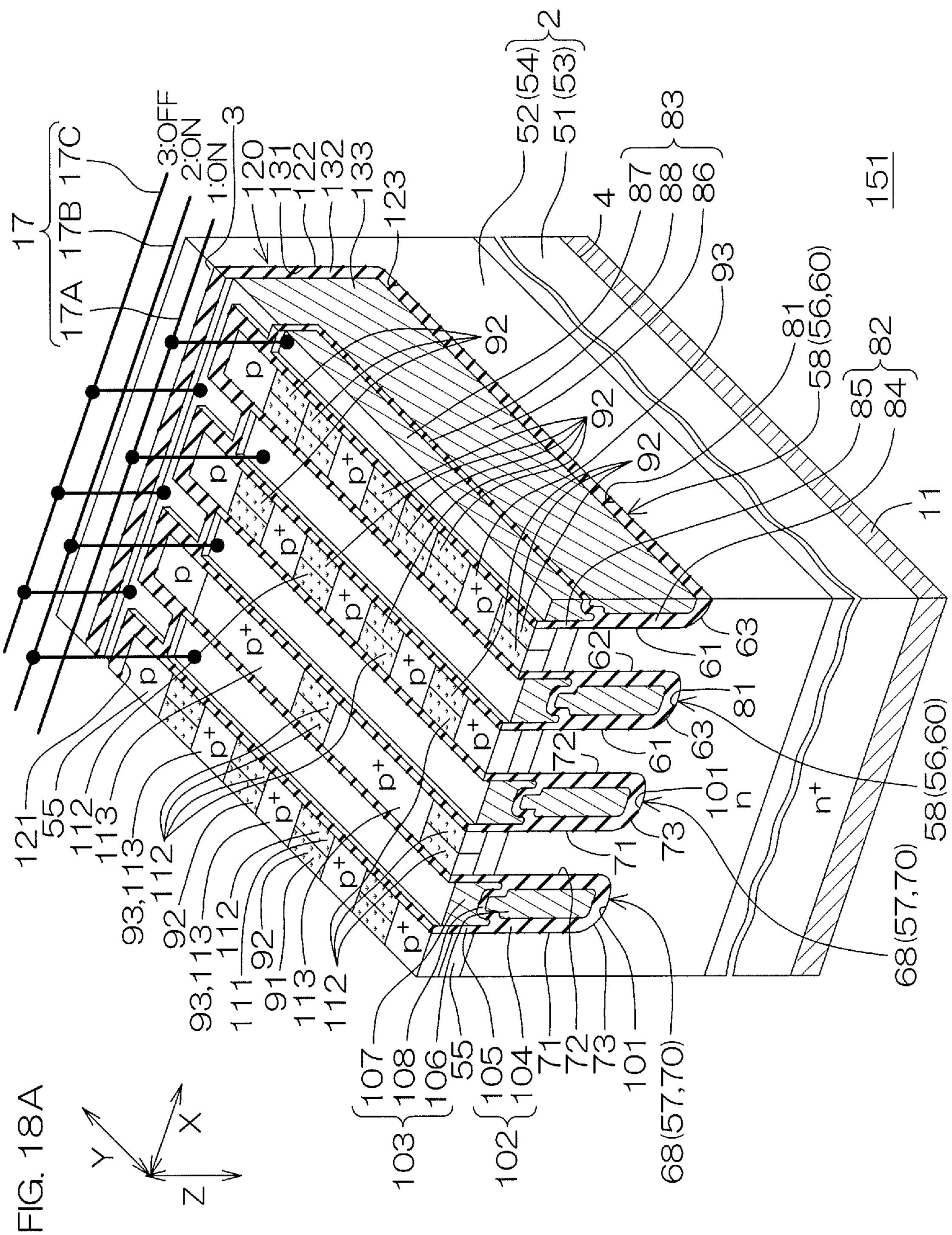
FIG. 18A is a sectional perspective view for describing a normal operation according to a second control example of the semiconductor device shown in FIG. 16.
Figure 18B:
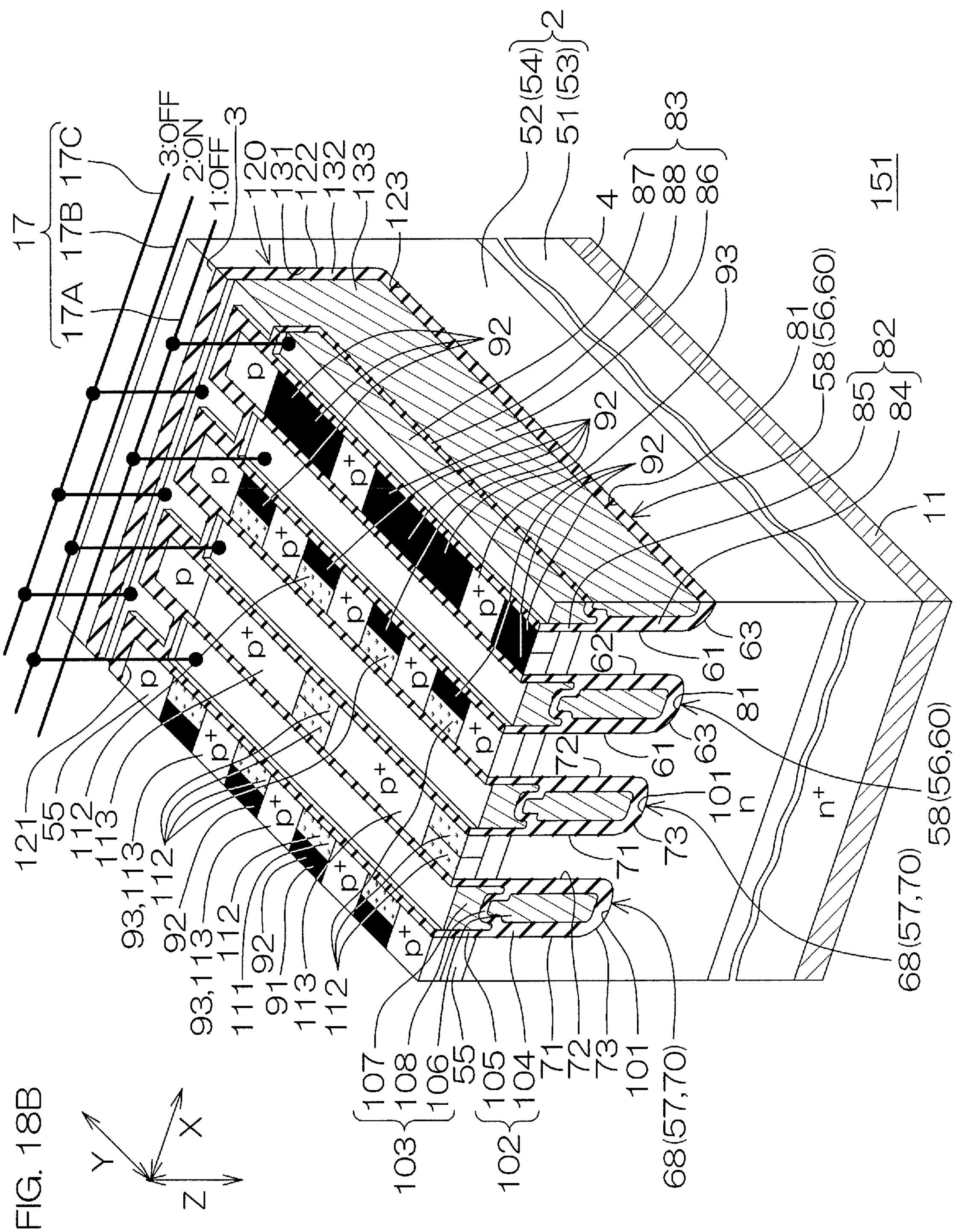
FIG. 18B is a sectional perspective view for describing an active clamp operation according to the second control example of the semiconductor device shown in FIG. 16.

FIG. 18A is a sectional perspective view for describing the normal operation according to a second control example of the semiconductor device 151 shown in FIG. 16. FIG. 18B is a sectional perspective view for describing the active clamp operation according to the second control example of the semiconductor device 151 shown in FIG. 16. In FIG. 18A and FIG. 18B, for convenience of description, structures in the first main surface 3 are omitted to simplify a gate control wiring 17.

With reference to FIG. 18A, when the power MISFET 9 is in the normal operation, a first ON signal Von1 is input to the first gate control wiring 17A, a second ON signal Von2 is input to the second gate control wiring 17B, and the OFF signal Voff is input to the third gate control wiring 17C.

The first ON signal Von1, the second ON signal Von2, and the OFF signal Voff are each input from the control IC 10. The first ON signal Von1 and the second ON signal Von2 each have a voltage not less than the gate threshold voltage Vth. The first ON signal Von1 and the second ON signal Von2 may each have an equal voltage. The OFF signal Voff may be the reference voltage.

In this case, the first opening-side electrode 87 and the second opening-side electrode 107 are each put into the ON state, and the first bottom-side electrode 86 and the second bottom-side electrode 106 are each put into the OFF state. That is, while the first opening-side electrode 87 and the second opening-side electrode 107 each function as a gate electrode, the first bottom-side electrode 86 and the second bottom-side electrode 106 each function as a field electrode.

Thereby, the first channel region 91 and the second channel region 111 are both controlled to be in the ON states. In FIG. 18A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 18B, when the power MISFET 9 is in the active clamp operation, a first OFF signal Voff1 is input to the first gate control wiring 17A, a clamp ON signal VCon is input to the second gate control wiring 17B, and a second OFF signal Voff2 is input to the third gate control wiring 17C.

The first OFF signal Voff1, the clamp ON signal VCon, and the second OFF signal Voff2 are each input from the control IC 10. The first OFF signal Voff1 has a voltage less than the gate threshold voltage Vth (for example, the reference voltage). The clamp ON signal VCon has a voltage not less than the gate threshold voltage Vth. The clamp ON signal VCon may have a voltage not more than or less than a voltage in the normal operation. The second OFF signal Voff2 may be the reference voltage.

In this case, the first opening-side electrode 87, the first bottom-side electrode 86, and the second bottom-side electrode 106 are each put into the OFF state, and the second opening-side electrode 107 is put into the ON state. Thereby, the first channel region 91 is controlled to be in the OFF state, and the second channel region 111 is controlled to be in the ON state. In FIG. 18B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. Specifically, the first channel region 91 having the first channel rate R1 (R2<R1) in excess of the second channel rate R2 is controlled to be in the OFF state, and the channel utilization rate RU in the active clamp operation therefore becomes less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the fourth plot point P4 in the graph of FIG. 13 or exceeds the active clamp capability Eac concerned.

Figure 19A:
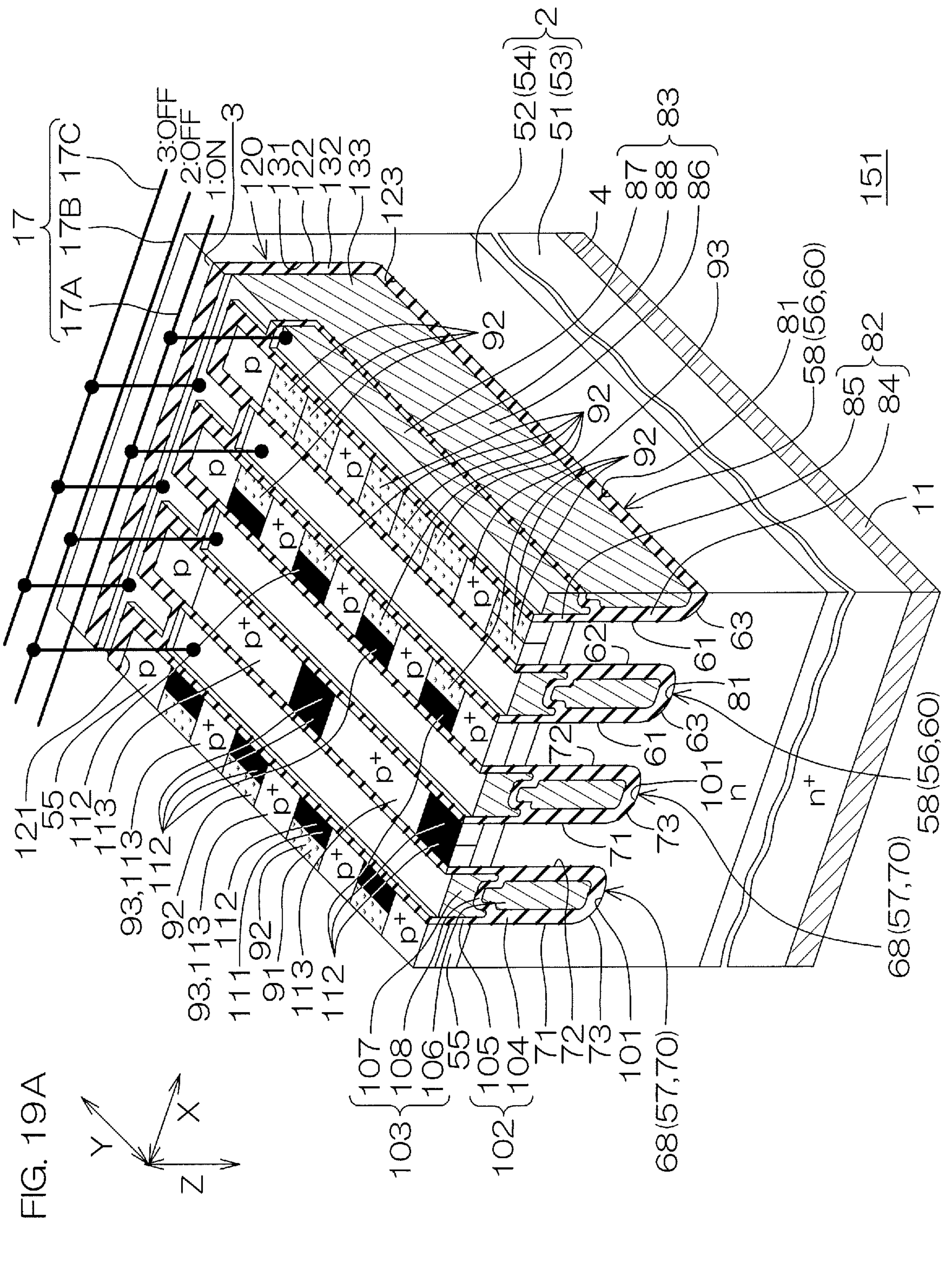
FIG. 19A is a sectional perspective view for describing a normal operation according to a third control example of the semiconductor device shown in FIG. 16.
Figure 19B:
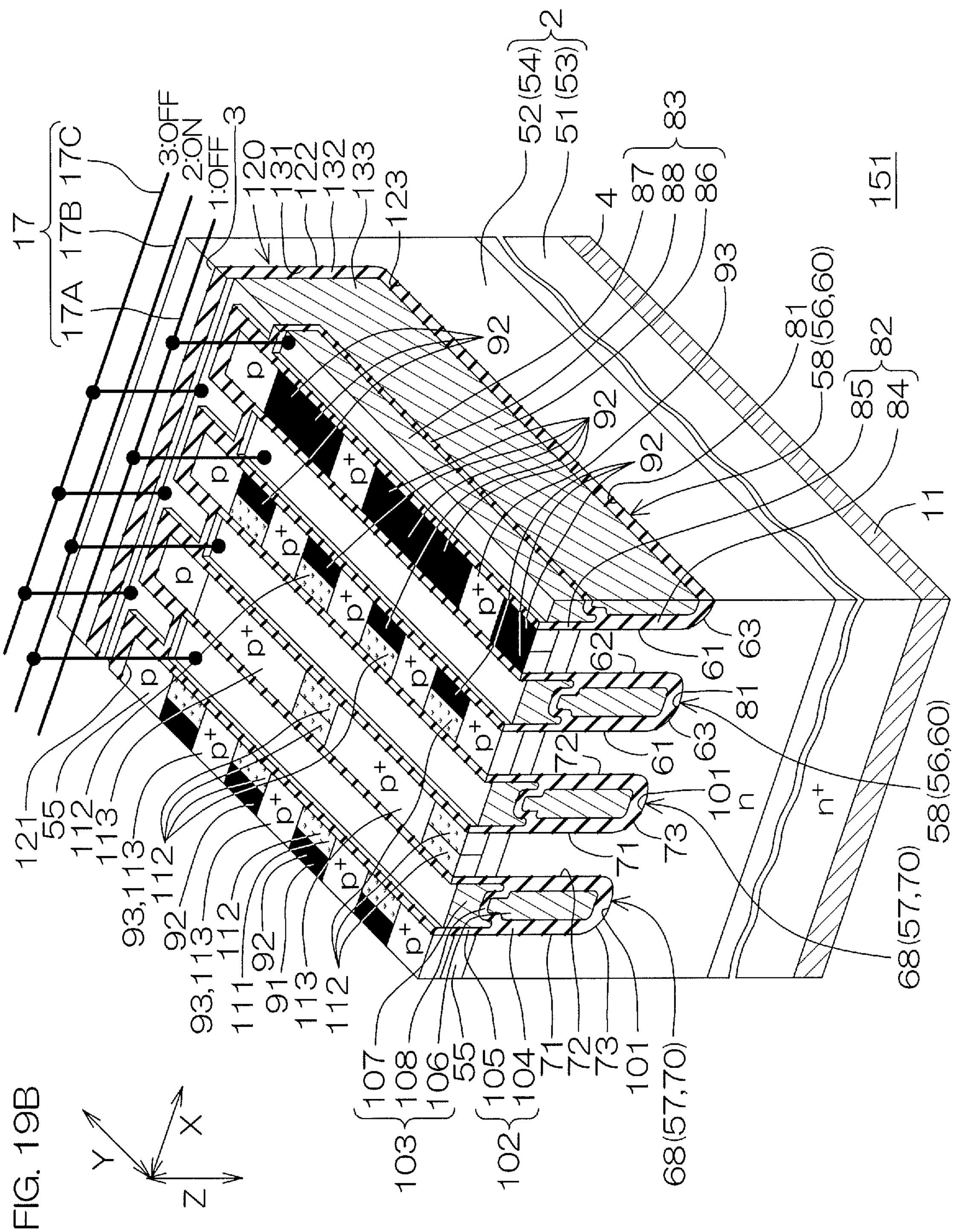
FIG. 19B is a sectional perspective view for describing an active clamp operation according to the third control example of the semiconductor device shown in FIG. 16.

FIG. 19A is a sectional perspective view for describing the normal operation according to a third control example of the semiconductor device 151 shown in FIG. 16. FIG. 19B is a sectional perspective view for describing the active clamp operation according to the third control example of the semiconductor device 151 shown in FIG. 16. In FIG.

19A and FIG. 19B, for convenience of description, structures in the first main surface 3 are omitted to simplify a gate control wiring 17.

With reference to FIG. 19A, when the power MISFET 9 is in the normal operation, an ON signal Von is input to the first gate control wiring 17A, a first OFF signal Voff1 is input to the second gate control wiring 17B, and a second OFF signal Voff2 is input to the third gate control wiring 17C.

The ON signal Von, the first OFF signal Voff1, and the second OFF signal Voff2 are each input from the control IC 10. The ON signal Von has a voltage not less than the gate threshold voltage Vth. The first OFF signal Voff1 and the second OFF signal Voff2 may each have a voltage (for example, reference voltage) less than the gate threshold voltage Vth.

In this case, the first opening-side electrode 87 is put into the ON state, and the first bottom-side electrode 86, the second bottom-side electrode 106, and the second opening-side electrode 107 are each put into the OFF state. That is, while the first opening-side electrode 87 functions as a gate electrode, the first bottom-side electrode 86 and the second bottom-side electrode 106 each function as a field electrode.

Thereby, the first channel region 91 is controlled to be in the ON state, and the second channel region 111 is controlled to be in the OFF state. In FIG. 19A, the first channel region 91 in the ON state is indicated by dotted hatching, and the second channel region 111 in the OFF state is indicated by filled hatching.

As a result, while the first MISFET 56 is controlled to be in the ON state, the second MISFET 57 is controlled to be in the OFF state (first Half-ON control). Thereby, the second channel region 111 having the second channel rate R2 (R2<R1) less than the first channel rate R1 is controlled to be in the OFF state, and the characteristics channel rate RC in the normal operation therefore becomes less than the average channel rate RAV.

The channel utilization rate RU in the normal operation is 62.5%. Further, the characteristics channel rate RC in the normal operation is 31.25%. Thereby, the area resistivity Ron·A approaches the area resistivity Ron·A indicated by the third plot point P3 in the graph of FIG. 13.

On the other hand, with reference to FIG. 19B, when the power MISFET 9 is in the active clamp operation, a first OFF signal Voff1 is input to the first gate control wiring 17A, a clamp ON signal VCon is input to the second gate control wiring 17B, and a second OFF signal Voff2 is input to the third gate control wiring 17C.

The first OFF signal Voff1, the clamp ON signal VCon, and the second OFF signal Voff2 are each input from the control IC 10. The first OFF signal Voff1 has a voltage less than the gate threshold voltage Vth (for example, the reference voltage). The clamp ON signal VCon has a voltage not less than the gate threshold voltage Vth. The clamp ON signal VCon may have a voltage not more than or less than a voltage in the normal operation. The second OFF signal Voff2 may be the reference voltage.

In this case, the second opening-side electrode 107 is put into the ON state, and the first bottom-side electrode 86, the first opening-side electrode 87, and the second bottom-side electrode 106 are each put into the OFF state. That is, while the second opening-side electrode 107 functions as a gate electrode, the first bottom-side electrode 86 and the second bottom-side electrode 106 each function as a field electrode.

Thereby, the first channel region 91 is controlled to be in the OFF state, and the second channel region 111 is controlled to be in the ON state. In FIG. 19B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the first channel region 91 having the first channel rate R1 (R2<R1) in excess of the second channel rate R2 is controlled to be in the OFF state, and the channel utilization rate RU in the active clamp operation therefore becomes in excess of zero and less than the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the second plot point P2 in the graph of FIG. 13 or exceeds the active clamp capability Eac.

In the third control example, in the normal operation and in the active clamp operation, the OFF signal Voff is input to the third gate control wiring 17C. However, in the normal operation and in the active clamp operation, the ON signal Von may be input to the third gate control wiring 17C.

As described above, the same effects as those described for the semiconductor device 1 can be exhibited as well by the semiconductor device 151. In particular, according to the semiconductor device 151, the second channel rate R2 is different from the first channel rate R1 (R1≠R2). Specifically, the second channel rate R2 is less than the first channel rate R1 (R1>R2).

In the above-described structure, the control IC 10 controls the first MISFET 56 and the second MISFET 57 such that the channel utilization rate RU in the active clamp operation becomes in excess of zero and less than the channel utilization rate RU in the normal operation. Specifically, the control IC 10 controls the first channel region 91 to be in the OFF state and controls the second channel region 111 to be in the ON state in the active clamp operation. Thereby, it is possible to enhance the effects of improving the active clamp capability Eac.

Further, according to the semiconductor device 151, as shown in the third control example, the first Half-ON control can be applied in the normal operation and the second Half-ON control can be applied in the active clamp operation. Further, according to the semiconductor device 151, the second Half-ON control can be applied in the normal operation and the first Half-ON control can be applied in the active clamp operation.

Therefore, according to the semiconductor device 151, by only changing a control pattern, it becomes possible to realize various types of area resistivity Ron·A and active clamp capability Eac, while having the same average channel rate RAV.

Further, in the semiconductor device 151, in a manner that the group of the plurality (in this embodiment, two) of first FET structures 58 and the group of the plurality (in this embodiment, two) of second FET structures 68 are alternately arrayed, the plurality of first FET structures 58 and the plurality of second FET structures 68 are formed.

According to a structure in which the plurality of first FET structures 58 are adjacent to each other, the first channel region 91 can be formed, without being connected to the second channel region 111, in the region between the plurality of first FET structures 58 which are adjacent to each other. Therefore, it is possible to appropriately form the first channel region 91 and appropriately adjust the first channel rate R1.

Similarly, according to a structure in which the plurality of second FET structures 68 are adjacent to each other, the second channel region 111 can be formed, without being connected to the first channel region 91, in the region between the plurality of second FET structures 68 which are adjacent to each other. Therefore, it is possible to appropriately form the second channel region 111 and appropriately adjust the second channel rate R2. Thereby, the average channel rate RAV and the characteristics channel rate RC can be appropriately adjusted.

Figure 20:
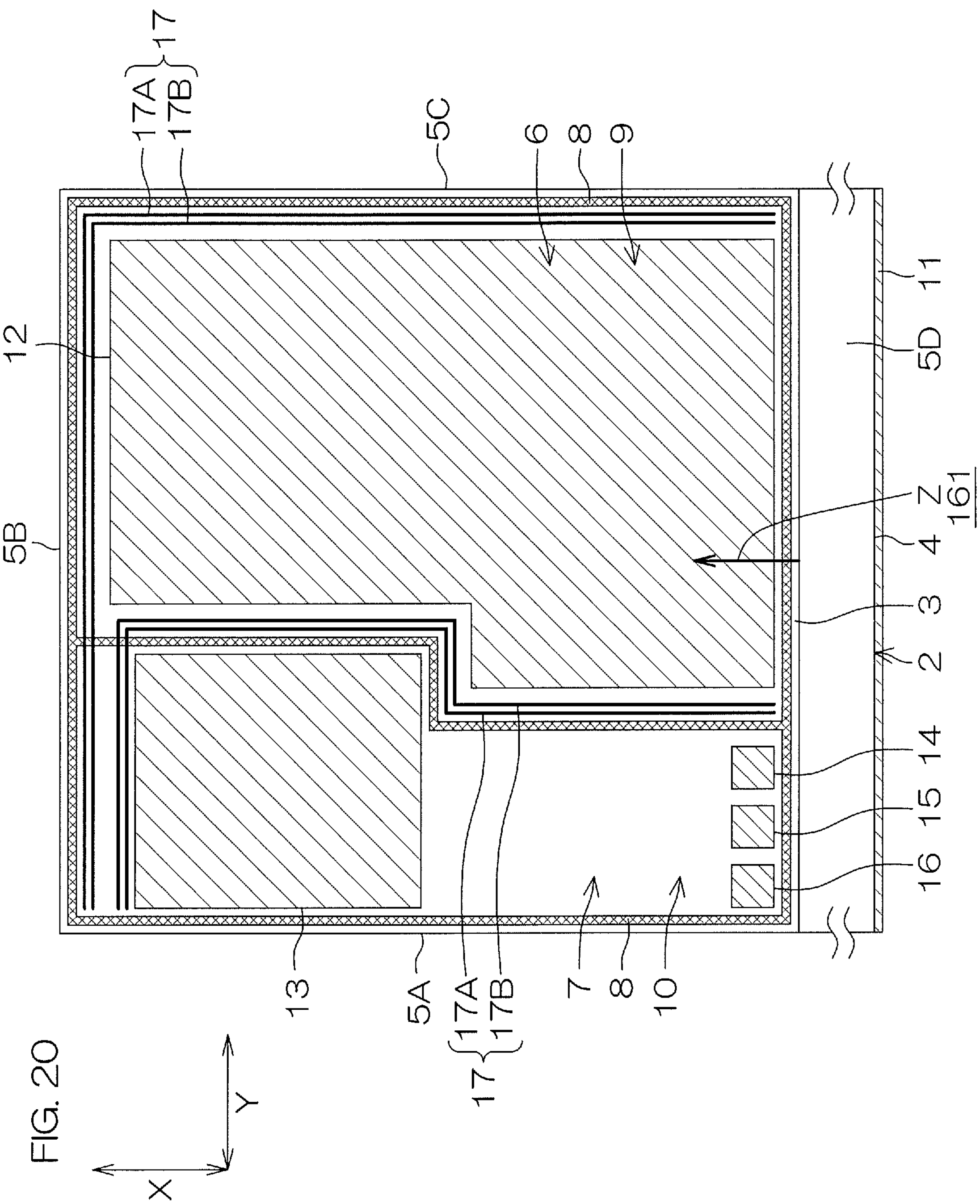
FIG. 20 is a perspective view of the semiconductor device according to the third preferred embodiment of the present invention which is viewed from one direction.
Figure 21:
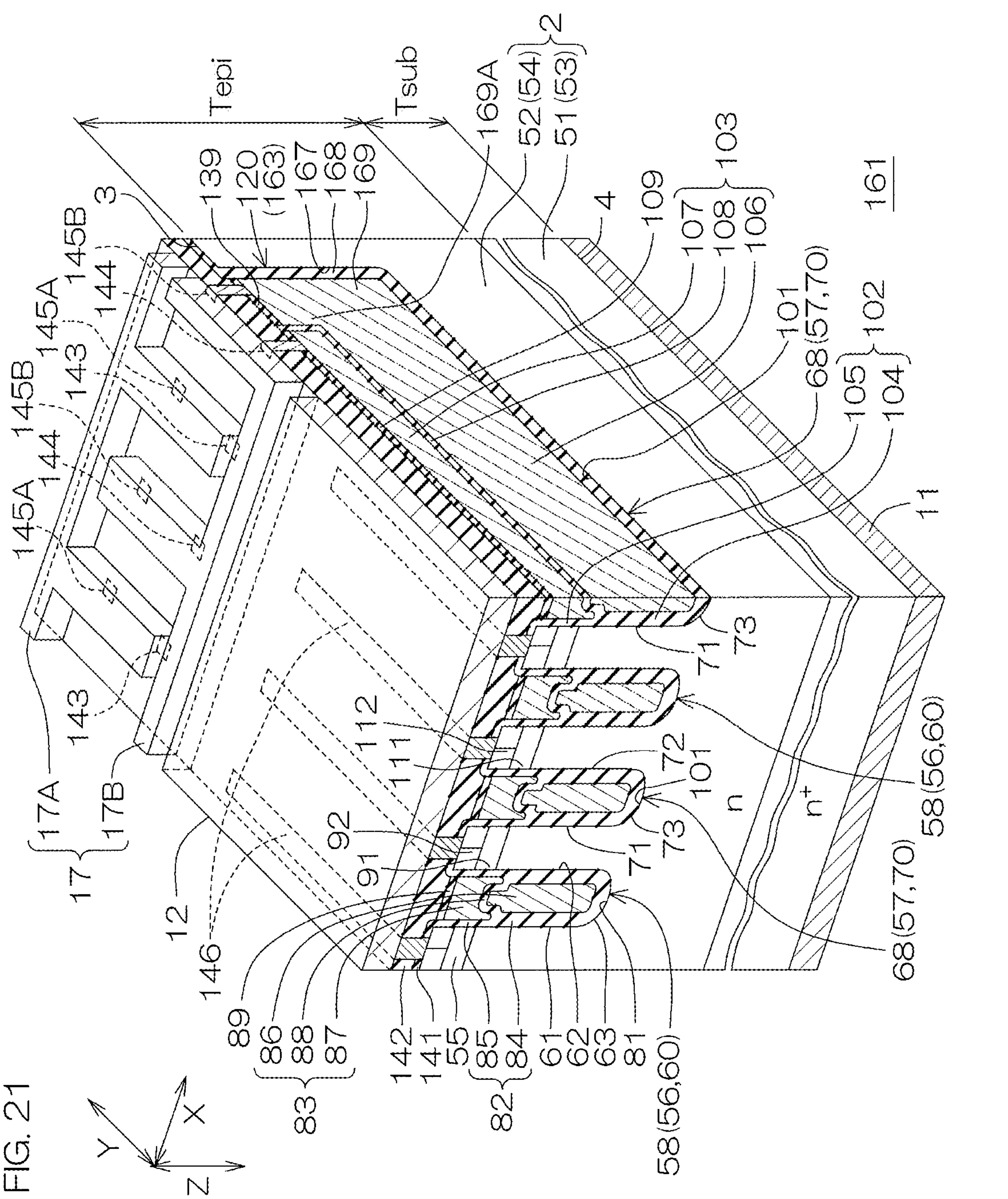
FIG. 21 is a sectional perspective view of a region XXI shown in FIG. 20.
Figure 22:
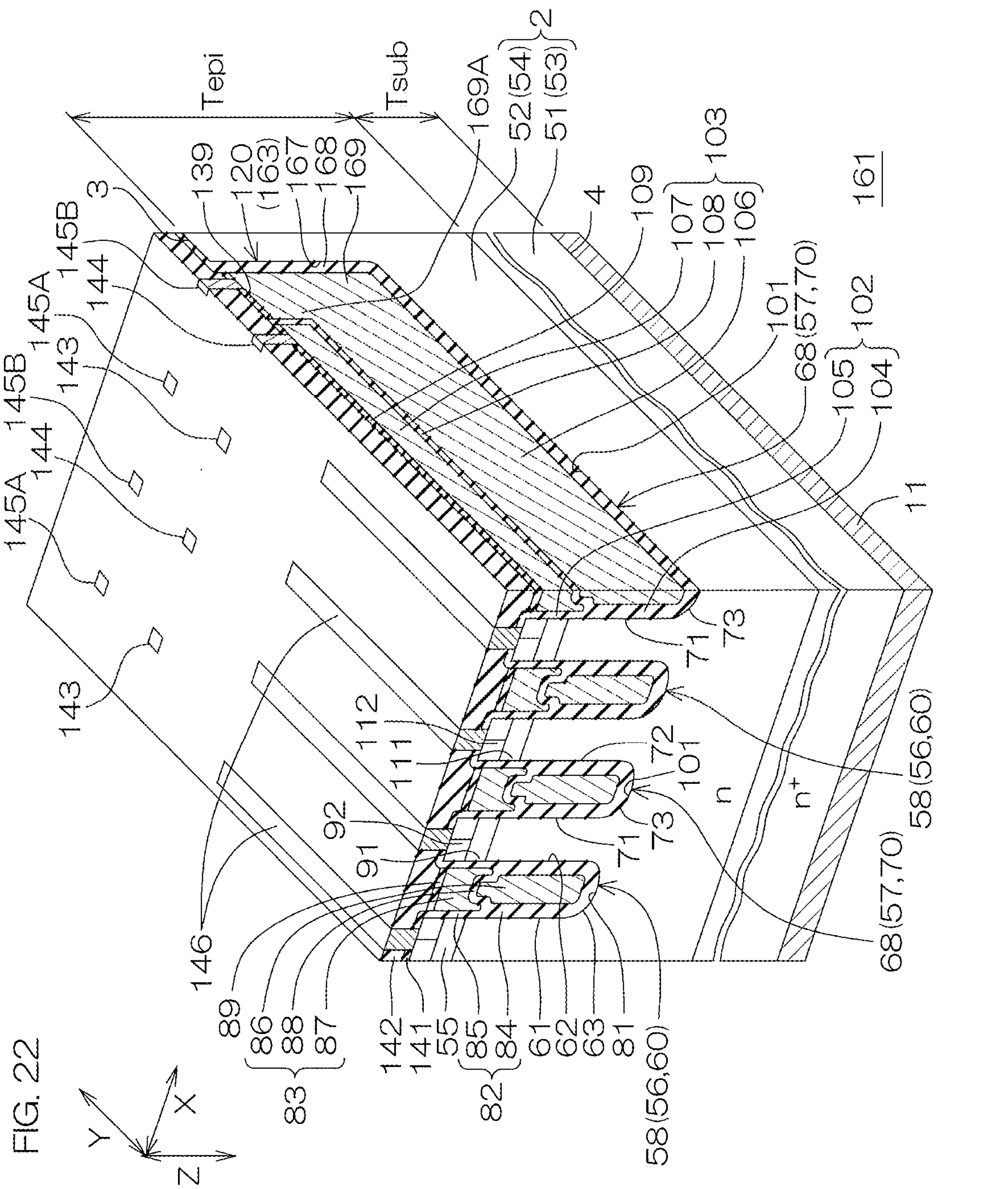
FIG. 22 is a sectional perspective view in which an electrode is removed from FIG. 21.
Figure 23:
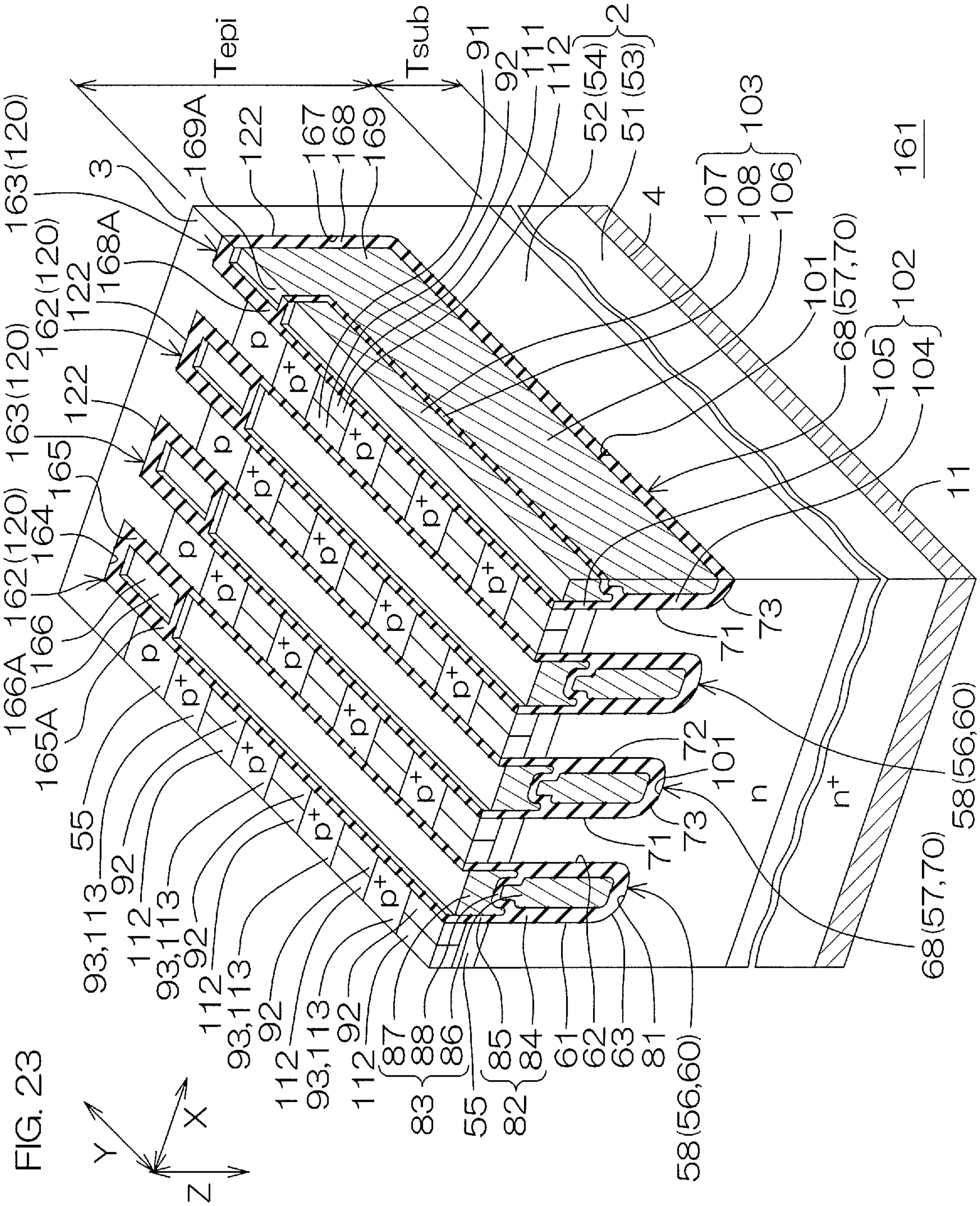
FIG. 23 is a sectional perspective view in which structures on the semiconductor layer are removed from FIG. 22.

FIG. 20 is a perspective view of a semiconductor device 161 according to a third preferred embodiment of the present invention which is viewed from one direction. FIG. 21 is a sectional perspective view of a region XXI shown in FIG. 20. FIG. 22 is a sectional perspective view in which a source electrode 12 and a gate control wiring 17 are removed from FIG. 21. FIG. 23 is a sectional perspective view in which an interlayer insulation layer 142 is removed from FIG. 22. Hereinafter, structures corresponding to the structures described for the semiconductor device 1 shall be provided with the same reference symbols and description thereof shall be omitted.

In the semiconductor device 1, the gate control wiring 17 includes the first gate control wiring 17A, the second gate control wiring 17B, and the third gate control wiring 17C. In contrast thereto, in the semiconductor device 161, the gate control wiring 17 does not have the third gate control wiring 17C and only has the first gate control wiring 17A and the second gate control wiring 17B.

Further, in the semiconductor device 1, the second bottom-side electrode 106 is electrically connected to the first bottom-side electrode 86. In contrast thereto, in the semiconductor device 161, the second bottom-side electrode 106 is electrically insulated from the first bottom-side electrode 86.

Specifically, the semiconductor device 161 includes a plurality of trench contact structures 120 which are each connected to the first trench gate structure 60 and the second trench gate structure 70 in a manner that the first trench gate structure 60 and the second trench gate structure 70 are electrically insulated from each other.

A region which is at the side of the other end portion side of a first FET structure 58 and at the side of the other end portion side of a second FET structure 68 are similar in structure to a region which is at the side of one end portion of the first FET structure 58 and at the side of one end portion of the second FET structure 68. Hereinafter, a description will be given of the structure of the region which is at the side of one end portion of the first FET structure 58 and at the side of one end portion of the second FET structure 68 as an example, and a description of the structure of the region which is at the side of the other end portion side of a first FET structure 58 and at the side of the other end portion side of a second FET structure 68 shall be omitted.

With reference to FIG. 20 to FIG. 23, the plurality of trench contact structures 120 include a plurality of first trench contact structures 162 and a plurality of second trench contact structures 163. Each of the first trench contact structures 162 is connected to one end portion of corresponding one of the plurality of first trench gate structures 60 at an interval from the plurality of second trench gate structures 70. In this embodiment, the first trench contact structures 162 are connected to the corresponding first trench gate structures 60 in a one-to-one correspondence.

Each of the second trench contact structures 163 is connected to one end portion of corresponding one of the plurality of second trench gate structures 70 at an interval from the plurality of first trench gate structures 60. In this embodiment, the second trench contact structures 163 are connected to the corresponding second trench gate structures 70 in a one-to-one correspondence.

Each of the first trench contact structure 162 includes a first contact trench 164, a first contact insulation layer 165, and a first contact electrode 166. The first contact trench 164, the first contact insulation layer 165, and the first contact electrode 166 correspond respectively to the contact trench 131, the contact insulation layer 132, and the contact electrode 133 aforementioned.

The first contact trench 164 communicates with one end portion of a first gate trench 81. With respect to the first direction X, a width WTC1 of the first contact trench 164 is equal to a first width WT1 of the first gate trench 81 (WTC1=WT1). The first contact trench 164 forms, with the first gate trench 81, one trench which extends along the second direction Y.

The first contact insulation layer 165 is integrally formed with the first insulation layer 82 in a communication portion between the first gate trench 81 and the first contact trench 164. Specifically, the first contact insulation layer 165 includes a lead-out insulation layer 165A which is led out to the inside of the first gate trench 81. The lead-out insulation layer 165A corresponds to the lead-out insulation layer 132A aforementioned. That is, the first contact insulation layer 165 crosses the communication portion and is integrally formed with the first bottom-side insulation layer 84 and the first opening-side insulation layer 85 inside the first gate trench 81.

The first contact electrode 166 is integrally formed with the first bottom-side electrode 86 in the communication portion between the first gate trench 81 and the first contact trench 164. Specifically, the first contact electrode 166 includes a lead-out electrode 166A which is led out to the inside of the first gate trench 81. The lead-out electrode 166A corresponds to the lead-out electrode 133A aforementioned.

That is, the first contact electrode 166 crosses the communication portion and is electrically connected to the first bottom-side electrode 86 inside the first gate trench 81. Inside the first gate trench 81, the first intermediate insulation layer 88 is interposed between the first contact electrode 166 and the first opening-side electrode 87.

Each of the second trench contact structures 163 includes a second contact trench 167, a second contact insulation layer 168, and a second contact electrode 169. The second contact trench 167, the second contact insulation layer 168, and the second contact electrode 169 correspond respectively to the contact trench 131, the contact insulation layer 132, and the contact electrode 133 aforementioned.

The second contact trench 167 communicates with one end portion of the second gate trench 101. With respect to the first direction X, a width WTC2 of the second contact trench 167 is equal to the second width WT2 of the second gate trench 101 (WTC2=WT2). The second contact trench 167 forms, with the second gate trench 101, one trench extending along the second direction Y.

The second contact insulation layer 168 is integrally formed with the second insulation layer 102 in a communication portion between the second gate trench 101 and the second contact trench 167. Specifically, the second contact insulation layer 168 includes a lead-out insulation layer 168A which is led out to the inside of the second gate trench 101. The lead-out insulation layer 168A corresponds to the lead-out insulation layer 132A aforementioned. That is, the second contact insulation layer 168 crosses the communication portion and is formed integrally with the second bottom-side insulation layer 104 and the second opening-side insulation layer 105 inside the second gate trench 101.

The second contact electrode 169 is integrally formed with the second bottom-side electrode 106 in the communication portion between the second gate trench 101 and the second contact trench 167. Specifically, the second contact electrode 169 includes a lead-out electrode 169A which is led out to the inside of the second gate trench 101. The lead-out electrode 169A corresponds to the aforementioned lead-out electrode 133A.

That is, the second contact electrode 169 crosses the communication portion and is electrically connected to the second bottom-side electrode 106 inside the second gate trench 101. Inside the second gate trench 101, the second intermediate insulation layer 108 is interposed between the second contact electrode 169 and the second opening-side electrode 107.

The second contact electrode 169 is electrically insulated from the first contact electrode 166. Thereby, the second bottom-side electrode 106 is electrically insulated from the first bottom-side electrode 86. That is, the first bottom-side electrode 86 and the second bottom-side electrode 106 are configured such as to be independently controlled with each other.

In this embodiment, the plurality of third plug electrodes 145 include a plurality of third plug electrodes 145A and a plurality of third plug electrodes 145B. The plurality of third plug electrodes 145A are each embedded in a part which covers the first contact electrode 166 of the first trench contact structure 162 in an interlayer insulation layer 142. The plurality of third plug electrodes 145A penetrate through the interlayer insulation layer 142 and are connected to the first contact electrode 166.

The plurality of third plug electrodes 145B are each embedded in a part which covers the second contact electrode 169 of the second trench contact structure 163 in the interlayer insulation layer 142. The plurality of third plug electrodes 145B penetrate through the interlayer insulation layer 142 and are connected to the second contact electrode 169.

The first gate control wiring 17A of the gate control wiring 17 is electrically connected to the first bottom-side electrode 86 and the first opening-side electrode 87. Specifically, the first gate control wiring 17A is electrically connected to the plurality of first plug electrodes 143 and the plurality of third plug electrodes 145A in the interlayer insulation layer 142. The wiring pattern of the first gate control wiring 17A is arbitrary.

The gate control signal from the control IC 10 is input to the first gate control wiring 17A. The gate control signal is transmitted to the first bottom-side electrode 86 and the first opening-side electrode 87 through the plurality of first plug electrodes 143 and the plurality of third plug electrodes 145A.

Therefore, in this embodiment, the first bottom-side electrode 86 and the first opening-side electrode 87 are controlled to the same voltage at the same time. Thereby, it is possible to appropriately suppress a potential difference formed between the first bottom-side electrode 86 and the first opening-side electrode 87 and therefore it is possible to appropriately suppress an electric field concentration on the first intermediate insulation layer 88. As a result, it is possible to increase a withstand voltage of the first trench gate structure 60.

The second gate control wiring 17B of the gate control wiring 17 is electrically connected to the second bottom-side electrode 106 and the second opening-side electrode 107. Specifically, the second gate control wiring 17B is electrically connected to the plurality of second plug electrodes 144 and the plurality of third plug electrodes 145B in the interlayer insulation layer 142. The wiring pattern of the second gate control wiring 17B is arbitrary.

The gate control signal from the control IC 10 is input to the second gate control wiring 17B. The gate control signal is transmitted to the second bottom-side electrode 106 and the second opening-side electrode 107 through the plurality of first plug electrodes 143 and the plurality of third plug electrodes 145B.

Therefore, in this embodiment, the second bottom-side electrode 106 and the second opening-side electrode 107 are controlled to the same voltage at the same time. Thereby, it is possible to appropriately suppress a potential difference formed between the second bottom-side electrode 106 and the second opening-side electrode 107 and therefore it is possible to appropriately suppress an electric field concentration on the second intermediate insulation layer 108. As a result, it is possible to increase a withstand voltage of the second trench gate structure 70.

Figure 24A:
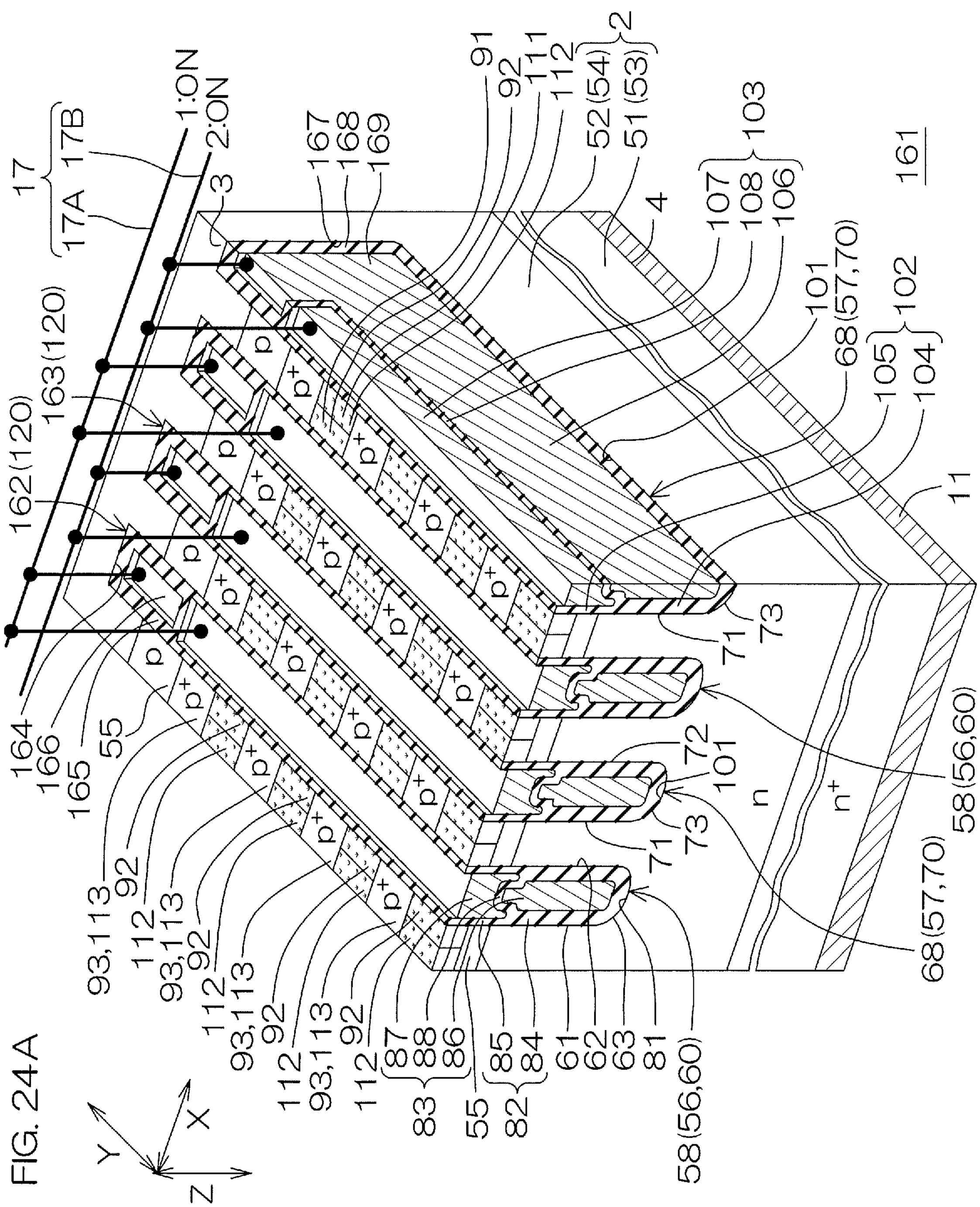
FIG. 24A is a sectional perspective view for describing a normal operation of the semiconductor device shown in FIG. 23.
Figure 24B:
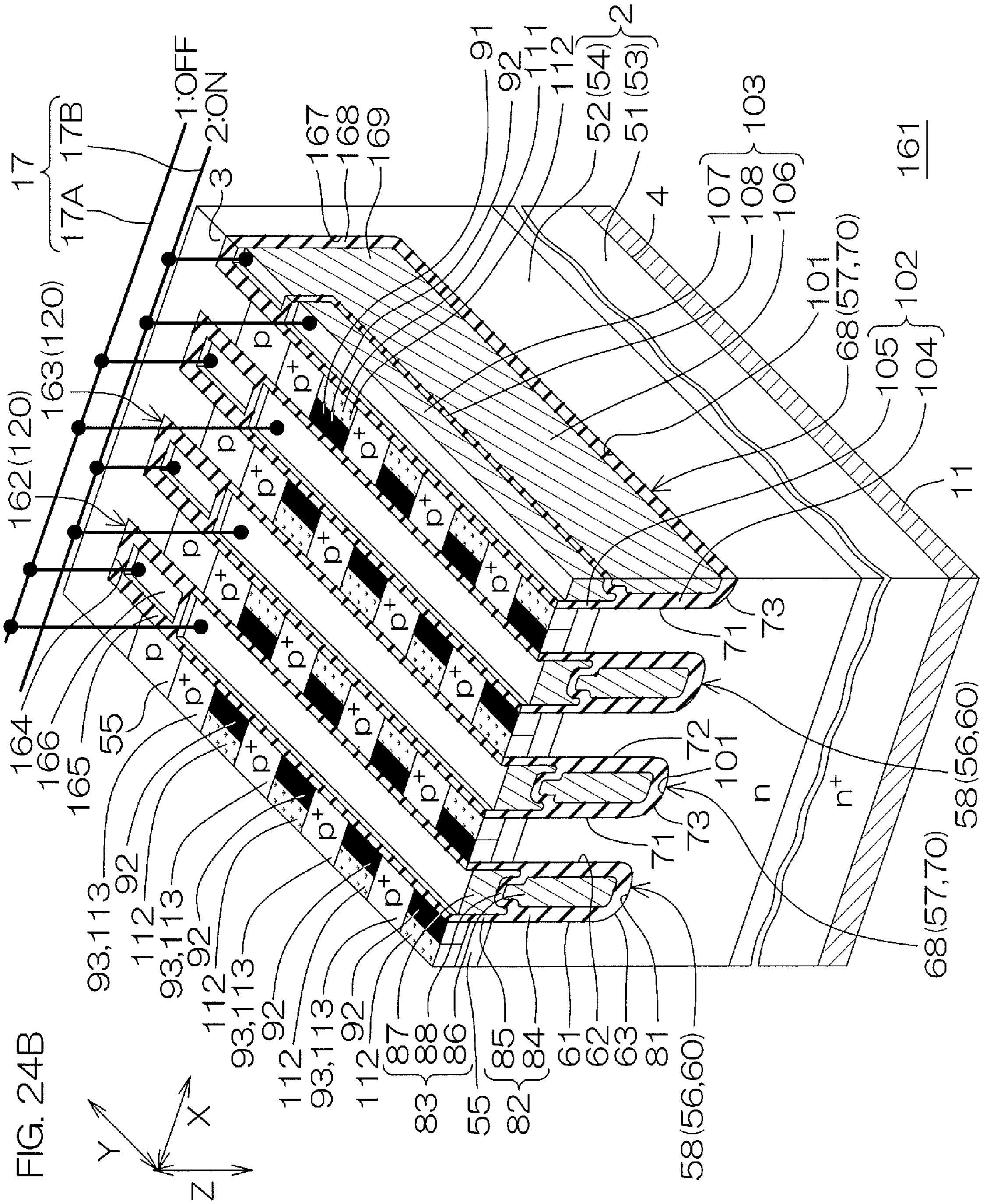
FIG. 24B is a sectional perspective view for describing an active clamp operation of the semiconductor device shown in FIG. 23.

FIG. 24A is a sectional perspective view for describing the normal operation of the semiconductor device 161 shown in FIG. 23. FIG. 24B is a sectional perspective view for describing the active clamp operation of the semiconductor device 161 shown in FIG. 23. In FIG. 24A and FIG. 24B, for convenience of description, structures in the first main surface 3 are omitted to simplify the gate control wiring 17.

With reference to FIG. 24A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 24A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 24B, when the power MISFET 9 is in the active clamp operation, an OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. Thereby, the first channel region 91 is controlled to be in the OFF state, and the second channel region 111 is controlled to be in the ON state. In FIG. 24B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In this control example, a description has been given of an example in which the second Half-ON control is applied in the active clamp operation. However, the first Half-ON control may be applied in the active clamp operation.

As described above, the same effects as those described for the semiconductor device 1 can be exhibited as well by the semiconductor device 161. In particular, according to the semiconductor device 161, the second bottom-side electrode 106 is electrically insulated from the first bottom-side electrode 86, and the second opening-side electrode 107 is electrically insulated from the first opening-side electrode 87.

In the above-described structure, the control IC 10 controls the first bottom-side electrode 86 and the first opening-side electrode 87 of the first MISFET 56 to the same voltage at the same time. Thereby, it is possible to appropriately suppress a potential difference formed between the first bottom-side electrode 86 and the first opening-side electrode 87 in the normal operation and in the active clamp operation. As a result, it is possible to appropriately suppress an electric field concentration on the first intermediate insulation layer 88 and therefore it is possible to increase a withstand voltage of the first trench gate structure 60.

Further, the control IC 10 controls the second bottom-side electrode 106 and the second opening-side electrode 107 of the second MISFET 57 to the same voltage at the same time. Thereby, it is possible to appropriately suppress a potential difference formed between the second bottom-side electrode 106 and the second opening-side electrode 107 in the normal operation and in the active clamp operation. As a result, it is possible to appropriately suppress an electric field concentration on the second intermediate insulation layer 108 and therefore it is possible to increase a withstand voltage of the second trench gate structure 70.

Figure 25:
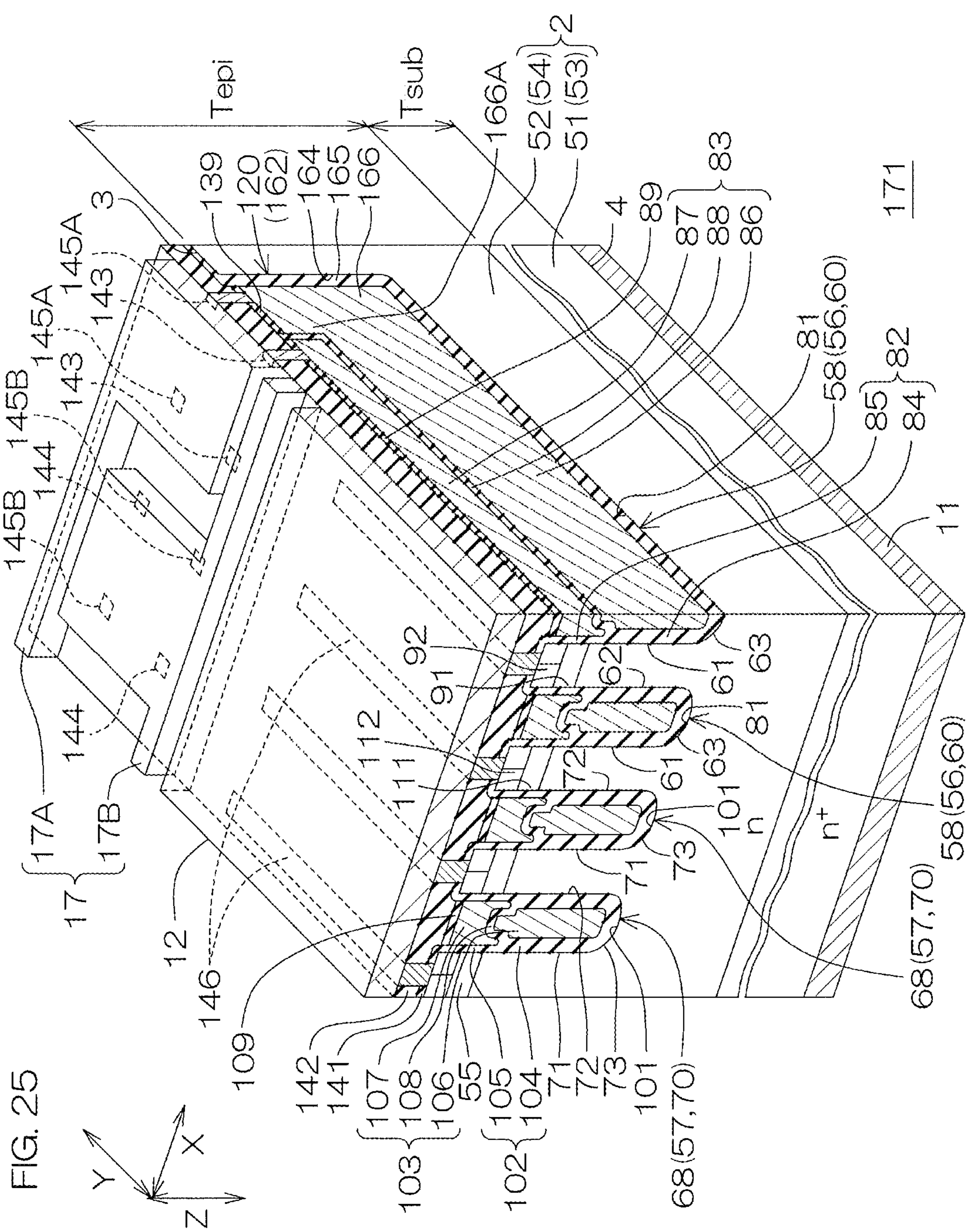
FIG. 25 is a sectional perspective view of a region corresponding to FIG. 21 and is a sectional perspective view which shows a semiconductor device according to a fourth preferred embodiment of the present invention.
Figure 26:
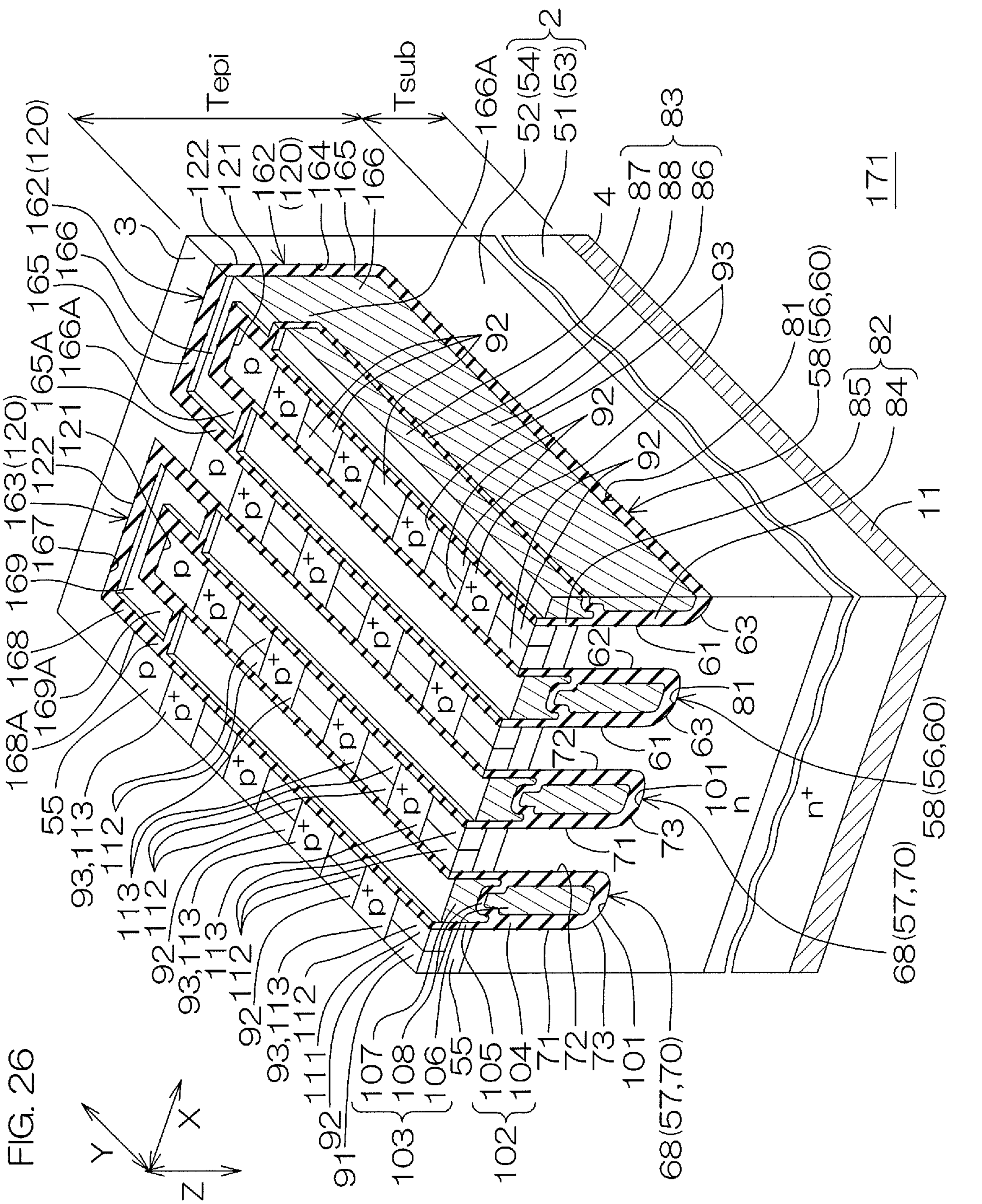
FIG. 26 is a sectional perspective view in which structures on the semiconductor layer are removed from FIG. 25.

FIG. 25 is a sectional perspective view of a region corresponding to FIG. 21 and is a sectional perspective view which shows a semiconductor device 171 according to a fourth preferred embodiment of the present invention. FIG. 26 is a sectional perspective view in which structures in a semiconductor layer 2 are removed from FIG. 25. Hereinafter, structures corresponding to the structures described for the semiconductor device 161 shall be provided with the same reference symbols and description thereof shall be omitted.

Hereinafter, a description will be given of the structure of the region which is at the side of one end portion of the first FET structure 58 and at the side of one end portion of the second FET structure 68 as an example, and a description of the structure of the region which is at the side of the other end portion side of the first FET structure 58 and at the side of the other end portion side of the second FET structure 68 shall be omitted.

In the semiconductor device 161, the plurality of first FET structures 58 and the plurality of second FET structures 68 are formed in a manner that one first FET structure 58 and one second FET structure 68 are alternately arrayed. In contrast thereto, in the semiconductor device 171, the plurality of first FET structures 58 and the plurality of second FET structures 68 are formed in a manner that a group of a plurality (in this embodiment, two) of first FET structures 58 and a group of a plurality (in this embodiment, two) of second FET structures 68 are alternately arrayed.

Further, in the semiconductor device 161, the plurality of first trench contact structures 162 are connected to the corresponding first trench gate structures 60 in a one-to-one correspondence. In contrast thereto, in the semiconductor device 171, the plurality of first trench contact structures 162 are each connected to the group of the plurality (in this embodiment, two) of first trench gate structures 60 which are adjacent to each other. The plurality of first trench contact structures 162 are formed in an arch shape in plan view.

Further, in the semiconductor device 161, the plurality of second trench contact structures 163 are connected to the corresponding second trench gate structures 70 in a one-to-one correspondence. In contrast thereto, in the semiconductor device 171, the plurality of second trench contact structures 163 are each connected to the group of the plurality (in this embodiment, two) of second trench gate structures 70 which are adjacent to each other. The plurality of second trench contact structures 163 are formed in an arch shape in plan view. Hereinafter, a specific description will be given of a structure of the semiconductor device 171.

With reference to FIG. 25 and FIG. 26, in this embodiment, the plurality of cell regions 75 are each defined to a region between two first FET structures 58 which are adjacent to each other, a region between one first FET structure 58 and one second FET structure 68 which are adjacent to each other, and a region between two second FET structures 68 which are adjacent to each other.

In this embodiment, three types of total channel rates RT are applied to the plurality of cell regions 75. The three types of total channel rates RT include a first total channel rate RT1, a second total channel rate RT2, and a third total channel rate RT3.

The first total channel rate RT1 is applied to the region between two first FET structures 58 which are adjacent to each other. No second channel region 111 is formed in the region between two first FET structures 58 which are adjacent to each other, due to its structure.

The first total channel rate RT1 is a total value of the first channel rates R1 of two first FET structures 58 which are adjacent to each other. The first total channel rate RT1 may be adjusted to a range from not less than 0% to not more than 100% (preferably, in excess of 0% and less than 100%). In this embodiment, the first total channel rate RT1 is adjusted to 50%. In the first total channel rate RT1, the first channel rate R1 at one side and the first channel rate R1 at the other side are each 25%.

The second total channel rate RT2 is applied to the region between one first FET structure 58 and one second FET structure 68 which are adjacent to each other. The first channel region 91 and the second channel region 111 are formed in the region between one first FET structure 58 and one second FET structure 68 which are adjacent to each other, due to its structure.

The second total channel rate RT2 is a total value of the first channel rate R1 and the second channel rate R2. The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 is applied to the region between two second FET structures 68 which are adjacent to each other. No first channel region 91 is formed in the region between two second FET structures 68 which are adjacent to each other, due to its structure.

The third total channel rate RT3 is a total value of the second channel rates R2 of two second FET structures 68 which are adjacent to each other. The third total channel rate RT3 may be adjusted to a range from not less than 0% to not more than 100% (preferably in excess of 0% and less than 100%). In this embodiment, the third total channel rate RT3 is adjusted to 50%. In the third total channel rate RT3, the second channel rate R2 on one side and the second channel rate R2 on the other side are each 25%.

The first channel region 91 occupies ½ (50%) of a total channel, and the second channel region 111 occupies ½ (50%) of the total channel. In this embodiment, the average channel rate RAV is 50%.

In each of the first trench contact structures 162, the first contact trench 164 communicates with one end portions of the plurality of first gate trenches 81 which are adjacent to each other. The first contact insulation layer 165 is integrally formed with the first insulation layer 82 at the communication portion between each of the first gate trenches 81 and the first contact trench 164.

Specifically, the first contact insulation layer 165 includes the lead-out insulation layer 165A which is led out to the inside of each of the first gate trenches 81, crosses the communication portion, and is integrally formed with the first bottom-side insulation layer 84 and the first opening-side insulation layer 85 inside each of the first gate trenches 81.

The first contact electrode 166 is integrally formed with the first bottom-side electrode 86 at the communication portion between each of the first gate trenches 81 and the first contact trench 164. Specifically, the first contact electrode 166 includes the lead-out electrode 166A which is led out to the inside of each of the first gate trenches 81, crosses the communication portion, and is electrically connected to the first bottom-side electrode 86 inside each of the first gate trenches 81. Inside each of the first gate trenches 81, the first intermediate insulation layer 88 is interposed between the first contact electrode 166 and the first opening-side electrode 87.

In each of the second trench gate structures 70, the second contact trench 167 communicates with one end portions of the plurality of second gate trenches 101 which are adjacent to each other. The second contact insulation layer 168 is integrally formed with the second insulation layer 102 at the communication portion between each of the second gate trenches 101 and the second contact trench 167.

Specifically, the second contact insulation layer 168 includes the lead-out insulation layer 168A which is led out to the inside of each of the second gate trenches 101, crosses the communication portion, and is integrally formed with the second bottom-side insulation layer 104 and the second opening-side insulation layer 105 inside each of the second gate trenches 101.

The second contact electrode 169 is integrally formed with the second bottom-side electrode 106 at the communication portion between each of the second gate trenches 101 and the second contact trench 167. Specifically, the second contact electrode 169 includes the lead-out electrode 169A which is led out to the inside of each of the second gate trenches 101, crosses the communication portion, and is electrically connected to the second bottom-side electrode 106 inside each of the second gate trenches 101. Inside each of the second gate trenches 101, the second intermediate insulation layer 108 is interposed between the second contact electrode 169 and the second opening-side electrode 107.

Figure 27A:
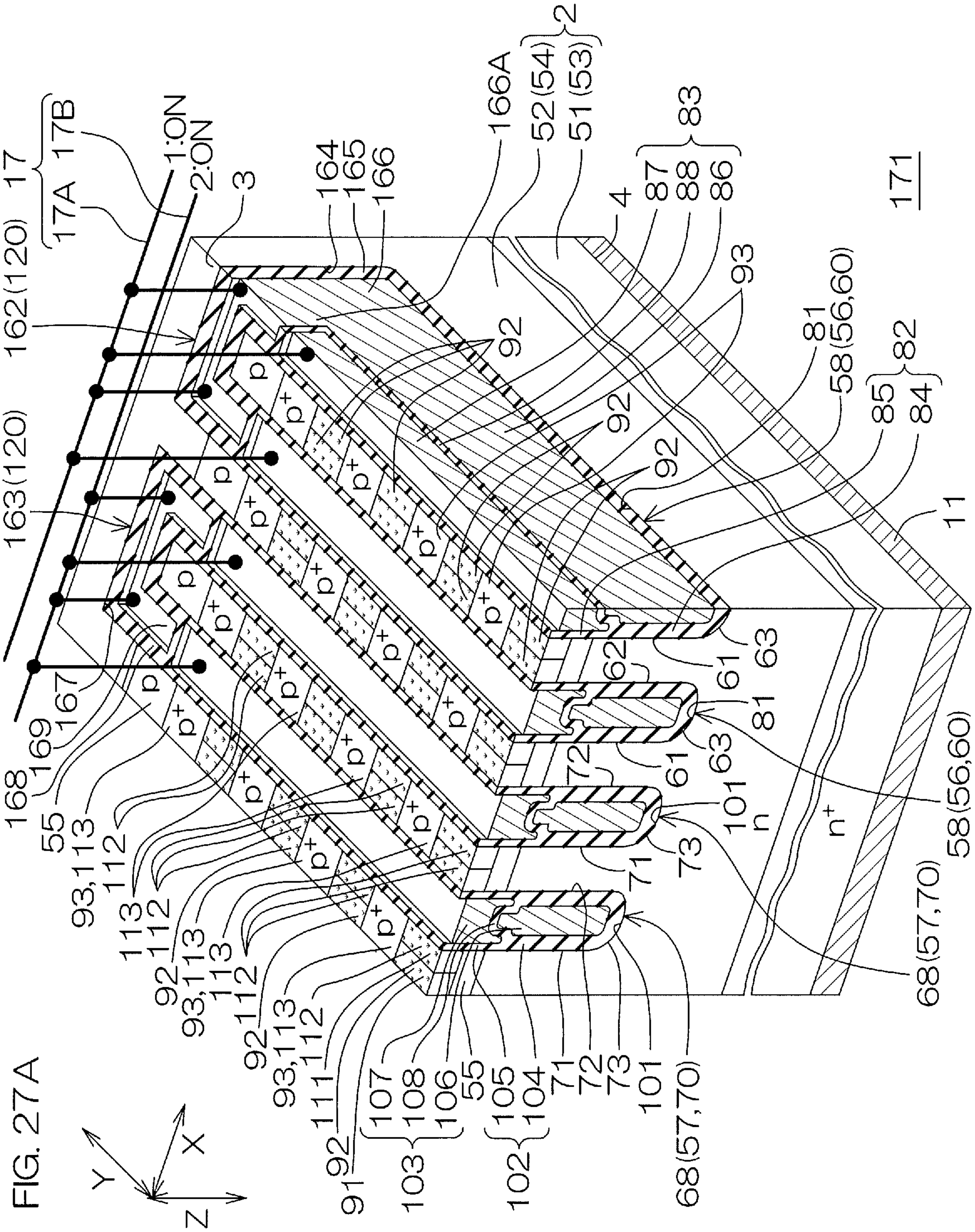
FIG. 27A is a sectional perspective view for describing a normal operation of the semiconductor device shown in FIG. 25.
Figure 27B:
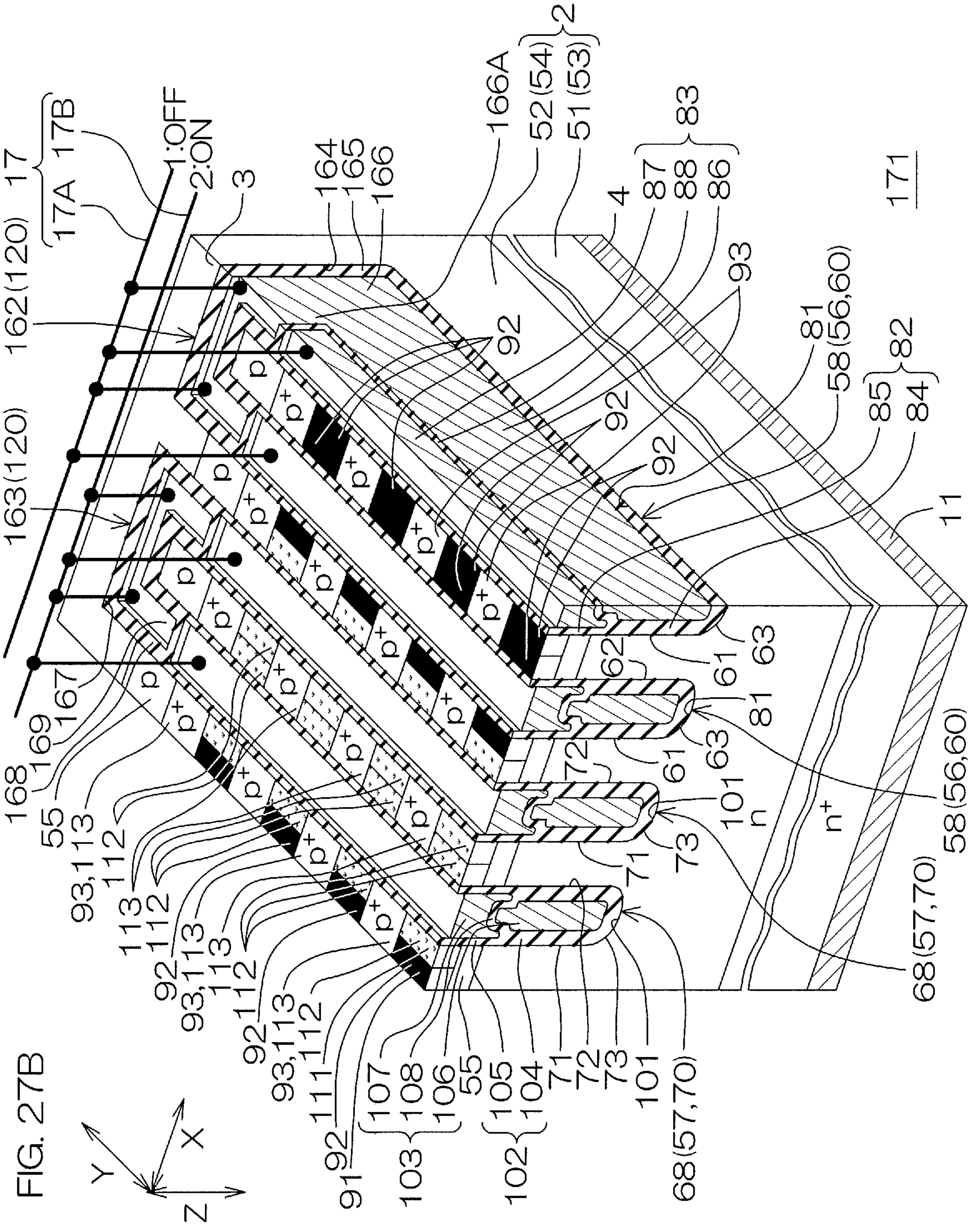
FIG. 27B is a sectional perspective view for describing an active clamp operation of the semiconductor device shown in FIG. 25.

FIG. 27A is a sectional perspective view for describing the normal operation of the semiconductor device 171 shown in FIG. 25. FIG. 27B is a sectional perspective view for describing the active clamp operation of the semiconductor device 171 shown in FIG. 25. In FIG. 27A and FIG. 27B, for convenience of description, structures in the first main surface 3 are omitted to simplify the gate control wiring 17.

With reference to FIG. 27A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 27A, the first channel region 91 and the second channel region 111 in the ON states are indicated by dotted hatching.

As a result, the first MISFET 56 and the second MISFET 57 are both driven (Full-ON control). The channel utilization rate Ru in the normal operation is 100%. The characteristics channel rate RC in the normal operation is 50%. Thereby, the area resistivity Ron·A approaches the area resistivity Ron·A shown by the second plot point P2 in the graph of FIG. 13.

On the other hand, with reference to FIG. 27B, when the power MISFET 9 is in the active clamp operation, an OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon is a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. Thereby, the first channel region 91 is controlled to be in the OFF state, and the second channel region 111 is controlled to be in the ON state. In FIG. 27B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 13.

In this control example, a description has been given of an example in which the second Half-ON control is applied in the active clamp operation. However, the first Half-ON control may be applied in the active clamp operation.

As described above, the same effects as those described for the semiconductor device 161 can be exhibited as well by the semiconductor device 171. Further, in the semiconductor device 171, the plurality of first FET structures 58 and the plurality of second FET structures 68 are formed in a manner that the group of the plurality (in this embodiment, two) of first FET structures 58 and the group of the plurality (in this embodiment, two) of second FET structures 68 are alternately arrayed.

According to a structure in which the plurality of first FET structures 58 are adjacent to each other, the first channel region 91 can be formed, without being connected to the second channel region 111, in the region between the plurality of first FET structures 58 which are adjacent to each other. Therefore, it is possible to appropriately form the first channel region 91 and appropriately adjust the first channel rate R1.

Similarly, according to a structure in which the plurality of second FET structures 68 are adjacent to each other, the second channel region 111 can be formed, without being connected to the first channel region 91, in the region between the plurality of second FET structures 68 which are adjacent to each other. Therefore, it is possible to appropriately form the second channel region 111 and appropriately adjust the second channel rate R2. Thereby, the average channel rate RAV and the characteristics channel rate RC can be appropriately adjusted.

Figure 28:
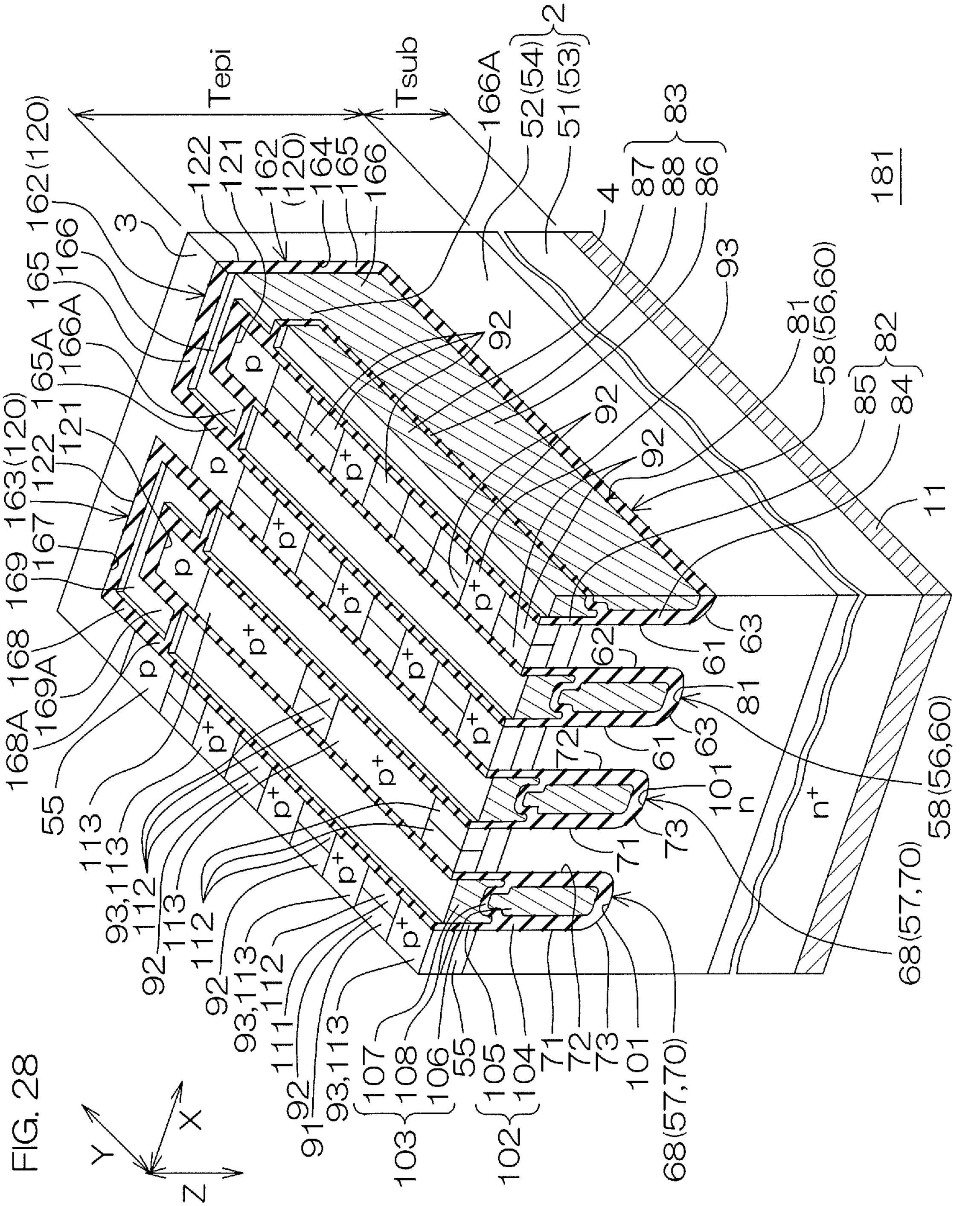
FIG. 28 is a sectional perspective view of a region corresponding to FIG. 25 and is a sectional perspective view which shows a semiconductor device according to a fifth preferred embodiment of the present invention.

FIG. 28 is a sectional perspective view of a region corresponding to FIG. 25 and is a sectional perspective view which shows a semiconductor device 181 according to a fifth preferred embodiment of the present invention. Hereinafter, structures corresponding to the structures described for the semiconductor device 171 shall be provided with the same reference symbols and description thereof shall be omitted.

In this embodiment, the first total channel rate RT1, the second total channel rate RT2, and the third total channel rate RT3, each of which has a different value from each other, are applied to the plurality of cell regions 75.

The first total channel rate RT1 may be adjusted to a range from not less than 60% to not more than 80% as an example. In this embodiment, the first total channel rate RT1 is adjusted to 75%. In the first total channel rate RT1, the first channel rate R1 in one side and the first channel rate R1 in the other side are each 37.5%.

The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 may be adjusted to a range from not less than 20% to not more than 40% as an example. In this embodiment, the third total channel rate RT3 is adjusted to 25%. In the third total channel rate RT3, the second channel rate R2 on one side and the second channel rate R2 on the other side are each 12.5%.

The first channel region 91 occupies a rate in excess of 50% (½) of a total channel. In this embodiment, the first channel region 91 occupies 62.5% of the total channel, and the second channel region 111 occupies 37.5% of the total channel. That is, the second channel rate R2 is less than the first channel rate R1 (R2<R1). In this embodiment, the average channel rate RAV is 50%. Other structures of the semiconductor device 181 are similar to those of the semiconductor device 171. In this embodiment, control which shall be described hereinafter is performed.

Figure 29A:
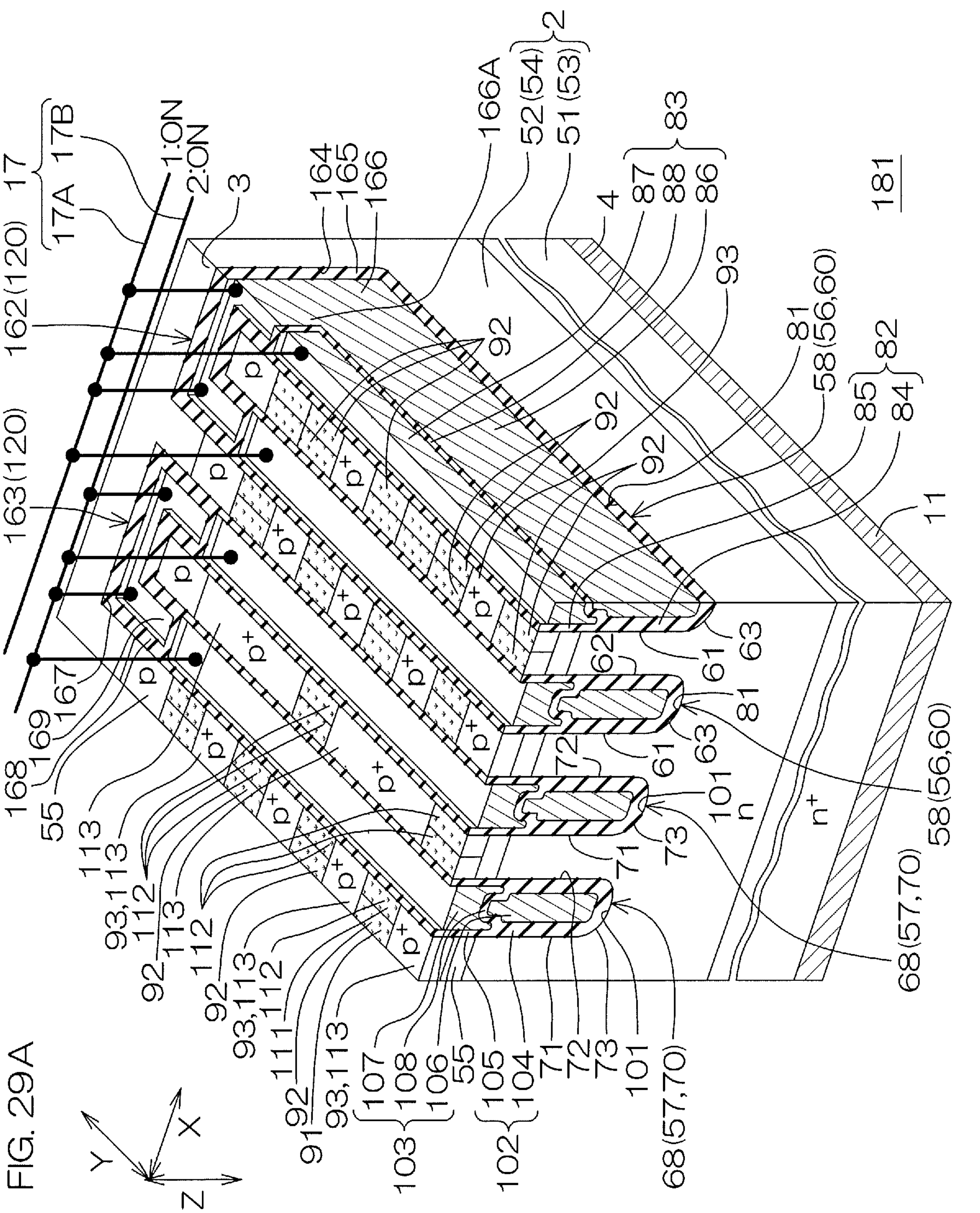
FIG. 29A is a sectional perspective view for describing a normal operation according to a first control example of the semiconductor device shown in FIG. 28.
Figure 29B:
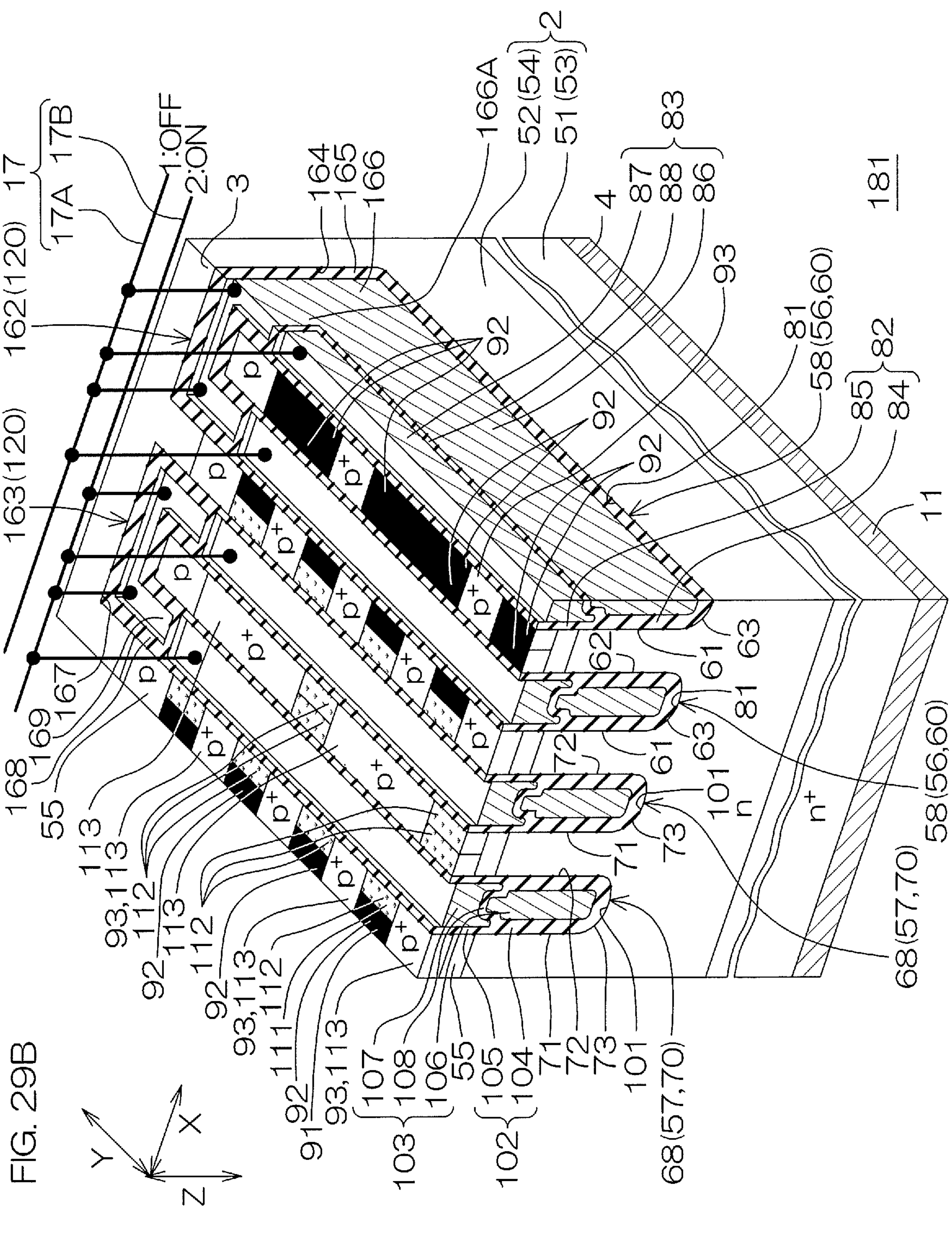
FIG. 29B is a sectional perspective view for describing an active clamp operation according to the first control example of the semiconductor device shown in FIG. 28.

FIG. 29A is a sectional perspective view for describing the normal operation according to a first control example of the semiconductor device 181 shown in FIG. 28. FIG. 29B is a sectional perspective view for describing the active clamp operation according to the first control example of the semiconductor device 181 shown in FIG. 28. In FIG. 29A and FIG. 29B, for convenience of description, structures in the first main surface 3 are omitted to simplify the gate control wiring 17.

With reference to FIG. 29A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 29A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A approaches the area resistivity Ron·A indicated by the second plot point P2 in the graph of FIG. 13.

On the other hand, with reference to FIG. 29B, when the power MISFET 9 is in the active clamp operation, an OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon each has a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. Thereby, the first channel region 91 is controlled to be in the OFF state, and the second channel region 111 is controlled to be in the ON state. In FIG. 29B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. Specifically, the channel utilization rate RU in the active clamp operation is less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the fourth plot point P4 in the graph of FIG. 13 or exceeds the active clamp capability Eac concerned.

Figure 30A:
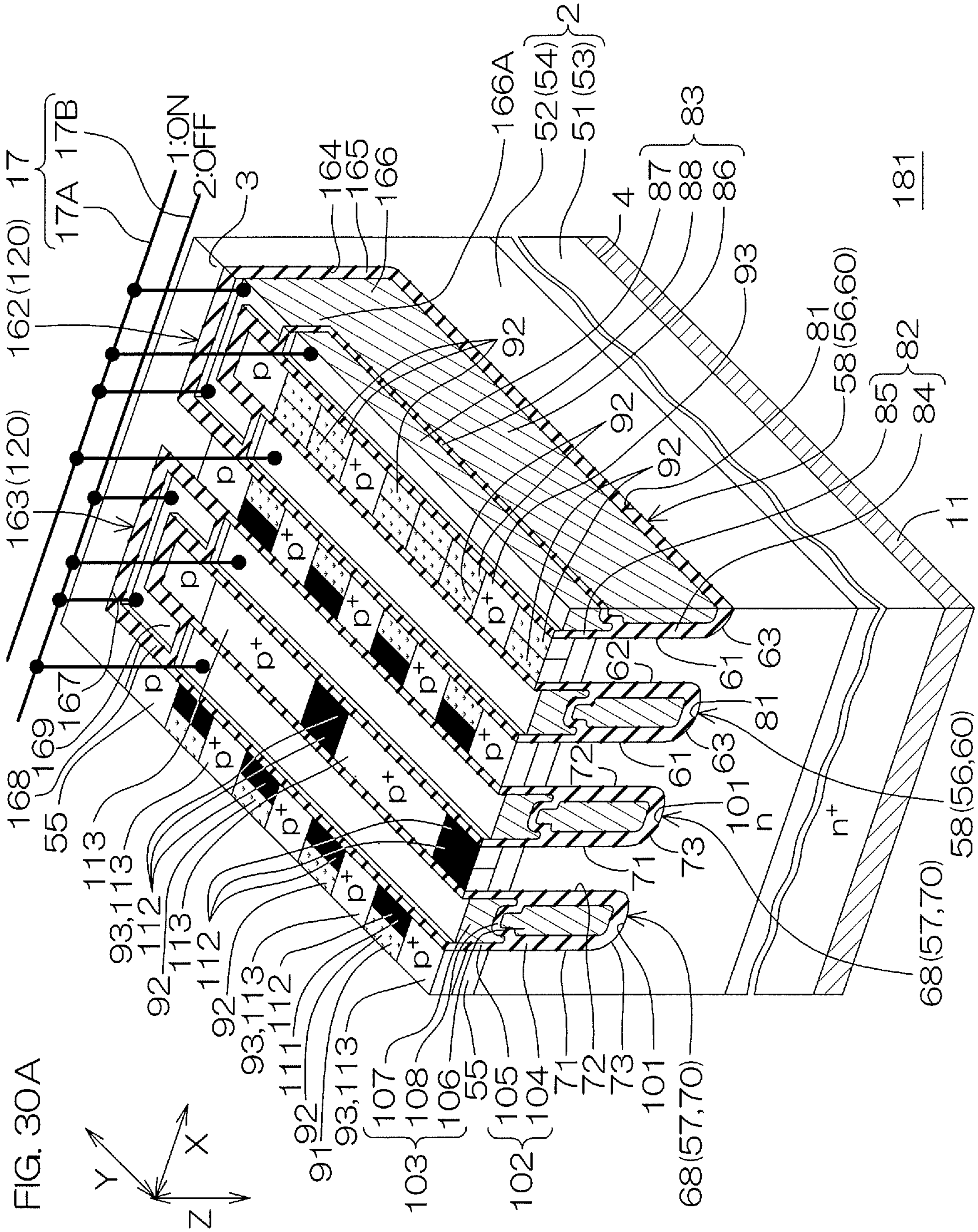
FIG. 30A is a sectional perspective view for describing a normal operation according to a second control example of the semiconductor device shown in FIG. 28.
Figure 30B:
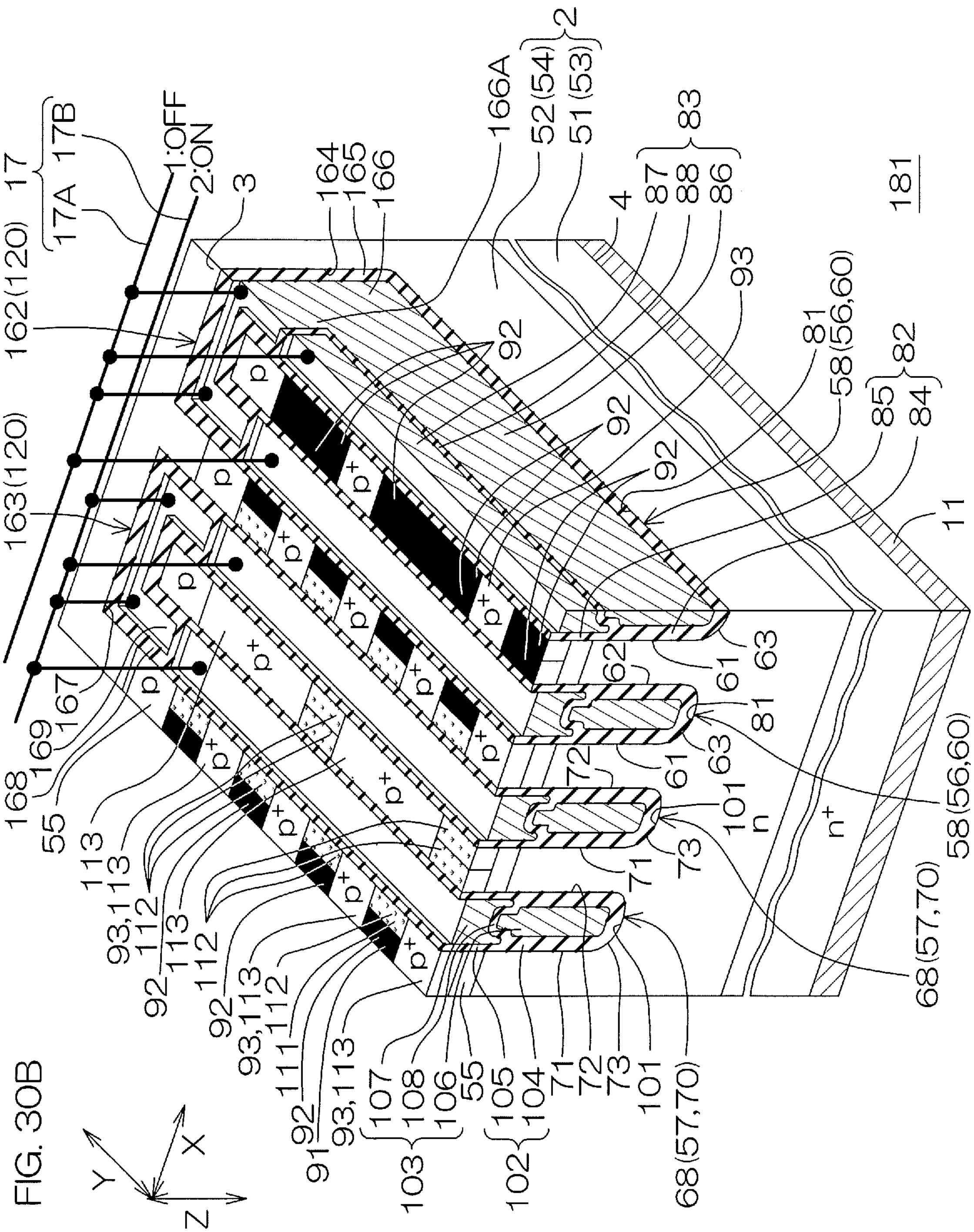
FIG. 30B is a sectional perspective view for describing an active clamp operation according to the second control example of the semiconductor device shown in FIG. 28.

FIG. 30A is a sectional perspective view for describing the normal operation according to a second control example of the semiconductor device 181 shown in FIG. 28. FIG. 30B is a sectional perspective view for describing the active clamp operation according to the second control example of the semiconductor device 181 shown in FIG. 28. In FIG. 30A and FIG. 30B, for convenience of description, structures in the first main surface 3 are omitted to simplify the gate control wiring 17.

With reference to FIG. 30A, when the power MISFET 9 is in the normal operation, an ON signal Von is input to the gate control wiring 17A and an OFF signal Voff is input to the second gate control wiring 17B. The ON signal Von and the OFF signal Voff are each input from the control IC 10. The ON signal Von has a voltage not less than the gate threshold voltage Vth. The OFF signal Voff has a voltage (for example, the reference voltage) less than the gate threshold voltage Vth.

In this case, the first bottom-side electrode 86 and the first opening-side electrode 87 are each put into the ON state, and the second bottom-side electrode 106 and the second opening-side electrode 107 are each put into the OFF state. That is, while the first bottom-side electrode 86 and the first opening-side electrode 87 each function as a gate electrode, the second bottom-side electrode 106 and the second opening-side electrode 107 each function as a field electrode.

Thereby, the first channel region 91 is controlled to be in the ON state and the second channel region 111 is controlled to be in the OFF state. In FIG. 30A, the first channel region 91 in the ON state is indicated by dotted hatching, and the second channel region 111 in the ON state is indicated by filled hatching.

As a result, while the first MISFET 56 is controlled to be in the ON state, the second MISFET 57 is controlled to be in the OFF state (first Half-ON control). Thereby, the second channel region 111 having the second channel rate R2 (R2<R1) less than the first channel rate R1 is controlled to be in the OFF state, and the characteristics channel rate RC in the normal operation therefore becomes less than the average channel rate RAV.

The channel utilization rate RU in the normal operation is 62.5%. Further, the characteristics channel rate RC in the normal operation is 31.25%. Thereby, the area resistivity Ron·A approaches the area resistivity Ron·A indicated by the third plot point P3 in the graph of FIG. 13.

On the other hand, with reference to FIG. 30B, when the power MISFET 9 is in the active clamp operation, an OFF signal Voff is input to the first gate control wiring 17A, and a clamp ON signal VCon is input to the second gate control wiring 17B. The OFF signal Voff and the clamp ON signal VCon are both input from the control IC 10.

The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first bottom-side electrode 86 and the first opening-side electrode 87 are each put into the OFF state, and the second bottom-side electrode 106 and the second opening-side electrode 107 are each put into the ON state. That is, while the first bottom-side electrode 86 and the first opening-side electrode 87 each function as a field electrode, the second bottom-side electrode 106 and the second opening-side electrode 107 each function as a gate electrode.

Thereby, the first channel region 91 is controlled to be in the OFF state, and the second channel region 111 is controlled to be in the ON state. In FIG. 30B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). The second channel region 111 having the second channel rate R2 less than the first channel rate R1 (R2<R1) is controlled to be in the ON state, and the channel utilization rate RU in the active clamp operation therefore becomes in excess of zero and less than the channel utilization rate RU in the normal operation.

The channel utilization rate RU in the active clamp operation is 37.5%. Further, the characteristics channel rate RC in the active clamp operation is 18.75%. Thereby, the active clamp capability Eac approaches the active clamp capability Eac indicated by the second plot point P2 in the graph of FIG. 13 or exceeds the active clamp capability Eac.

As described above, the same effects as those described for the semiconductor device 171 can be exhibited as well by the semiconductor device 181. In particular, according to the semiconductor device 181, the second channel rate R2 is different from the first channel rate R1 (R1≠R2). Specifically, the second channel rate R2 is less than the first channel rate R1 (R1>R2).

In the above-described structure, the control IC 10 controls the first MISFET 56 and the second MISFET 57 such that the channel utilization rate RU in the active clamp operation becomes in excess of zero and less than the channel utilization rate RU in the normal operation. Thereby, it is possible to enhance the effects of improving the active clamp capability Eac.

Further, according to the semiconductor device 181, as shown in the second control example, the first Half-ON control can be applied in the normal operation and the second Half-ON control can be applied in the active clamp operation. Further, according to the semiconductor device 181, the second Half-ON control can be applied in the normal operation and the first Half-ON control can be applied in the active clamp operation. That is, according to the semiconductor device 181, by only changing a control pattern, it becomes possible to realize various types of area resistivity Ron·A and active clamp capability Eac, while having the same average channel rate RAV.

Figure 31:
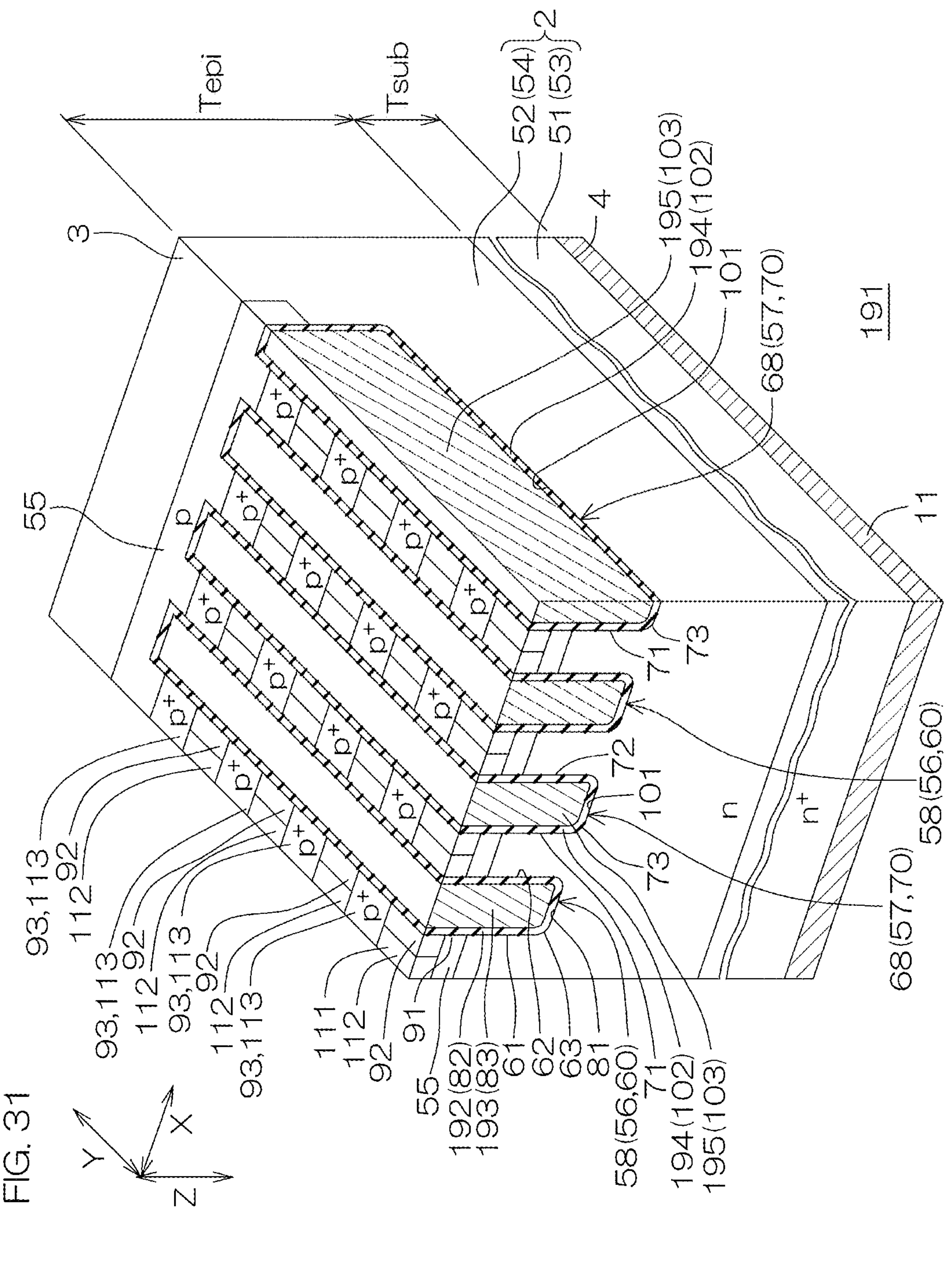
FIG. 31 is a sectional perspective view of a region corresponding to FIG. 7 and is a sectional perspective view for showing a semiconductor device according to a sixth preferred embodiment of the present invention.

FIG. 31 is a sectional perspective view of a region corresponding to FIG. 7 and is a sectional perspective view of a semiconductor device 191 according to a sixth preferred embodiment of the present invention. Hereinafter, structures corresponding to the structures described for the semiconductor device 1 shall be provided with the same reference symbols and description thereof shall be omitted.

According to the semiconductor device 1, the first insulation layer 82 includes the first bottom-side insulation layer 84 and the first opening-side insulation layer 85 in the first trench gate structure 60, and the first electrode 83 includes the first bottom-side electrode 86, the first opening-side electrode 87 and the first intermediate insulation layer 88.

In contrast thereto, in the semiconductor device 191, the first insulation layer 82 does not include the first bottom-side insulation layer 84, and the first electrode 83 does not include the first bottom-side electrode 86 and the first intermediate insulation layer 88. That is, in the semiconductor device 191, the first insulation layer 82 includes a first gate insulation layer 192 which corresponds to the first opening-side insulation layer 85, and the first electrode 83 includes a first gate electrode 193 which corresponds to the first opening-side electrode 87.

Further, according to the semiconductor device 1, the second insulation layer 102 includes the second bottom-side insulation layer 104 and the second opening-side insulation layer 105 in the second trench gate structure 70, and the second electrode 103 includes the second bottom-side electrode 106, the second opening-side electrode 107 and the second intermediate insulation layer 108.

In contrast thereto, in the semiconductor device 191, the second insulation layer 102 does not include the second bottom-side insulation layer 104, and the second electrode 103 does not include the second bottom-side electrode 106 and the second intermediate insulation layer 108. That is, in the semiconductor device 191, the second insulation layer 102 includes a second gate insulation layer 194 which corresponds to the second opening-side insulation layer 105, and the second electrode 103 includes a second gate electrode 195 which corresponds to the second opening-side electrode 107.

Further, the semiconductor device 1 has the trench contact structure 120. In contrast thereto, the semiconductor device 191 does not have the trench contact structure 120. Hereinafter, a specific description will be given of a structure of the semiconductor device 191.

In the first trench gate structure 60, the first gate insulation layer 192 is formed in a film shape along the inner wall of the first gate trench 81. The first gate insulation layer 192 defines a concave space inside the first gate trench 81.

A part which covers the bottom wall 63 of the first gate trench 81 in the first gate insulation layer 192 may be larger in thickness than a part which covers the first side wall 61 and the second side wall 62 of the first gate trench 81 in the first gate insulation layer 192. As a matter of course, the first gate insulation layer 192 may have a uniform thickness.

The first gate electrode 193 is embedded in the first gate trench 81 across the first gate insulation layer 192. Specifically, the first gate electrode 193 is embedded as an integrated member into the concave space defined by the first gate insulation layer 192 in the first gate trench 81. The first gate control signal (first control signal) including the ON signal Von and the OFF signal Voff is applied to the first gate electrode 193.

The first gate electrode 193 may include at least any one of conductive polysilicon, tungsten, aluminum, copper, an aluminum alloy, and a copper alloy. In this embodiment, the first gate electrode 193 includes conductive polysilicon. The conductive polysilicon may include an n-type impurity or a p-type impurity. The conductive polysilicon preferably includes an n-type impurity.

In the second trench gate structure 70, the second gate insulation layer 194 is formed in a film shape along an inner wall of the second gate trench 101. The second gate insulation layer 194 defines a concave space inside the second gate trench 101.

In the second gate insulation layer 194, a part which covers the bottom wall 73 of the second gate trench 101 may be larger in thickness than a part which covers the first side wall 71 and the second side wall 72 in the second gate insulation layer 194. As a matter of course, the second gate insulation layer 194 may have a uniform thickness.

The second gate electrode 195 is embedded in the second gate trench 101 across the second gate insulation layer 194. Specifically, the second gate electrode 195 is embedded as an integrated member into the concave space defined by the second gate insulation layer 194 in the second gate trench 101. The second gate control signal (second control signal) including the ON signal Von and the OFF signal Voff is applied to the second gate electrode 195.

The second gate electrode 195 may include at least any one of conductive polysilicon, tungsten, aluminum, copper, an aluminum alloy, and a copper alloy. It is preferable that the second gate electrode 195 includes the same conductive material as the first gate electrode 193. In this embodiment, the second gate electrode 195 includes conductive polysilicon. The conductive polysilicon may include an n-type impurity or a p-type impurity. The conductive polysilicon preferably includes an n-type impurity.

Although not specifically shown in the drawing, the first gate control wiring 17A is electrically connected to the first gate electrode 193, and the second gate control wiring 17B is electrically connected to the second gate electrode 195.

Figure 32A:
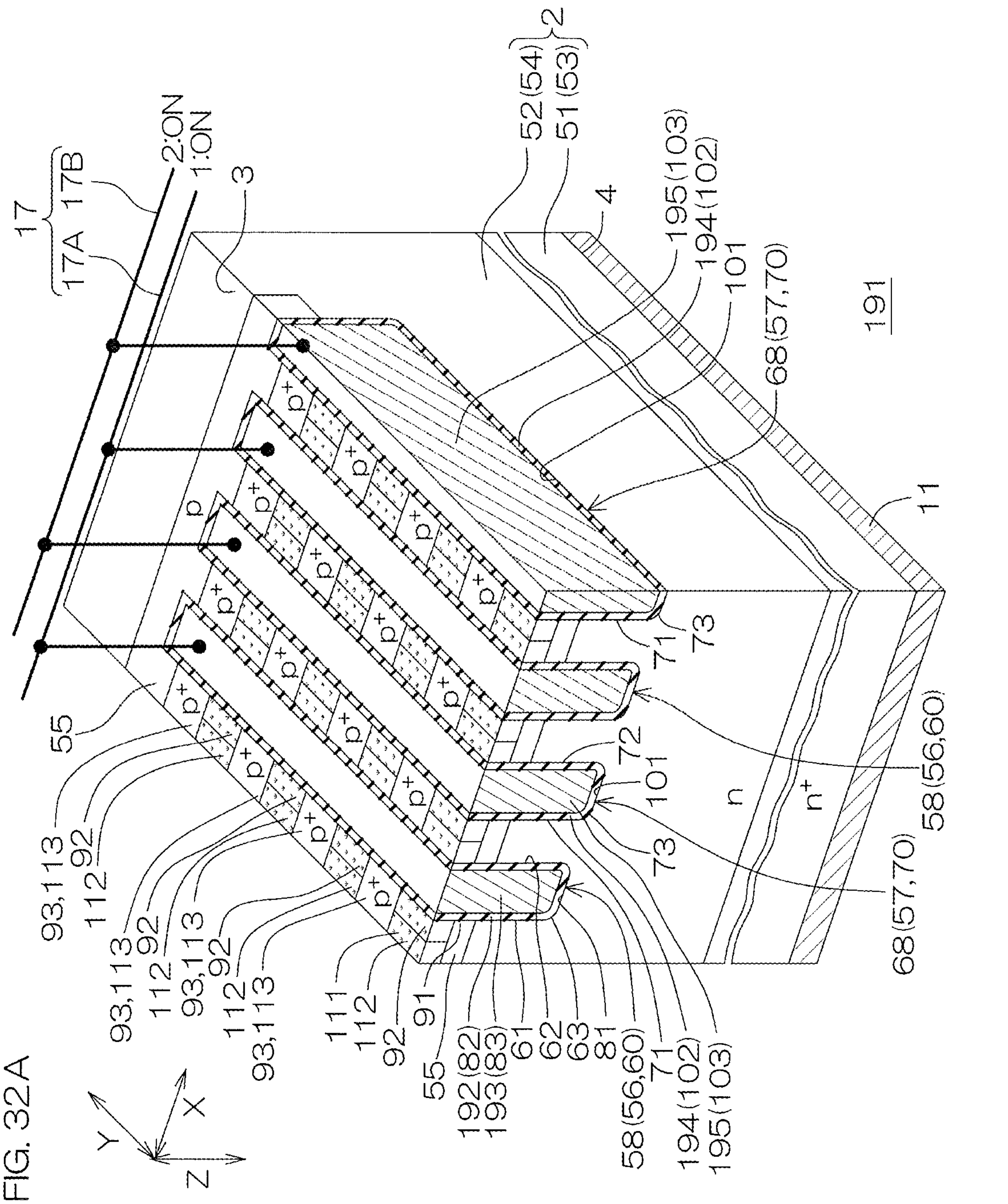
FIG. 32A is a sectional perspective view for describing a normal operation of the semiconductor device shown in FIG. 31.
Figure 32B:
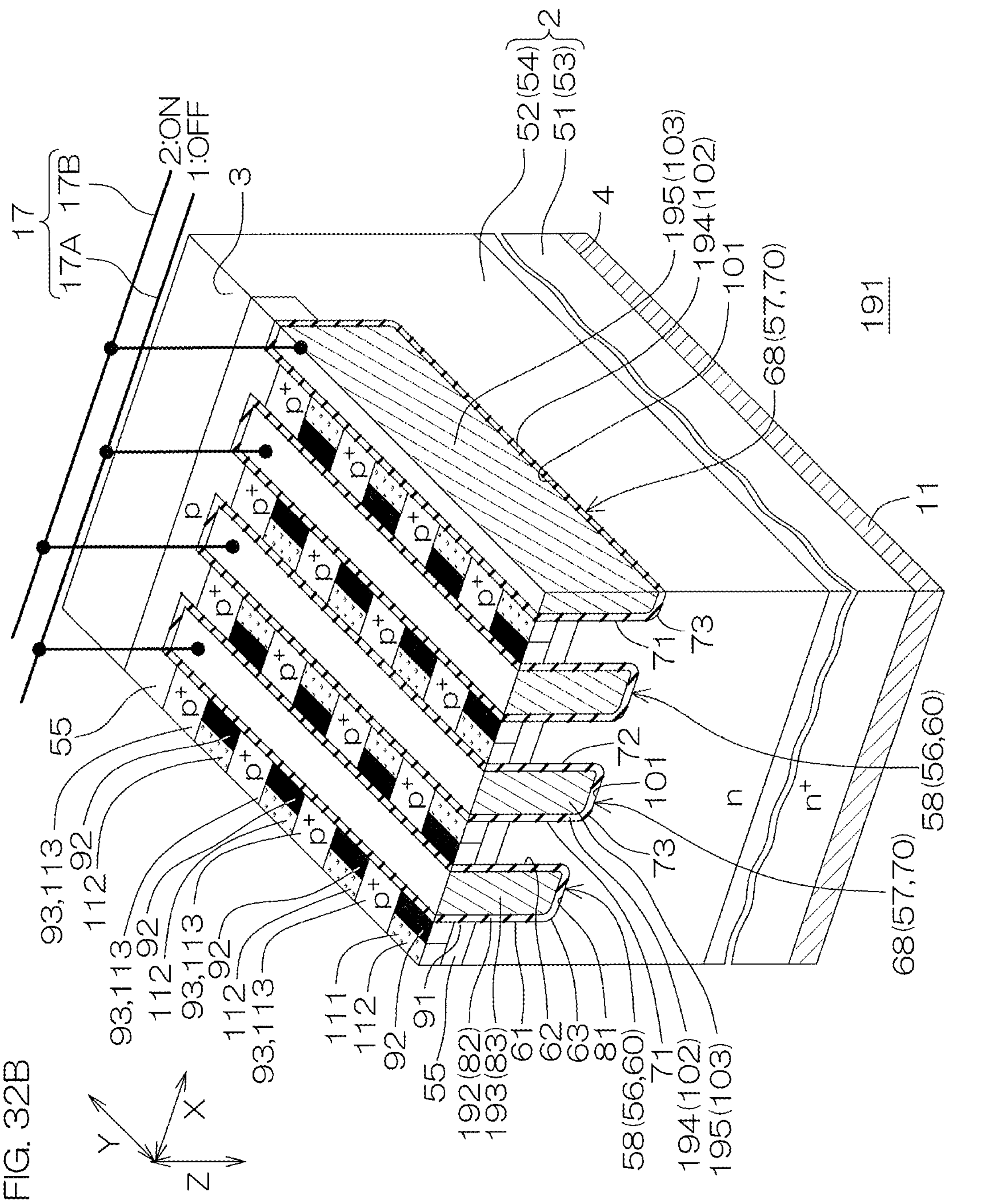
FIG. 32B is a sectional perspective view for describing an active clamp operation of the semiconductor device shown in FIG. 31.

FIG. 32A is a sectional perspective view for describing the normal operation of the semiconductor device 191 shown in FIG. 31. FIG. 32B is a sectional perspective view for describing the active clamp operation of the semiconductor device 191 shown in FIG. 31.

With reference to FIG. 32A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first gate electrode 193 and the second gate electrode 195 are each put into the ON state. Thereby, the first channel region 91 and the second channel region 111 are both controlled to be in the ON states. In FIG. 32A, the first channel region 91 and the second channel region 111 in the ON states are indicated by dotted hatching.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A is lowered as compared with a case where the characteristics channel rate RC is less than 50%.

On the other hand, with reference to FIG. 32B, when the power MISFET 9 is in the active clamp operation, the OFF signal Voff is input to the first gate control wiring 17A, and a clamp ON signal VCon is input to the second gate control wiring 17B.

The OFF signal Voff and the clamp ON signal VCon are each input from the control IC 10. The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first gate electrode 193 is put into the OFF state, and the second gate electrode 195 is put into the ON state. Thereby, the first channel region 91 is controlled to be in the OFF state, and the second channel region 111 is controlled to be in the ON state. In FIG. 32B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. Further, the characteristics channel rate RC in the active clamp operation is 25%. Thereby, the active clamp capability Eac is improved as compared with a case where the characteristics channel rate RC is in excess of 25%.

In this control example, a description has been given of an example in which the second Half-ON control is applied in the active clamp operation. However, the first Half-ON control may be applied in the active clamp operation.

As described above, the same effects as those described for the semiconductor device 1 can be exhibited as well by the semiconductor device 191. In this embodiment, an example is shown in which the second channel rate R2 (second channel area S2) is equal to the first channel rate R1 (first channel area S1). However, the second channel rate R2 may be different from the first channel rate R1 (R1≠R2) as in a case of the second preferred embodiment (refer to FIG. 16). The second channel rate R2 may be less than the first channel rate R1 (R2<R1).

Figure 33:
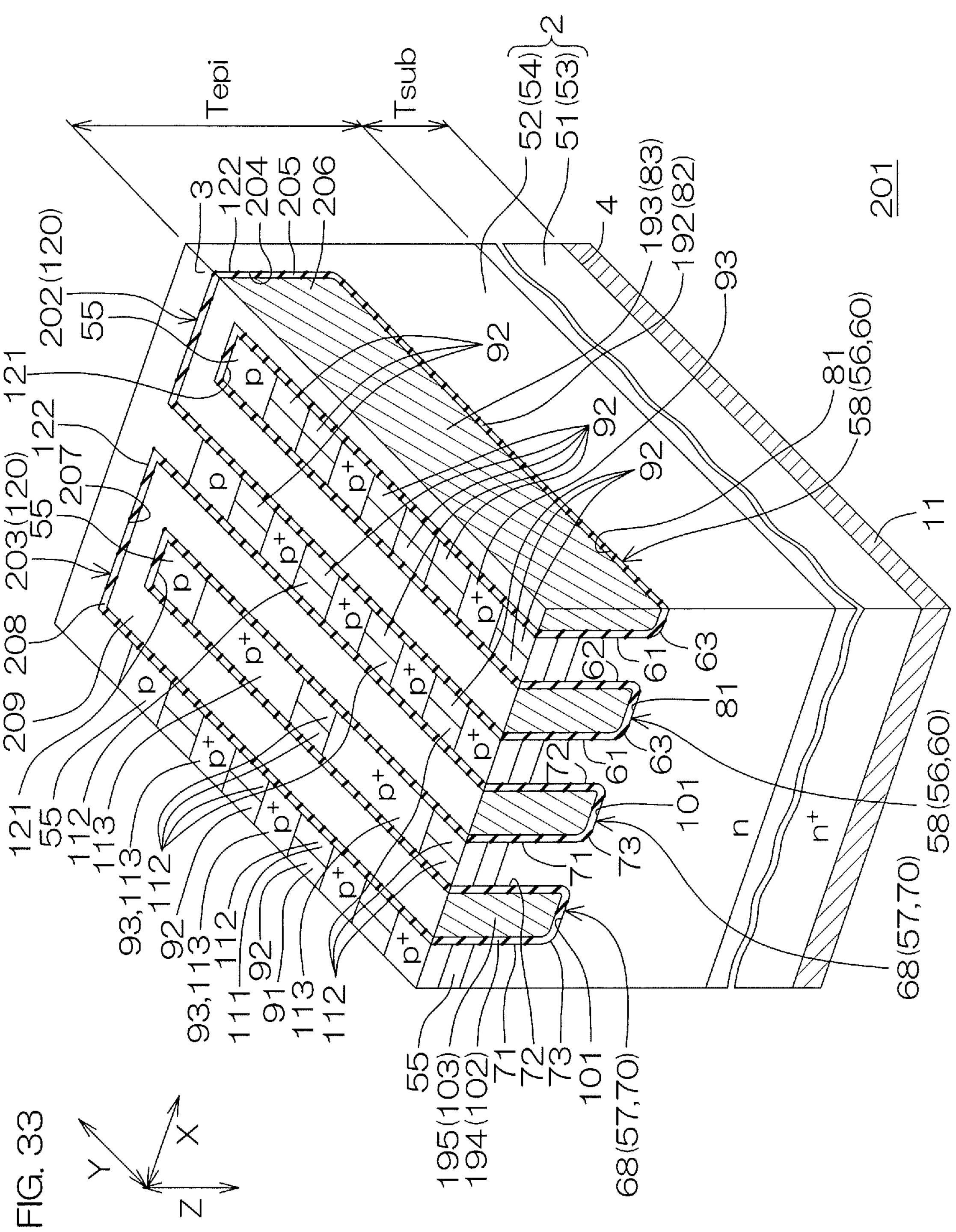
FIG. 33 is a sectional perspective view of a region corresponding to FIG. 7 and is a perspective view which shows a semiconductor device according to a seventh preferred embodiment of the present invention.

FIG. 33 is a sectional perspective view of a region corresponding to FIG. 31 and is a perspective view which shows a semiconductor device 201 according to a seventh preferred embodiment of the present invention. Hereinafter, structures corresponding to the structures described for the semiconductor device 191 shall be provided with the same reference symbols and description thereof shall be omitted.

In the semiconductor device 191, the plurality of first FET structures 58 and the plurality of second FET structures 68 are formed in a manner that one first FET structure 58 and one second FET structure 68 are alternately arrayed. In contrast thereto, in the semiconductor device 201, the plurality of first FET structures 58 and the plurality of second FET structures 68 are formed in a manner that a group of a plurality (in this embodiment, two) of first FET structures 58 and a group of a plurality (in this embodiment, two) of second FET structures 68 are alternately arrayed.

Further, the semiconductor device 191 does not have the trench contact structure 120. In contrast thereto, the semiconductor device 201 has the trench contact structure 120. Specifically, the semiconductor device 201 includes the plurality of trench contact structures 120 which are each connected to the first trench gate structure 60 and the second trench gate structure 70 in a manner that the first trench gate structure 60 and the second trench gate structure 70 are electrically insulated from each other.

Further, in the semiconductor device 191, the second channel rate R2 (second channel area S2) is equal to the first channel rate R1 (first channel area S1). In contrast thereto, in the semiconductor device 201, the second channel rate R2 is different from the first channel rate R1 (R1≠R2). Specifically, the second channel rate R2 is less than the first channel rate R1 (R2<R1). Hereinafter, a specific description will be given of a structure of the semiconductor device 201.

With reference to FIG. 33, the plurality of cell regions 75 are each defined to a region between two first FET structures 58 which are adjacent to each other, a region between one first FET structure 58 and one second FET structure 68 which are adjacent to each other, and a region between two second FET structures 68 which are adjacent to each other.

In this embodiment, three types of total channel rates RT which are different in value from each other are applied to the plurality of cell regions 75. The three types of total channel rates RT include a first total channel rate RT1, a second total channel rate RT2, and a third total channel rate RT3.

The first total channel rate RT1 is applied to the region between two first FET structures 58 which are adjacent to each other. No second channel region 111 is formed in the region between two first FET structures 58 which are adjacent to each other, due to its structure.

The first total channel rate RT1 is a total value of the first channel rates R1 of two first FET structures 58 which are adjacent to each other. The first total channel rate RT1 may be adjusted to a range from not less than 60% to not more than 80% as an example. In this embodiment, the first total channel rate RT1 is adjusted to 75%. In the first total channel rate RT1, the first channel rate R1 on one side and the first channel rate R1 on the other side are each 37.5%.

The second total channel rate RT2 is applied to the region between one first FET structure 58 and one second FET structure 68 which are adjacent to each other. The first channel region 91 and the second channel region 111 are formed in the region between one first FET structure 58 and one second FET structure 68 which are adjacent to each other, due to its structure.

The second total channel rate RT2 is a total value of the first channel rate R1 and the second channel rate R2. The second total channel rate RT2 may be adjusted to a range in excess of 40% and less than 60% as an example. In this embodiment, the second total channel rate RT2 is adjusted to 50%. In the second total channel rate RT2, the first channel rate R1 is 25% and the second channel rate R2 is 25%.

The third total channel rate RT3 is applied to the region between two second FET structures 68 which are adjacent to each other. No first channel region 91 is formed in the region between two second FET structures 68 which are adjacent to each other, due to its structure.

The third total channel rate RT3 is a total value of the second channel rates R2 of two second FET structures 68 which are adjacent to each other. The third total channel rate RT3 may be adjusted to a range from not less than 20% to not more than 40% as an example. In this embodiment, the third total channel rate RT3 is adjusted to 25%. In the third total channel rate RT3, the second channel rate R2 on one side and the second channel rate R2 on the other side are each 12.5%.

The first channel region 91 occupies a rate in excess of 50% (½) of a total channel. In this embodiment, the first channel region 91 occupies 62.5% of the total channel, and the second channel region 111 occupies 37.5% of the total channel. That is, the second channel rate R2 is less than the first channel rate R1 (R2<R1). In this embodiment, the average channel rate RAV is 50%.

The plurality of trench contact structures 120 include a plurality of first trench contact structures 202 and a plurality of second trench contact structures 203. Each of the first trench contact structures 202 is connected to one end portion of corresponding one of the plurality of first trench gate structures 60 at an interval from the plurality of second trench gate structure 70. The plurality of first trench contact structures 202 are formed in an arch shape in plan view.

Each of the second trench contact structures 203 is connected to one end portion of corresponding one of the plurality of second trench gate structures 70 at an interval from the plurality of first trench gate structures 60. The plurality of second trench contact structures 203 are formed in an arch shape in plan view.

Each of the first trench contact structures 202 includes a first contact trench 204, a first contact insulation layer 205, and a first contact electrode 206. In this embodiment, the first contact trench 204, the first contact insulation layer 205, and the first contact electrode 206 have structures respectively corresponding to the first gate trench 81, the first gate insulation layer 192, and the first gate electrode 193.

In each of the first trench contact structures 202, the first contact trench 204 communicates with one end portions of the plurality of first gate trenches 81 which are adjacent to each other. The first contact insulation layer 205 is integrally formed with the first gate insulation layer 192 at a communication portion between each of the first gate trenches 81 and the first contact trench 204. The first contact electrode 206 is integrally formed with the first gate electrode 193 at the communication portion between each of the first gate trenches 81 and the first contact trench 204.

Each of the second trench contact structures 203 includes a second contact trench 207, a second contact insulation layer 208, and a second contact electrode 209. In this embodiment, the second contact trench 207, the second contact insulation layer 208, and the second contact electrode 209 have structures respectively corresponding to the second gate trench 101, the second gate insulation layer 194, and the second gate electrode 195.

In each of the second trench contact structures 203, the second contact trench 207 communicates with one end portions of the plurality of second gate trenches 101 which are adjacent to each other. The second contact insulation layer 208 is integrally formed with the second gate insulation layer 194 at a communication portion between each of the second gate trenches 101 and the second contact trench 207. The second contact electrode 209 is integrally formed with the second gate electrode 195 at the communication portion between each of the second gate trenches 101 and the second contact trench 207.

Although not specifically shown in the drawing, the first gate control wiring 17A is electrically connected to the first gate electrode 193 and the first contact electrode 206, and the second gate control wiring 17B is electrically connected to the second gate electrode 195 and the second contact electrode 209.

Figure 34A:
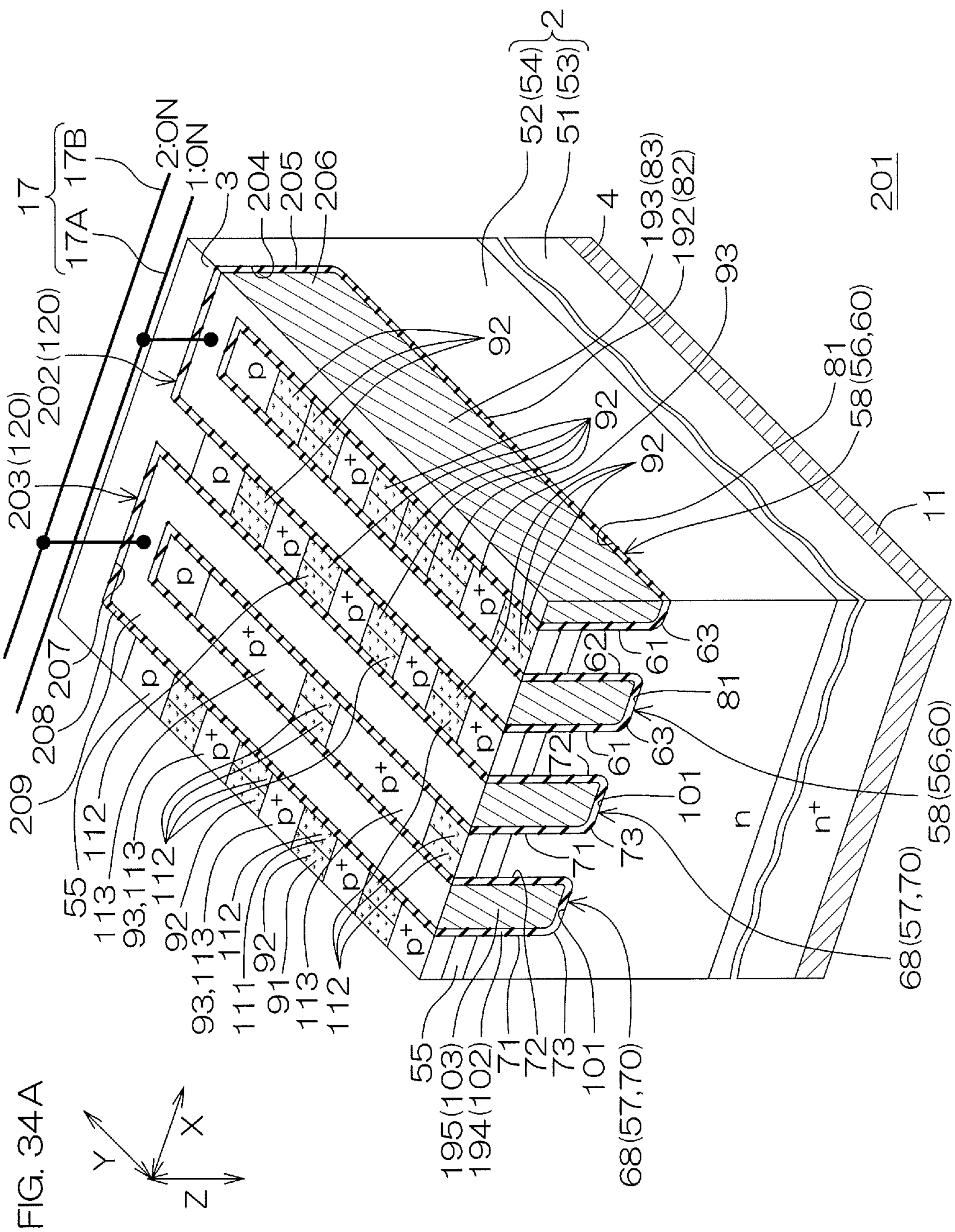
FIG. 34A is a sectional perspective view for describing a normal operation of the semiconductor device shown in FIG. 33.
Figure 34B:
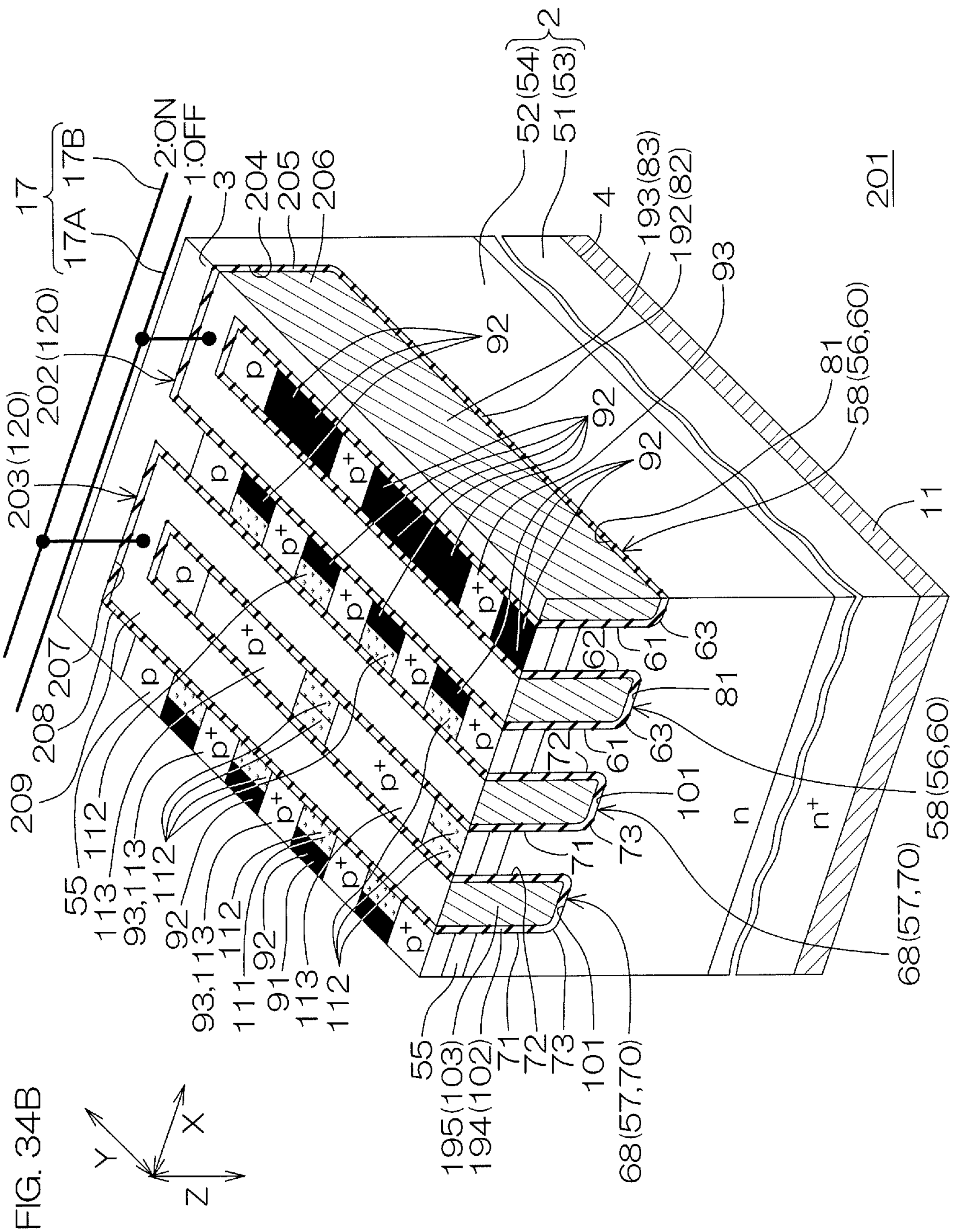
FIG. 34B is a sectional perspective view for describing an active clamp operation of the semiconductor device shown in FIG. 33.

FIG. 34A is a sectional perspective view for describing the normal operation of the semiconductor device 201 shown in FIG. 33. FIG. 34B is a sectional perspective view for describing the active clamp operation of the semiconductor device 201 shown in FIG. 33. In FIG. 34A and FIG. 34B, for convenience of description, structures in the first main surface 3 are omitted to simplify the gate control wiring 17.

With reference to FIG. 34A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may each have an equal voltage.

In this case, the first gate electrode 193 and the second gate electrode 195 are each put into the ON state. Thereby, the first channel region 91 and the second channel region 111 are both controlled to be in the ON states. In FIG. 34A, the first channel region 91 and the second channel region 111 in the ON states are indicated by dotted hatching.

As a result, the first MISFET 56 and the second MISFET 57 are both driven (Full-ON control). A channel utilization rate RU in the normal operation is 100%. A characteristics channel rate RC in the normal operation is 50%. Thereby, the area resistivity Ron·A is lowered as compared with a case where the characteristics channel rate RC is less than 50%.

On the other hand, with reference to FIG. 34B, when the power MISFET 9 is in the active clamp operation, an OFF signal Voff is input to the first gate control wiring 17A, and a clamp ON signal VCon is input to the second gate control wiring 17B. The OFF signal Voff and the clamp ON signal VCon are each input from the control IC 10.

The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first gate electrode 193 is put into the OFF state, and the second gate electrode 195 is put into the ON state. Thereby, the first channel region 91 is controlled to be in the OFF state, and the second channel region 111 is controlled to be in the ON state. In FIG. 34B, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. Specifically, the channel utilization rate RU in the active clamp operation is less than ½ of the channel utilization rate RU in the normal operation.

The channel utilization rate RU in the active clamp operation is 37.5%. Further, the characteristics channel rate RC in the active clamp operation is 18.75%. Thereby, the active clamp capability Eac is improved as compared with a case where the characteristics channel rate RC exceeds 18.75%.

As described above, the same effects as those described for the semiconductor device 191 can be exhibited as well by the semiconductor device 201. Further, in the semiconductor device 201, the plurality of first FET structures 58 and the plurality of second FET structures 68 are formed in a manner that the group of the plurality (in this embodiment, two) of first FET structures 58 and the group of the plurality (in this embodiment, two) of second FET structures 68 are alternately arrayed.

According to a structure in which the plurality of first FET structures 58 are adjacent to each other, the first channel region 91 can be formed, without being connected to the second channel region 111, in the region between the plurality of first FET structures 58 which are adjacent to each other. Therefore, it is possible to appropriately form the first channel region 91 and appropriately adjust the first channel rate R1.

Similarly, according to a structure in which the plurality of second FET structures 68 are adjacent to each other, the second channel region 111 can be formed, without being connected to the first channel region 91, in the region between the plurality of second FET structures 68 which are adjacent to each other. Therefore, it is possible to appropriately form the second channel region 111 and appropriately adjust the second channel rate R2. Thereby, the average channel rate RAV and the characteristics channel rate RC can be appropriately adjusted.

Figure 35:
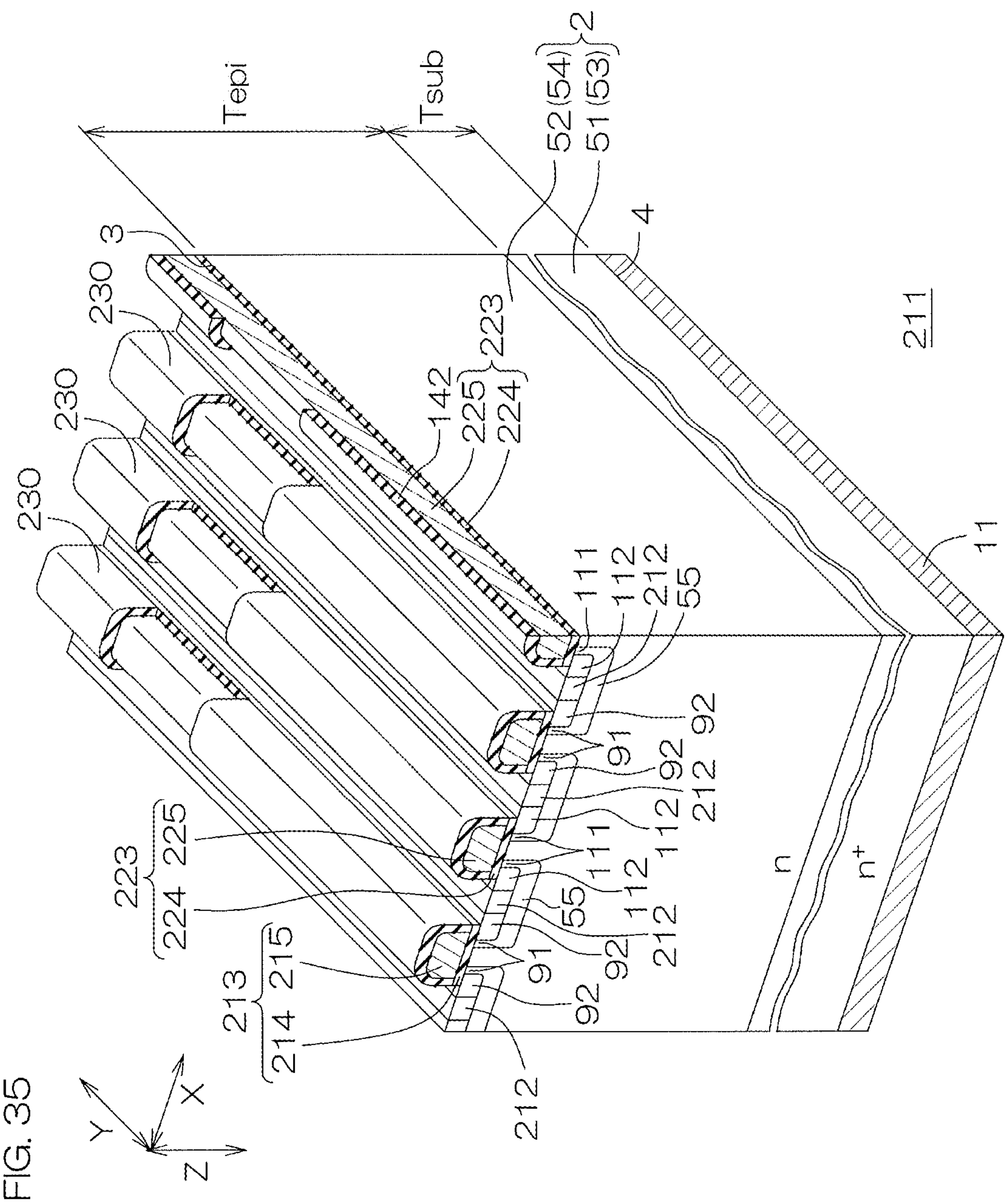
FIG. 35 is a sectional perspective view of a region corresponding to FIG. 7 and is a partially cutaway sectional perspective view which shows a semiconductor device according to an eighth preferred embodiment of the present invention.

FIG. 35 is a sectional perspective view of a region corresponding to FIG. 7 and is a partially cutaway sectional perspective view which shows a semiconductor device 211 according to an eighth preferred embodiment of the present invention. Hereinafter, structures corresponding to the structures described for the semiconductor device 1 shall be provided with the same reference symbols and description thereof shall be omitted.

The semiconductor device 1 includes the trench gate-type first FET structures 58 and the trench-gate type second FET structures 68. In contrast thereto, the semiconductor device 211 includes a planar gate-type first FET structure 58 and a planar gate-type second FET structure 68. Hereinafter, a description will be given of a specific structure of the semiconductor device 211.

With reference to FIG. 35, a plurality of body regions 55 are formed in the surface layer portion of the first main surface 3 of the semiconductor layer 2. The plurality of body regions 55 are regions which serve as bases of the power MISFET 9. The plurality of body regions 55 are formed at intervals along the first direction X, and each extend in a band shape along the second direction Y. The plurality of body regions 55 are formed in a stripe shape as a whole in plan view.

Each of the first FET structures 58 includes the first source region 92 formed in the surface layer portion of each of the body regions 55. The first source region 92 extends in a band shape along the second direction Y. Each of the second FET structures 68 includes the second source region 112 formed in the surface layer portion of each of the body regions 55. Specifically, the second source region 112 is formed with an interval along the first direction X and extends in a band shape along the second direction Y.

Each of the first FET structures 58 and each of the second FET structures 68 include the $p^+$-type contact region 212 formed in the surface layer portion of each of the body regions 55. The contact region 212 is shared by the first FET structure 58 and the second FET structure 68. The contact region 212 is formed in a region between the first source region 92 and the second source region 112. The contact region 212 extends in a band shape along the second direction Y.

The first FET structure 58 includes a first planar gate structure 213 formed on the first main surface 3 of the semiconductor layer 2. The first planar gate structure 213 extends in a band shape along the second direction Y and faces the drift region 54, the body region 55, and the first source region 92.

Specifically, each of the first planar gate structures 213 includes a first gate insulation layer 214 and a first gate electrode 215. The first gate insulation layer 214 is formed on the first main surface 3. The first gate insulation layer 214 covers the drift region 54, the body region 55, and the first source region 92 on the first main surface 3. The first gate electrode 215 faces the drift region 54, the body region 55, and the first source region 92 across the first gate insulation layer 214.

In this embodiment, the first channel region 91 of the first MISFET 56 is formed in a region between the drift region 54 and the first source region 92 in the body region 55. The first channel region 91 faces the first gate electrode 215 across the first gate insulation layer 214.

The second FET structure 68 includes a second planar gate structure 223 formed on the second main surface 4 of the semiconductor layer 2. The second planar gate structure 223 extends in a band shape along the second direction Y and faces the drift region 54, the body region 55, and the second source region 112.

Specifically, each of the second planar gate structures 223 includes a second gate insulation layer 224 and a second gate electrode 225. The second gate insulation layer 224 is formed on the second main surface 4. The second gate insulation layer 224 covers the drift region 54, the body region 55, and the second source region 112 on the second main surface 4. The second gate electrode 225 faces the drift region 54, the body region 55, and the second source region 112 across the second gate insulation layer 224.

In this embodiment, the second channel region 111 of the second MISFET 57 is formed in a region between the drift region 54 and the second source region 112 in the body region 55. The second channel region 111 faces the second gate electrode 225 across the second gate insulation layer 224.

The interlayer insulation layer 142 is formed on the first main surface 3. A plurality of source openings 230 are formed in the interlayer insulation layer 142. The source openings 230 are each formed in a part which covers a region between the first planar gate structure 213 and the second planar gate structure 223 which are adjacent to each other in the interlayer insulation layer 142. The source openings 230 each expose the first source region 92, the second source region 112, and the contact region 212.

Although not specifically shown in the drawing, the source electrode 12 is formed on the interlayer insulation layer 142 in a manner that enters each of the source openings 230. The source electrode 12 is electrically connected to the first source region 92, the second source region 112, and the contact region 212 inside each of the source openings 230. Further, although not specifically shown in the drawing, the first gate control wiring 17A is electrically connected to the first gate electrode 193, and the second gate control wiring 17B is electrically connected to the second gate electrode 195.

Figure 36A:
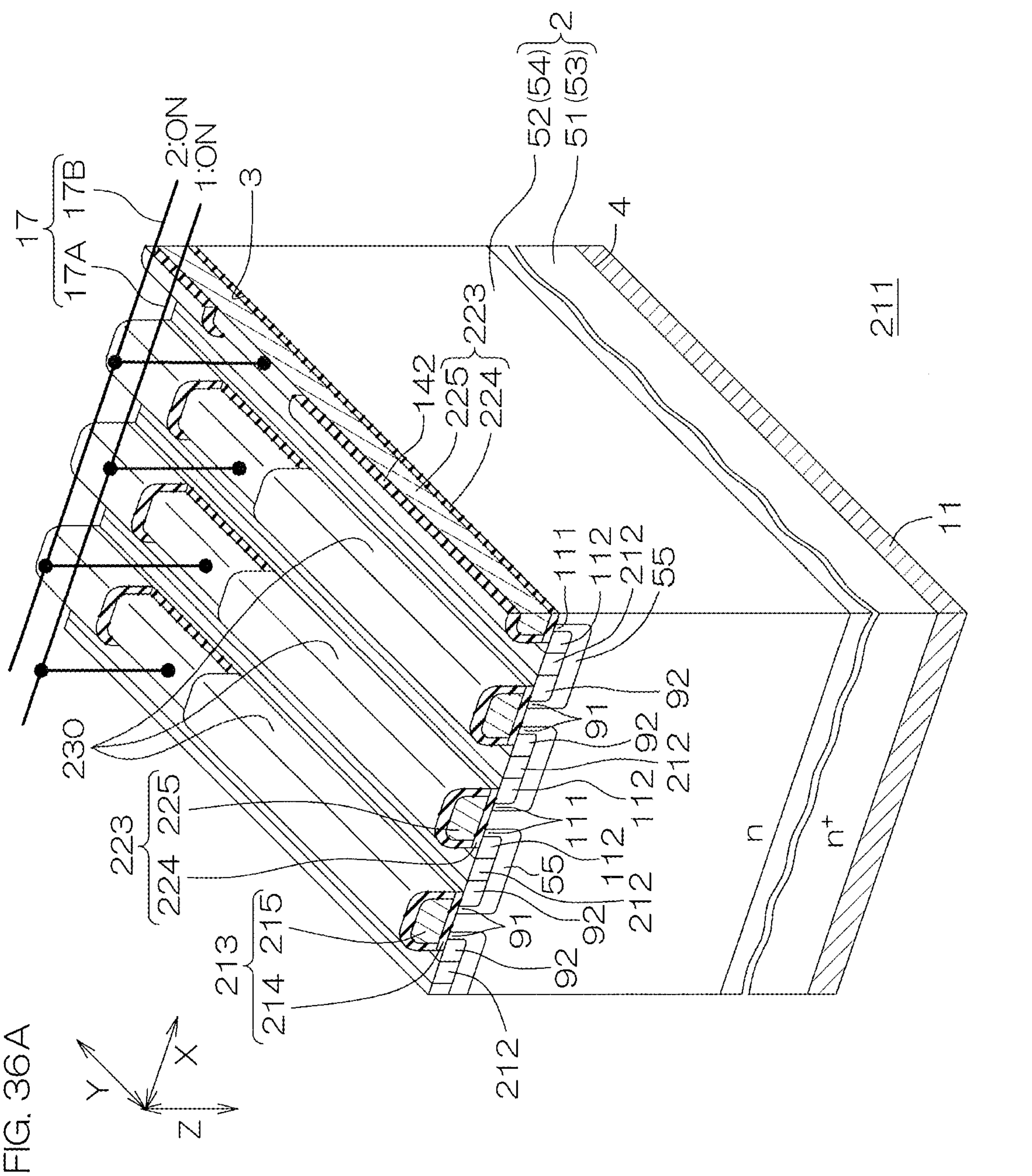
FIG. 36A is a sectional perspective view for describing a normal operation of the semiconductor device shown in FIG. 35.
Figure 36B:
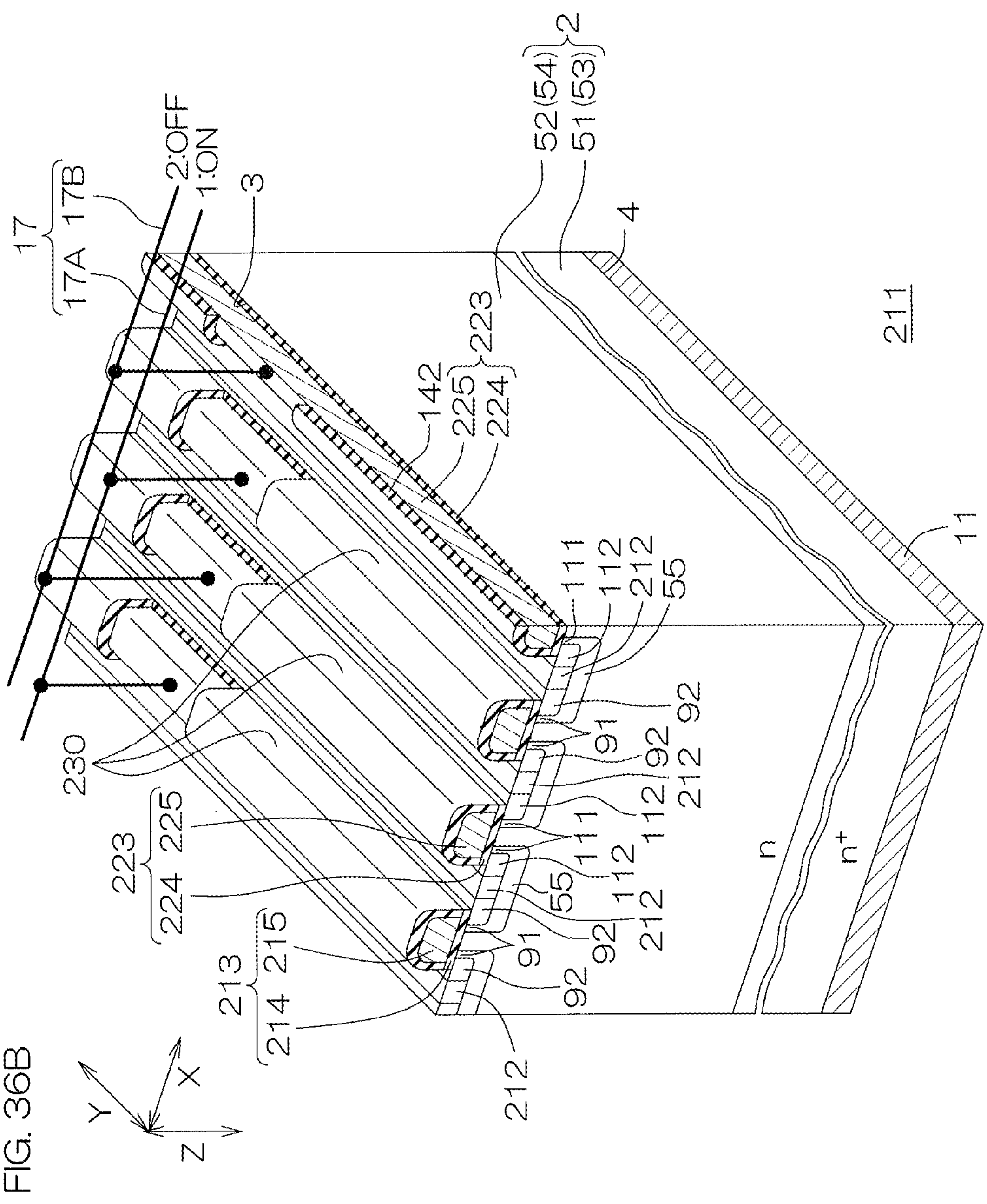
FIG. 36B is a sectional perspective view for describing an active clamp operation of the semiconductor device shown in FIG. 35.

FIG. 36A is a sectional perspective view for describing the normal operation of the semiconductor device 211 shown in FIG. 35. FIG. 36B is a sectional perspective view for describing the active clamp operation of the semiconductor device 211 shown in FIG. 35.

With reference to FIG. 36A, when the power MISFET 9 is in the normal operation, a first ON signal Von1 is input to the first gate control wiring 17A and a second ON signal Von2 is input to the second gate control wiring 17B. The first ON signal Von1 and the second ON signal Von2 are each input from the control IC 10.

The first ON signal Von1 and the second ON signal Von2 each have a voltage not less than the gate threshold voltage Vth. The first ON signal Von1 and the second ON signal Von2 may have an equal voltage.

In this case, the first gate electrode 193 and the second gate electrode 195 are each put into the ON state. Thereby, the first channel region 91 and the second channel region 111 are both controlled to be in the ON states.

As a result, the first MISFET 56 and the second MISFET 57 are both driven (Full-ON control). The channel utilization rate RU in the normal operation is 100%. The characteristics channel rate RC in the normal operation is 50%. Thereby, the area resistivity Ron·A is lowered as compared with a case where the characteristics channel rate RC is less than 50%.

On the other hand, with reference to FIG. 36B, when the power MISFET 9 is in the active clamp operation, the OFF signal Voff is input to the first gate control wiring 17A, and a clamp ON signal VCon is input to the second gate control wiring 17B. The OFF signal Voff and the clamp ON signal VCon are each input from the control IC 10.

The OFF signal Voff has a voltage (for example, the reference voltage) less than the gate threshold voltage Vth. The clamp ON signal VCon has a voltage not less than the gate threshold voltage Vth. The clamp ON signal VCon may have a voltage not more than or less than a voltage in the normal operation.

In this case, the first gate electrode 193 is put into the OFF state, and the second gate electrode 195 is put into the ON state. Thereby, the first channel region 91 is controlled to be in the OFF state, and the second channel region 111 is controlled to be in the ON state.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation. The channel utilization rate RU in the active clamp operation is 50%. Further, the characteristics channel rate RC in the active clamp operation is 25%. Thereby, the active clamp capability Eac is improved as compared with a case where the characteristics channel rate RC is in excess of 25%.

As described above, the same effects as those described for the semiconductor device 1 can be exhibited as well by the semiconductor device 211.

Figure 37:
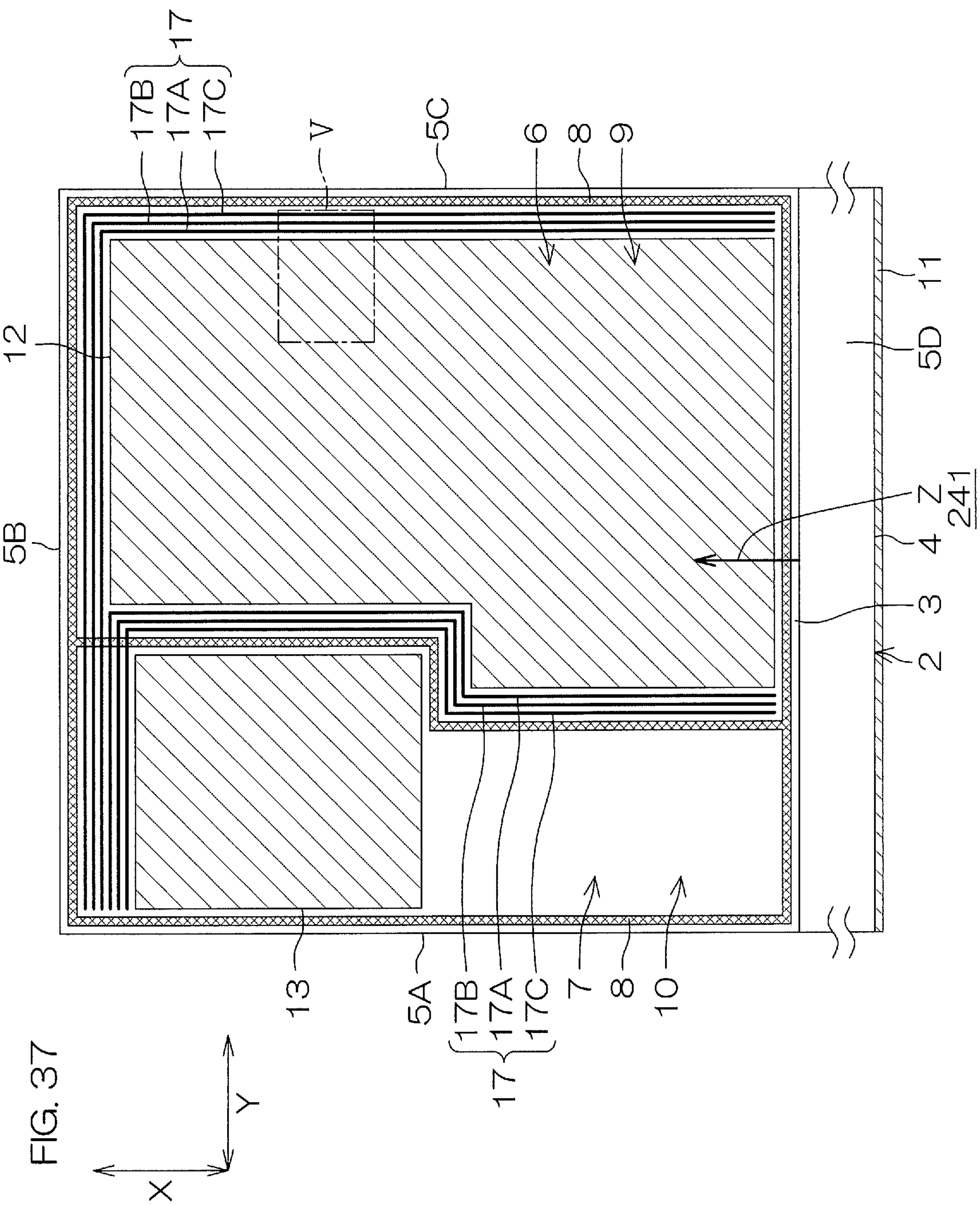
FIG. 37 is a perspective view of a semiconductor device according to a ninth preferred embodiment of the present invention which is viewed from one direction.

FIG. 37 is a perspective view of a semiconductor device 241 according to a ninth preferred embodiment of the present invention which is viewed from one direction. Hereinafter, structures corresponding to the structures described for the semiconductor device 1 shall be provided with the same reference symbols and description thereof shall be omitted.

In the aforementioned first preferred embodiment, a description has been given of a configuration example in which the semiconductor device 1 is the high-side switching device. However, the semiconductor device 1 may be provided as a low-side switching device. Here, a configuration example of the semiconductor device 1 which is manufactured as the low-side switching device shall be described as the semiconductor device 241 according to the ninth preferred embodiment.

As a structure (control example) of the power MISFET 9 which is incorporated into the semiconductor device 241, without being restricted to the structure (control example) of the power MISFET 9 according to the first preferred embodiment, any one of the structures (control examples) of the power MISFETs 9 shown in the second preferred embodiment, third preferred embodiment, fourth preferred embodiment, fifth preferred embodiment, sixth preferred embodiment, seventh preferred embodiment, and eighth preferred embodiment is applied. It shall be deemed that a description of any one of the structures (control examples) of the power MISFETs 9 according to the first to the eighth preferred embodiments is applied with modifications to a description of the structure (control example) of the power MISFET 9 of the semiconductor device 241 and a description thereof shall be omitted.

With reference to FIG. 37, the semiconductor device 241 includes the semiconductor layer 2, as with the first preferred embodiment, etc. The output region 6 and the input region 7 are defined in the semiconductor layer 2, as with the first preferred embodiment, etc. The output region 6 includes the power MISFET 9. The input region 7 includes the control IC 10.

The plurality (in this embodiment, three) of electrodes 11, 12, and 13 are formed on the semiconductor layer 2. In FIG. 37, the plurality of electrode 11 to 13 are shown by hatching. The number, the arrangement, and the planar shape of the plurality of electrodes 11 to 13 are arbitrary, and they are not restricted to the configuration shown in FIG. 37.

The number, the arrangement, and the planar shape of the plurality of electrodes 11 to 13 are adjusted according to the specification of the power MISFET 9 and/or the specification of the control IC 10. In this embodiment, the plurality of electrodes 11 to 13 include the drain electrode 11 (output electrode), the source electrode 12 (reference voltage electrode), and the input electrode 13.

The drain electrode 11 is formed on the second main surface 4 of the semiconductor layer 2, as with the first preferred embodiment, etc. The drain electrode 11 transmits to the outside an electrical signal generated by the power MISFET 9.

The source electrode 12 is formed in the output region 6 on the first main surface 3, as with the first preferred embodiment, etc. The source electrode 12 supplies the reference voltage (for example, the ground voltage) to the power MISFET 9 and/or various functional circuits of the control IC 10.

The input electrode 13 is formed in the input region 7 on the first main surface 3, as with the first preferred embodiment, etc. The input electrode 13 transmits an input voltage for driving the control IC 10.

The gate control wiring 17 as one example of the control wiring is formed on the semiconductor layer 2, as with the first preferred embodiment, etc. In this embodiment, the gate control wiring 17 includes the first gate control wiring 17A, the second gate control wiring 17B, and the third gate control wiring 17C. The gate control wiring 17 is selectively laid around in the output region 6 and the input region 7. The gate control wiring 17 is electrically connected to the gate of the power MISFET 9 in the output region 6 and electrically connected to the control IC 10 in the input region 7.

Figure 38:
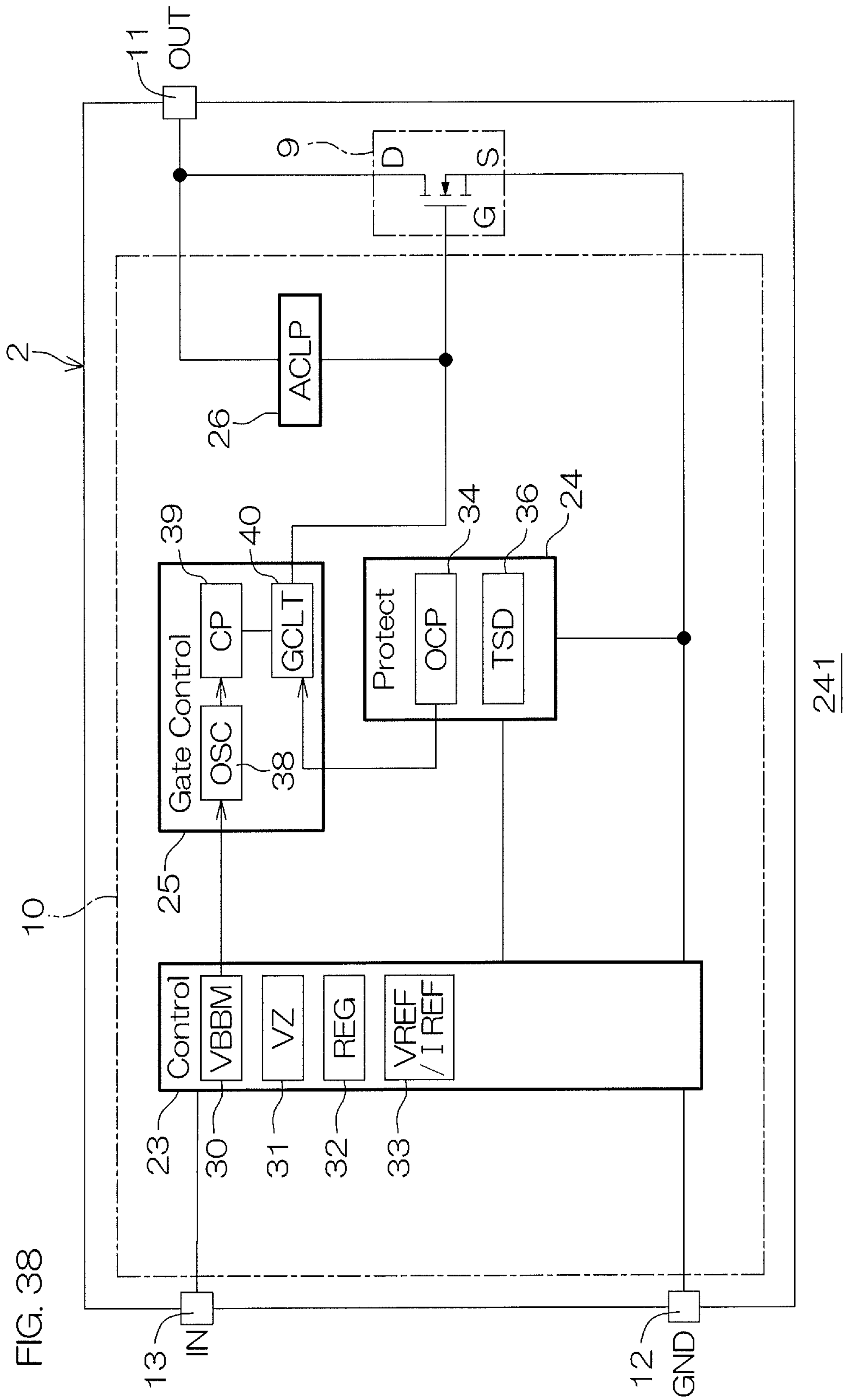
FIG. 38 is a block circuit diagram which shows an electrical configuration of the semiconductor device shown in FIG. 37.

FIG. 38 is a block circuit diagram which shows an electrical configuration of the semiconductor device 241 shown in FIG. 37. Hereinafter, an example in which the semiconductor device 241 is adopted into a vehicle shall be described.

The semiconductor device 241 includes the drain electrode as an output electrode, the source electrode 12 as the reference voltage electrode, the input electrode 13, the gate control wiring 17, the power MISFET 9, and the control IC 10.

The drain electrode 11 is electrically connected to the drain of the power MISFET 9. The drain electrode 11 is connected to a load. The source electrode 12 is electrically connected to the source of the power MISFET 9. The source electrode 12 supplies the reference voltage to the power MISFET 9 and the control IC 10.

The input electrode 13 may be connected to an MCU, a DC/DC converter, a LDO, etc. The input electrode 13 supplies an input voltage to the control IC 10. The gate of the power MISFET 9 is connected to the control IC 10 (the gate control circuit 25 to be described later) through the gate control wiring 17.

In this embodiment, the control IC 10 includes the current-voltage control circuit 23, the protection circuit 24, the gate control circuit 25, and the active clamp circuit 26.

The current-voltage control circuit 23 is connected to the source electrode 12, the input electrode 13, the protection circuit 24, and the gate control circuit 25. The current-voltage control circuit 23 generates various voltages in response to an electrical signal from the input electrode 13 and an electrical signal from the protection circuit 24. In this embodiment, the current-voltage control circuit 23 includes a driving voltage generation circuit 30, the first constant voltage generation circuit 31, the second constant voltage generation circuit 32, and the reference voltage-reference current generation circuit 33.

The driving voltage generation circuit 30 generates the driving voltage for driving the gate control circuit 25. The driving voltage generated by the driving voltage generation circuit 30 is input to the gate control circuit 25.

The first constant voltage generation circuit 31 generates a first constant voltage for driving the protection circuit 24. The first constant voltage generation circuit 31 may include a Zener diode and/or a regulator circuit. The first constant voltage is input to the protection circuit 24 (for example, the overcurrent protection circuit 34).

The second constant voltage generation circuit 32 generates a second constant voltage for driving the protection circuit 24. The second constant voltage generation circuit 32 may include a Zener diode and/or a regulator circuit. A second constant voltage is input to the protection circuit 24 (for example, the overheat protection circuit 36).

The reference voltage-reference current generation circuit 33 generates a reference voltage and a reference current for various types of circuits. The reference voltage and the reference current are input to various types of circuits. In a case where the various types of circuits include the comparator, the reference voltage and the reference current may be input to the comparator.

The protection circuit 24 is connected to the current-voltage control circuit 23, the gate control circuit 25, and the source of the power MISFET 9. The protection circuit 24 includes the overcurrent protection circuit 34 and the overheat protection circuit 36.

The overcurrent protection circuit 34 protects the power MISFET 9 from an overcurrent. The overcurrent protection circuit 34 is connected to the gate control circuit 25. The overcurrent protection circuit 34 may include the current monitor circuit. A signal generated by the overcurrent protection circuit 34 is input to the gate control circuit 25 (specifically, the driving signal output circuit 40 to be described later).

The overheat protection circuit 36 protects the power MISFET 9 from an excessive temperature rise. The overheat protection circuit 36 is connected to the current-voltage control circuit 23. The overheat protection circuit 36 monitors a temperature of the semiconductor device 241. The overheat protection circuit 36 may include a temperature sensitive device such as a diode and a thermistor. A signal generated by the overheat protection circuit 36 is input to the current-voltage control circuit 23.

The gate control circuit 25 controls the ON state and the OFF state of the power MISFET 9. The gate control circuit 25 is connected to the current-voltage control circuit 23, the protection circuit 24, and the gate of the power MISFET 9.

The gate control circuit 25 generates plural types of gate control signals according to the number of the gate control wirings 17 in response to an electrical signal from the current-voltage control circuit 23 and an electrical signal from the protection circuit 24. The plural types of gate control signals are input to the gate of the power MISFET 9 through the gate control wiring 17.

Specifically, the gate control circuit 25 includes the oscillation circuit 38, the charge pump circuit 39, and the driving signal output circuit 40. The oscillation circuit 38 oscillates in response to an electrical signal from the current-voltage control circuit 23 to generate a predetermined electrical signal. The electrical signal generated by the oscillation circuit 38 is input to the charge pump circuit 39. The charge pump circuit 39 boosts the electrical signal from the oscillation circuit 38. The electrical signal boosted by the charge pump circuit 39 is input to the driving signal output circuit 40.

The driving signal output circuit 40 generates plural types of gate control signals in response to an electrical signal from the charge pump circuit 39 and an electrical signal from the protection circuit 24 (specifically, the overcurrent protection circuit 34). The plural types of gate control signals are input to the gate of the power MISFET 9 through the gate control wiring 17. Thereby, the power MISFET 9 is driven and controlled.

The active clamp circuit 26 protects the power MISFET 9 from the counter electromotive force. The active clamp circuit 26 is connected to the drain electrode 11 and the gate of the power MISFET 9.

Figure 39:
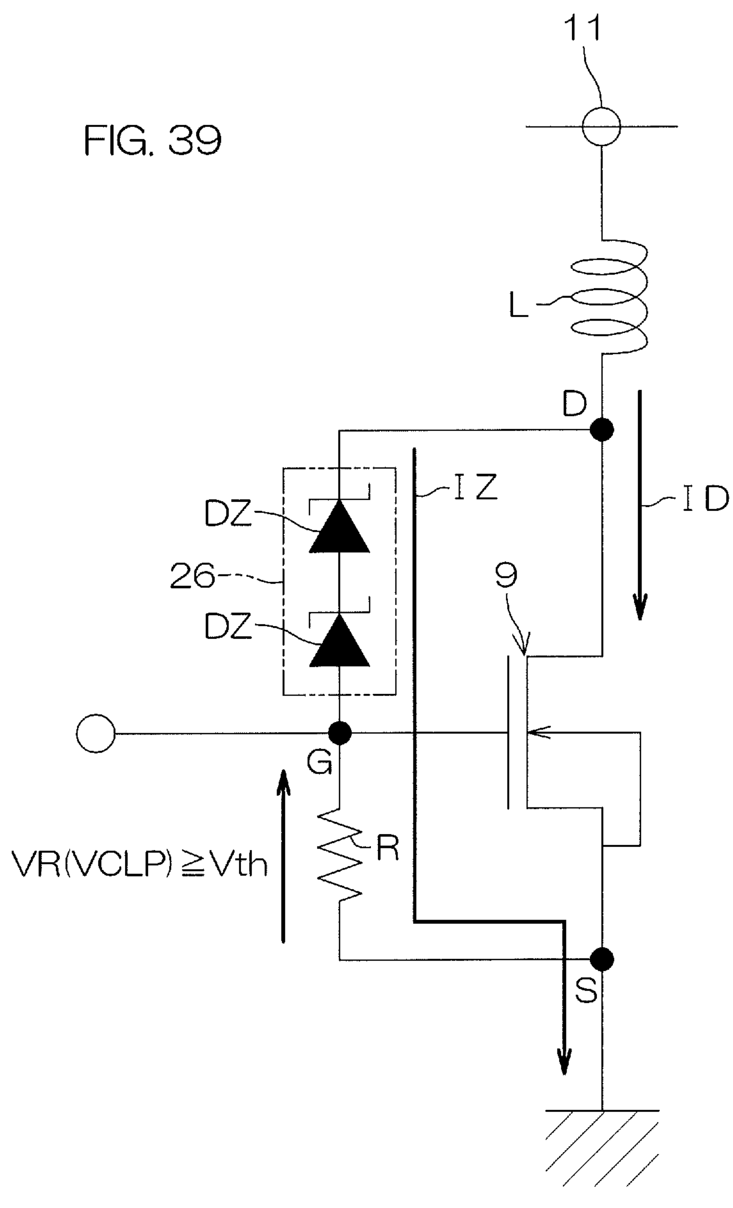
FIG. 39 is a circuit diagram for describing a normal operation and an active clamp operation of the semiconductor device shown in FIG. 37.
Figure 40:
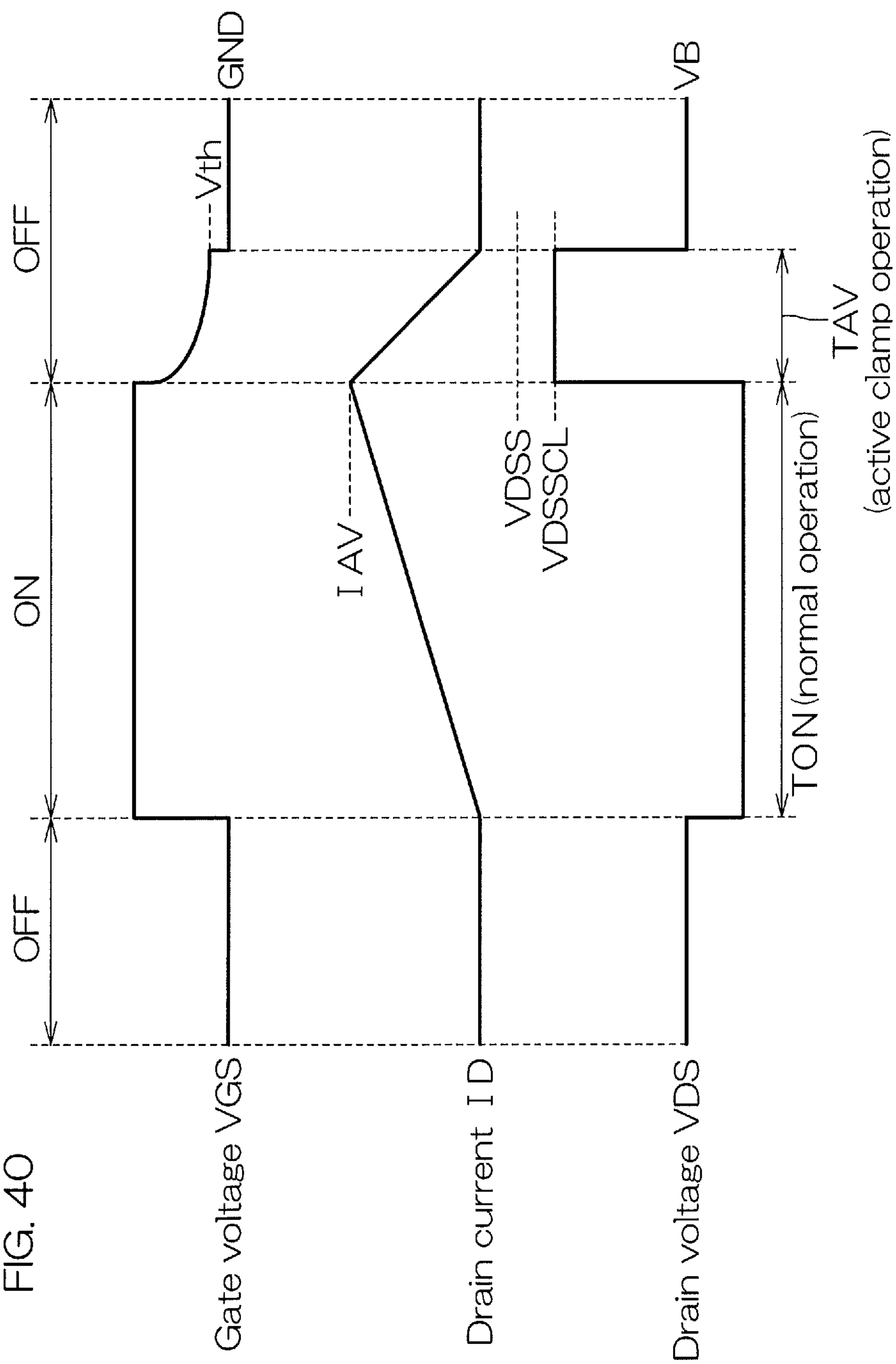
FIG. 40 is a waveform chart of a main electrical signal applied to the circuit diagram shown in FIG. 39.

FIG. 39 is a circuit diagram for describing the normal operation and the active clamp operation of the semiconductor device 241 shown in FIG. 37. FIG. 40 is a waveform chart of a main electrical signal applied to the circuit diagram shown in FIG. 39.

Here, a circuit example in which the inductive load L is connected to the power MISFET 9 is used to describe the normal operation and the active clamp operation of the semiconductor device 241. A device which uses a solenoid, a motor, a transformer, and a winding (coil) such as a relay, etc., is shown as an example of the inductive load L. The inductive load L is also called the L load.

With reference to FIG. 39, the source of the power MISFET 9 is connected to the ground. The drain of the power MISFET 9 is electrically connected to the inductive load L. The gate and the drain of the power MISFET 9 are connected to the active clamp circuit 26. The gate and the source of the power MISFET 9 are connected to a resistance R. In this circuit example, the active clamp circuit 26 includes the k number (k is a natural number) of Zener diodes DZ which are connected to each other in a biased manner.

With reference to FIG. 39 and FIG. 40, when the ON signal Von is input to the gate of the power MISFET 9 in the OFF state, the power MISFET 9 is switched from the OFF state to the ON state (the normal operation). The ON signal Von has a voltage equal to or larger than the gate threshold voltage Vth (Vth Von). The power MISFET 9 is kept in the ON state only for a predetermined ON time TON.

When the power MISFET 9 is switched to the ON state, a drain current ID starts to flow from the drain of the power MISFET 9 to the source thereof. The drain current ID is increased proportionally in accordance with the ON time TON of the power MISFET 9. The inductive load L allows an inductive energy to accumulate due to an increase in the drain current ID.

When the OFF signal Voff is input to the gate of the power MISFET 9, the power MISFET 9 is switched from the ON state to the OFF state. The OFF signal Voff has a voltage less than the gate threshold voltage Vth (Voff<Vth). The OFF signal Voff may be the reference voltage (for example, the ground voltage). When the power MISFET 9 is switched to the OFF state, an inductive energy of the inductive load L is applied to the power MISFET 9 as the counter electromotive force.

Thereby, the power MISFET 9 is shifted to the active clamp state (the active clamp operation). When the power MISFET 9 is shifted to the active clamp state, a drain voltage VDS is sharply raised to a clamp voltage VDSSCL.

In a case where the clamp voltage VDSSCL exceeds a maximum rated drain voltage VDSS (VDSS<VDSSCL), the power MISFET 9 reaches breakdown. The power MISFET 9 is designed such that the clamp voltage VDSSCL becomes equal to or less than the maximum rated drain voltage VDSS (VDSSCL VDSS).

In a case where the clamp voltage VDSSCL is equal to or less than the maximum rated drain voltage VDSS (VDSSCL VDSS), a reverse current IZ flows to the active clamp circuit 26. Thereby, a limit voltage VL is formed between terminals of the active clamp circuit 26. In this embodiment, the limit voltage VL is a sum of voltages across terminals VZ of Zener diodes DZ in the active clamp circuit 26 (VL=k·VZ).

Further, the reverse current IZ passes through the resistance R and reaches a ground. Thereby, a voltage VR between terminals is formed between terminals of the resistance R. The voltage VR between terminals of the resistance R (=IZ×R) is adjusted to a voltage not less than the gate threshold voltage Vth (Vth VR). The voltage VR between terminals is applied between the gate and the source of the power MISFET 9 as the clamp ON voltage VCLP. Therefore, the power MISFET 9 keeps the ON state in the active clamp state. The clamp ON voltage VCLP (voltage VR between terminals) may have a voltage less than the ON signal Von.

Thereby, the inductive energy of the inductive load L is consumed (absorbed) in the power MISFET 9. After an active clamp time TAV, the drain current ID is reduced to zero from a peak value IAV which is immediately before the power MISFET 9 becomes the OFF state. Thereby, the gate voltage VGS becomes the ground voltage and the drain voltage VDS becomes the power supply voltage VB, and the power MISFET 9 is switched from the ON state to the OFF state.

The active clamp capability Eac of the power MISFET 9 is defined by the capability in the active clamp operation. Specifically, the active clamp capability Eac is defined by the capability with respect to the counter electromotive force caused by an inductive energy of the inductive load L in transition when the power MISFET 9 is switched from the ON state to the OFF state.

More specifically, the active clamp capability Eac is defined by a capability with respect to an energy caused by the clamp voltage VDSSCL, as apparent from the circuit example of FIG. 36.

As described above, the same effects as those described for the semiconductor device 1 can be exhibited as well by the semiconductor device 241.

While the preferred embodiments of the present invention have been described above, the present invention may be implemented in yet other embodiments.

In each of the aforementioned preferred embodiments, in a case where the first bottom-side electrode 86 and the second bottom-side electrode 106 which are electrically connected to the third gate control wiring 17C each function as a field electrode, the third gate control wiring 17C may be electrically connected to the source electrode 12 in place of the control IC.

In this case, the third gate control wiring 17C may be led out from the source electrode 12. Therefore, the reference voltage (for example, the ground voltage) is transmitted to the first bottom-side electrode 86 and the second bottom-side electrode 106 from the source electrode 12 through the third gate control wiring 17C. The same effects as those described for the semiconductor device 1, etc., can be exhibited as well by the above-described structure.

In each of the aforementioned preferred embodiments, as long as the channel utilization rate RU in the active clamp operation and the channel utilization rate RU in the normal operation can be appropriately controlled, the plurality of first FET structures 58 and the plurality of second FET structures 68 may be arrayed in an arbitrary manner.

For example, the plurality of second FET structures 68 may be alternately arrayed with the plurality of first FET structure 58 in a manner that the plurality of first FET structures 58 are held therebetween. The plurality of second FET structures 68 may be alternately arrayed with the plurality of first FET structures 58 in a manner that 2, 3, 4, 5, 6, 7, 8, 9, or 10 of the first FET structures 58 are held therebetween.

Similarly, the plurality of first FET structures 58 may be alternately arrayed with the plurality of second FET structures 68 in a manner that the plurality of second FET structures 68 are held therebetween. The plurality of first FET structures 58 may be alternately arrayed with the plurality of second FET structures 68 in a manner that 2, 3, 4, 5, 6, 7, 8, 9, or 10 of the second FET structures 68 are held therebetween.

As a matter of course, a group of the plurality (two or more) of first FET structures 58 and a group of the plurality (two or more) of second FET structures 68 may be alternately arrayed with each other. Further, the plurality of first FET structures 58 and the plurality of second FET structures 68 may be formed in a manner that a group of the plurality of first FET structures 58 and one second FET structure 68 are alternately arrayed. Further, the plurality of first FET structures 58 and the plurality of second FET structures 68 may be formed in a manner that one first FET structure 58 and a group of the plurality of second FET structures 68 are alternately arrayed.

However, in a case where the plurality of first FET structures 58 and/or the plurality of second FET structures 68 are arrayed in a group, a biased temperature distribution is easily formed in the semiconductor layer 2. Therefore, it is preferable that not more than four of the first FET structures 58 and/or not more than four of the second FET structures 68 are arrayed in a group.

In each of the aforementioned preferred embodiments, as long as the channel utilization rate RU in the active clamp operation and the channel utilization rate RU in the normal operation can be appropriately controlled, a value of the total channel rate RT in each cell region 75 may take any arbitrary value.

For example, in some of the aforementioned preferred embodiments, a description has been given of an example in which a total channel rate RT including the first total channel rate RT1, the second total channel rate RT2, and the third total channel rate RT3 is applied to the plurality of cell regions 75.

However, plural (two or more) types of total channel rates RT different in value from each other may be applied to the plurality of cell regions 75. For example, 2, 3, 4, 5 or 6 or more of the total channel rates RT different in value from each other may be applied to the plurality of cell regions 75.

Further, in each of the aforementioned preferred embodiments, a description has been given of an example in which the power MISFET 9 includes the first MISFET 56 and the second MISFET 57. However, the power MISFET 9 may include 2, 3, 4, 5 or 6 or more of the MISFETs which can be controlled in a mutually independent mode. The plurality (two or more) of the MISFETs can be formed only by changing the number of the gate control wirings 17 connected to the trench gate structure.

In this case, the control IC 10 controls the plurality (two or more) of the MISFETs such that the channel utilization rate RU in the active clamp operation becomes in excess of zero and less than the channel utilization rate RU in the normal operation.

In each of the aforementioned preferred embodiments, the gate control wiring 17 may be formed in a layer different from the drain electrode 11, the source electrode 12, the input electrode 13, the reference voltage electrode 14, the ENABLE electrode 15, or the SENSE electrode 16 or may be formed in the same layer. Further, in the gate control wiring 17, the first gate control wiring 17A, the second gate control wiring 17B, and the third gate control wiring 17C may be formed in a layer different from each other or may be formed in the same layer.

In each of the aforementioned preferred embodiments, a p-type semiconductor part may be given as an n-type semiconductor part, and an n-type semiconductor part may be given as a p-type semiconductor part. In this case, in a description of each of the aforementioned preferred embodiments, an "n-type" part is read as a "p-type" and a "p-type" part is read as an "n-type."

Figure 41:
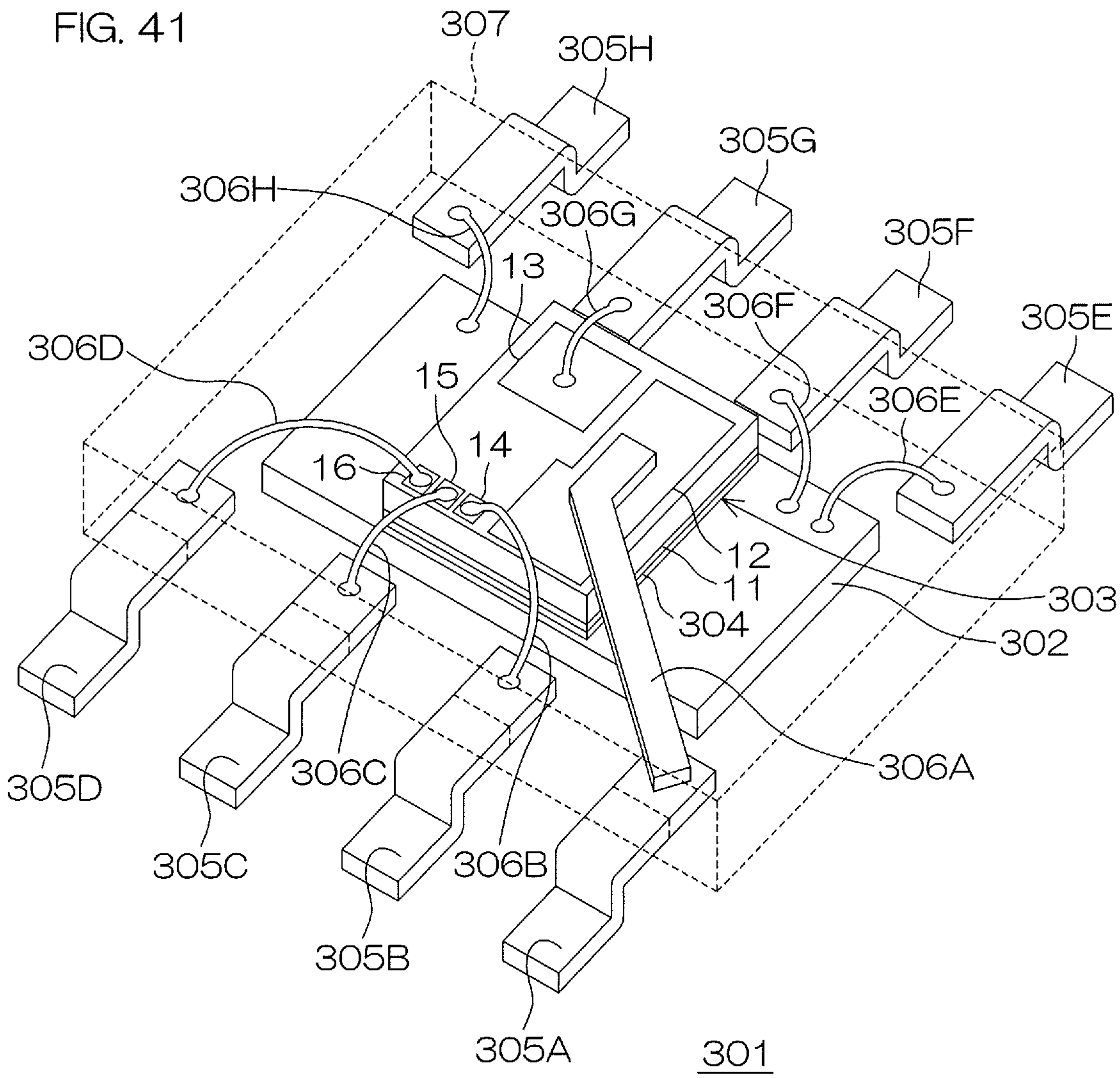
FIG. 41 is a perspective view which shows a semiconductor package as seen through a sealing resin.
Figure 42:
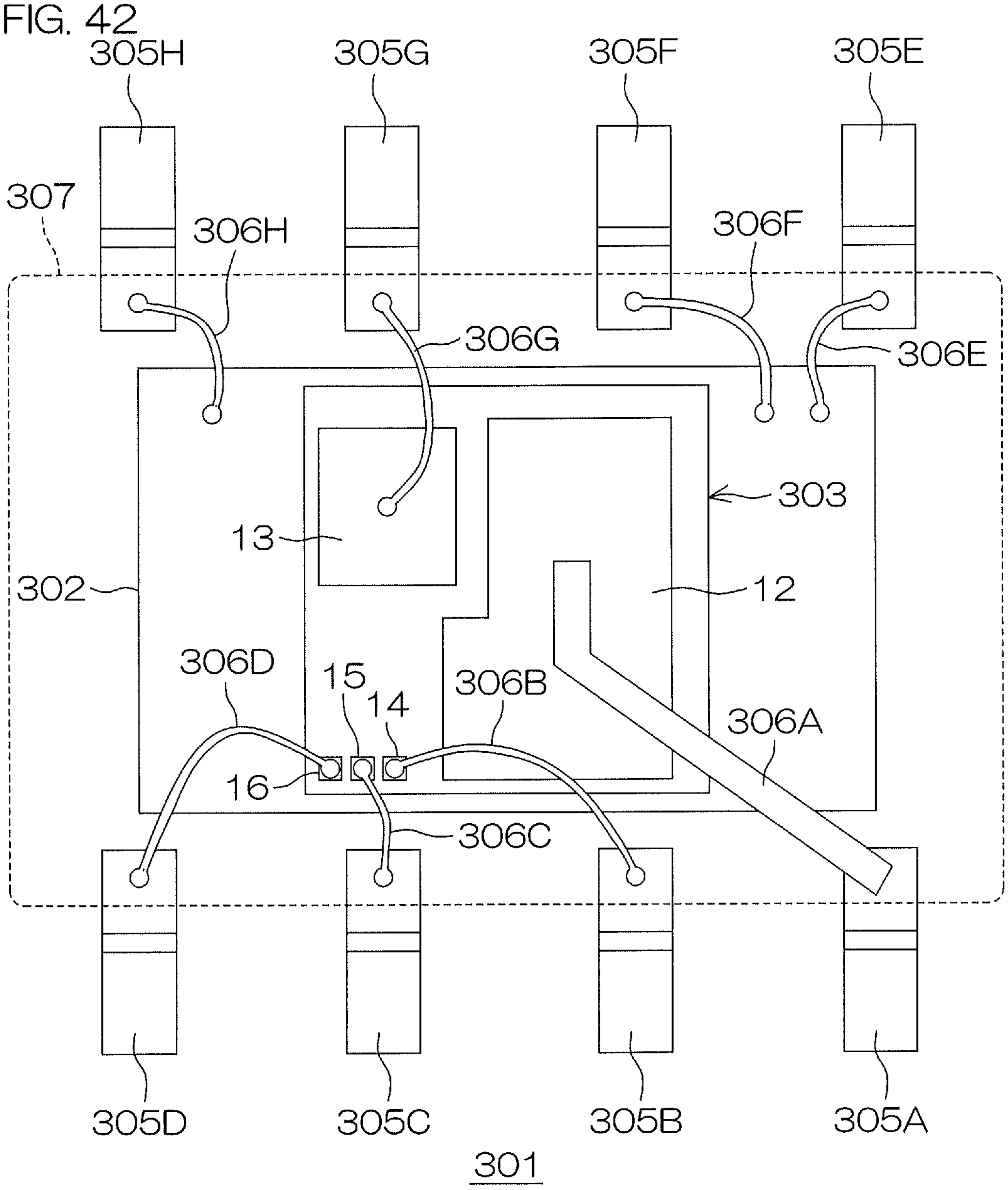
FIG. 42 is a plan view of FIG. 41.

The semiconductor devices 1, 151, 161, 171, 181, 191, 201, 211, and 241 according to each of the aforementioned preferred embodiments may be incorporated into a semiconductor package as shown in FIG. 41 and FIG. 42. FIG. 41 is a perspective view which shows a semiconductor package 301 as seen through a sealing resin 307. FIG. 42 is a plan view of FIG. 41.

With reference to FIG. 41 and FIG. 42, in this embodiment, the semiconductor package 301 is a so-called SOP (Small Outline Package). The semiconductor package 301 includes a die pad 302, a semiconductor chip 303, a conductive bonding material 304, a plurality (in this embodiment, eight) of lead electrodes 305A to 305H, a plurality (in this embodiment, eight) of lead wires 306A to 306H, and the sealing resin 307.

The die pad 302 is composed of a metal plate formed in a rectangular parallelepiped shape. The die pad 302 may include iron, aluminum, or copper. The semiconductor chip 303 is composed of any one of the semiconductor devices 1, 151, 161, 171, 181, 191, 201, 211, and 241 according to the first to the ninth preferred embodiment. Here, the semiconductor chip 303 is composed of the semiconductor device 1 according to the first preferred embodiment.

The semiconductor chip 303 is arranged on the die pad 302 in a posture such that the second main surface 4 faces the die pad 302. The drain electrode 11 of the semiconductor chip 303 is connected to the die pad 302 through the conductive bonding material 304. The conductive bonding material 304 may be metal paste or solder.

The plurality of lead electrodes 305A to 305H include a first lead electrode 305A, a second lead electrode 305B, a third lead electrode 305C, a fourth lead electrode 305D, a fifth lead electrode 305E, a sixth lead electrode 305F, a seventh lead electrode 305G, and an eighth lead electrode 305H. The number of lead electrodes is selected according to functions of the semiconductor chip 303 and is not restricted to the number shown in FIG. 41 and FIG. 42.

The plurality of lead electrodes 305A to 305H may include iron, aluminum, or copper. The plurality of lead electrodes 305A to 305H are arranged around the die pad 302 at an interval from the die pad 302.

Specifically, the four lead electrodes 305A to 305D are arrayed at intervals along one side of the die pad 302. The remaining four lead electrodes 305E to 305H are arrayed at intervals along a side facing the side at which the lead electrodes 305A to 305D are arrayed in the die pad 302.

The plurality of lead electrodes 305A to 305H are each formed in a band shape extending along a direction orthogonal to a direction of arrangement. The plurality of lead electrodes 305A to 305H have one end portion which faces the die pad 302 and the other end portion which is the opposite side. One end portions of the plurality of lead electrodes 305A to 305H are internally connected to the semiconductor chip 303. The other end portions of the plurality of lead electrodes 305A to 305H are externally connected to connection targets such as a mounting substrate, etc.

The plurality of lead wires 306A to 306H include a first lead wire 306A, a second lead wire 306B, a third lead wire 306C, a fourth lead wire 306D, a fifth lead wire 306E, a sixth lead wire 306F, a seventh lead wire 306G, and an eighth lead wire 306H. The number of lead wires is selected according to functions of the semiconductor chip 303 (semiconductor device) and is not restricted to the number shown in FIG. 41 and FIG. 42.

The first lead wire 306A is electrically connected to one end portion of the first lead electrode 305A and the source electrode 12. In this embodiment, the first lead wire 306A is composed of a metal clip. The first lead wire 306A may include iron, gold, aluminum, or copper. The first lead wire 306A effectively releases to the outside heat generated in the power MISFET 9. As a matter of course, the first lead wire 306A may be composed of a bonding wire.

The second lead wire 306B is electrically connected to one end portion of the second lead electrode 305B and the reference voltage electrode 14. The third lead wire 306C is electrically connected to one end portion of the third lead electrode 305C and the ENABLE electrode 15. The fourth lead wire 306D is electrically connected to one end portion of the fourth lead electrode 305D and the SENSE electrode 16.

The fifth lead wire 306E is electrically connected to one end portion of the fifth lead electrode 305E and the die pad 302. The sixth lead wire 306F is electrically connected to one end portion of the sixth lead electrode 305F and the die pad 302. The seventh lead wire 306G is electrically connected to one end portion of the seventh lead electrode 305G and the input electrode 13. The eighth lead wire 306H is electrically connected to one end portion of the eighth lead electrode 305H and the die pad 302.

In this embodiment, the second to the eighth lead wire 306B to 306H are composed of a bonding wire. The second to the eighth lead wire 306B to 306H may each include gold, aluminum, or copper. The connection configuration of the plurality of lead wires 306A to 306H to the semiconductor chip 303 and the plurality of lead electrodes 305A to 305H are arbitrary and not restricted to the connection configuration shown in FIG. 41 and FIG. 42.

The sealing resin 307 seals the semiconductor chip 303, the die pad 302, one end portions of the plurality of lead electrodes 305A to 305H, and the plurality of lead wires 306A to 306H such as to expose the other end portions of the plurality of lead electrodes 305A to 305H. The sealing resin 307 is formed in a rectangular parallelepiped shape. The sealing resin 307 may include an epoxy resin.

The configuration of the semiconductor package 301 is not restricted to SOP. TO (Transistor Outline), QFN (Quad For Non Lead Package), DFP (Dual Flat Package), DIP (Dual Inline Package), QFP (Quad Flat Package), SIP (Single Inline Package), SOJ (Small Outline J-leaded Package), or any of various similar configurations may be applied as the semiconductor package 301.

Figure 43:
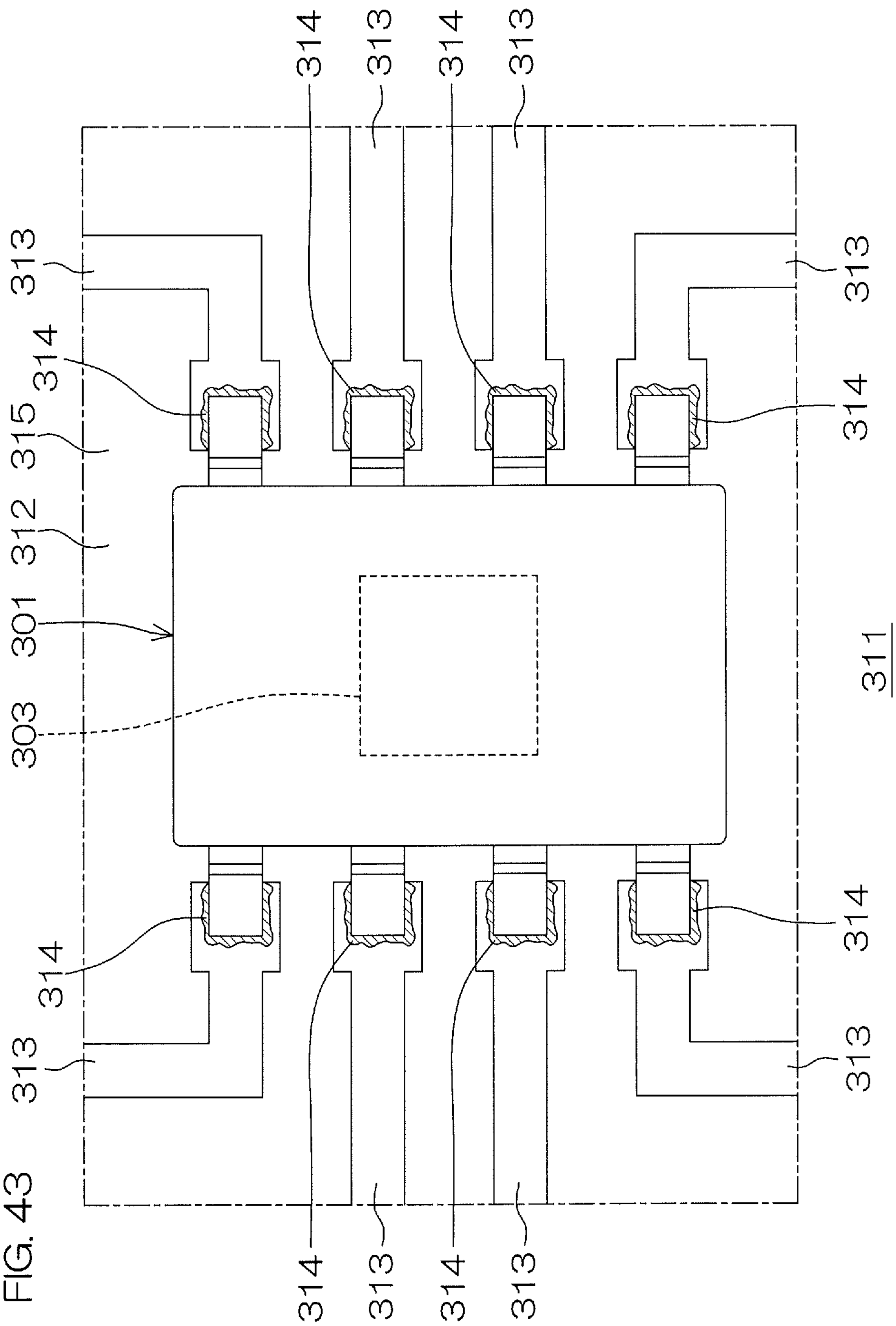
FIG. 43 is a plan view which shows a part of a circuit module according to the first configuration example.

The semiconductor package 301 (semiconductor devices 1, 151, 161, 171, 181, 191, 201, 211, or 241) may be incorporated into a circuit module, as shown in FIG. 43. FIG. 43 is a plan view which shows a part of a circuit module 311 according to the first configuration example.

With reference to FIG. 43, the circuit module 311 includes a mounting substrate 312, a plurality of wirings 313, the semiconductor package 301 (semiconductor device 1, 151, 161, 171, 181, 191, 201, 211 or 241), and a conductive bonding material 314.

The mounting substrate 312 includes a main surface 315. The plurality of wirings 313 are formed on the main surface 315 of the mounting substrate 312. The semiconductor package 301 (semiconductor device 1, 151, 161, 171, 181, 191, 201, 211 or 241) is mounted on the mounting substrate 312 such as to be electrically connected to the plurality of wirings 313 through a conductive bonding material 314. The conductive bonding material 314 may be metal paste or solder.

In each of the aforementioned preferred embodiments, a description has been given of an example in which the semiconductor device 1, 151, 161, 171, 181, 191, 201, 211 or 241 is integrally formed with the power MISFET 9 and the control IC 10.

However, the semiconductor device 1, 151, 161, 171, 181, 191, 201, 211 or 241 which only has the power MISFET 9 may be adopted. Further, the semiconductor device 1, 151, 161, 171, 181, 191, 201, 211 or 241 which only has the power MISFET 9 may be incorporated into the semiconductor package 301 aforementioned.

Figure 44:
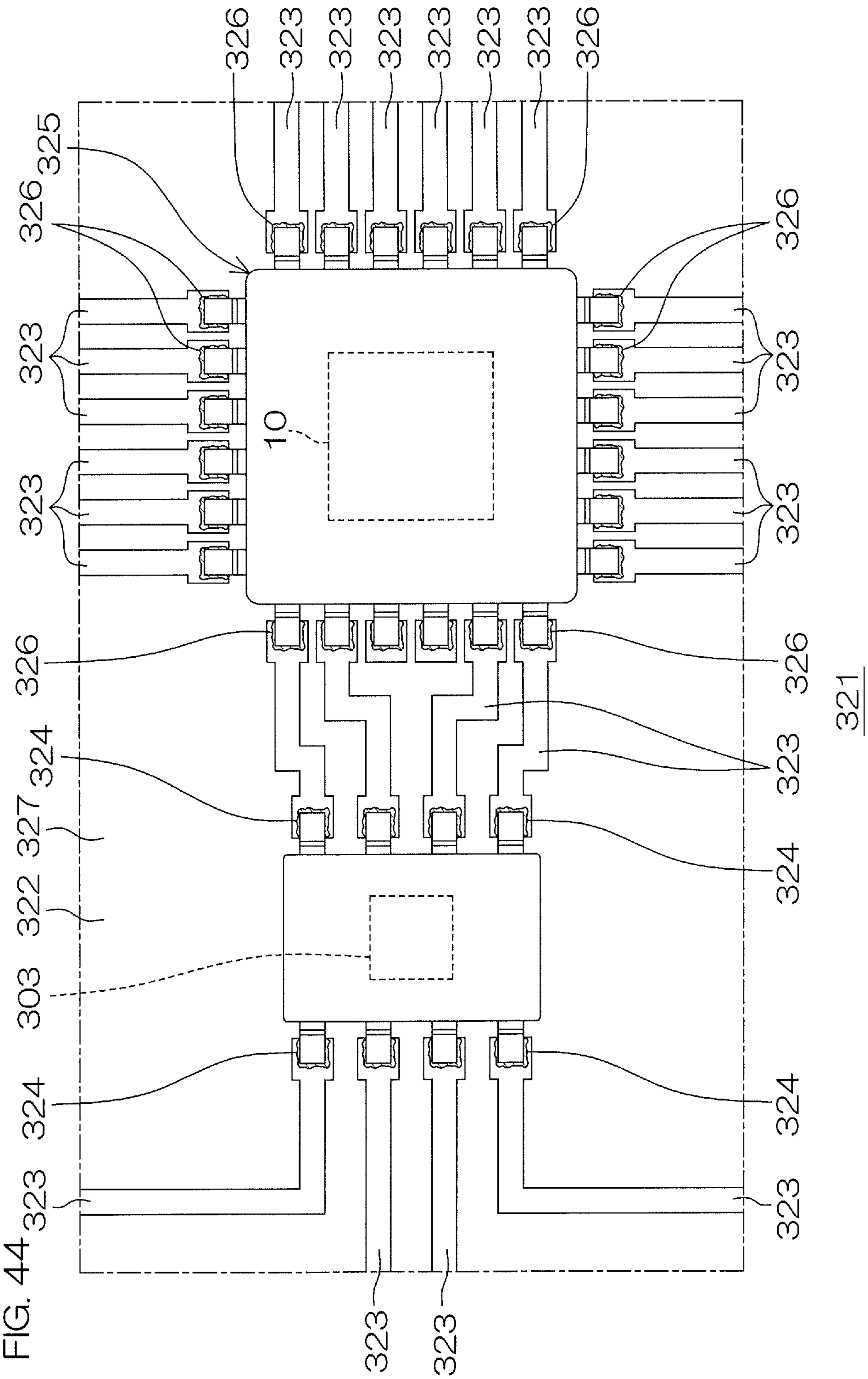
FIG. 44 is a plan view which shows a part of a circuit module according to the second configuration example.

As shown in FIG. 44, the semiconductor package 301 (semiconductor device 1, 151, 161, 171, 181, 191, 201, 211 or 241) which only has the power MISFET 9 may be incorporated into a circuit module. FIG. 44 is a plan view which shows a part of a circuit module 321 according to the second configuration example.

With reference to FIG. 44, the circuit module 321 includes a mounting substrate 322, a plurality of wirings 323, the semiconductor package 301 (semiconductor device 1, 151, 161, 171, 181, 191, 201, 211 or 241), a first conductive bonding material 324, a control IC device 325, and a second conductive bonding material 326.

The mounting substrate 322 includes a main surface 327. The plurality of wirings 323 are formed on the main surface 327 of the mounting substrate 322. The semiconductor package 301 is mounted on the mounting substrate 322. The semiconductor package 301 is electrically connected to the plurality of wirings 323 through the first conductive bonding material 324. The first conductive bonding material 324 may be metal paste or solder.

The control IC device 325 includes the control IC 10 (refer to FIG. 2 and FIG. 38). The control IC device 325 is mounted on the mounting substrate 322. The control IC device 325 is electrically connected to the plurality of wirings 323 through the second conductive bonding material 326. The control IC device 325 is also electrically connected to the semiconductor package 301 through the plurality of wirings 323.

The control IC device 325 is electrically connected to the semiconductor package 301 in a manner similar to that shown in FIG. 2. The control IC device 325 externally controls the semiconductor package 301 (semiconductor device 1, 151, 161, 171, 181, 191, 201, 211 or 241).

The same effects as those described in each of the aforementioned preferred embodiments can be exhibited as well by the above-described structure. In this embodiment, a description has been given of an example in which the one-chip control IC device 325 including the control IC 10 is mounted on the mounting substrate 322.

However, in place of the control IC device 325, a circuit network which has functions similar to those of the control IC 10 may be mounted on the mounting substrate 322. The circuit network which has functions similar to those of the control IC 10 may be configured by mounting on the mounting substrate 322 a plurality of discrete devices and IC chips having any arbitrary functions.

As a matter of course, the control IC 10 in each of the aforementioned preferred embodiments and the circuit network having functions similar to those of the control IC 10 may be configured in any given manner, and it is not necessary to include all of the functional circuits (that is, the sensor MISFET 21, the input circuit 22, the current-voltage control circuit 23, the protection circuit 24, the gate control circuit 25, the active clamp circuit 26, the current detecting circuit 27, the power-supply reverse connection protection circuit 28, and the malfunction detection circuit 29), and some of the functional circuits may be removed.

Figure 45:
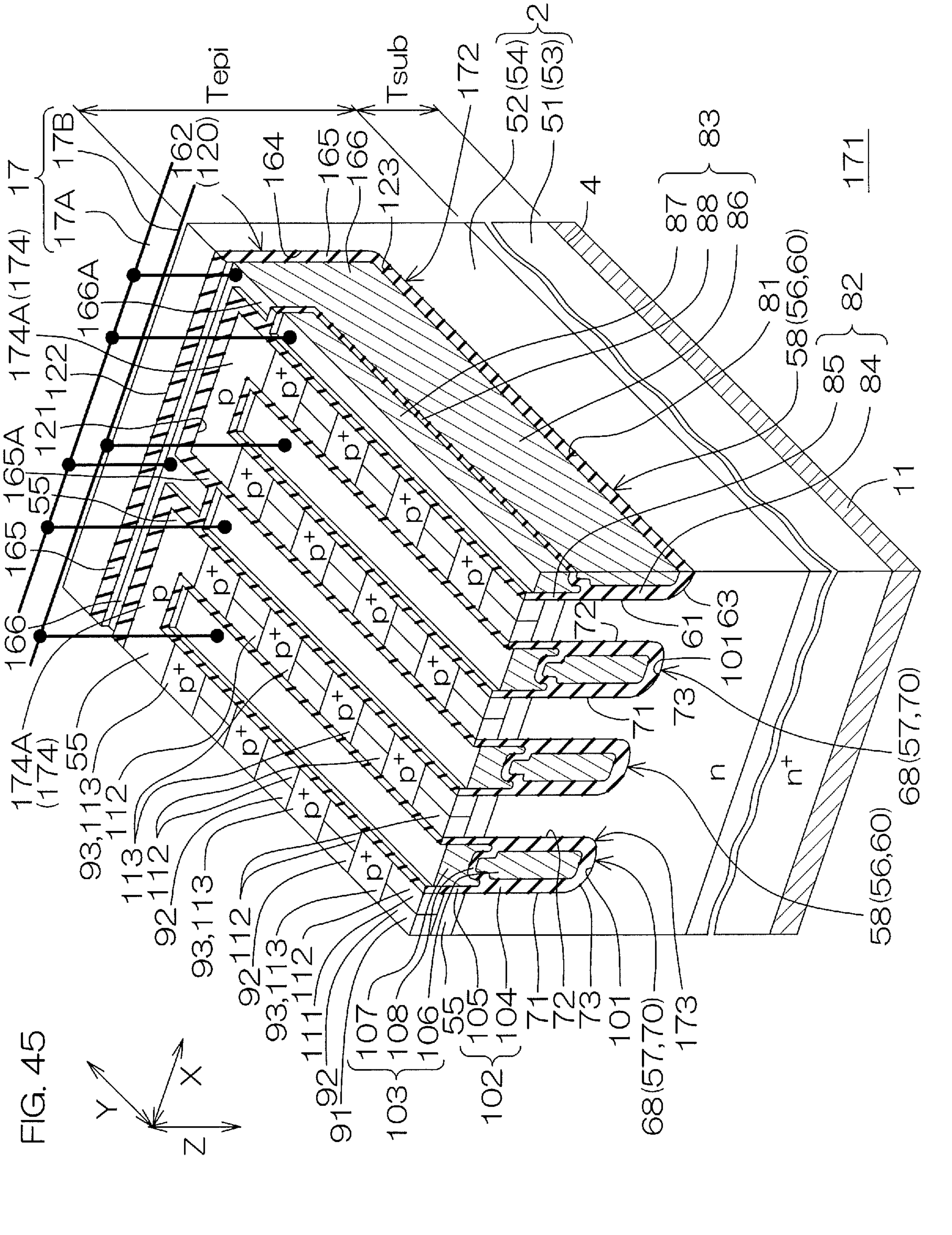
FIG. 45 is a sectional perspective view of a region corresponding to FIG. 26 and is a sectional perspective view which shows a modification example of the semiconductor device according to the fourth preferred embodiment.
Figure 46:
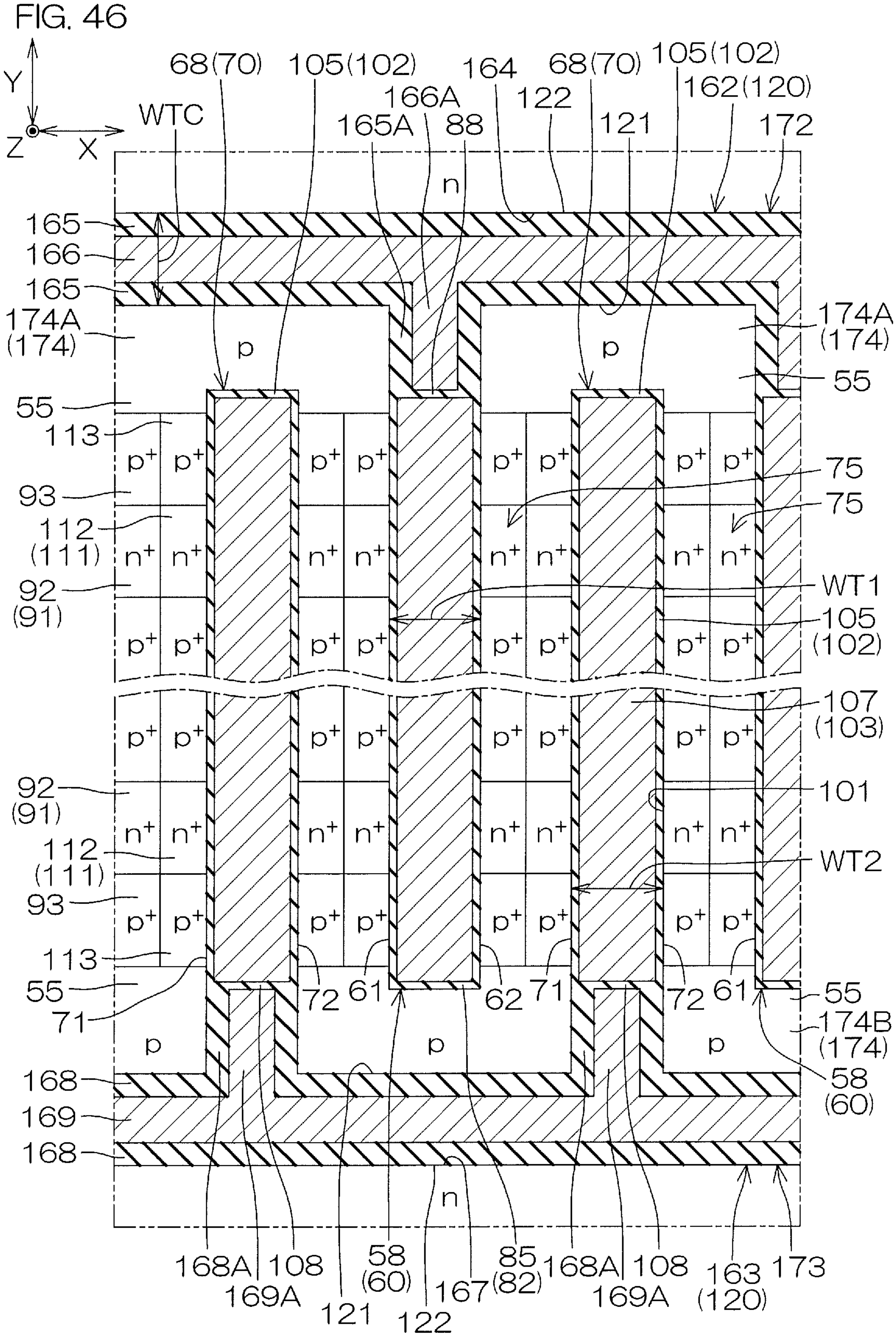
FIG. 46 is a plan view of a major portion extracted from a semiconductor layer shown in FIG. 45.

FIG. 45 is a sectional perspective view of a region corresponding to FIG. 26 and is a sectional perspective view which shows a modification example of the semiconductor device 171 according to the fourth preferred embodiment. FIG. 46 is a plan view of a major portion extracted from the semiconductor layer 2 shown in FIG. 45. Hereinafter, structures corresponding to the structures described for the semiconductor device 171 shall be provided with the same reference symbols and description thereof shall be omitted. In FIG. 45, the gate control wirings 17 (first gate control wiring 17A and second gate control wiring 17B) are shown in a simplified manner.

In the semiconductor device 171 according to the fourth preferred embodiment, the plurality of first trench contact structures 162 are each formed in an arch shape in plan view, and connected to the group of the plurality of first trench gate structures 60 which are adjacent to each other. Moreover, in the semiconductor device 171 according to the fourth preferred embodiment, the plurality of second trench contact structures 163 are each formed in an arch shape in plan view, and connected to the group of the plurality of second trench gate structures 70 which are adjacent to each other.

In contrast thereto, with reference to FIG. 45 and FIG. 46, in the semiconductor device 171 according to the modification example, the plurality of first FET structures 58 and the plurality of second FET structures 68 are formed in a manner that one first FET structure 58 and one second FET structure 68 are alternately arrayed.

Moreover, in the semiconductor device 171 according to the modification example, one or a plurality of (in this example, one) first trench contact structure 162 is formed in an arch shape in plan view, and connected to one end portions of the plurality of first trench gate structures 60 at an interval from one end portions of the plurality of second trench gate structures 70. Moreover, in the semiconductor device 171 according to the modification example, one or a plurality of (in this example, one) second trench contact structure 163 is formed in an arch shape in plan view, and connected to the other end portions of the plurality of second trench gate structures 70 at an interval from the other end portions of the plurality of first trench gate structures 60.

Thereby, a first trench structure 172 which integrally includes the plurality of first trench gate structures 60 and the first trench contact structure 162 and a second trench structure 173 which integrally includes the plurality of second trench gate structures 70 and the second trench contact structure 163 are formed. The first trench structure 172 is formed in a comb-teeth shape in plan view. The second trench structure 173 is formed in a comb-teeth shape which meshes with the first trench structure 172 in plan view.

In a region of the plurality of first trench gate structures 60 at one end portion side, the first contact trench 164 of the first trench contact structure 162 communicates with one end portions of the plurality of first gate trenches 81. The first contact insulation layer 165 is integrally formed with the first insulation layer 82 in the communication portion between each of the first gate trenches 81 and the first contact trench 164.

Specifically, the first contact insulation layer 165 includes the lead-out insulation layer 165A which is led out to the inside of each of the first gate trenches 81, crosses the communication portion, and is integrally formed with the first bottom-side insulation layer 84 and the first opening-side insulation layer 85 inside each of the first gate trenches 81.

The first contact electrode 166 is integrally formed with the first bottom-side electrode 86 in the communication portion between each of the first gate trenches 81 and the first contact trench 164. Specifically, the first contact electrode 166 includes the lead-out electrode 166A which is led out to the inside of each of the first gate trenches 81, crosses the communication portion, and is electrically connected to the first bottom-side electrode 86 inside each of the first gate trenches 81. Inside each of the first gate trenches 81, the first intermediate insulation layer 88 is interposed between the first contact electrode 166 and the first opening-side electrode 87.

In a region of the plurality of second trench gate structures 70 at the other end portion side, the second contact trench 167 of the second trench contact structure 163 communicates with the other end portions of the plurality of second gate trenches 101. The second contact insulation layer 168 is integrally formed with the second insulation layer 102 in the communication portion between each of the second gate trenches 101 and the second contact trench 167.

Specifically, the second contact insulation layer 168 includes the lead-out insulation layer 168A which is led out to the inside of each of the second gate trenches 101, crosses the communication portion, and is integrally formed with the second bottom-side insulation layer 104 and the second opening-side insulation layer 105 inside each of the second gate trenches 101.

The second contact electrode 169 is integrally formed with the second bottom-side electrode 106 in the communication portion between each of the second gate trenches 101 and the second contact trench 167. Specifically, the second contact electrode 169 includes the lead-out electrode 169A which is led out to the inside of each of the second gate trenches 101, crosses the communication portion, and is electrically connected to the second bottom-side electrode 106 inside each of the second gate trenches 101. Inside each of the second gate trenches 101, the second intermediate insulation layer 108 is interposed between the second contact electrode 169 and the second opening-side electrode 107.

In this example, the plurality of cell regions 75 are each defined in a region between one first FET structure 58 and one second FET structure 68 which are adjacent to each other. In this example, the total channel rate RT of each of the cell regions 75 is 50%. As a matter of course, the total channel rate RT of each of the cell regions 75 is arbitrary, and as in other preferred embodiments, it is appropriately adjusted according to an area resistivity Ron·A and an active clamp capability Eac that need to be achieved.

The semiconductor device 171 according to the modification example includes a plurality of cell connecting portions 174 which connect the plurality of cell regions 75 that are adjacent in a region of the first trench gate structure 60 at one end portion side and a region of the second gate trench structure 70 at one end portion side. The plurality of cell connecting portions 174 extend in a direction orthogonal to the plurality of cell regions 75. The plurality of cell connecting portions 174 each expose the body region 55 from the first main surface 3. Specifically, the plurality of cell connecting portions 174 include a plurality of first cell connecting portions 174A and a plurality of second cell connecting portions 174B.

Each of the plurality of first cell connecting portions 174A is interposed between one end portion of the second trench gate structure 70 and the first trench contact structure 162. Each of the plurality of second cell connecting portions 174B is interposed between the other end portion of the first trench gate structure 60 and the second trench contact structure 163. Thereby, the plurality of cell connecting portions 174 connect the plurality of cell regions 75 in a meandering shape (a zigzag shape) in plan view.

A width of the cell connecting portion 174 may be from not less than 0.2 μm to not more than 2 μm. The width of the cell connecting portion 174 is a width in a direction orthogonal to the direction in which the cell connecting portion 174 extends. The width of the cell connecting portion 174 may be from not less than 0.2 μm to not more than 0.4 μm, from not less than 0.4 μm to not more than 0.6 μm, from not less than 0.6 μm to not more than 0.8 μm, from not less than 0.8 μm to not more than 1.0 μm, from not less than 1.0 μm to not more than 1.2 μm, from not less than 1.2 μm, to not more than 1.4 μm, from not less than 1.4 μm to not more than 1.6 μm, from not less than 1.6 μm to not more than 1.8 μm, or from not less than 1.8 μm to not more than 2.0 μm. A cell ratio of the width of the cell connecting portion 174 with respect to a width of the cell region 75 (pitch PS) is preferably from not less than 0.1 to not more than 1.5. The cell ratio is more preferably from not less than 0.5 to not more than 1.

In the semiconductor device 171 according to the modification example, the same control as the control described with use of FIG. 27A and FIG. 27B is performed. A description according to FIG. 27A and FIG. 27B is applied with modifications to a description of the control of the semiconductor device 171 according to the modification example. As described above, the same effects as those described for the semiconductor device 171 according to the fourth preferred embodiment can be exhibited as well by the semiconductor device 171 according to the modification example.

With FIG. 45 and FIG. 46, a description has been given of an example in which the plurality of first FET structures 58 and the plurality of second FET structures 68 are formed in a manner that one first FET structure 58 and one second FET structure 68 are alternately arrayed. However, as in the semiconductor device 171 according to the fourth preferred embodiment, the plurality of first FET structures 58 and the plurality of second FET structures 68 may be formed in a manner that a group of a plurality of first FET structures 58 and a group of a plurality of second FET structures 68 are alternately arrayed. The structure of the semiconductor device 171 according to the modification example can also be applied to the semiconductor device 181 according to the fifth preferred embodiment of the present invention.

The present specification does not restrict any combined configuration of features illustrated with the first to ninth preferred embodiments. The first to ninth preferred embodiments may be combined among each other in any mode or any configuration. That is, a semiconductor device in which the features illustrated with the first to ninth preferred embodiments are combined in any mode or any configuration may be adopted.

In the following, description will be given of an electrical structure for performing first Half-ON control (or second Half-ON control) of the power MISFET 9 during an active clamp operation by raising specific examples.

Figure 47:
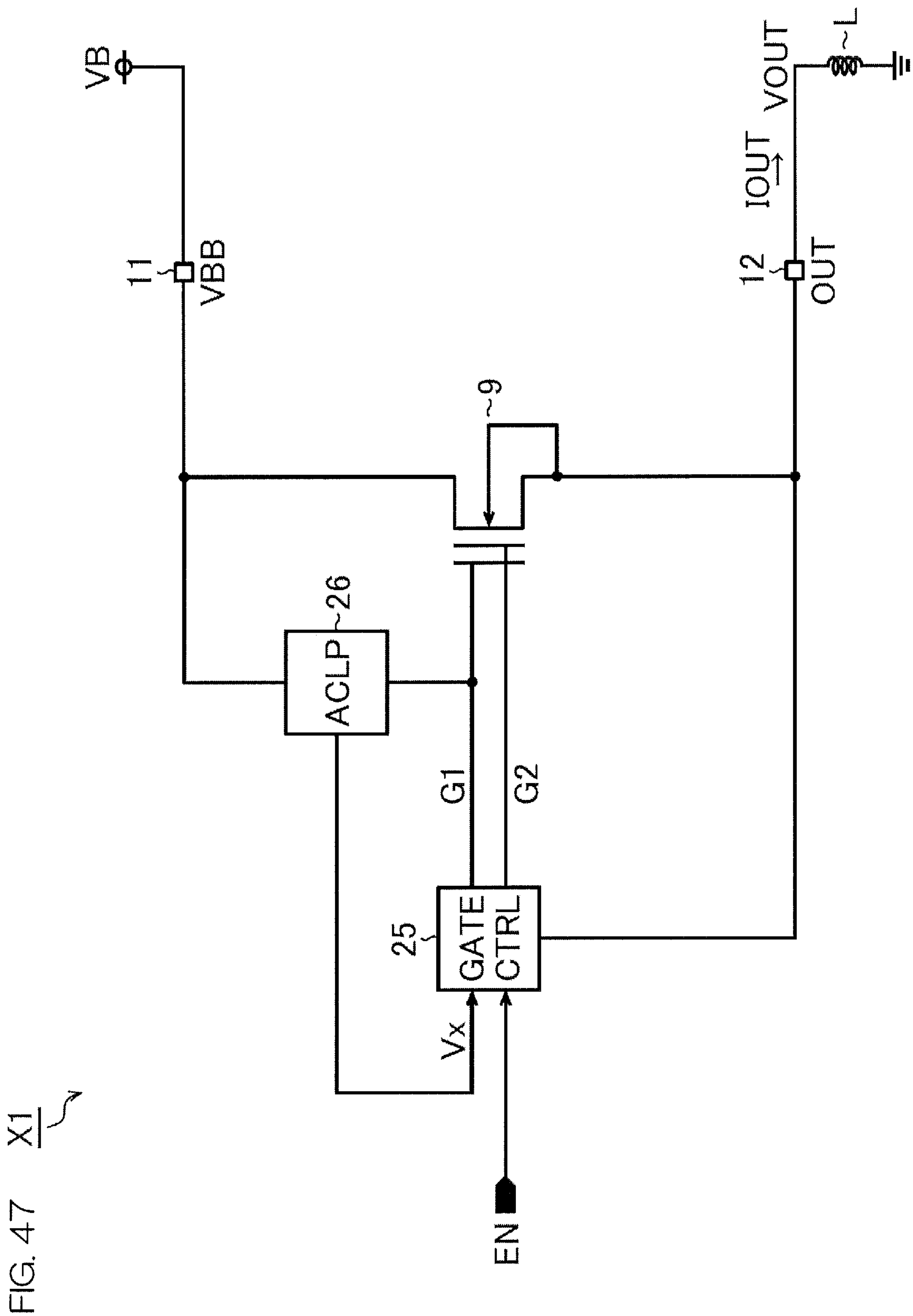
FIG. 47 is a block circuit diagram which shows a semiconductor device according to a tenth preferred embodiment of the present invention (=an electrical structure for performing first Half-ON control of a power MISFET during an active clamp operation in a case where the semiconductor device is a high-side switch).
Figure 48:
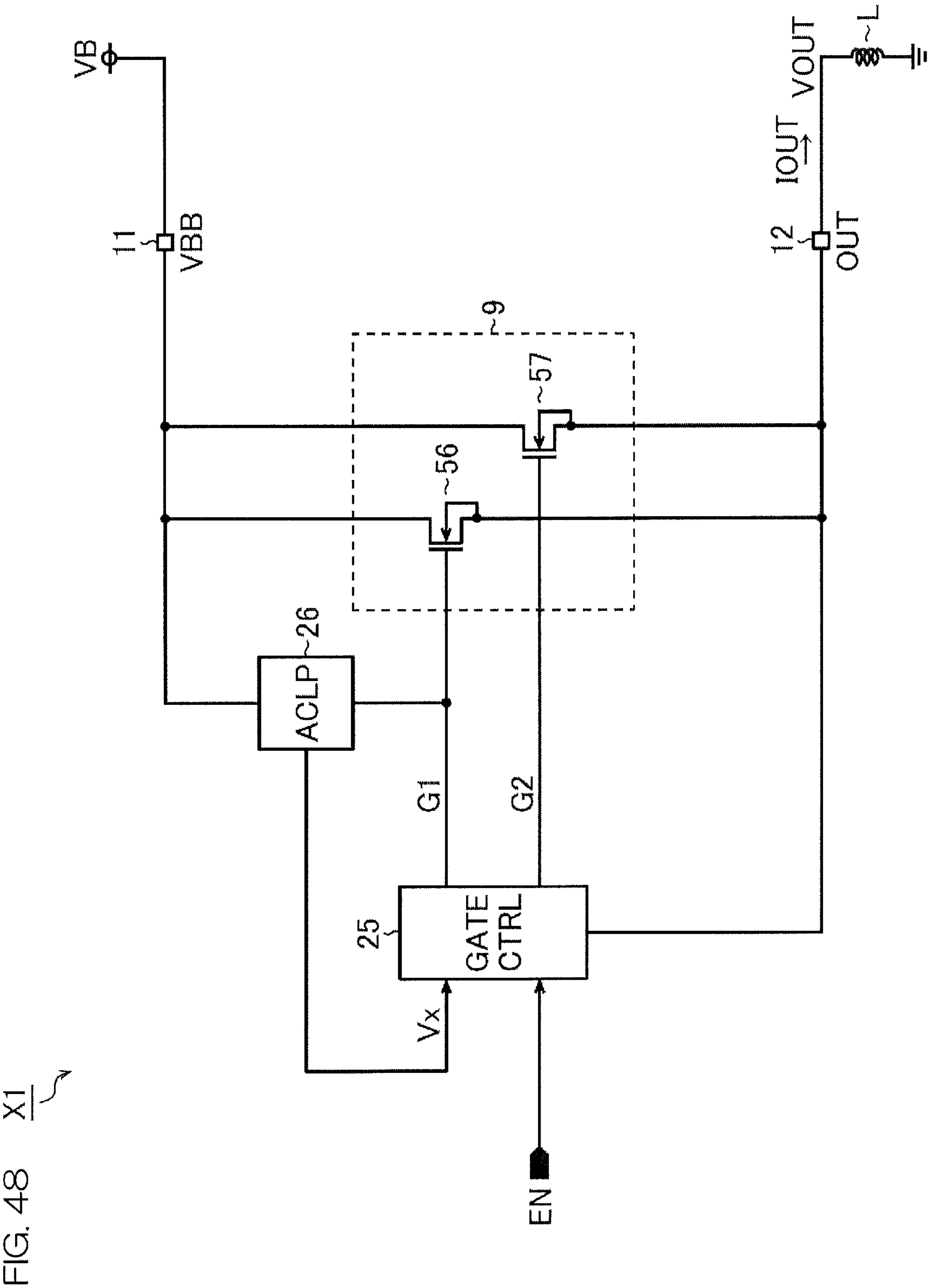
FIG. 48 is an equivalent circuit diagram in which the power MISFET of FIG. 47 is represented as a first MISFET and a second MISFET.

FIG. 47 is a block circuit diagram which shows a semiconductor device according to a tenth preferred embodiment of the present invention (=an electrical structure for performing first Half-ON control of a power MISFET during an active clamp operation in a case where the semiconductor device 1 is a high-side switch (refer to, for example, FIG. 1 to FIG. 4)). FIG. 48 is an equivalent circuit diagram in which the power MISFET of FIG. 47 is represented as a first MISFET and a second MISFET.

The semiconductor device X1 according to the present preferred embodiment has a drain electrode 11 (=power supply electrode VBB), the source electrode 12 (=output electrode OUT), the power MISFET 9, the gate control circuit 25, and the active clamp circuit 26. Components already mentioned are provided with the same symbols as before.

Further, in these figures, only part of the components are illustrated by extraction for the sake of simplification of description, however, it may be understood that the semiconductor device X1 basically includes the same components as those of the foregoing semiconductor device 1 (refer to FIG. 2).

The power MISFET 9 is a gate divided device the structure of which has been described in detail by giving various types of preferred embodiments as examples so far. That is, as shown in FIG. 48, the power MISFET 9 can be equivalently represented as a first MISFET 56 and a second MISFET 57 (=which respectively correspond to the first transistor and the second transistor) that are in parallel connection.

From another point of view, it can also be understood that the first MISFET 56 and the second MISFET 57 which are respectively controlled in an independent manner are formed integrally as the power MISFET 9 that is a single gate divided device.

The gate control circuit 25 performs a gate control of the power MISFET 9 (and consequently, a gate control of each of the first MISFET 56 and the second MISFET 57). For example, the gate control circuit 25 generates gate signals G1 and G2 for the first MISFET 56 and the second MISFET 57, respectively, such as to turn on both of the first MISFET 56 and the second MISFET 57 in an enable state (=which corresponds to a first operation state) in which an enable signal EN is made high level, while turning off both of the first MISFET 56 and the second MISFET 57 in a disable state (=which corresponds to a second operation state) in which the enable signal EN is made low level.

Further, the gate control circuit 25 accepts an input of an internal node voltage Vx from the active clamp circuit 26, and has a function of short-circuiting between a gate and a source of the second MISFET 57 after transition from the enable state (EN=H) to the disable state (EN=L) and before the active clamp circuit 26 operates (=before an output voltage VOUT is clamped), that is, a function of realizing the first Half-ON control of the power MISFET 9 by completely stopping the second MISFET 57 by making G2=VOUT.

The active clamp circuit 26 is connected between a drain and a gate of the first MISFET 56, and limits a drain-source voltage (=VB−VOUT) of each of the first MISFET 56 and the second MISFET 57 to be equal to or less than a predetermined clamp voltage Vclp by (not fully turning off) forcibly turning on the first MISFET 56 when the output voltage VOUT of the source electrode 12 has reached a negative voltage. Since the second MISFET 57 does not contribute to the active clamp operation, no active clamp circuit 26 is connected between the drain and gate of the second MISFET 57.

Figure 49:
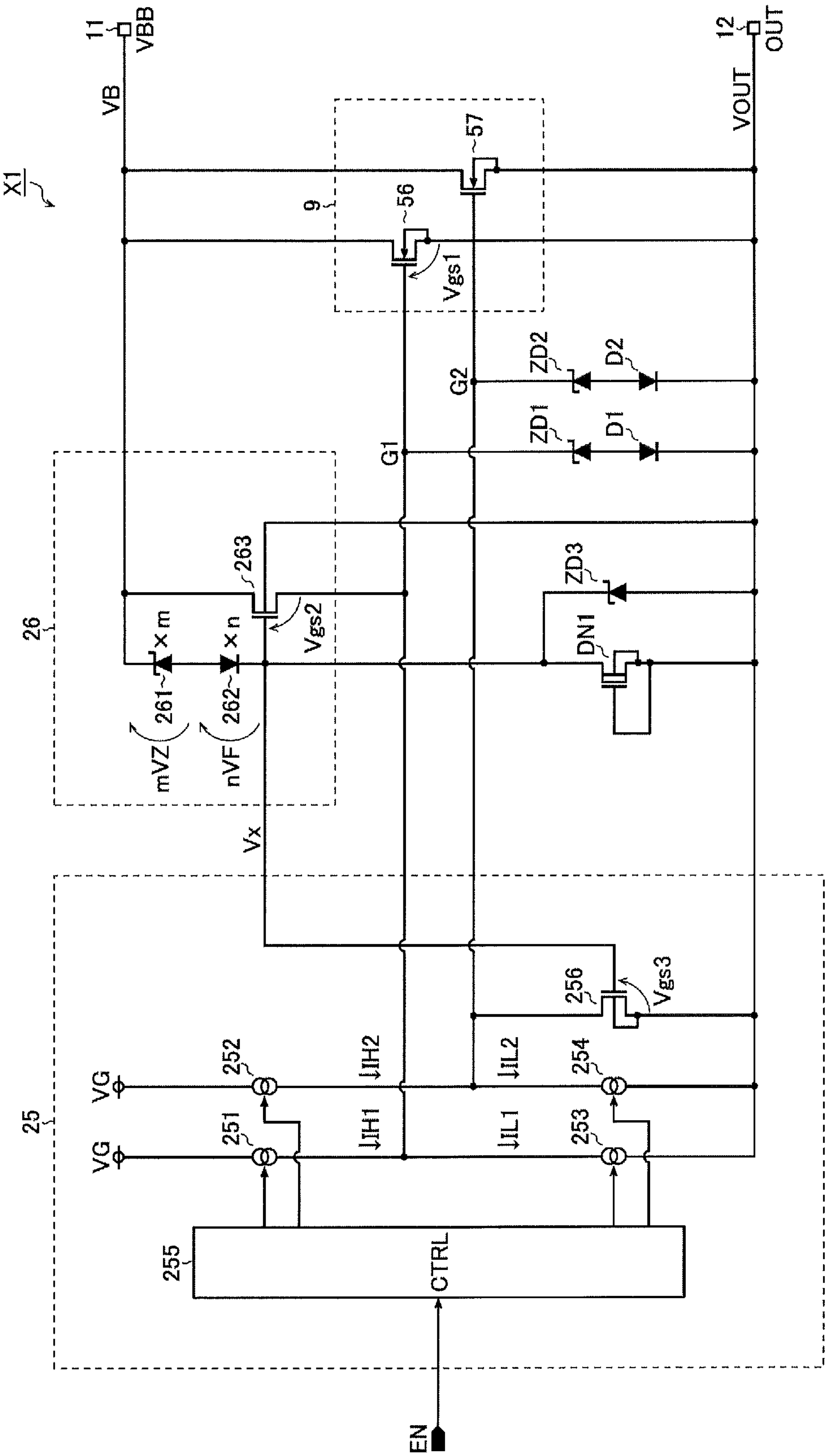
FIG. 49 is a circuit diagram which shows a construction example of a gate control circuit and an active clamp circuit in FIG. 47.

FIG. 49 is a circuit diagram which shows a construction example of the gate control circuit 25 and the active clamp circuit 26 in FIG. 47.

First, a specific description will be given of a construction of the active clamp circuit 26. The active clamp circuit 26 of the present construction example includes an m-stage (for example, m=8) Zener diode array 261, an n-stage (for example, n=3) diode array 262, and an N-channel type MISFET 263 (=which corresponds to a third transistor).

A cathode of the Zener diode array 261 and the drain of the MISFET 263 are connected to the drain electrode 11 (=which corresponds to the power supply electrode VBB to which the power supply voltage VB is applied) together with the drain of each of the first MISFET 56 and the second MISFET 57. An anode of the Zener diode array 261 is connected to an anode of the diode array 262. A cathode of the diode array 262 is connected to a gate of the MISFET 263. A source of the MISFET 263 is connected to the gate of the first MISFET 56 (=application terminal of the gate signal G1). A back gate of the MISFET 263 is connected to the source electrode 12 (=which corresponds to the output electrode OUT to which the output voltage VOUT is applied) together with the source of each of the first MISFET 56 and the second MISFET 57. As shown in the foregoing FIG. 47 and FIG. 48, the source electrode 12 may be connected with the inductive load L such as a coil, a solenoid, etc.

Next, a specific description will be given of a construction of the gate control circuit 25. The gate control circuit 25 of the present construction example includes current sources 251 to 254, a controller 255, and an N-channel type MISFET 256 (=which corresponds to a fourth transistor).

The current source 251 is connected between an application terminal of a boost voltage VG (=charge pump output) and the gate of the first MISFET 56, and generates a source current IH1.

The current source 252 is connected between an application terminal of the boost voltage VG and the gate of the second MISFET 57, and generates a source current IH2.

The current source 253 is connected between the gate of the first MISFET 56 and an application terminal of the output voltage VOUT (=source electrode 12), and generates a sink current IL1.

The current source 254 is connected between the gate of the second MISFET 57 and the application terminal of the output voltage VOUT, and generates a sink current IL2.

The controller 255 turns on the current sources 251 and 252 and turns off the current sources 253 and 254 in the enable state (EN=H). By the above-described current control, each of the source currents 1H1 and IH2 is allowed to flow into the gate of each of the first MISFET 56 and the second MISFET 57.

On the other hand, the controller 255 turns off the current sources 251 and 252 and turns on the current sources 253 and 254 in the disable state (EN=L). By the above-described current control, each of the sink currents IL1 and IL2 is drawn out from the gate of each of the first MISFET 56 and the second MISFET 57.

The MISFET 256 is connected between the gate and source of the second MISFET 57, and is turned on/off according to the internal node voltage Vx of the active clamp circuit 26. As the internal node voltage Vx, for example, as shown in this figure, it is desirable that a gate voltage of the MISFET 263 is input. However, the internal node voltage Vx is not restricted to this, and for example, it is also possible to use an anode voltage of any of the n-stage of diodes that form the diode array 262 as the internal node voltage Vx.

Further, besides the components described above, Zener diodes ZD1 to ZD3, diodes D1 and D2, and a depression N-channel type MISFET DN1 are provided as electrostatic breakdown protective devices in the semiconductor device X1. The connecting relationship among each of the components will be briefly described.

A cathode of each of the Zener diodes ZD1 and ZD2 is connected to the gate of each of the first MISFET 56 and the second MISFET 57. An anode of each of the Zener diodes ZD1 and ZD2 is connected to an anode of each of the diodes D1 and D2. A cathode of the Zener diode ZD3 and a drain of the MISFET DN1 are connected to the gate of the MISFET 263. A cathode of each of the diodes D1 and D2, an anode of the Zener diode ZD3, and a source, a gate, and a back gate of the MISFET DN1 are connected to the application terminal of the output voltage VOUT.

Hereinafter, description will be given of the first Half-ON control of the power MISFET 9 in the active clamp operation, for which a gate-source voltage of the first MISFET 56 is Vgs1, a gate-source voltage of the MISFET 263 is Vgs2, a gate-source voltage of the MISFET 256 is Vgs3, a breakdown voltage of the Zener diode array 261 is mVZ, and a forward drop voltage of the diode array 262 is nVF.

Figure 50:
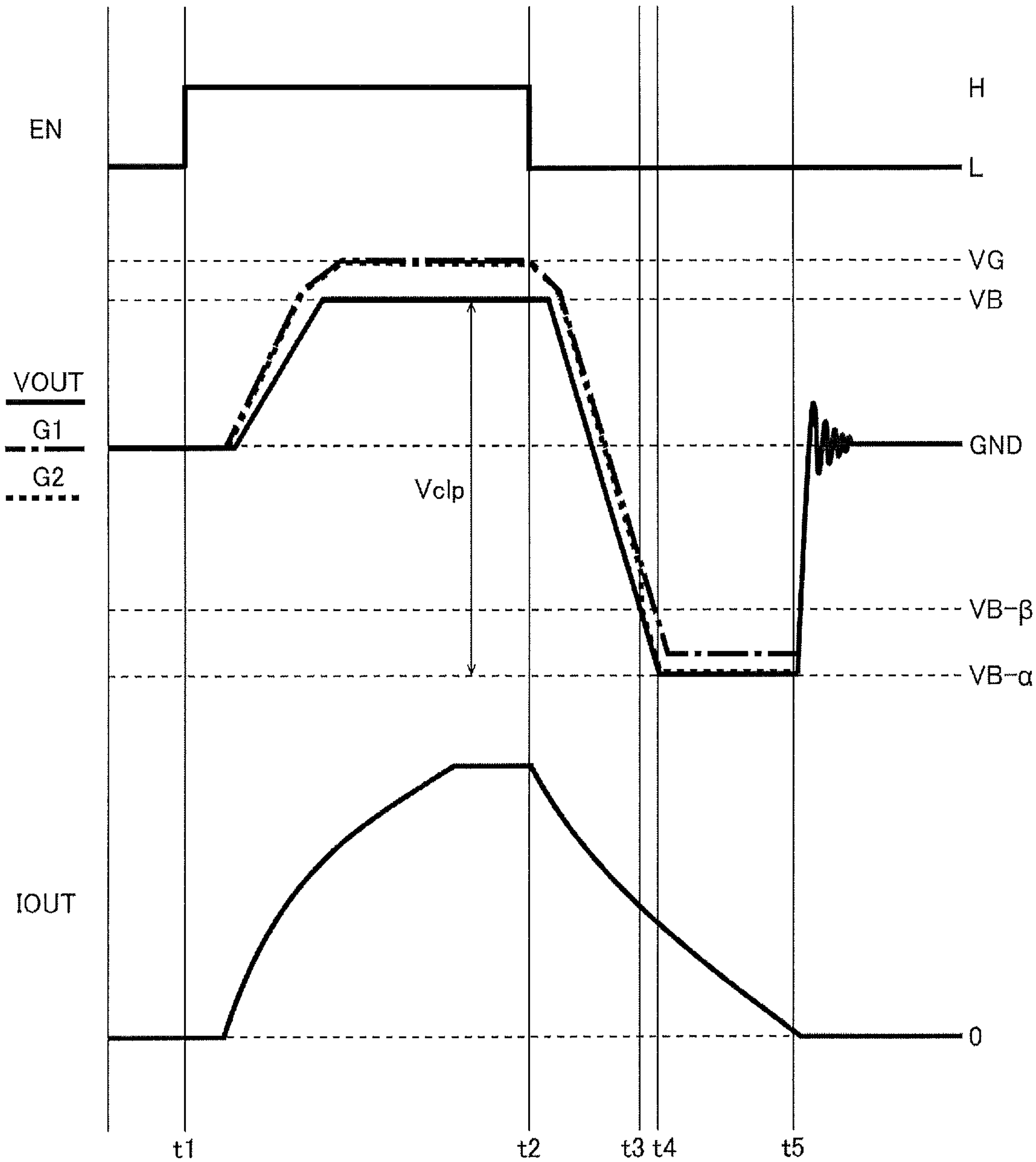
FIG. 50 is a timing chart which shows a state of first Half-ON control of the power MISFET performed during an active clamp operation in the case where the semiconductor device is a high-side switch.

FIG. 50 is a timing chart which shows a state of the first Half-ON control of the power MISFET 9 performed during an active clamp operation in the semiconductor device X1, for which in order from the top, an enable signal EN, an output voltage VOUT (solid line), a gate signal G1 (alternate long and short dashed line), a gate signal G2 (broken line), and an output current IOUT are plotted. In this figure, it is assumed that the inductive load L is connected to the source electrode 12 (output electrode OUT).

When the enable signal EN is raised to a high level (=logic level when turning on the power MISFET 9) at time t1, the gate signals G1 and G2 rise to high levels (≈VG), and the first MISFET 56 and the second MISFET 57 are both turned on. As a result, the output current IOUT starts to flow, so that the output voltage VOUT is increased to nearly the power supply voltage VB. This state corresponds to a Full-ON state of the power MISFET 9.

Thereafter, when the enable signal EN is made to fall to a low level (=logic level when turning off the power MISFET 9) at time t2, the gate signals G1 and G2 fall to low levels (≈VOUT) to turn off both of the first MISFET 56 and the second MISFET 57.

At this time, the inductive load L continues to allow the output current IOUT to flow until it has released energy accumulated during the ON period of the power MISFET 9. As a result, the output VOUT is sharply reduced to a negative voltage lower than a ground voltage GND.

However, when the output voltage VOUT is reduced to a lower limit voltage VB−α (for example, VB−50V) that is lower by a predetermined value α (=mVZ+nVF+Vgs1+Vgs2) than the power supply voltage VB at time t4, the first MISFET 56 is (not fully turned off) turned on by the operation of the active clamp circuit 26, so that the output current IOUT is discharged through the first MISFET 56. Therefore, the output voltage VOUT is limited to be equal to or more than the lower limit voltage VB−α.

That is, the active clamp circuit 26 limits a drain-source voltage Vds (=VB−VOUT) of the power MISFET 9 to be equal to or less than the predetermined clamp voltage Vclp (=α) by limiting the output voltage VOUT based on a reference of the power supply voltage VB. The above-described active clamp operation is continued until time t5 at which the energy accumulated in the inductive load L has been completely released and the output current IOUT no longer flows.

On the other hand, in terms of the second MISFET 57, after transition from an enable state (EN=H) to a disable state (EN=L), when the output voltage VOUT is reduced to a channel switching voltage VB−β (>VB−α) that is lower by a predetermined value β (=mVZ+nVF+Vgs3) than the power supply voltage VB at time t3, the internal node voltage Vx becomes higher than the gate-source voltage Vgs3, so that the MISFET 256 is turned on to provide short-circuiting (G2=VOUT) between the gate and source of the second MISFET 57.

That is, the second MISFET 57 is completely stopped, by the operation of the MISFET 256, before the active clamp circuit 26 operates (before time t4). This state corresponds to a first Half-ON state of the power MISFET 9.

As described above, by performing switching from the Full-ON state to the first Half-ON state, the channel utilization rate RU in the active clamp operation (=time t4 to t5) becomes in excess of zero and less than the channel utilization rate RU in the normal operation (=time t1 to t2).

Therefore, the characteristics channel rate RC relatively increases in the normal operation (for example, RC=50%). Thereby, the current path is relatively increased, and it becomes possible to reduce the area resistivity Ron·A (ON resistance). On the other hand, the characteristics channel rate RC relatively reduces in the active clamp operation (for example, RC=25%). Thereby, it is possible to suppress a sharp temperature rise due to the counter electromotive force of the inductive load L and therefore it is possible to improve the active clamp capability Eac.

Thus, it becomes possible to provide a semiconductor device 1 which can realize an excellent area resistivity Ron·A and an excellent active clamp capability Eac at the same time independently of the trade-off relationship shown in FIG. 13. Particularly, in the field of IPDs, the active clamp capability Eac is one of the characteristics that are crucial for driving a greater inductive load L.

With FIG. 47 to FIG. 50, a description has been given of an example in which first Half-ON control is applied in the active clamp operation. However, second Half-ON control may be applied in the active clamp operation. In that case, it suffices to replace the first MISFET 56 and the second MISFET 57 with each other for understanding.

Figure 51:
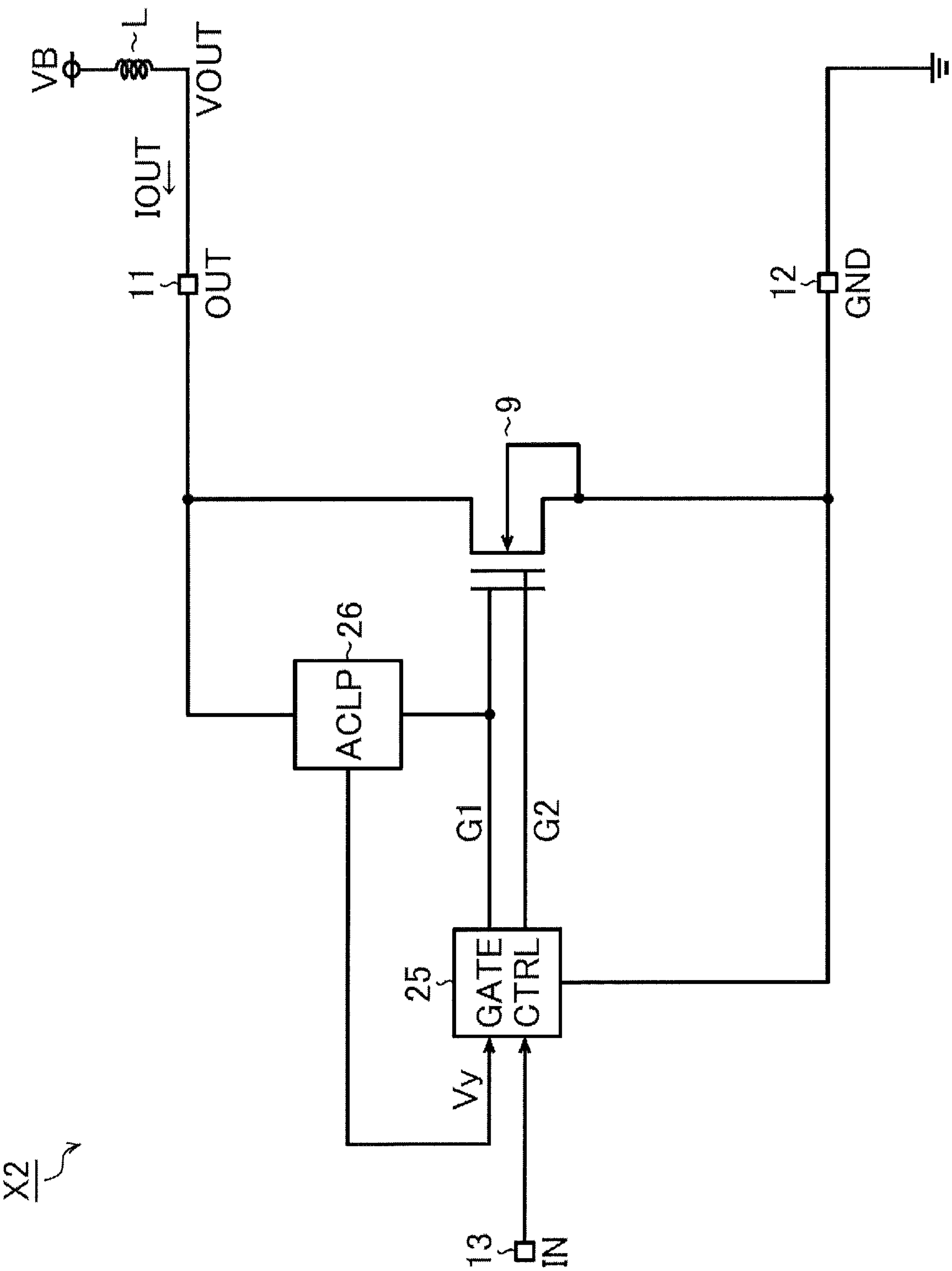
FIG. 51 is a block circuit diagram which shows a semiconductor device according to an eleventh preferred embodiment of the present invention (=an electrical structure for performing first Half-ON control of a power MISFET during an active clamp operation in a case where the semiconductor device is a low-side switch).
Figure 52:
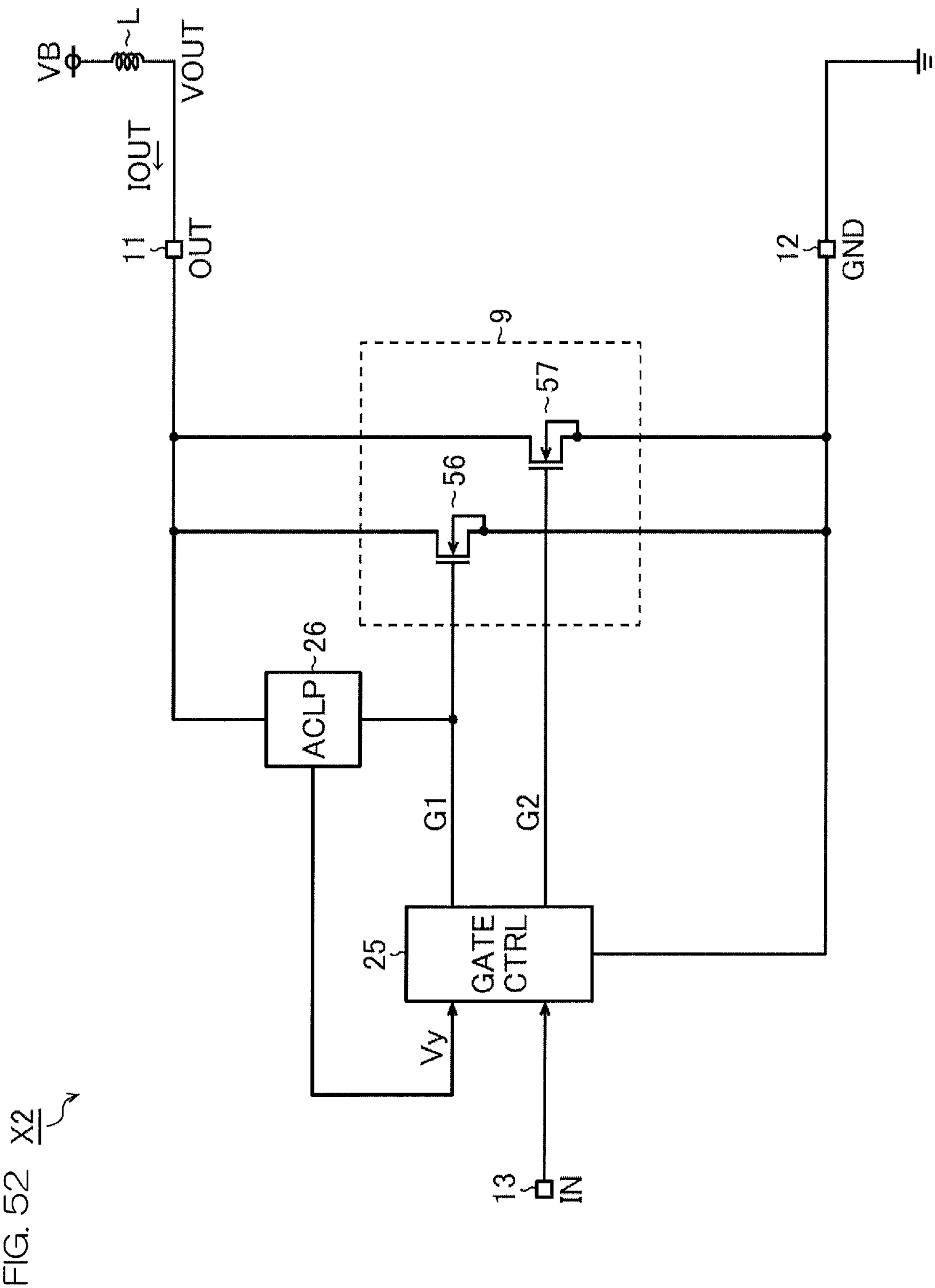
FIG. 52 is an equivalent circuit diagram in which the power MISFET of FIG. 51 is represented as a first MISFET and a second MISFET.

FIG. 51 is a block circuit diagram which shows a semiconductor device according to an eleventh preferred embodiment of the present invention (=an electrical structure for performing first Half-ON control of a power MISFET during an active clamp operation in a case where the semiconductor device 1 is a low-side switch (refer to, for example, FIG. 1 to FIG. 4)). FIG. 52 is an equivalent circuit diagram in which the power MISFET of FIG. 51 is represented as a first MISFET and a second MISFET.

The semiconductor device X2 according to the present preferred embodiment has the drain electrode 11 (=power supply electrode OUT), the source electrode 12 (=ground electrode GND), the power MISFET 9, the gate control circuit 25, and the active clamp circuit 26. Components already mentioned are provided with the same symbols as before.

Further, in these figures, only part of the components are illustrated by extraction for the sake of simplification of description, however, it may be understood that the semiconductor device X2 basically includes the same components as those of the foregoing semiconductor device 241 (refer to FIG. 38).

The power MISFET 9 is a gate divided device the structure of which has been described in detail by giving various types of preferred embodiments as examples so far. That is, as shown in FIG. 52, the power MISFET 9 can be equivalently represented as the first MISFET 56 and the second MISFET 57 (=which respectively correspond to a first transistor and a second transistor) that are in parallel connection.

From another point of view, it can also be understood that the first MISFET 56 and the second MISFET 57 which are respectively controlled in an independent manner are formed integrally as the power MISFET 9 that is a single gate divided device.

The gate control circuit 25 performs a gate control of the power MISFET 9 (and consequently, a gate control of each of the first MISFET 56 and the second MISFET 57). For example, the gate control circuit 25 generates gate signals G1 and G2 for the first MISFET 56 and the second MISFET 57, respectively, such as to turn on both of the first MISFET 56 and the second MISFET 57 in an enable state (=which corresponds to a first operation state) in which an external control signal IN to be input to the input electrode 13 is made high level, while turning off both of the first MISFET 56 and the second MISFET 57 in a disable state (=which corresponds to a second operation state) in which the external control signal IN is made low level.

In the semiconductor device X2 that is used as a low-side switch, not only does the external control signal IN function as an on/off control signal of the power MISFET 9, but it can also be used as a power supply voltage of the semiconductor device X2.

Further, the gate control circuit 25 accepts an input of an internal node voltage Vy from the active clamp circuit 26, and has the function of short-circuiting between the gate and source of the second MISFET 57 after transition from the enable state (IN=H) to the disable state (IN=L) and before the active clamp circuit 26 operates (=before the output voltage VOUT is clamped), that is, a function of realizing the first Half-ON control of the power MISFET 9 by completely stopping the second MISFET 57 by making G2=GND.

The active clamp circuit 26 is connected between the drain and gate of the first MISFET 56, and limits a drain-source voltage (=VB−GND) of each of the first MISFET 56 and the second MISFET 57 to be equal to or less than the predetermined clamp voltage Vclp by (not fully turning off) forcibly turning on the first MISFET 56 when the output voltage VOUT of the drain electrode 11 has reached an overvoltage. Since the second MISFET 57 does not contribute to the active clamp operation, no active clamp circuit 26 is connected between the drain and gate of the second MISFET 57.

Figure 53:
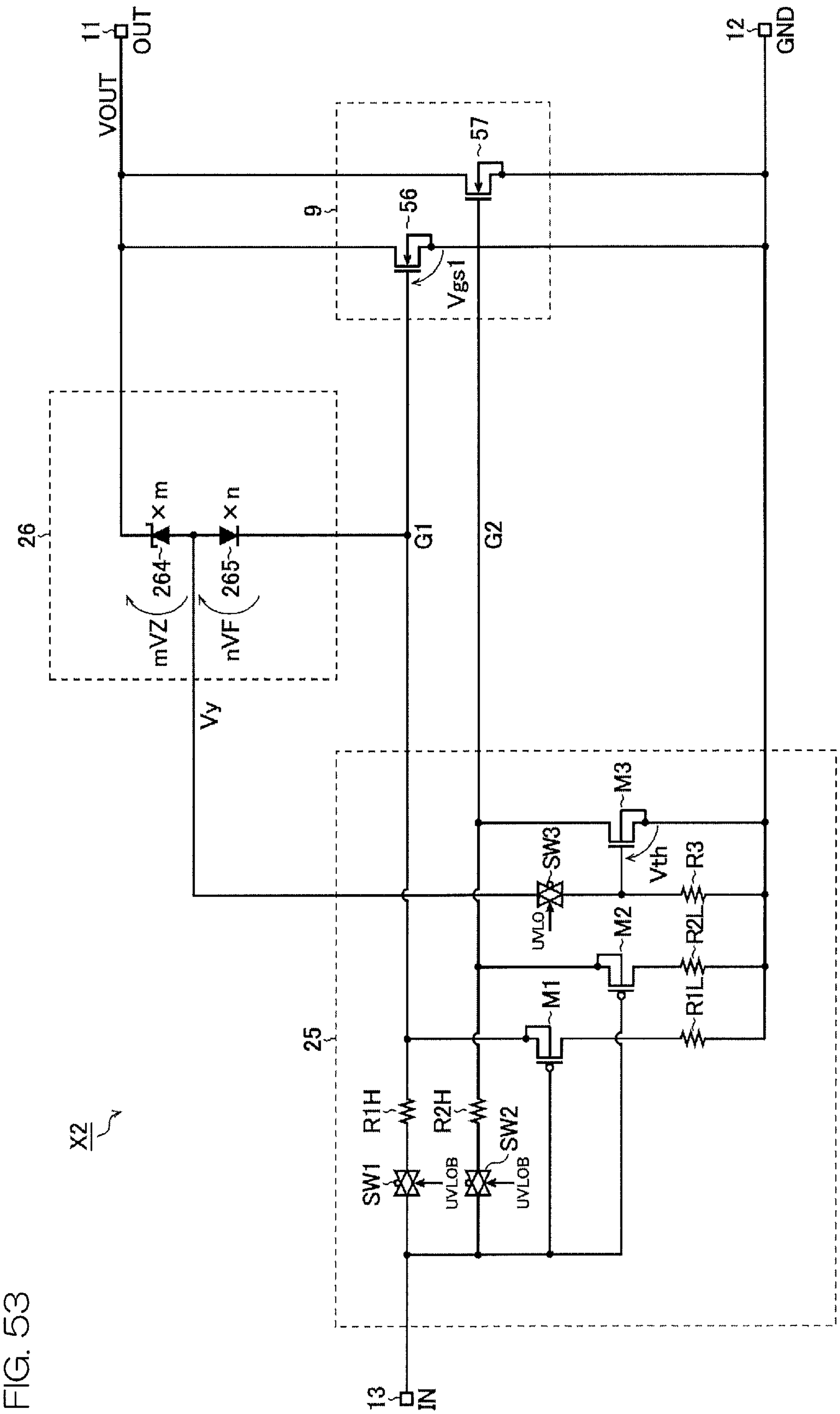
FIG. 53 is a circuit diagram which shows a construction example of a gate control circuit and an active clamp circuit in FIG. 51.

FIG. 53 is a circuit diagram which shows a construction example of the gate control circuit 25 and the active clamp circuit 26 in FIG. 51.

First, a specific description will be given of a construction of the active clamp circuit 26. The active clamp circuit 26 of the present construction example includes an m-stage (for example, m=8) Zener diode array 264 and an n-stage (for example, n=3) diode array 265.

A cathode of the Zener diode array 264 is connected to the drain electrode 11 (=which corresponds to the output electrode OUT to which the output voltage VOUT is applied) together with the drain of each of the first MISFET 56 and the second MISFET 57. As shown in the foregoing FIG. 51 and FIG. 52, the drain electrode 11 may be connected with the inductive load L such as a coil, a solenoid, etc. The anode of the Zener diode array 264 is connected to the anode of the diode array 265. A cathode of the diode array 265 is connected to the gate of the first MISFET 56 (=application terminal of the gate signal G1).

Next, a specific description will be given of a construction of the gate control circuit 25. The gate control circuit 25 of the present construction example includes P-channel type MOS field-effect transistors M1 and M2, an N-channel type MOS field-effect transistor M3, resistors R1H and R1L, resistors R2H and R2L, a resistor R3, and switches SW1 to SW3.

The switch SW1 is connected between the input electrode 13 and a first terminal of the resistor R1H (=which corresponds to a first upper resistor), and is turned on/off according to an inverted low-voltage detection signal UVLOB (=signal for which a low-voltage detection signal UVLO is inverted in logic level). More specifically, the switch SW1 is turned on when UVLOB=H (UVLO=L), and is turned off when UVLOB=L (UVLO=H).

The switch SW2 is connected between the input electrode 13 and a first terminal of the resistor R2H (=which corresponds to a second upper resistor), and is turned on/off according to the inverted low-voltage detection signal UVLOB. More specifically, the switch SW2 is turned on when UVLOB=H (UVLO=L), and is turned off when UVLOB=L (UVLO=H).

The switch SW3 is connected between an application terminal of the internal node voltage Vy in the active clamp circuit 26 (=for example, a connection node of the Zener diode array 264 and the diode array 265) and a first terminal of the resistor R3, and is turned on/off according to the low-voltage detection signal UVLO. More specifically, the switch SW3 is turned on when UVLO=H (UVLOB=L), and is turned off when UVLO=L (UVLOB=H). The application terminal of the internal node voltage Vy is not restricted to the one described above, and for example, it is also possible to use an anode voltage of any of the n stages of diodes that form the diode array 265 as the internal node voltage Vy.

Meanwhile, the logic level of each of the low-voltage detection signal UVLO and the inverted low-voltage detection signal UVLOB is switched according to a comparison result of the external control signal IN (=which corresponds to the power supply voltage of the semiconductor device X2) with a low-voltage detection threshold Vuvlo. More specifically, when IN<Vuvlo, UVLO=H and UVLOB=L (logic levels at the time of UVLO detection) are provided, the switches SW1 and SW2 are turned off and the switch SW3 is turned on. Conversely, when IN>Vuvlo, UVLO=L and UVLOB=H (logic levels at the time of UVLO cancelation) are provided, the switches SW1 and SW2 are turned on and the switch SW3 is turned off. As described above, the switches SW1 and SW2 and the switch SW3 are complementarily turned on/off.

A second terminal of the resistor R1H and a source and a back gate of the transistor M1 are connected to the gate of the first MISFET 56. A drain of the transistor M1 is connected to a first terminal of the resistor R1L (=which corresponds to a first lower resistor). A second terminal of the resistor R1L is connected to the source electrode 12 (=which corresponds to the ground electrode GND to which the ground voltage GND is applied). A gate of the transistor M1 is connected to the input electrode 13.

A second terminal of the resistor R2H and a source and a back gate of the transistor M2 are connected to the gate of the second MISFET 57. A drain of the transistor M2 is connected to a first terminal of the resistor R2L (=which corresponds to a second lower resistor). A second terminal of the resistor R2L is connected to the source electrode 12 (=which corresponds to the ground electrode GND). A gate of the transistor M2 is connected to the input electrode 13.

A drain of the transistor M3 is connected to the gate of the second MISFET 57. A gate of the transistor M3 is connected to the first terminal of the resistor R3. A source and back gate of the transistor M3 and a second gate of the resistor R3 are connected to the source electrode 12.

Hereinafter, description will be given of the first Half-ON control of the power MISFET 9 in the active clamp operation, for which the gate-source voltage of the first MISFET 56 is Vgs1, an ON threshold voltage of the transistor M3 is Vth, a breakdown voltage of the Zener diode array 264 is mVZ, and a forward drop voltage of the diode array 265 is nVF.

Figure 54:
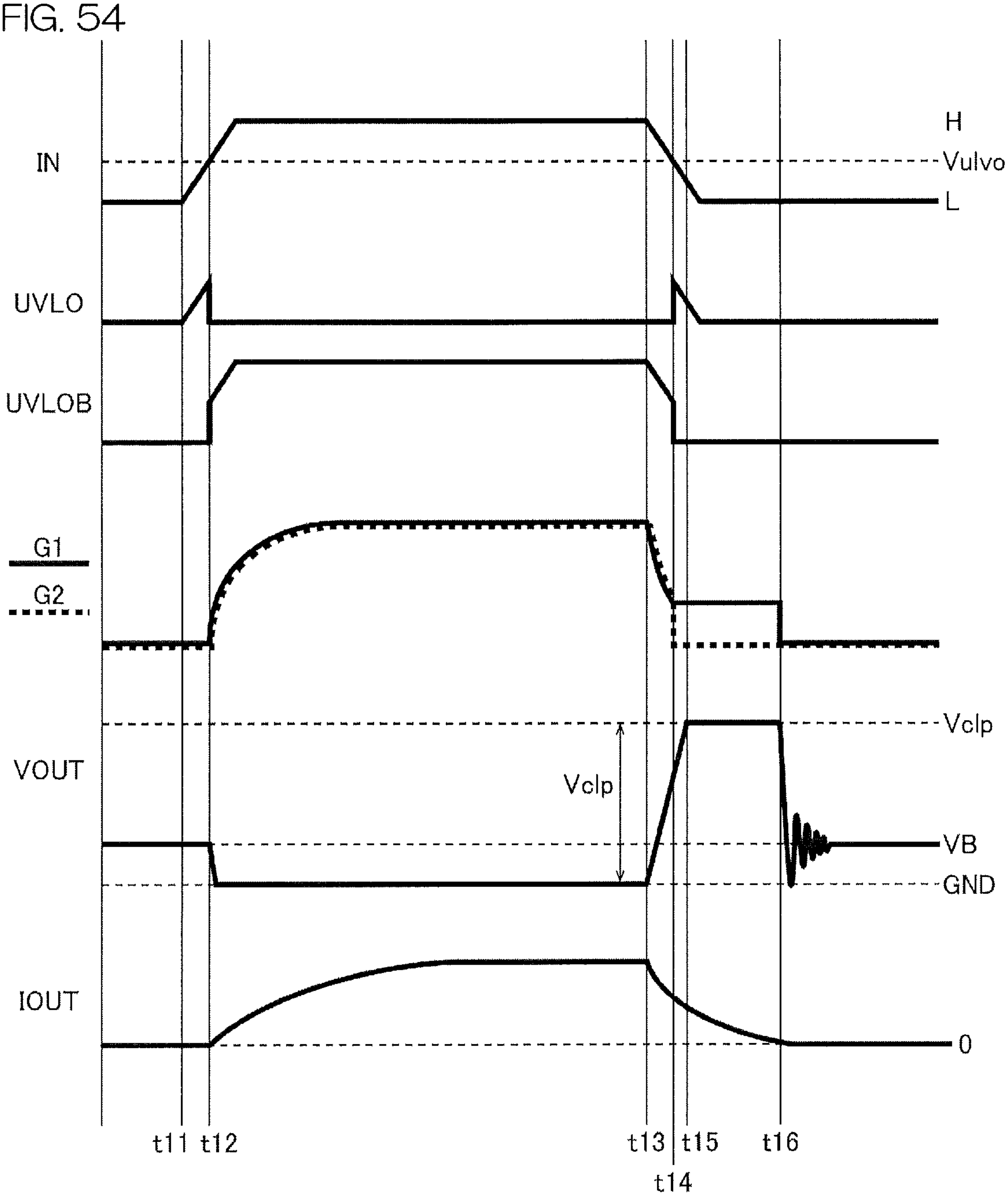
FIG. 54 is a timing chart which shows a state of first Half-ON control of the power MISFET performed during an active clamp operation in the case where the semiconductor device is a low-side switch.

FIG. 54 is a timing chart which shows a state of the first Half-ON control of the power MISFET 9 performed during an active clamp operation in the semiconductor device X2, for which in order from the top, an external control signal IN, a low-voltage detection signal UVLO and an inverted low-voltage detection signal UVLOB, a gate signal G1 (solid line), gate signal G2 (broken line), an output voltage VOUT, and an output current IOUT are plotted. In this figure, it is assumed that the inductive load L is connected to the drain electrode 11 (output electrode OUT).

At time t11, the external control signal IN starts to transit from a low level (=logic level when turning off the power MISFET 9) to a high level (=logic level when turning on the power MISFET 9). However, at this point in time, since IN<Vuvlo, UVLO=H and UVLOB=L. Accordingly, in the gate control circuit 25, a state in which the switches SW1 and SW2 are turned off and the switch SW3 is turned on is brought about, and the gate signals G1 and G2 are kept at low levels, so that the first MISFET 56 and the second MISFET 57 both remain to be off. As a result, no output current IOUT flows, and this results in VOUT≈VB.

When the external control signal reaches IN>Vuvlo at time t12, UVLO=L and UVLOB=H are provided. Accordingly, in the gate control circuit 25, a state in which the switches SW1 and SW2 are turned on and the switch SW3 is turned off is brought about. At this time, since the gate of each of the first MISFET 56 and the second MISFET 57 and the input electrode 13 are made conductive to each other, the gate signals G1 and G2 rise to high levels, and the first MISFET 56 and the second MISFET 57 are both turned on. As a result, the output current IOUT starts to flow, so that the output voltage VOUT is reduced to nearly the ground voltage GND. This state corresponds to a Full-ON state of the power MISFET 9. Rising rates of each of the gate signals G1 and G2 (=slew rate at switch-on time) can be adjusted according to resistance values of each of the resistors R1H and R2H.

Further, since the switch SW3 is off, the node voltage Vy of the active clamp circuit 26 is not applied to the gate of the transistor M3, and the transistor M3 is not unexpectedly turned on.

Thereafter, at time t13, the external control signal IN starts to transit from the high level to the low level. As a result, the transistors M1 and M2 are turned on, and the gate of each of the first MISFET 56 and the second MISFET 57 and the source electrode 12 (=ground electrode GND) are made conductive to each other, so that the gate signals G1 and G2 are lowered, and the first MISFET 56 and the second MISFET 57 are turned to off from on. Falling rates of each of the gate signals G1 and G2 (=slew rate at switch-off time) can be adjusted according to the resistance values of each of the resistors R1L and R2L.

At this time, the inductive load L continues to allow the output current IOUT to flow until it has released energy accumulated during the ON period of the power MISFET 9. As a result, the output VOUT is sharply raised to a voltage higher than the power supply voltage VB.

However, when the output voltage VOUT is increased to the clamp voltage Vclp (=Vgs1+nVF+mVZ) at time t15, the first MISFET 56 is (not fully turned off) turned on by the operation of the active clamp circuit 26, so that the output current IOUT is discharged through the first MISFET 56. Therefore, the output voltage VOUT is limited to be equal to or less than the clamp voltage Vclp. The above-described active clamp operation is continued until time t16 at which the energy accumulated in the inductive load L has been completely released and the output current IOUT no longer flows.

On the other hand, in terms of the second MISFET 57, the external control signal reaches IN<Vuvlo at time t14, and the switch SW3 is turned on at the point in time where the low-voltage detection signal UVLO has risen from the low level to the high level, so that a state is brought about in which the node voltage Vy (>Vth) of the active clamp circuit 26 is applied to the gate of the transistor M3. Accordingly, the transistor M3 is turned on to provide short-circuiting (G2=VOUT) between the gate and source of the second MISFET 57.

That is, the second MISFET 57 is completely turned off, by the operation of the transistor M3, before the active clamp circuit 26 operates (before time t15). This state corresponds to a first Half-ON state of the power MISFET 9.

As described above, by performing switching from the Full-ON state to the first Half-ON state, the channel utilization rate RU in the active clamp operation (=time t15 to t16) becomes in excess of zero and less than the channel utilization rate RU in the normal operation (=time t11 to t13).

Therefore, the characteristics channel rate RC relatively increases in the normal operation (for example, RC=50%). Thereby, the current path is relatively increased, and it becomes possible to reduce the area resistivity Ron·A (ON resistance). On the other hand, the characteristics channel rate RC relatively reduces in the active clamp operation (for example, RC=25%). Thereby, it is possible to suppress a sharp temperature rise due to the counter electromotive force of the inductive load L and therefore it is possible to improve the active clamp capability Eac.

Thus, it becomes possible to provide a semiconductor device 1 which can realize an excellent area resistivity Ron·A and an excellent active clamp capability Eac at the same time independently of the trade-off relationship shown in FIG. 13. Particularly, in the field of IPDs, the active clamp capability Eac is one of the characteristics that are crucial for driving a greater inductive load L.

With FIG. 51 to FIG. 54, a description has been given of an example in which first Half-ON control is applied in the active clamp operation. However, second Half-ON control may be applied in the active clamp operation. In that case, it suffices to replace the first MISFET 56 and the second MISFET 57 with each other for understanding.

Figure 55:
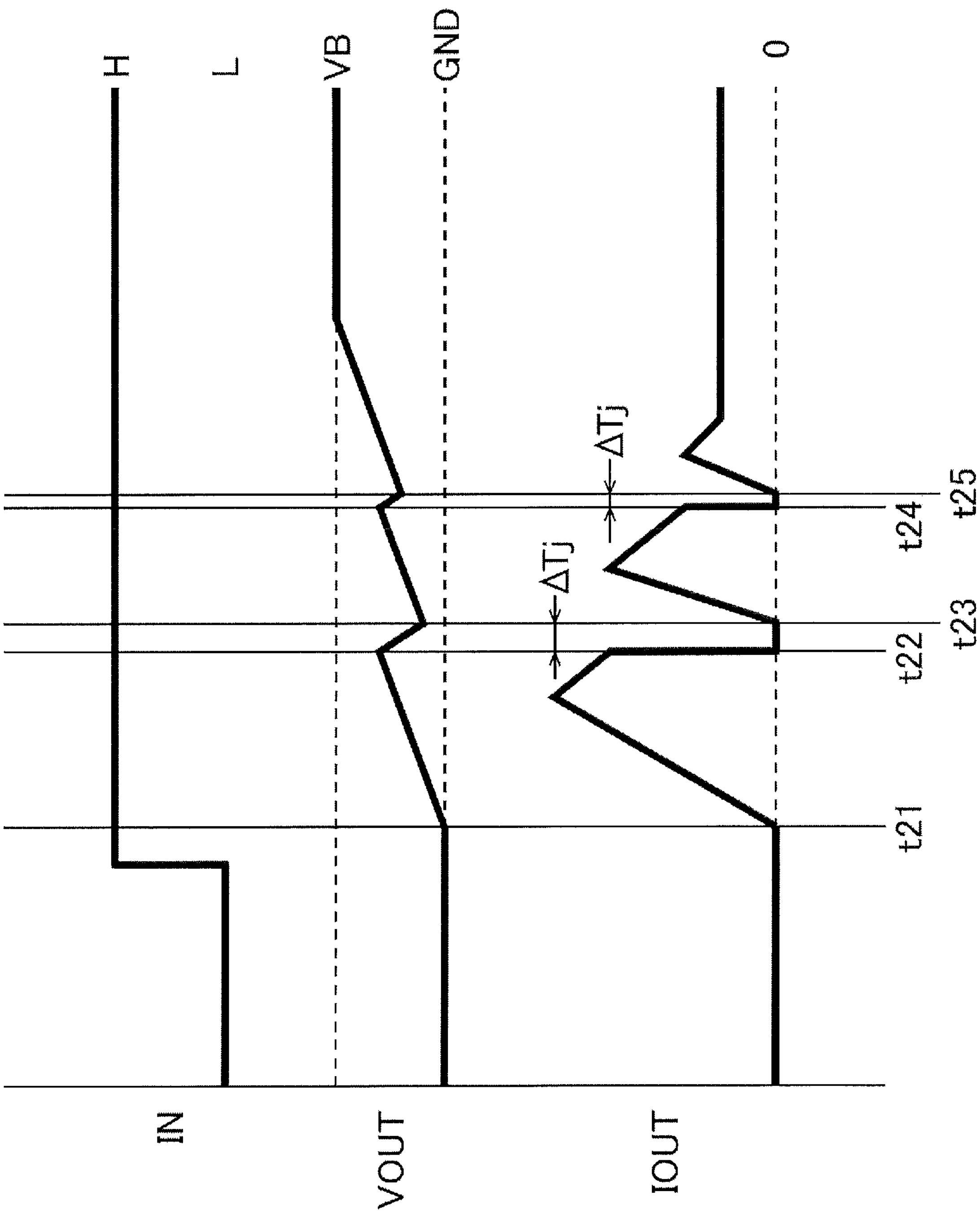
FIG. 55 is a chart which shows a starting behavior when a capacitive load is connected.

Hereinafter, a case in which a capacitive load is connected will be discussed. FIG. 55 is a chart which shows a starting behavior when a capacitive load is connected, for which in order from the top, an external control signal IN, an output voltage VOUT, and an output current IOUT are plotted.

When the capacitive load is connected to the source electrode 12 (output electrode OUT) of the semiconductor device 1, a rush current flows at the time of starting the semiconductor device 1 (=in ON-transition of the power MISFET 9) (refer to time t21 to t22 and time t23 to t24). Therefore, the power MISFET 9 instantaneously generates heat.

The semiconductor device 1 has the foregoing overcurrent protection circuit 36. The overcurrent protection circuit 36 forcibly turns off the power MISFET 9 when a temperature Tj of the power MISFET 9 has reached a predetermined upper limit value or when a temperature difference ΔTj of the power MISFET 9 from another circuit block (such as a logic circuit which hardly generates heat) has reached a predetermined upper limit value.

In particular, at the time of starting the semiconductor device 1, due to the instantaneous heat generation of the power MISFET 9 caused by the rush current described above, the latter overheat protection (ΔTj protection) is easily applied. Therefore, there is a possibility that the power MISFET 9 may be forcibly turned off in the middle of the starting to prolong the starting time of the semiconductor device 1 (refer to time t22 to t23 and time t24 to t25).

Figure 56:
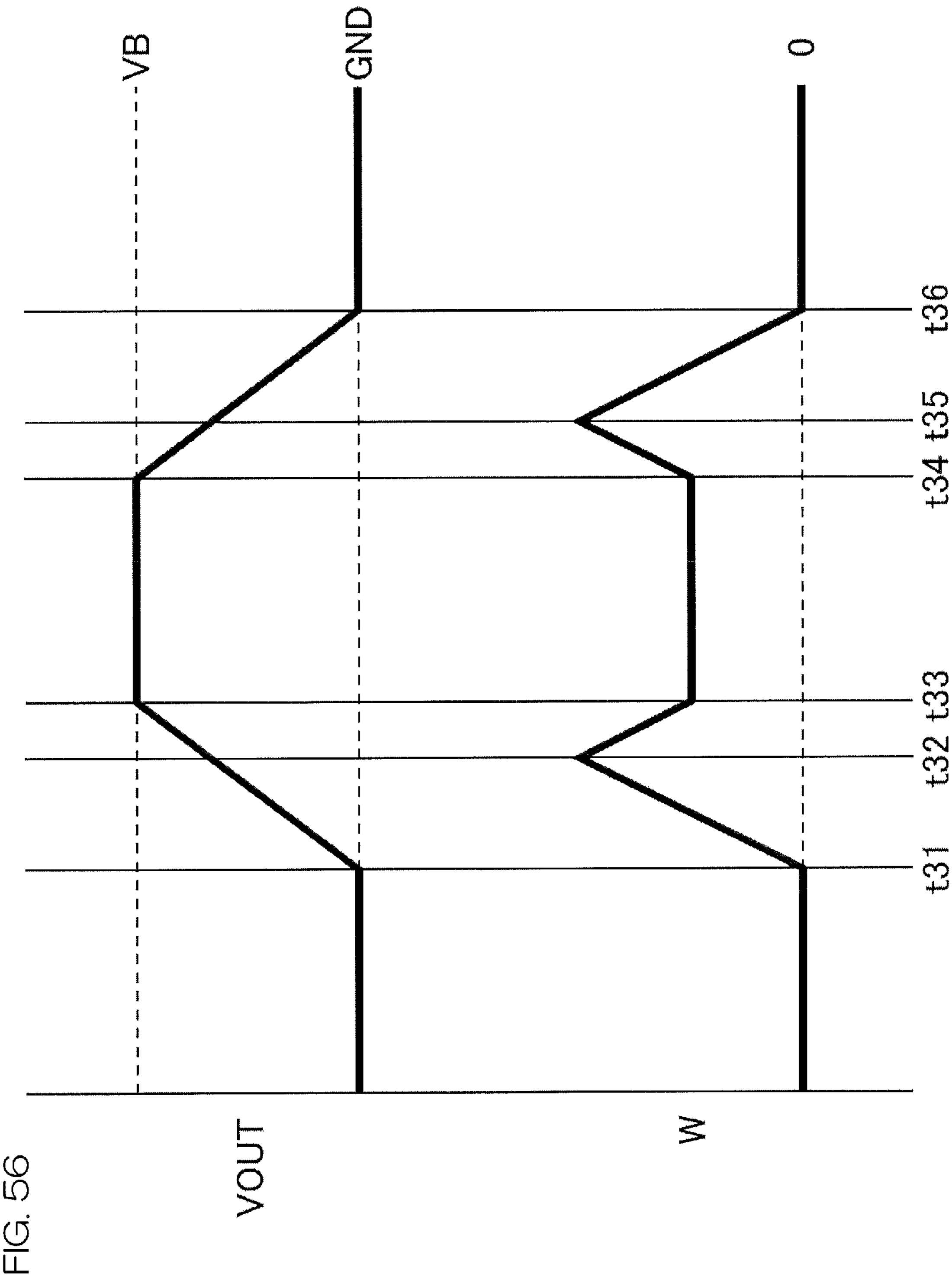
FIG. 56 is a chart which shows a power consumption when a capacitive load is connected.

FIG. 56 is a chart which shows a power consumption when a capacitive load is connected, for which in order from the top, an output voltage VOUT and a power consumption W are plotted.

The power consumption W of the power MISFET 9 is expressed by IOUT×RON$^2$ (wherein, RON is an ON resistance of the power MISFET 9). Therefore, in a period for which the ON resistance RON of the power MISFET 9 becomes higher than that in a full-on state (=rising period (time t31 to t33) of the output voltage VOUT and a falling period (time t34 to t36) of the output voltage VOUT), the power consumption W of the power MISFET 9 (and consequently, a heat generation amount of the power MISFET 9) is large, so that the aforementioned overheat protection (in particular, ΔTj protection) is easily applied.

In view of the discussion described above, new preferred embodiments will be hereinafter proposed, in which the starting time of the semiconductor device 1 can be reduced by suppressing heat generation (in particular, heat generation in ON-transition) of the power MISFET 9.

Figure 57:
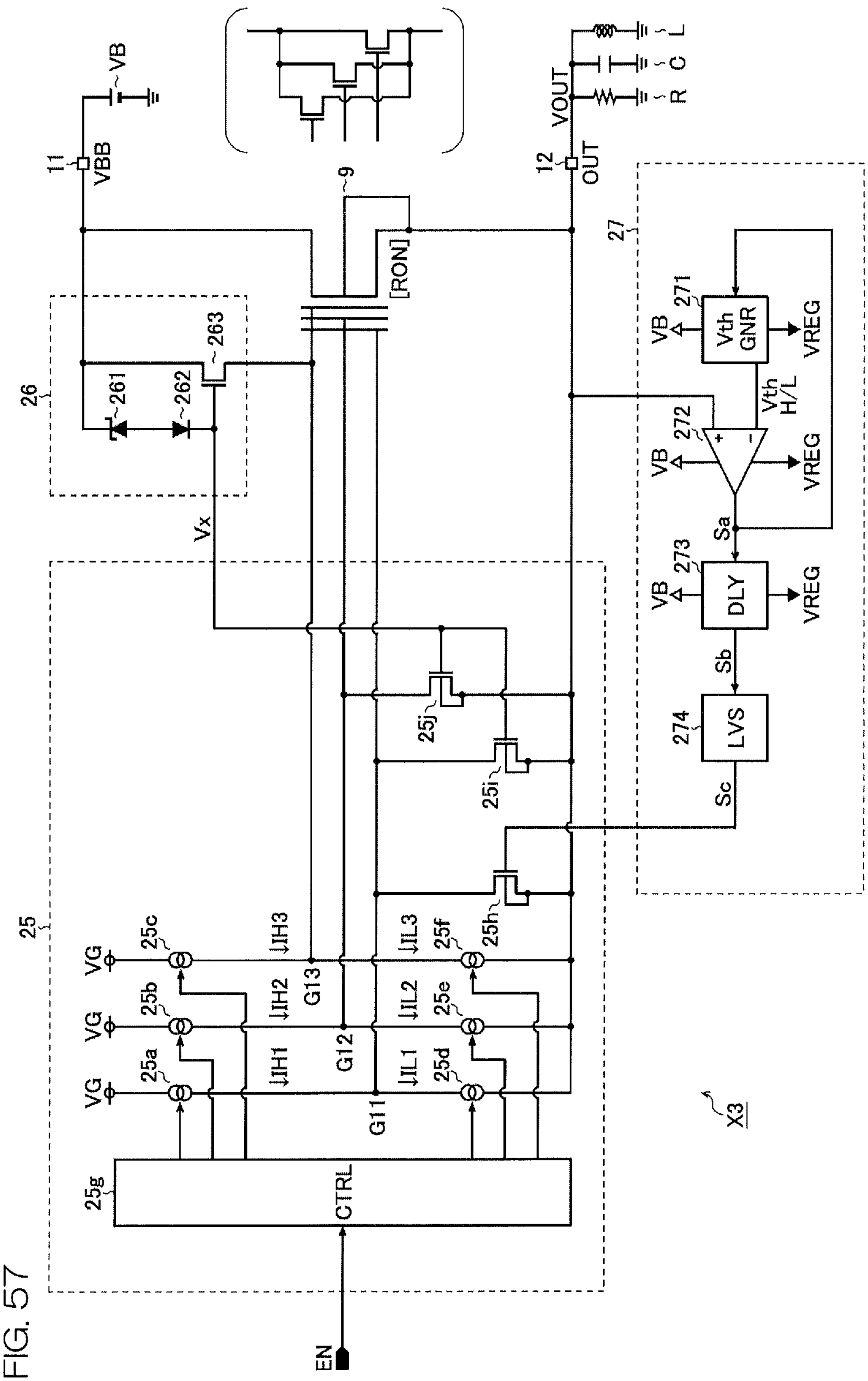
FIG. 57 is a diagram which shows a semiconductor device according to a twelfth preferred embodiment of the present invention (=an electrical structure for performing 3-mode control).

FIG. 57 is a diagram which shows a twelfth preferred embodiment of a semiconductor device (=an electrical structure for performing 3-mode control). The semiconductor device X3 according to the present preferred embodiment has the drain electrode 11 (=power supply electrode VBB), the source electrode 12 (=output electrode OUT), the power MISFET 9, the gate control circuit 25, the active clamp circuit 26, and the output voltage monitoring circuit 27.

As shown in this figure, any of the resistive load R, the capacitive load C, and the inductive load L may be connected to the source electrode 12.

Components already mentioned are provided with the same symbols as before. Further, in these figures, only part of the components are illustrated by extraction for the sake of simplification of description, however, it may be understood that the semiconductor device X3 basically includes the same components as those of the foregoing semiconductor device 1 (refer to FIG. 2).

The power MISFET 9 is a gate divided transistor the structure of which has been described in detail by giving various types of preferred embodiments as examples so far. However, the number of gates of the power MISFET 9 that has conventionally been 2 is increased to 3 (G11 to G13) in order to realize a 3-mode control to be described later. That is, the power MISFET 9 has a first gate to which a gate signal G11 is input, a second gate to which a gate signal G12 is input, and a third gate to which a gate signal G13 is input. Moreover, the ON resistance RON of the power MISFET 9 is changed in three ways by individual control of the plurality of gate signals G11 to G13.

As shown within the brackets in this figure, the power MISFET 9 can be equivalently represented as three MISFETs that are in parallel connection. From another point of view, it can also be understood that the three MISFETs which are respectively controlled in an independent manner are formed integrally as the power MISFET 9 that is a single gate divided device.

The gate control circuit 25 performs a gate control of the power MISFET 9 (=drive and control of each of the gate signals G11 to G13). Basically, the gate control circuit 25 makes all of the gate signals G11 to G13 high levels when the enable signal EN is high level, while making all of the gate signals G11 to G13 low levels when the enable signal EN is low level.

Further, the gate control circuit 25 accepts an internal node voltage Vx of the active clamp circuit 26 and monitoring results (=drive signal Sc) of the output voltage monitoring circuit 27, and also has a function of controlling each of the gate signals G11 to G13 individually such as to switch the ON resistance RON of the power MISFET 9 in an ON-transition and in an OFF-transition of the power MISFET 9. An internal construction and operation of the gate control circuit 25 will be described later in detail.

The active clamp circuit 26 is connected between a third gate (=application terminal of the gate signal G13) and the drain of the power MISFET 9, and limits the drain-source voltage (=VB−VOUT) of the power MISFET 9 to be equal to or less than the predetermined clamp voltage Vclp by (not fully turning off) forcibly turning on the power MISFET 9 when the output voltage VOUT of the source electrode 12 has reached a negative voltage. Since neither a first gate nor a second gate of the power MISFET 9 contributes to the active clamp operation, no active clamp circuit 26 is connected. An internal construction of the active clamp circuit 26 is as in the foregoing and therefore overlapping description thereof shall be omitted.

The output voltage monitoring circuit 27 is a circuit block which monitors the output voltage VOUT and outputs the monitoring results (voltage signal Sc) to the gate control circuit 25, and includes a threshold voltage generating portion 271, a comparator 272, a delay portion 273, a level shifter 274.

The threshold voltage generating portion 271 generates a threshold voltage Vth (VthH/VthL) having hysteresis between the power supply voltage VB and a constant voltage VREG (for example, VREG=VB−5 V). More specifically, the threshold voltage generating portion 271 makes Vth=VthH (for example, VthH=VB−100 mV) when a comparison signal Sa to be described later is low level, and makes Vth=VthL (for example, VthL=VB−200 mV) when the comparison signal Sa is high level.

The comparator 272 generates the comparison signal Sa by comparing the output voltage VOUT input to a non-inverted input terminal (+) and the threshold voltage Vth input to an inverted input terminal (−). The comparison signal Sa becomes low level (≈VREG) when VOUT<Vth, and becomes high level (≈VB) when VOUT>Vth.

The delay portion 273 generates a delay signal Sb by giving a predetermined delay to a rising edge of the comparison signal Sa. More specifically, the delay portion 273 raises the delay signal Sb to high level (≈VREG) after a lapse of a predetermined delay time Td following the comparison signal Sa having risen to high level, and on the other hand, makes the delay signal Sb to low level VREG) without delay when the comparison signal Sa has fallen to low level. Preferably, the delay time Td is set to be equal to or more than a necessary time until the output voltage VOUT reaches the power supply voltage VB after exceeding the threshold voltage VthH. Further, the delay time Td may be provided as a variable value that can be arbitrarily adjusted.

The level shifter 274 level-shifts the delay signal Vb to generate the drive signal Sc. The drive signal Sc becomes high level (≥VOUT+Vgs, wherein Vgs is an ON threshold voltage of a MISFET 25h that follows) when the delay signal Vb is high level, and becomes low level (≈VOUT) when the delay signal Vb is low level.

Next, a specific description will be given of a construction of the gate control circuit 25. The gate control circuit 25 of the present construction example includes current sources 25a to 25f, a controller 25g, and N-channel type MISFETs 25h to 25j.

The current source 25a is connected between an application terminal of the boost voltage VG (=charge pump output) and the first gate of the power MISFET 9 (=application terminal of the gate signal G11), and generates a source current IH1.

The current source 25b is connected between an application terminal of the boost voltage VG and the second gate of the power MISFET 9 (=application terminal of the gate signal G12), and generates a source current IH2.

The current source 25c is connected between an application terminal of the boost voltage VG and the third gate of the power MISFET 9 (=application terminal of the gate signal G13), and generates a source current IH3.

The current source 25d is connected between the first gate of the power MISFET 9 and an application terminal of the output voltage VOUT (=source electrode 12), and generates a sink current IL1.

The current source 25e is connected between the second gate of the power MISFET 9 and the application terminal of the output voltage VOUT, and generates a sink current IL2.

The current source 25f is connected between the third gate of the power MISFET 9 and the application terminal of the output voltage VOUT, and generates a sink current IL3.

The controller 25g turns on the current sources 25a, 25b, and 25c and turns off the current sources 25d, 25e, and 25f when the enable signal EN is high level. By the above-described current control, to the first gate, the second gate, and the third gate of the power MISFET 9, the source currents 1H1, 1H2, and IH3 are allowed to flow in, respectively. As a result, the gate signals G11, G12, and G13 are each raised to high levels.

On the other hand, the controller 25g turns off the current sources 25a, 25b, and 25c and turns on the current sources 25d, 25e, and 25f when the enable signal EN is low level. By the above-described current control, from the first gate, the second gate, and the third gate of the power MISFET 9, the sink currents 1L1, 1L2, and IL3 are drawn off, respectively. As a result, the gate signals G11, G12, and G13 are each made to fall to low level.

The MISFET 25h (=which corresponds to a first switch) is connected between the first gate and a source of the power MISFET 9, and is turned on/off according to the drive signal Sc (=monitoring results of the output voltage monitoring circuit 27) which is input to the gate.

The MISFET 25i (=which corresponds to a second switch) is connected between the first gate and the source of the power MISFET 9, and is turned on/off according to the internal node voltage Vx of the active clamp circuit 26 which is input to the gate.

The MISFET 25j (=which corresponds to a third switch) is connected between the second gate and the source of the power MISFET 9, and is turned on/off according to the internal node voltage Vx of the active clamp circuit 26 which is input to the gate.

As the internal node voltage Vx, for example, as shown in this figure, it is desirable to input a gate voltage of the MISFET 263. However, the internal node voltage Vx is not restricted to this example, and for example, it is also possible to use an anode voltage of any of the n-stage of diodes that form the diode array 262 as the internal node voltage Vx.

Figure 58:
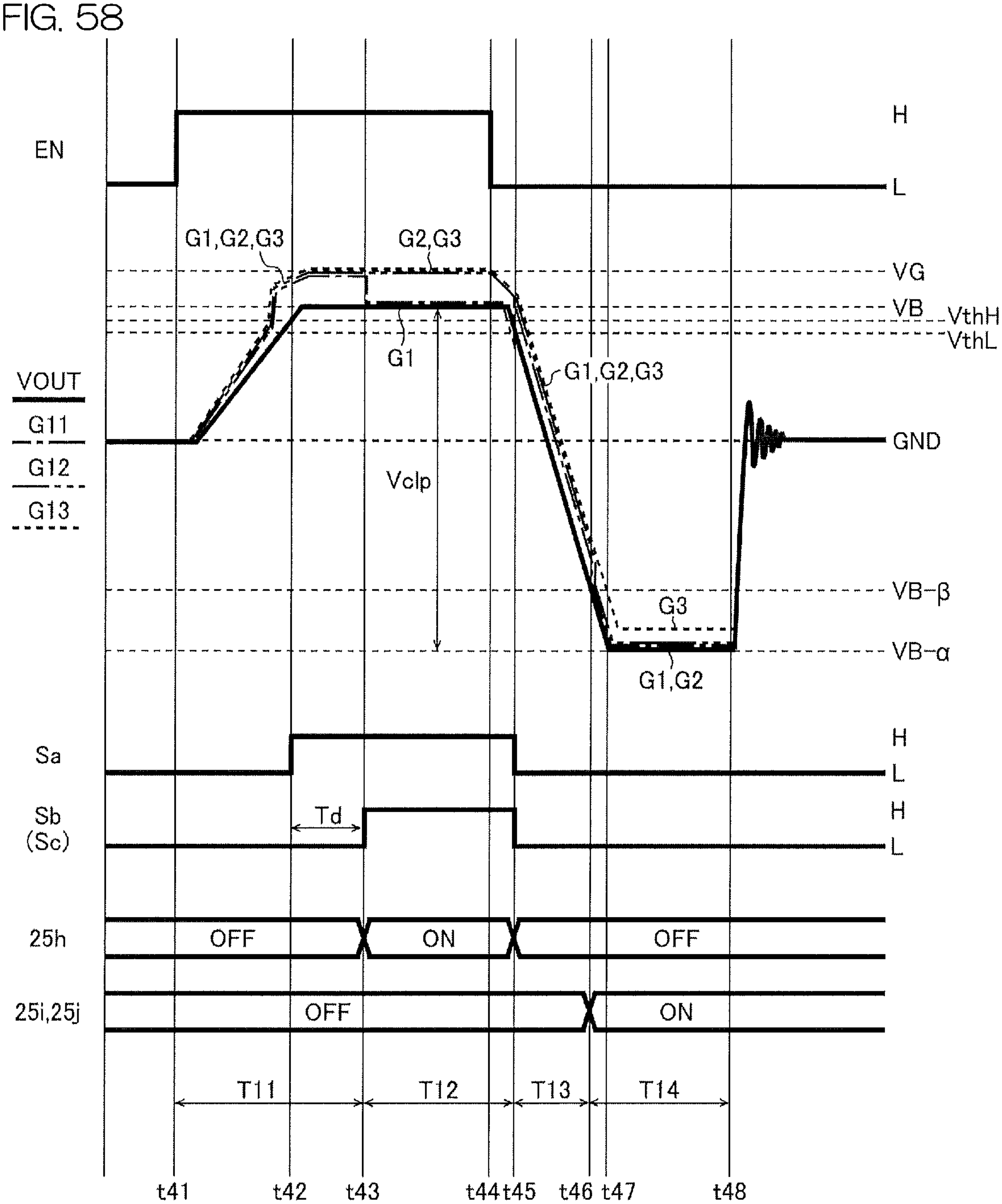
FIG. 58 is a chart which shows an example of the 3-mode control.

FIG. 58 is a chart which shows an example of the 3-mode control, for which in order from the top, an enable signal VOUT, an output voltage VOUT (solid line), a gate signal G11 (alternate long and short dashed line), a gate signal G12 (alternate long and two short dashed line), a gate signal (broken line), a comparison signal Sa, delay signals (and consequently, drive signal Sc), an ON/OFF state of the MISFET 25*h*, and an ON/OFF state of each of the MISFETs 25*i* and 25*j* are plotted. In this figure, it is assumed that at least the inductive load L (for example, an inductance component of a harness) is connected to the source electrode 12.

When the enable signal EN is raised to high level at time t41, charging of the gate signals G11, G12, and G13 is started, so that the output voltage VOUT starts to rise. However, at this point in time, since VOUT<VthH, Sa=L, and consequently, Sb (=Sc)=L. Therefore, the MISFET 25*h* is off. Further, the MISFETs 25*i* and 25*j* are also off. As a result, an open state is made between each of the first and second gates and the source of the power MISFET 9. At this time, the characteristics channel rate RC of the power MISFET 9 becomes a maximum value (for example, 75%).

When VOUT>VthH is reached at time t42, the comparison signal Sa rises to high level. However, since the delay signal Sb (and consequently, the drive signal Sc) is kept at low level until the delay time Td elapses, the MISFET 25*h* remains off. Further, the MISFETs 25*i* and 25*j* also remain off. Accordingly, the characteristics channel rate RC of the power MISFET 9 is kept at the maximum value (for example, 75%).

When the delay time Td has elapsed from the rising point in time of the comparison signal Sa, at time t43, the delay signal Sb (and consequently, the drive signal Sc) rises to high level. Accordingly, the MISFET 25*h* is turned on, so that a short-circuited state (G11=VOUT) is made between the first gate and the source of the power MISFET 9. As a result, the characteristics channel rate RC of the power MISFET 9 is reduced from the maximum value to a steady-state value (for example, RC=50%).

Then, when the enable signal EN is made to fall to low level at time t44, since discharging of the gate signals G11, G12, and G13 is started, the output voltage VOUT starts to be reduced from the power supply voltage VB.

When VOUT<VthL is reached at time t45, the comparison signal Sa falls to low level, and the delay signal Sb (and consequently, the drive signal Sc) also falls to low level without delay. Accordingly, the MISFET 25*h* is turned off, so that an open state is again made between the first gate and the source of the power MISFET. As a result, the characteristics channel rate of the power MISFET 9 is increased from the steady-state value to the maximum value (for example, RC=75%).

Even when the power MISFET 9 is turned off, the inductive load L continues to allow the output current IOUT flow until it has released energy accumulated during the ON period of the power MISFET 9. As a result, the output voltage VOUT is sharply reduced to a negative voltage lower than the ground voltage GND.

However, when the output voltage VOUT is reduced to the lower limit voltage VB−α (for example, VB−50V) at time t47, the power MISFET 9 is (not fully turned off) turned on by the operation of the active clamp circuit 26, so that the output current IOUT is discharged through the power MISFET 9. Therefore, the output voltage VOUT is limited to be equal to or more than the lower limit voltage VB−α.

That is, the active clamp circuit 26 limits the drain-source voltage Vds (=VB−VOUT) of the power MISFET 9 to be equal to or less than the predetermined clamp voltage Vclp (=α) by limiting the output voltage VOUT based on a reference of the power supply voltage VB. The above-described active clamp operation is continued until time t48 at which the energy accumulated in the inductive load L has been completely released and the output current IOUT no longer flows.

On the other hand, in terms of the gate signals G11 and G12, after transition from the enable state (EN=H) to the disable state (EN=L), when the output voltage VOUT is reduced to the channel switching voltage VB−β (>VB−α) at time t46, the internal node voltage Vx becomes higher than an ON threshold voltage of each of the MISFETs 25*i* and 25*j*. Accordingly, the MISFETs 25*i* and 25*j* are both turned on, so that a short-circuited state is made between each of the first and second gates and the source of the power MISFET 9 (G11=G12=VOUT). As a result, the characteristics channel rate of the power MISFET 9 is reduced from the steady-state value to a minimum value (for example, RC=25%).

The series of operations described above will be summarized as follows. First, in a first period T11 (=time t41 to t43) which is immediately after the On transition of the power MISFET 9, the MISFETs 25*h* to 25*j* of the gate control circuit 25 are turned off, and therefore, the characteristics channel rate of the power MISFET 9 is set to the maximum value (for example, RC=75%).

That is, at the time of starting the semiconductor device X3, the ON resistance RON of the power MISFET 9 is brought into a state in which it has been reduced to be lower than a steady-state value. Therefore, even in the situation where an excessively large rush current may possibly flow at the time of starting (when a capacitive load is connected), the power consumption W (refer to time t31 to t33 of FIG. 56) of the power MISFET 9 can be suppressed, so that overcurrent protection (in particular, ΔTj protection) becomes unlikely to be applied. As a result, it becomes possible to reduce the starting time of the semiconductor device X3.

Next, in a second period T12 (=time t43 to t45) which is after the completion of the ON transition of the power MISFET 9, the MISFET 25*h* of the gate control circuit 25 is turned on, and therefore, the characteristics channel rate RC of the power MISFET 9 is set to the steady-state value (for example, RC=50%).

That is, after the starting of the semiconductor device X3 is completed, the ON resistance RON of the power MISFET 9 is brought into a state in which it has been returned to the steady-state value. For example, when there is a large difference between the rush current (for example, a few tens of A) immediately after the starting and a steady-state current (a few A) after the completion of the starting, it is desirable to have the ON resistance RON of the power MISFET 9 that is returned to the steady-state value without keeping it reduced, by prioritizing overcurrent protection over a reduction in the power consumption W.

Next, in a third period T13 (=time t45 to t46) which is after the OFF transition of the power MISFET 9, the MISFET 25*h* of the gate control circuit 25 is again turned off, and therefore, the characteristics channel rate of the power MISFET 9 is set to the maximum value (for example, RC=75%).

That is, at the time of stopping the semiconductor device X3, in the same manner as the time of starting the semiconductor device X3, the ON resistance RON of the power MISFET 9 is brought into a state in which it has been reduced to be lower than the steady-state value. Therefore, the power consumption W (refer to time t34 to t36 of FIG. 56) of the power MISFET 9 can be suppressed, so that it becomes possible to increase safety of the semiconductor device X3.

Next, in a fourth period T14 (=time t46 to t48) which is in the active clamp operation, the MISFETs 25*i* and 25*j* of the gate control circuit 25 are both turned on, and therefore, the characteristics channel rate of the power MISFET 9 is set to the minimum value (for example, RC=25%).

That is, in the active clamp operation of the semiconductor device X3, the ON resistance RON of the power MISFET 9 is brought into a state in which it has been increased to be higher than the steady-state value. Accordingly, it is possible to suppress a sharp temperature rise due to the counter electromotive force of the capacitive load L and therefore it becomes possible to improve the active clamp capability Eac.

It is possible to apply the 3-mode control (for example, RC=25%, 50%, and 75%) described in the above not only to a high-side switch IC but also to a low-side switch IC.

Figure 59:
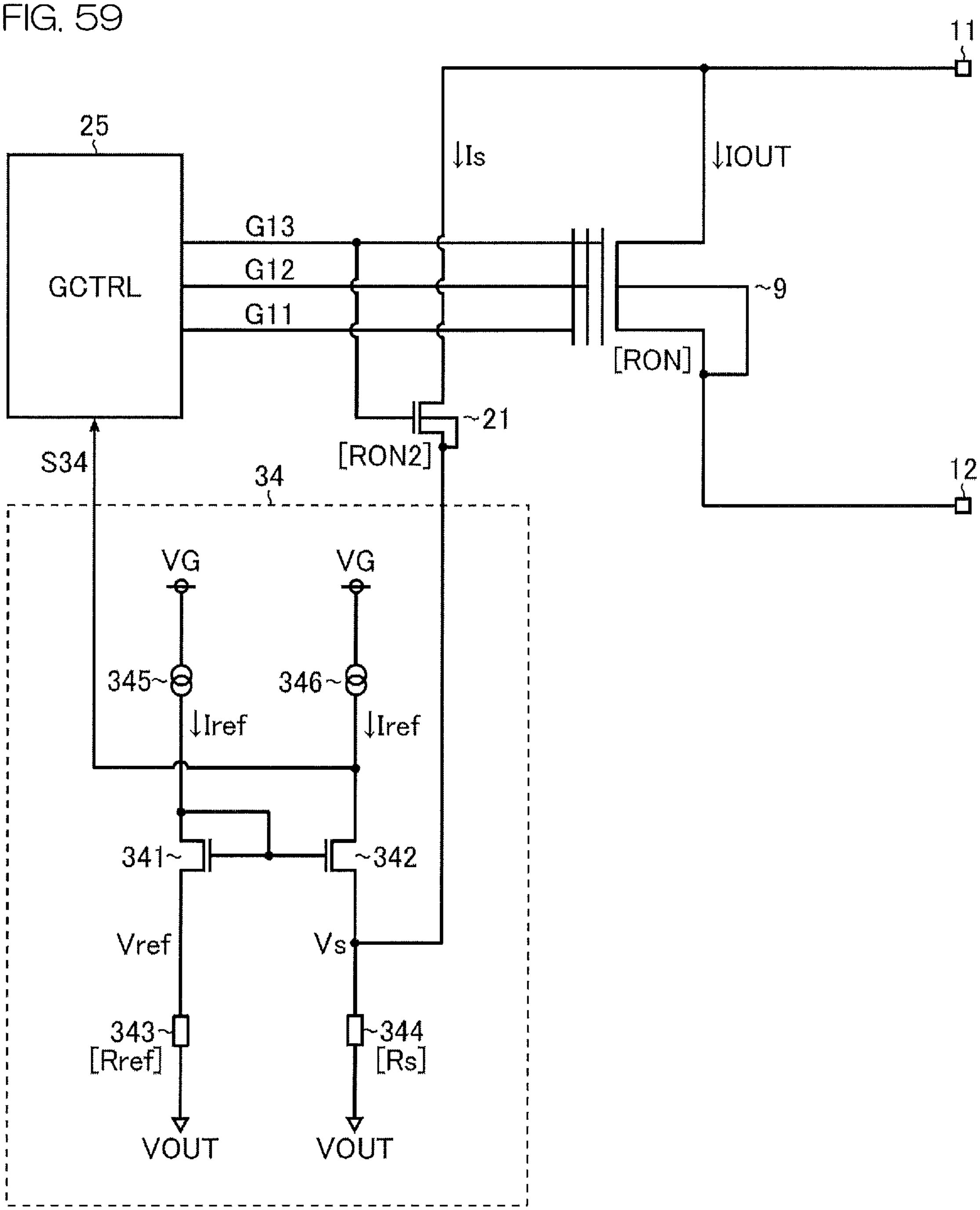
FIG. 59 is a diagram which shows a construction example of an overcurrent protection circuit.

FIG. 59 is a diagram which shows a construction example of the overcurrent protection circuit 34. The overcurrent protection circuit 34 of the present construction example is a circuit block which detects the output current IOUT that flows to the power MISFET 9 and generates an overcurrent protection signal S34 so as to limit the output current IOUT to be less than a predetermined upper limit value Iocp, and includes N-channel type MISFETs 341 and 342, resistors 343 and 344, and current sources 345 and 346.

First terminals of each of the current sources 345 and 346 are both connected to application terminals of the boost voltage VG. A second terminal of the current source 345 is connected to a drain of the MISFET 341. A second terminal of the current source 346 is connected to a drain of the MISFET 342. The drain of the MISFET 342 is also connected to the gate control circuit 25 as an output terminal of the overcurrent protection signal S34. Gates of each of the MISFETs 341 and 342 are both connected to the drain of the MISFET 341.

A source of the MISFET 341 is connected to a first terminal of the resistor 343 (a resistance value: Rref). A source of the MISFET 342 is connected to a first terminal of the resistor 344 (a resistance value: Rs) together with a source (=output terminal of a sense current Is according to the output current IOUT (wherein Is:IOUT=1:α)) of a sensor MISFET 21. A drain of the sensor MISFET 21 is connected to the drain electrode 11. A gate of the sensor MISFET 21 is preferably connected to the third gate (=full-time drive gate to which the MISFETs 25*h* to 25*j* are not connected) of the power MISFET 9. Second terminals of each of the resistors 343 and 344 are connected to application terminals of the output voltage VOUT.

In the overcurrent protection circuit 34 consisting of the construction described above, at the source of the MISFET 341, a reference voltage Vref (=Iref×Rref+VOUT) is generated. On the other hand, at the source of the MISFET 342, a sense voltage Vs (=(Iref+Is)×Rs+VOUT) is generated. Accordingly, the overcurrent protection signal S34 becomes a low level (=logic level when an abnormality has not been detected) when the sense voltage Vs is lower than the reference voltage Vref, and becomes a high level (=logic level when an abnormality was detected) when the sense voltage Vs is higher than the reference voltage Vref.

Here, where the ON resistance RON of the power MISFET 9 is a variable value, and an ON resistance RON2 of the sensor MISFET 21 is a fixed value, a current ratio α (>0) between the sense current Is and the output current IOUT changes according to switching control of the ON resistance RON. As a result, the upper limit value Iocp of the output current IOUT is automatically switched over according to the ON resistance RON.

For example, at the time of starting the semiconductor device X3 and where the ON resistance RON has been reduced to be lower than the steady-state value, since the current ratio α between the sense current Is and the output current IOUT becomes large, the upper limit value Iocp of the output current IOUT becomes high. Therefore, overcurrent protection becomes difficult to be applied to a transient rush current, so that it is possible to smoothly start the semiconductor device X3.

On the other hand, after the completion of the starting of the semiconductor device X3 and where the ON resistance RON has been returned to the steady-state value, since the current ratio α described above becomes small, the upper limit value Iocp of the output current IOUT becomes low. Therefore, it becomes possible to increase security of the semiconductor device X3 in the steady state.

Examples of the features extracted from the description and drawings are shown hereinafter.

[A1] A semiconductor device comprising: a semiconductor layer; an insulation gate-type first transistor which is formed in the semiconductor layer; an insulation gate-type second transistor which is formed in the semiconductor layer; and a control wiring which is formed on the semiconductor layer such as to be electrically connected to the first transistor and the second transistor, and transmits control signals that control the first transistor and the second transistor to be in ON states in (during) a normal operation and that control the first transistor to be in an OFF state and the second transistor to be in an ON state in (during) an active clamp operation.

According to the semiconductor device, in the normal operation, a current is allowed to flow by using the first transistor and the second transistor. Thereby, it is possible to reduce an ON resistance. On the other hand, in the active clamp operation, a current is allowed to flow by using the second transistor in a state where the first transistor is stopped. Thereby, it is possible to consume (absorb) a counter electromotive force by the second transistor while suppressing a sharp temperature rise due to the counter electromotive force. As a result, it is possible to improve an active clamp capability. Therefore, it is possible to realize an excellent ON resistance and an excellent active clamp capability at the same time.

[A2] The semiconductor device according to A1, wherein the control wiring includes a first control wiring which is electrically connected to the first transistor and a second control wiring which is electrically connected to the second transistor in a state of being electrically insulated from the first transistor.

[A3] A semiconductor device comprising: a semiconductor layer; an insulation gate-type first transistor which is formed in the semiconductor layer; an insulation gate-type second transistor which is formed in the semiconductor layer; and a control circuit which is formed in the semiconductor layer such as to be electrically connected to the first transistor and the second transistor, controls the first transistor and the second transistor to be in ON states in (during) a normal operation, and controls the first transistor to be in an OFF state and the second transistor to be in an ON state in (during) an active clamp operation.

According to the semiconductor device, in the normal operation, a current is allowed to flow by using the first transistor and the second transistor. Thereby, it is possible to reduce an ON resistance. On the other hand, in the active clamp operation, in a state where the first transistor is stopped, a current is allowed to flow by using the second transistor. Thereby, it is possible to consume (absorb) a counter electromotive force by the second transistor while suppressing a sharp temperature rise due to the counter electromotive force. As a result, it is possible to improve an active clamp capability. Therefore, it is possible to realize an excellent ON resistance and an excellent active clamp capability at the same time.

[A4] A semiconductor device comprising: a semiconductor layer; an insulation gate-type first transistor which includes a first channel and is formed in the semiconductor layer; an insulation gate-type second transistor which includes a second channel and is formed in the semiconductor layer; and a control wiring which is formed on the semiconductor layer such as to be electrically connected to the first transistor and the second transistor, and transmits control signals that control the first transistor and the second transistor such that utilization rates of the first channel and the second channel in an active clamp operation becomes in excess of zero and less than utilization rates of the first channel and the second channel in a normal operation.

According to the semiconductor device, in the normal operation, the utilization rates of the first channel and the second channel are relatively increased. Thereby, a current path is relatively increased, and it becomes possible to reduce an ON resistance. On the other hand, in the active clamp operation, the utilization rates of the first channel and the second channel are relatively reduced. Thereby, it is possible to suppress a sharp temperature rise due to the counter electromotive force and therefore it is possible to improve an active clamp capability. Therefore, it is possible to realize an excellent ON resistance and an excellent active clamp capability at the same time.

[A5] The semiconductor device according to A4, wherein the control wiring includes a first control wiring which is electrically connected to the first transistor and a second control wiring which is electrically connected to the second transistor in a state of being electrically insulated from the first transistor.

[A6] A semiconductor device comprising: a semiconductor layer; an insulation gate-type first transistor which includes a first channel and is formed in the semiconductor layer; an insulation gate-type second transistor which includes a second channel and is formed in the semiconductor layer; and a control circuit which is formed in the semiconductor layer such as to be electrically connected to the first transistor and the second transistor, and controls the first transistor and the second transistor such that utilization rates of the first channel and the second channel in an active clamp operation becomes in excess of zero and less than utilization rates of the first channel and the second channel in a normal operation.

According to the semiconductor device, in the normal operation, the utilization rates of the first channel and the second channel are relatively increased. Thereby, a current path is relatively increased, and it becomes possible to reduce an ON resistance. On the other hand, in the active clamp operation, the utilization rates of the first channel and the second channel are relatively reduced. Thereby, it is possible to suppress a sharp temperature rise due to the counter electromotive force and therefore it is possible to improve an active clamp capability. Therefore, it is possible to realize an excellent ON resistance and an excellent active clamp capability at the same time.

[A7] The semiconductor device according to any one of A4 to A6, wherein the first channel is formed at a first rate in plan view and the second channel is formed at a second rate different from the first rate in plan view.

[A8] The semiconductor device according to A7, wherein the second channel is formed at a second rate less than the first rate.

[A9] The semiconductor device according to any one of A1 to A8, wherein the first transistor includes a first gate structure which has a first insulation layer in contact with the semiconductor layer and a first electrode facing the semiconductor layer across the first insulation layer, and the second transistor includes a second gate structure which has a second insulation layer in contact with the semiconductor layer and a second electrode facing the semiconductor layer across the second insulation layer.

[A10] The semiconductor device according to A9, wherein the first transistor includes the plurality of first gate structures and the second transistor includes the plurality of second gate structures.

[A11] The semiconductor device according to A10, wherein the plurality of second gate structures are alternately arrayed with the plurality of first gate structures in a manner that one or the plurality of first gate structures are held therebetween.

[A12] The semiconductor device according to A10 or A11, wherein the plurality of first gate structures are formed at an interval along a first direction, and each extend in a band shape along a second direction which intersects the first direction, and the plurality of second gate structures are formed at an interval along the first direction, and each extend in a band shape along the second direction.

[A13] The semiconductor device according to any one of A9 to A12, wherein the semiconductor layer includes a main surface, the first gate structure has a first trench gate structure which includes a first trench formed in the main surface, the first insulation layer along an inner wall of the first trench, and the first electrode embedded in the first trench across the first insulation layer, and the second gate structure has a second trench gate structure which includes a second trench formed in the main surface, the second insulation layer along an inner wall of the second trench, and the second electrode embedded in the second trench across the second insulation layer.

[A14] The semiconductor device according to A13, wherein the first electrode has an insulated separation-type electrode structure which includes a first bottom-side electrode embedded in a bottom wall side of the first trench across the first insulation layer, a first opening-side electrode embedded in an opening side of the first trench across the first insulation layer, and a first intermediate insulation layer interposed between the first bottom-side electrode and the first opening-side electrode, and the second electrode has an insulated separation-type electrode structure which includes a second bottom-side electrode embedded in a bottom wall side of the second trench across the second insulation layer, a second opening-side electrode embedded in an opening side of the second trench across the second insulation layer, and a second intermediate insulation layer interposed between the second bottom-side electrode and the second opening-side electrode.

[A15] The semiconductor device according to A14, wherein the second opening-side electrode is electrically insulated from the first opening-side electrode.

[A16] The semiconductor device according to A14 or A15, wherein the second bottom-side electrode is electrically connected to the first bottom-side electrode.

[A17] The semiconductor device according to A14 or A15, wherein the second bottom-side electrode is electrically insulated from the first bottom-side electrode.

[A18] The semiconductor device according to A13, wherein the first electrode is embedded in the first trench as an integrated member and the second electrode is embedded in the second trench as an integrated member.

[A19] A circuit module comprising: a mounting substrate; and the semiconductor device according to any one of A1 to A18 which is mounted in the mounting substrate.

[B1] A semiconductor circuit comprising: a gate divided transistor an ON resistance of which changes by individual control of a plurality of gate signals; and a gate control circuit which controls the plurality of gate signals individually such as to reduce the ON resistance to be lower than a steady-state value in an ON-transition of the gate divided transistor.

[B2] The semiconductor circuit according to B1, further comprising: an active clamp circuit which limits a terminal-to-terminal voltage of the gate divided transistor to be equal to or less than a clamp voltage, wherein the gate control circuit controls the plurality of gate signals individually such as to reduce the ON resistance to be lower than the steady-state value before operation of the active clamp circuit.

[B3] The semiconductor circuit according to B1 or B2, further comprising: an overcurrent protection circuit which limits current that flows to the gate divided transistor.

[B4] The semiconductor circuit according to any one of B1 to B3, further comprising: an overcurrent protection circuit which forcibly turns off the gate divided transistor according to a temperature of the gate divided transistor or a temperature difference between the gate divided transistor and another circuit block.

[B5] An electronic equipment comprising: the semiconductor circuit according to any one of B1 to B4; and a load which is connected to the semiconductor circuit.

[B6] A semiconductor device comprising: a semiconductor layer; and the semiconductor circuit according to any one of B1 to B4 which is formed in the semiconductor layer.

[B7] An electronic equipment comprising: the semiconductor circuit according to B6; and a load which is connected to the semiconductor circuit.

[C1] A semiconductor device comprising: a semiconductor layer; a plurality of insulation gate-type transistors which are formed in the semiconductor layer; and a control circuit which is formed in the semiconductor layer and performs control to turn on/off the plurality of transistors such that an ON resistance in an active clamp operation differs from an ON resistance in a normal operation.

[C2] The semiconductor device according to C1, wherein the control circuit performs control to turn on/off the plurality of transistors such that an ON resistance in an active clamp operation exceeds an ON resistance in a normal operation.

[D1] A semiconductor device comprising: a semiconductor layer; a plurality of insulation gate-type transistors which are formed in the semiconductor layer; and a plurality of control wirings which are formed anywhere above the semiconductor layer such as to be electrically connected to the plurality of transistors, and control each of the plurality of transistors individually.

[D2] The semiconductor device according to D1, wherein the plurality of control wirings transmit control signals that perform control to turn on/off the plurality of transistors such that a number of the transistors in an ON state in an active clamp operation differs from a number of the transistors in an ON state in a normal operation.

[D3] The semiconductor device according to D1 or D2, wherein the plurality of control wirings transmit control signals that perform control to turn on/off the plurality of transistors such that a number of the transistors in an ON state in an active clamp operation becomes less than a number of the transistors in an ON state in a normal operation.

[D4] The semiconductor device according to any one of D1 to D3, wherein the plurality of control wirings transmit control signals that perform control to turn on/off the plurality of transistors such that a channel utilization rate in an active clamp operation differs from a channel utilization rate in a normal operation.

[D5] The semiconductor device according to any one of D1 to D4, wherein the plurality of control wirings transmit control signals that perform control to turn on/off the plurality of transistors such that a number of the transistors in an ON state in an active clamp operation becomes less than a number of the transistors in an ON state in a normal operation.

[E1] A semiconductor device comprising: a semiconductor layer having a main surface; a first trench gate structure which includes a first trench formed in the main surface, a first insulation layer along an inner wall of the first trench, a first bottom-side electrode embedded in a bottom wall side of the first trench across the first insulation layer, a first opening-side electrode embedded in an opening side of the first trench across the first insulation layer, and a first intermediate insulation layer interposed between the first bottom-side electrode and the first opening-side electrode; a second trench gate structure which includes a second trench formed in the main surface, a second insulation layer along an inner wall of the second trench, a second bottom-side electrode embedded in a bottom wall side of the second trench across the second insulation layer, a second opening-side electrode embedded in an opening side of the second trench across the second insulation layer, and a second intermediate insulation layer interposed between the second bottom-side electrode and the second opening-side electrode; a first channel which is formed adjacent to the first trench gate structure in the semiconductor layer, and is controlled by the first trench gate structure; and a second channel which is formed adjacent to the second trench gate structure in the semiconductor layer, and is controlled by the second trench gate structure.

[E2] The semiconductor device according to E1, further comprising: a first control wiring which is electrically connected to the first opening-side electrode on the semiconductor layer; a second control wiring which is electrically connected to the second opening-side electrode on the semiconductor layer; and a third control wiring which is electrically connected to the first bottom-side electrode and the second bottom-side electrode on the semiconductor layer.

[E3] The semiconductor device according to E1, further comprising: a first control wiring which is electrically connected to the first bottom-side electrode and the first opening-side electrode on the semiconductor layer; and a second control wiring which is electrically connected to the second bottom-side electrode and the second opening-side electrode on the semiconductor layer.

[E4] The semiconductor device according to any one of E1 to E3, further comprising: a control circuit which is formed in the semiconductor layer, and controls each of the first trench gate structure and the second trench gate structure individually.

[F1] A semiconductor device comprising: a semiconductor layer; a plurality of insulation gate-type transistors which are formed in the semiconductor layer; and a control circuit which is formed in the semiconductor layer such as to be electrically connected to the plurality of transistors, and controls each of the plurality of transistors individually.

[F2] The semiconductor device according to F1, wherein the control circuit performs control to turn on/off the plurality of transistors such that a number of the transistors in an ON state in an active clamp operation differs from a number of the transistors in an ON state in a normal operation.

[F3] The semiconductor device according to F1 or F2, wherein the control circuit performs control to turn on/off the plurality of transistors such that a number of the transistors in an ON state in an active clamp operation becomes less than a number of the transistors in an ON state in a normal operation.

[F4] The semiconductor device according to any one of F1 to F3, wherein the control circuit performs control to turn on/off of the plurality of transistors such that a channel utilization rate in an active clamp operation differs from a channel utilization rate in a normal operation.

[F5] The semiconductor device according to any one of F1 to F4, wherein the control circuit performs control to turn on/off the plurality of transistors such that a channel utilization rate in an active clamp operation becomes less than a channel utilization rate in a normal operation.

[G1] A semiconductor device comprising: a semiconductor layer having a first main surface on one side and a second main surface on the other side; a drift region of a first conductivity type which is formed in a surface layer portion of the first main surface; a drain region of a first conductivity type which is formed in a region at the second main surface side with respect to the drift region in the semiconductor layer, and has an impurity concentration in excess of an impurity concentration of the drift region; a first trench gate structure which is formed in the first main surface; a second trench gate structure which is formed at an interval from the first trench gate structure; a first channel which is formed in the drift region adjacently to the first trench gate structure, and is controlled by the first trench gate structure; and a second channel which is formed in the drift region adjacently to the second trench gate structure, and is controlled by the second trench gate structure electrically independently of the first channel.

[G2] The semiconductor device according to G1, further comprising: a body region of a second conductivity type which is formed in a surface layer portion of the drift region; a first source region of a first conductivity type which is formed in a surface layer portion of the body region adjacently to the first trench gate structure such as to define the first channel with the drift region, and has an impurity concentration in excess of an impurity concentration of the drift region; and a second source region of a first conductivity type which is formed in the surface layer portion of the body region adjacently to the second trench gate structure such as to define the second channel with the drift region, and has an impurity concentration in excess of an impurity concentration of the drift region.

[G3] The semiconductor device according to G2, further comprising: a first contact region of a second conductivity type which is formed in the surface layer portion of the body region adjacently to the first trench gate structure, and has an impurity concentration in excess of an impurity concentration of the body region; and a second contact region of a second conductivity type which is formed in the surface layer portion of the body region adjacently to the second trench gate structure, and has an impurity concentration in excess of an impurity concentration of the body region.

[G4] The semiconductor device according to any one of G1 to G3, further comprising: an interlayer insulation layer which covers the semiconductor layer on the first main surface; and a plurality of control wirings which are formed on the interlayer insulation layer, penetrate through the interlayer insulation layer, and are electrically connected to the first trench gate structure and the second trench gate structure.

[G5] The semiconductor device according to any one of G1 to G4, wherein the drain region has a thickness in excess of a thickness of the drift region.

[G6] The semiconductor device according to any one of G1 to G5, wherein the first trench gate structure is formed in the first main surface at a first interval from a bottom portion of the drift region to the first main surface side; and the second trench gate structure is formed in the first main surface which is formed at a second interval from the bottom portion of the drift region to the first main surface side.

[G7] The semiconductor device according to G6, wherein the drift region has a thickness of not less than 5 μm and not more than 20 μm, and each of the first interval and the second interval is from not less than 1 μm to not more than 10 μm.

[H1] A semiconductor device comprising: a semiconductor layer; a plurality of insulation gate-type transistors which are formed in the semiconductor layer; a control circuit which is formed in the semiconductor layer such as to be electrically connected to the plurality of transistors, and generates control signals that control each of the plurality of transistors individually; and a plurality of control wirings which are formed anywhere above the semiconductor layer such as to be electrically connected to the plurality of transistors and the control circuit, and transmit the control signals generated by the control circuit to the plurality of transistors, respectively.

[H2] The semiconductor device according to H1, wherein the control circuit generates control signals that perform control to turn on/off the plurality of transistors such that a number of the transistors in an ON state in an active clamp operation differs from a number of the transistors in an ON state in a normal operation.

[H3] The semiconductor device according to H1 or H2, wherein the control circuit generates control signals that perform control to turn on/off the plurality of transistors such that a number of the transistors in an ON state in an active clamp operation becomes less than a number of the transistors in an ON state in a normal operation.

[H4] The semiconductor device according to any one of H1 to H3, wherein the control circuit generates control signals that perform control to turn on/off the plurality of transistors such that a channel utilization rate in an active clamp operation differs from a channel utilization rate in a normal operation.

[H5] The semiconductor device according to any one of H1 to H4, wherein the control circuit generates control signals that perform control to turn on/off the plurality of transistors such that a channel utilization rate in an active clamp operation becomes less than a channel utilization rate in a normal operation.

[I1] A semiconductor device comprising: a semiconductor layer; a first trench gate structure which is formed in the semiconductor layer; a second trench gate structure which is formed in the semiconductor layer at an interval from the first trench gate structure; a cell region which is defined to a region between the first trench gate structure and the second trench gate structure in the semiconductor device; a first channel which is formed in the cell region adjacently to the first trench gate structure, and is controlled by the first trench gate structure; and a second channel which is formed in the cell region adjacently to the second trench gate structure, and is controlled by the second trench gate structure electrically independently of the first channel.

[I2] The semiconductor device according to I1, wherein the plurality of first trench gate structures are formed at intervals in the semiconductor layer; the plurality of second trench gate structures are formed at intervals alternately with the plurality of first trench gate structures in the semiconductor layer; the plurality of cell regions are each defined to a region between corresponding one of the first trench gate structures and corresponding one of the second trench gate structures; the first channel is formed in each of the cell regions adjacently to the first trench gate structure; and the second channel is formed in each of the cell regions adjacently to the second trench gate structure.

[I3] The semiconductor device according to I1 or I2, wherein the first channels are each formed in the plurality of cell regions with first channel areas which are different from each other; and the second channels are each formed in the plurality of cell regions with second channel areas which are different from each other.

[J1] A semiconductor device comprising: a semiconductor layer; an output region which is defined in the semiconductor layer; an input region which is defined in the semiconductor layer; a plurality of insulation gate-type transistors which are formed in the output region; and a control circuit which is formed in the input region, and performs control to turn on/off the plurality of transistors by a method that differs between in a normal operation and in an active clamp operation.

[J2] The semiconductor device according to J1, wherein the plurality of transistors include a first transistor and a second transistor which is electrically independent of the first transistor; and the control circuit simultaneously generates a plurality of control signals which control the first transistor and the second transistor individually.

[J3] The semiconductor device according to J1 or J2, further comprising: a plurality of control wirings which are formed anywhere above the semiconductor layer such as to be connected to gates of the plurality of transistors in the output region and are electrically connected to the control circuit in the output region.

[J4] The semiconductor device according to any one of J1 to J3, wherein the input region has a planar area which is less than a planar area of the output region.

[K1] A semiconductor device comprising: a semiconductor layer having a main surface; a trench gate structure which includes a trench formed in the main surface, an insulation layer along an inner wall of the trench, a bottom-side electrode embedded in a bottom wall side of the trench across the insulation layer, an opening-side electrode embedded in an opening side of the trench across the insulation layer, and an intermediate insulation layer interposed between the bottom-side electrode and the opening-side electrode; and a trench contact structure which includes a contact trench formed in the main surface such as to extend in a direction to intersect the trench and communicate with the trench, a contact insulation layer along an inner wall of the contact trench, and a contact electrode embedded in the contact trench across the contact insulation layer such as to be connected to the bottom-side electrode.

[K2] The semiconductor device according to K1, wherein the contact insulation layer is led out to the inside of the trench from the contact trench, and is connected to the insulation layer and the intermediate insulation layer inside the trench, and the contact electrode is led out to the inside of the trench from the contact trench, and is connected to the bottom-side electrode inside the trench.

[L1] A semiconductor circuit comprising: a semiconductor device which includes a gate divided transistor an ON resistance of which changes by individual control of a plurality of gate signals; and a gate control circuit which is electrically connected to the semiconductor device, and controls the plurality of gate signals individually such as to reduce the ON resistance to be lower than a steady-state value in an ON-transition of the gate divided transistor.

[L2] The semiconductor circuit according to L1, further comprising: an active clamp circuit which limits a terminal-to-terminal voltage of the gate divided transistor to be equal to or less than a clamp voltage, wherein the gate control circuit controls the plurality of gate signals individually such as to increase the ON resistance to be higher than the steady-state value before operation of the active clamp circuit.

[L3] The semiconductor circuit according to L1 or L2, further comprising: an overcurrent protection circuit which limits current that flows to the gate divided transistor.

[L4] The semiconductor circuit according to any one of L1 to L3, further comprising: an overcurrent protection circuit which forcibly turns off the gate divided transistor according to a temperature of the gate divided transistor or a temperature difference between the gate divided transistor and another circuit block.

[L5] An electronic equipment comprising: the semiconductor circuit according to any one of L1 to L4; and a load which is connected to the semiconductor circuit.

[M1] A semiconductor device comprising: a semiconductor layer; a first gate structure which is formed in the semiconductor layer; a second gate structure which is formed in the semiconductor layer; a first channel which is formed with a first channel area adjacently to the first gate structure in the semiconductor layer, and is controlled by the first gate structure; and a second channel which is formed with a second channel area different from the first channel area adjacently to the second gate structure in the semiconductor layer, and is controlled by the second gate structure.

[M2] The semiconductor device according to M1, wherein the second gate structure is electrically independent of the first gate structure; and the second channel is controlled electrically indecently of the first channel.

[N1] A semiconductor device comprising: a gate divided transistor an ON resistance of which changes by individual control of a plurality of gate signals; and a gate control circuit which controls the plurality of gate signals individually.

[N2] The semiconductor device according to N1, wherein, the gate control circuit reduces the ON resistance to be lower than a steady-state value in an ON-transition of the gate divided transistor

[N3] The semiconductor device according to N1 or N2, further comprising: an active clamp circuit which limits a terminal-to-terminal voltage of the gate divided transistor to be equal to or less than a predetermined clamp voltage, wherein the gate control circuit controls the plurality of gate signals individually such as to reduce the ON resistance to be lower than the steady-state value before operation of the active clamp circuit.

[N4] The semiconductor device according to N3, wherein the gate divided transistor has a first gate and a second gate, and a third gate to which the active clamp circuit is connected, and the gate control circuit includes: a first switch which is connected between the first gate and a source of the gate divided transistor, and is turned off when the ON resistance is reduced to be lower than the steady-state value, and a second switch and a third switch which are connected between the first gate and the second gate and the source of the gate divided transistor, respectively, and are turned on when the ON resistance is increased to be higher than the steady-state value.

[N5] The semiconductor device according to N4, further comprising: an output voltage monitoring circuit which monitors an output voltage of the gate divided transistor and generates a drive signal of the first switch.

[N6] The semiconductor device according to N5, wherein the output voltage monitoring circuit includes: a threshold voltage generating portion which generates a predetermined threshold voltage; a comparator which compares the output voltage and the threshold voltage to generate a comparison signal; a delay portion which gives a predetermined delay to the comparison signal to generate a delay signal; and a level shifter which level-shifts the delay signal to generate the drive signal.

[N7] The semiconductor device according to any one of N4 to N6, wherein the second switch and the third switch are each turned on/off according to an internal node voltage of the active clamp circuit.

[N8] The semiconductor device according to any one of N4 to N7, wherein the active clamp circuit includes: a Zener diode which has a cathode that is connected to a drain of the gate divided transistor; a diode which has an anode that is connected to an anode of the Zener diode; and a transistor which has a drain that is connected to a drain of the gate divided transistor, a source that is connected to the third gate of the gate divided transistor, and a gate that is connected to a cathode of the diode.

[N9] The semiconductor device according to any one of N1 to N8, further comprising: an overcurrent protection circuit which detects and limits an output current that flows to the gate divided transistor to be less than a predetermined upper limit value.

[N10] The semiconductor device according to any one of N1 to N9, further comprising: an overcurrent protection circuit which protects the gate divided transistor from a temperature rise.

[N11] The semiconductor device according to N10, wherein the overcurrent protection circuit forcibly turns off the gate divided transistor when a temperature of the gate divided transistor has reached a predetermined upper limit value or a temperature difference between the gate divided transistor and another circuit block has reached a predetermined upper limit value

[N12] An electronic equipment comprising: the semiconductor device according to any one of N1 to N11; and a load which is connected to the semiconductor device.

This application claims the benefit of priority to Japanese Patent Application No. 2018-240076 filed on Dec. 21, 2018, and Japanese Patent Application No. 2019-026833 filed on Feb. 18, 2019. These entire contents of these applications are hereby incorporated herein by reference. While preferred embodiments of the present invention have been described above, it is to be understood that variations and modifications will be apparent to those skilled in the art without departing from the scope and spirit of the present invention.

The scope of the present invention, therefore, is to be determined solely by the following claims.

REFERENCE SIGNS LIST

1: Semiconductor device
2: Semiconductor layer
3: First main surface of the semiconductor layer
10: Control IC
17: Gate control wiring
17A: First gate control wiring
17B: Second gate control wiring
17C: Third gate control wiring
56: First MISFET
57: Second MISFET
58: First FET structure
60: First trench gate structure
68: Second FET structure
70: Second trench gate structure
81: First gate trench
82: First insulation layer
83: First electrode
86: First bottom-side electrode
87: First opening-side electrode
88: First intermediate insulation layer
91: First channel region
101: Second gate trench
102: Second insulation layer
103: Second electrode
106: Second bottom-side electrode
107: Second opening-side electrode
108: Second intermediate insulation layer
111: Second channel region
151: Semiconductor device
161: Semiconductor device
171: Semiconductor device
181: Semiconductor device
191: Semiconductor device
201: Semiconductor device
211: Semiconductor device
213: First planar gate structure
223: Second planar gate structure
241: Semiconductor device
311: Circuit module
312: Mounting substrate
321: Circuit module
322: Mounting substrate
325: Control IC device
R1: First channel rate
R2: Second channel rate
RU: Channel utilization rate

The invention claimed is:

1. A semiconductor device comprising:

a semiconductor layer including a main surface;

a first transistor of an insulation gate-type which is formed in the semiconductor layer;

a second transistor of an insulation gate-type which is formed in the semiconductor layer; and a control wiring, which is formed on the semiconductor layer such as to be electrically connected to the first transistor and the second transistor, configured to transmit control signals that control the first transistor and the second transistor to be in ON states in a normal operation and that control the first transistor to be in an OFF state and the second transistor to be in an ON state in an active clamp operation, wherein the control wiring includes a first control wiring which is electrically connected to the first transistor and a second control wiring which is electrically connected to the second transistor in a state of being electrically insulated from the first transistor, the first transistor includes a first trench gate structure which has a first insulation layer in contact with the semiconductor layer and a first electrode facing the semiconductor layer across the first insulation layer, the second transistor includes a second trench gate structure which has a second insulation layer in contact with the semiconductor layer and a second electrode facing the semiconductor layer across the second insulation layer, during the normal operation, the first transistor and the second transistor are each controlled to be in the ON states via the first control wiring and the second control wiring, respectively, and during the active clamp operation, the first transistor is controlled to be in the OFF state via the first control wiring, while the second transistor is controlled to be in the ON state via the second control wiring.

2. The semiconductor device according to claim 1, wherein the first transistor includes the plurality of first trench gate structures, and the second transistor includes the plurality of second trench gate structures.

3. The semiconductor device according to claim 2, wherein the plurality of second trench gate structures are alternately arrayed with the plurality of first trench gate structures in a manner that one or the plurality of first trench gate structures are held therebetween.

4. The semiconductor device according to claim 2, wherein the plurality of first trench gate structures are formed at an interval along a first direction, and each extend in a band shape along a second direction which intersects the first direction, and the plurality of second trench gate structures are formed at an interval along the first direction, and each extend in a band shape along the second direction.

5. The semiconductor device according to claim 1, wherein the first trench gate structure includes a first trench formed in the main surface, the first insulation layer along an inner wall of the first trench, and the first electrode embedded in the first trench across the first insulation layer, and the second trench gate structure includes a second trench formed in the main surface, the second insulation layer along an inner wall of the second trench, and the second electrode embedded in the second trench across the second insulation layer.

6. A circuit module comprising:

a mounting substrate; and the semiconductor device according to claim 2 which is mounted on the mounting substrate.

7. A semiconductor device comprising:

a semiconductor layer;

an insulation gate-type first transistor which includes a first channel and is formed in the semiconductor layer;

an insulation gate-type second transistor which includes a second channel and is formed in the semiconductor layer; and a control wiring, which is formed on the semiconductor layer such as to be electrically connected to the insulation gate-type first transistor and the insulation gate-type second transistor, configured to transmit control signals that control the insulation gate-type first transistor and the insulation gate-type second transistor such that utilization rates of the first channel and the second channel in an active clamp operation become in excess of zero and less than utilization rates of the first channel and the second channel in a normal operation, wherein the control wiring includes a first control wiring which is electrically connected to the insulation gate-type first transistor and a second control wiring which is electrically connected to the insulation gate-type second transistor in a state of being electrically insulated from the insulation gate-type first transistor, the first channel is formed at a first channel rate in plan view, the second channel is formed at a second channel rate different from the first rate in plan view, and during the normal operation and the active clamp operation, the insulation gate-type first transistor and the insulation gate-type second transistor are each controlled via the first control wiring and the second control wiring, respectively, so that the utilization rate of the first channel and the second channel during the active clamp operation is greater than zero and less than the utilization rates of the first channel and the second channel during the normal operation.

8. The semiconductor device according to claim 7, wherein the second channel rate is less than the first channel rate.

* * * * *